US012790353B2

(12) United States Patent
Takeda et al.

(10) Patent No.: US 12,790,353 B2
(45) Date of Patent: Nov. 10, 2026

(54) ORGANIC COMPOUND, LIGHT-EMITTING DEVICE, DISPLAY DEVICE, ELECTRONIC DEVICE, LIGHT-EMITTING APPARATUS, AND LIGHTING DEVICE

(71) Applicant: Semiconductor Energy Laboratory Co., Ltd., Kanagawa-ken (JP)

(72) Inventors: Kyoko Takeda, Atsugi (JP); Harue Osaka, Atsugi (JP); Naoaki Hashimoto, Sagamihara (JP); Tsunenori Suzuki, Yokohama (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 228 days.

(21) Appl. No.: 18/228,150

(22) Filed: Jul. 31, 2023

(65) Prior Publication Data

US 2024/0067664 A1 Feb. 29, 2024

(30) Foreign Application Priority Data

Aug. 9, 2022 (JP) ................................ 2022-126899

(51) Int. Cl.
*C07F 5/02* (2006.01)
*H10K 50/30* (2023.01)
*H10K 85/60* (2023.01)

(52) U.S. Cl.
CPC ............... *C07F 5/02* (2013.01); *H10K 50/30* (2023.02); *H10K 85/658* (2023.02)

(58) Field of Classification Search
None
See application file for complete search history.

(56) References Cited

U.S. PATENT DOCUMENTS

2021/0376249 A1 12/2021 Akashi et al.
2023/0200206 A1* 6/2023 Shibata ................ H10K 85/322 428/690

FOREIGN PATENT DOCUMENTS

CN 112645968 A 4/2021

OTHER PUBLICATIONS

Oda, S. et al., "Carbazole-Based DABNA Analogues as Highly Efficient Thermally Activated Delayed Fluorescence Materials for Narrowband Organic Light-Emitting Diodes," Angew. Chem. Int. Ed. (Angewandte Chemie International Edition), Feb. 8, 2021, vol. 60, No. 6, pp. 2882-2886.

* cited by examiner

*Primary Examiner* — Anthony Ho
(74) *Attorney, Agent, or Firm* — Husch Blackwell LL.P

(57) ABSTRACT

A novel organic compound that is highly convenient, useful, or reliable is to be provided. The organic compound is represented by General Formula (G0).

(G0)

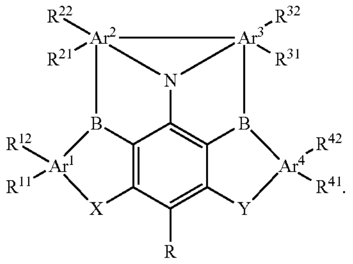

In General Formula (G0), X and Y each independently represent an oxygen atom or a sulfur atom. $Ar^1$ to $Ar^4$ each independently represent an aromatic ring or a nitrogen-containing heteroaromatic ring, the aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

18 Claims, 35 Drawing Sheets

ORGANIC COMPOUND, LIGHT-EMITTING DEVICE, DISPLAY DEVICE, ELECTRONIC DEVICE, LIGHT-EMITTING APPARATUS, AND LIGHTING DEVICE

BACKGROUND OF THE INVENTION

1. Field of the Invention

One embodiment of the present invention relates to an organic compound, a light-emitting device, a display device, an electronic device, a light-emitting apparatus, a lighting device, or a semiconductor device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter. Specific examples of the technical field of one embodiment of the present invention disclosed in this specification include a semiconductor device, a display device, a light-emitting apparatus, a power storage device, a memory device, a method for driving any of them, and a method for manufacturing any of them.

2. Description of the Related Art

An organic electroluminescence device enabling high emission efficiency with a polycyclic compound contained in a light-emitting layer is known (Patent Document 1).

REFERENCE

[Patent Document 1] United States Patent Application Publication No. 2021/0376249

SUMMARY OF THE INVENTION

An object of one embodiment of the present invention is to provide a novel organic compound that is highly convenient, useful, or reliable. Another object is to provide a novel light-emitting device that is highly convenient, useful, or reliable. Another object is to provide a novel display device that is highly convenient, useful, or reliable. Another object of one embodiment of the present invention is to provide a novel electronic device that is highly convenient, useful, or reliable. Another object is to provide a novel light-emitting apparatus that is highly convenient, useful, or reliable. Another object is to provide a novel lighting device that is highly convenient, useful, or reliable. Another object is to provide a novel organic compound, a novel light-emitting device, a novel display device, a novel electronic device, a novel light-emitting apparatus, a novel lighting device, or a novel semiconductor device.

Note that the description of these objects does not preclude the existence of other objects. In one embodiment of the present invention, there is no need to achieve all the objects. Other objects will be apparent from and can be derived from the description of the specification, the drawings, the claims, and the like.

(1) One embodiment of the present invention is an organic compound represented by General Formula (G0).

[Chemical Formula 1]

(G0)

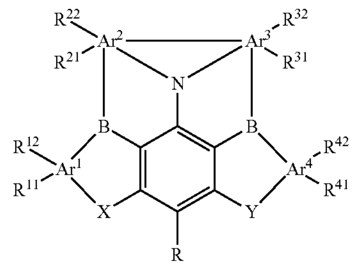

In General Formula (G0), X and Y each independently represent an oxygen atom or a sulfur atom. $Ar^1$ to $Ar^4$ each independently represent an aromatic ring or a nitrogen-containing heteroaromatic ring, the aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, $Ar^1$ can be bonded to a benzene ring through a B atom and an X atom, $Ar^4$ can be bonded to the benzene ring through a B atom and a Y atom, $Ar^2$ can be bonded to the benzene ring through the B atom and an N atom, and $Ar^3$ can be bonded to the benzene ring through the B atom and the N atom. With the bonding with the benzene ring through the B atom and the N atom, expansion of a conjugated system can be suppressed on purpose. The bonding brings the spectrum narrowing. Furthermore, the expansion of a conjugated system can be suppressed. Furthermore, $Ar^2$ and $Ar^3$ can be bonded. Furthermore, the molecular skeleton can be made rigid. Furthermore, the emission wavelength can be short. Furthermore, the full width at half maximum of an emission spectrum can be narrowed. Furthermore, the color purity of an emission color can be increased. Furthermore, a material with high heat resistance can be provided. As a result, a novel organic compound that is highly convenient, useful, or reliable can be provided.

(2) Another embodiment of the present invention is an organic compound represented by General Formula (G1).

[Chemical Formula 2]

(G1)

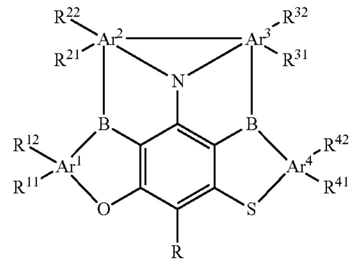

In General Formula (G1), $Ar^1$ to $Ar^4$ each independently represent an aromatic ring or a nitrogen-containing heteroaromatic ring, the aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, $Ar^1$ can be bonded to a benzene ring through a B atom and an O atom, and $Ar^4$ can be bonded to the benzene ring through a B atom and an S atom. Furthermore, with the O atom and the S atom, the molecular structure can be made asymmetric, which can inhibit crystallization from occurring. With use of the S atom for one of the bonding of $Ar^1$ and the bonding of $Ar^4$, the emission wavelength can be made longer than a case of using the O atom for the both. Furthermore, the emission color can be adjusted. As a result, a novel organic compound that is highly convenient, useful, or reliable can be provided.

(3) Another embodiment of the present invention is an organic compound represented by General Formula (G2).

[Chemical Formula 3]

(G2)

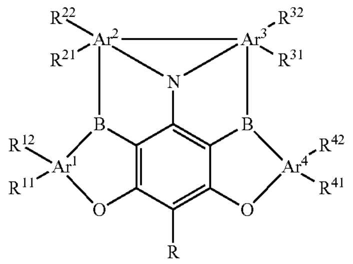

In General Formula (G2), $Ar^1$ to $Ar^4$ each independently represent an aromatic ring or a nitrogen-containing heteroaromatic ring, the aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, $Ar^1$ can be bonded to a benzene ring through a B atom and an O atom, and $Ar^4$ can be bonded to the benzene ring through a B atom and an O atom. With use of the O atom for both the bonding of $Ar^1$ and the bonding of $Ar^4$, the emission wavelength can be made shorter than that with use of an S atom for one or both of them. Furthermore, the level of difficulty of synthesis can be lowered. Furthermore, the cost of synthesis can below. As a result, a novel organic compound that is highly convenient, useful, or reliable can be provided.

(4) Another embodiment of the present invention is an organic compound represented by General Formula (G3).

[Chemical Formula 4]

(G3)

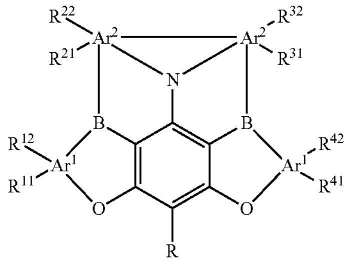

In General Formula (G3), $Ar^1$ and $Ar^2$ each independently represent an aromatic ring or a nitrogen-containing heteroaromatic ring, the aromatic ring is composed only of one or more six-membered rings and contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, the molecular structure can have high symmetry, whereby the synthesis can be facilitated. Furthermore, the yield of synthesis can be increased. Furthermore, the six-membered ring forms the organic compound, and the bonding of the organic compound can be stabilized. Furthermore, the degradation due to excitation is less likely to occur. Furthermore, the degradation due to a redox reaction is less likely to occur. As a result, a novel organic compound that is highly convenient, useful, or reliable can be provided.

(5) Another embodiment of the present invention is an organic compound represented by General Formula (G3) shown above, where at least one of R, $R^{11}$, $R^{12}$, $R^{21}$, $R^{22}$, $R^{31}$, $R^{32}$, $R^{41}$, and $R^{42}$ represents a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, at least one of, preferably three or more of, R, $R^{11}$, $R^{12}$, $R^{21}$, $R^{22}$, $R^{31}$, $R^{32}$, $R^{41}$, and $R^{42}$ can be a substituent. Furthermore, a bulky molecular structure can be provided. Furthermore, intermolecular interaction can be suppressed. Furthermore, light emission with high efficiency can be obtained in a solid phase. Furthermore, light emission whose emission spectrum has a narrow full width at half maximum can be obtained in a solid phase. Furthermore, at least one of R, $R^{11}$, $R^{12}$, $R^{21}$, $R^{22}$, $R^{31}$, $R^{32}$, $R^{41}$, and $R^{42}$ can be diarylamine or heteroarylamine. Furthermore, hole transfer can be facilitated. Furthermore, the emission efficiency of a light-emitting device can be increased. Furthermore, four or less, preferably two or less, of R, $R^{11}$, $R^{12}$, $R^{21}$, $R^{22}$, $R^{31}$, $R^{32}$, $R^{41}$, and $R^{42}$ can be a substituent. Furthermore, the evaporation temperature can be lowered. As a result, a novel organic compound that is highly convenient, useful, or reliable can be provided.

(6) Another embodiment of the present invention is an organic compound represented by General Formula (G3)

shown above, where $Ar^1$ is a benzene ring, and $Ar^2$ is a benzene ring or a naphthalene ring.

In this structure, the level of difficulty of synthesis can be lowered. Furthermore, the yield of synthesis can be increased. Furthermore, the evaporation temperature can be lowered. Furthermore, the alternation or degradation caused by the evaporation can be suppressed. Furthermore, the emission efficiency can be increased. Furthermore, the full width at half maximum of an emission spectrum can be narrowed. Furthermore, the color purity of an emission color can be increased. Furthermore, with use of a naphthalene ring for $Ar^2$, an emission wavelength can be made longer. Furthermore, blue emission suitable for display usage can be exhibited. As a result, a novel organic compound that is highly convenient, useful, or reliable can be provided.

(7) Another embodiment of the present invention is an organic compound represented by General Formula (G3) shown above, where $Ar^1$ is a benzene ring, $Ar^2$ is a benzene ring or a naphthalene ring, $R^{11}$, $R^{12}$, $R^{21}$, $R^{22}$, $R^{31}$, $R^{32}$, $R^{41}$, and $R^{42}$ each independently represent hydrogen, R represents hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, when hydrogen is used for R, $R^{11}$, $R^{12}$, $R^{21}$, $R^{22}$, $R^{31}$, $R^{32}$, $R^{41}$, and $R^{42}$, synthesis can be performed at low cost. Furthermore, the emission wavelength can be shortened. Furthermore, the full width at half maximum of an emission spectrum can be narrowed. As a result, a novel organic compound that is highly convenient, useful, or reliable can be provided.

(8) Another embodiment of the present invention is a light-emitting device including a first electrode, a second electrode, and a unit. The unit is located between the first electrode and the second electrode, and includes the above-described organic compound.

With this structure, a light-emitting device emitting blue light can be provided. A light-emitting device with high color purity can be provided. As a result, a novel light-emitting device that is highly convenient, useful, or reliable can be provided.

(9) Another embodiment of the present invention is a display device including the above-described light-emitting device, and a transistor or a substrate.

(10) Another embodiment of the present invention is an electronic device including the above-described display device, and any one of a sensor, an operation button, a speaker, and a microphone.

(11) Another embodiment of the present invention is a light-emitting apparatus including the above-described light-emitting device, and a transistor or a substrate.

(12) Another embodiment of the present invention is a lighting device including the above-described light-emitting apparatus and a housing.

Although the block diagram in drawings attached to this specification shows components classified based on their functions in independent blocks, it is difficult to classify actual components based on their functions completely, and one component can have a plurality of functions.

Note that the light-emitting apparatus in this specification includes, in its category, an image display device that uses a light-emitting device. The light-emitting apparatus may also include, in its category, a module in which a light-emitting device is provided with a connector such as an anisotropic conductive film or a tape carrier package (TCP), a module in which a printed wiring board is provided at the end of a TCP, and a module in which an integrated circuit (IC) is directly mounted on a light-emitting device by a chip on glass (COG) method. Furthermore, a lighting device or the like may include the light-emitting apparatus.

With one embodiment of the present invention, a novel organic compound that is highly convenient, useful, or reliable can be provided. One embodiment of the present invention can provide a novel light-emitting device that is highly convenient, useful, or reliable. Another embodiment of the present invention can provide a novel display device that is highly convenient, useful, or reliable. Another embodiment of the present invention can provide a novel electronic device that is highly convenient, useful, or reliable. One embodiment of the present invention can provide a novel light-emitting apparatus that is highly convenient, useful, or reliable. One embodiment of the present invention can provide a novel lighting device that is highly convenient, useful, or reliable. A novel organic compound can be provided. A novel light-emitting device can be provided. A novel display device can be provided. A novel electronic device can be provided. A novel light-emitting apparatus can be provided. A novel lighting device can be provided.

Note that the description of these effects does not preclude the existence of other effects. One embodiment of the present invention does not necessarily achieve all the effects listed above. Other effects will be apparent from and can be derived from the description of the specification, the drawings, the claims, and the like.

DETAILED DESCRIPTION OF THE INVENTION

Figure 1A:
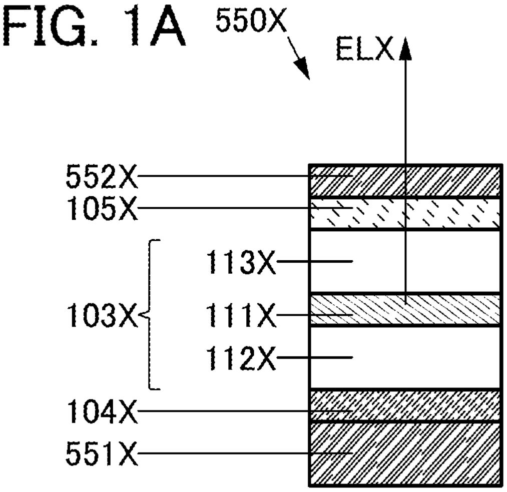
FIGS. 1A and 1B illustrate a structure of a light-emitting device of an embodiment.

An organic compound of one embodiment of the present invention is represented by General Formula (G0).

[Chemical Formula 5]

(G0)

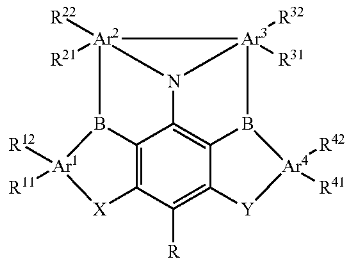

In General Formula (G0), X and Y each independently represent an oxygen atom or a sulfur atom. $Ar^1$ to $Ar^4$ each independently represent an aromatic ring or a nitrogen-containing heteroaromatic ring, the aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted diarylamine having 3 to 18 carbon atoms.

In this structure, $Ar^1$ can be bonded to a benzene ring through a B atom and an X atom, $Ar^4$ can be bonded to the benzene ring through a B atom and a Y atom, $Ar^2$ can be bonded to the benzene ring through the B atom and an N atom, and $Ar^3$ can be bonded to the benzene ring through the B atom and the N atom. With the bonding with the benzene ring through the B atom and the N atom, expansion of a conjugated system can be suppressed on purpose. The bonding brings the spectrum narrowing. Furthermore, the expansion of a conjugated system can be suppressed. Furthermore, $Ar^2$ and $Ar^3$ can be bonded. Furthermore, the molecular skeleton can be made rigid. Furthermore, the emission wavelength can be short. Furthermore, the full width at half maximum of an emission spectrum can be narrowed. Furthermore, the color purity of an emission color can be increased. Furthermore, a material with high heat resistance can be provided. As a result, a novel organic compound that is highly convenient, useful, or reliable can be provided.

Embodiments will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated.

Embodiment 1

In this embodiment, an organic compound of one embodiment of the present invention will be described.

Example 1 of Organic Compound

The organic compound described in this embodiment is an organic compound represented by General Formula (G0) below.

[Chemical Formula 6]

(G0)

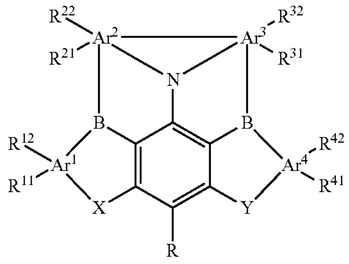

In General Formula (G0), X and Y each independently represent an oxygen atom or a sulfur atom. $Ar^1$ to $Ar^4$ each independently represent an aromatic ring or a nitrogen-containing heteroaromatic ring. The aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In General Formula (G0), hydrogen includes deuterium.

In this structure, $Ar^1$ can be bonded to a benzene ring through a B atom and an X atom, $Ar^4$ can be bonded to the benzene ring through a B atom and a Y atom, $Ar^2$ can be bonded to the benzene ring through the B atom and an N atom, and $Ar^3$ can be bonded to the benzene ring through the B atom and the N atom. With the bonding with the benzene ring through the B atom and the N atom, expansion of a conjugated system can be suppressed on purpose. The bonding brings the spectrum narrowing. Furthermore, the expansion of a conjugated system can be suppressed. Furthermore, $Ar^2$ and $Ar^3$ can be bonded. Furthermore, the molecular skeleton can be made rigid. Furthermore, the emission wavelength can be shortened. Furthermore, the full width at half maximum of an emission spectrum can be narrowed. For example, the full width at half maximum can be less than or equal to 30 nm. Furthermore, the color purity of an emission color can be increased. For example, light emission with a high color purity can be extracted without using a combination with a microcavity structure or a color filter. Alternatively, even in a combination with a microcavity structure or a color filter, the loss of light is little, and emission can be extracted with high efficiency. Furthermore, a material with high heat resistance can be provided. Furthermore, a peak wavelength of an absorption spectrum and a peak wavelength of an emission spectrum can be close to each other, whereby a Stokes shift can be small. For example, the Stokes shift can be less than or equal to 20 nm. For example, the loss of excitation energy due to vibration relaxation can be less than or equal to 0.20 eV. As a result, a novel organic compound that is highly convenient, useful, or reliable can be provided.

Example of $Ar^1$ to $Ar^4$ $Ar^1$ to $Ar^4$ each independently represent an aromatic ring or a nitrogen-containing heteroaromatic ring. $Ar^1$ to $Ar^4$ each independently have 0 to 2 substituents.

In the case where any of $Ar^1$ to $Ar^4$ is an aromatic ring, the aromatic ring has 6 to 10 carbon atoms.

In the case where any of $Ar^1$ to $Ar^4$ is a nitrogen-containing heteroaromatic ring, the nitrogen-containing heteroaromatic ring is composed only of one or more six-membered rings and has 4 to 9 carbon atoms. For example, a benzene ring and a naphthalene ring can be used.

[Case of $Ar^1$ or $Ar^4$ Being Aromatic Ring]

For example, aromatic rings (ii-1) to (ii-3) shown below can be used for $Ar^1$ and $Ar^4$. Note that $*^1$ and $*^2$ in the structural formulae represent bonds. One of $*^1$ and $*^2$ is bonded to a boron atom in General Formula (G0), and the other is bonded to an oxygen atom or a sulfur atom.

For example, with the aromatic ring (ii-1), an emission wavelength can be shortened. In addition, the full width at half maximum can be narrowed. For example, the full width at half maximum can be less than or equal to 20 nm. The peak wavelength of an absorption spectrum and the peak wavelength of an emission spectrum can be close to each other, whereby a Stokes shift can be small. For example, the Stokes shift can be less than or equal to 20 nm. The loss of excitation energy due to vibration relaxation can be less than or equal to 0.25 eV. With use of the aromatic ring (ii-2) and the aromatic ring (ii-3), the molecular weight can be increased. The glass transition temperature can be increased. Heat resistance can be improved. With use of the aromatic ring (ii-2), reliability favorable to a light-emitting material is exhibited. When $*^1$ is bonded to a boron atom and $*^2$ is bonded to X or Y with use of the aromatic ring (ii-3), steric hindrance in a molecule can be reduced. The distortion generated in a skeleton of the organic compound can be inhibited. The alteration of the organic compound can be inhibited.

[Chemical Formula 7]

(ii-1)

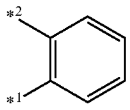

(ii-2)

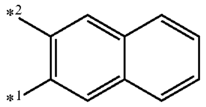

(ii-3)

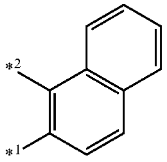

[Case of $Ar^1$ or $Ar^4$ being Nitrogen-Containing Heteroaromatic Ring]

For example, nitrogen-containing heteroaromatic rings (ii-4) to (ii-69) shown below can be used for $Ar^1$ and $Ar^4$. With use of the nitrogen-containing heteroaromatic ring, electron transfer is facilitated. In this case, the organic compound of one embodiment of the present invention can be used for an electron-transport material. Note that $*^1$ and $*^2$ in the structural formulae represent bonds. One of $*^1$ and $*^2$ is bonded to a boron atom in General Formula (G0), and the other is bonded to an oxygen atom or a sulfur atom.

For example, with use of the nitrogen-containing heteroaromatic rings (ii-31) to (ii-69), $*^1$ is bonded to a boron atom, and $*^2$ is bonded to X or Y, whereby steric hindrance in a molecule can be reduced. The distortion generated in a skeleton of the organic compound can be inhibited. The alteration of the organic compound can be inhibited.

[Chemical Formula 8]

(ii-4)

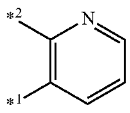

-continued
(ii-5)
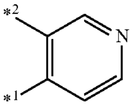
(ii-6)
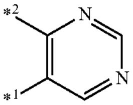
(ii-7)
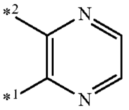
(ii-8)
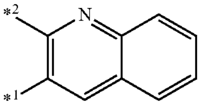
(ii-9)
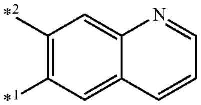
(ii-10)
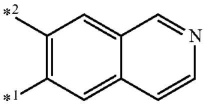
(ii-11)
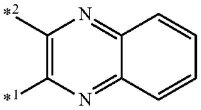
(ii-12)
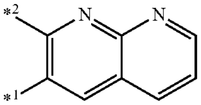
(ii-13)
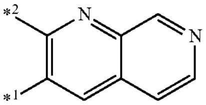
(ii-14)
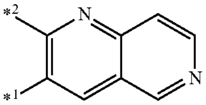
(ii-15)
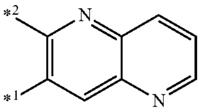
(ii-16)
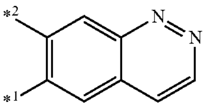
(ii-17)
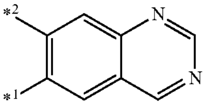
-continued
(ii-18)
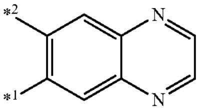
(ii-19)
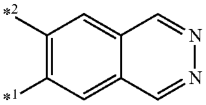
(ii-20)
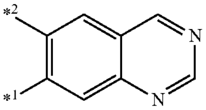
(ii-21)
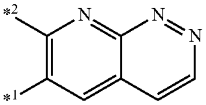
(ii-22)
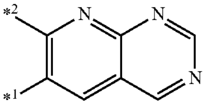
(ii-23)
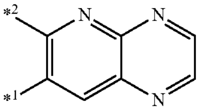
(ii-24)
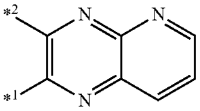
(ii-25)
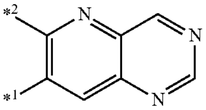
(ii-26)
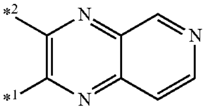
[Chemical Formula 9]
(ii-27)
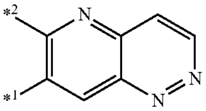
(ii-28)
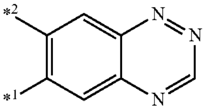
(ii-29)
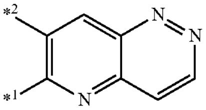

-continued
(ii-30)
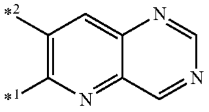
(ii-31)
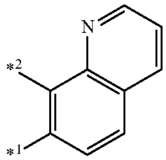
(ii-32)
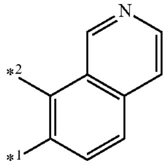
(ii-33)
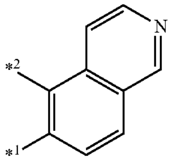
(ii-34)
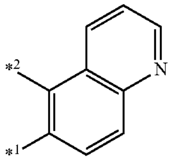
(ii-35)
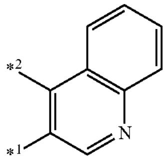
(ii-36)
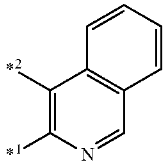
(ii-37)
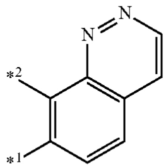
(ii-38)
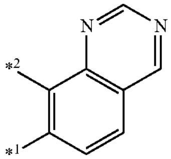
-continued
(ii-39)
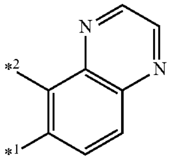
(ii-40)
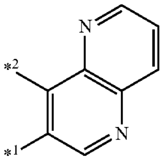
(ii-41)
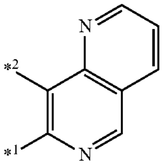
(ii-42)
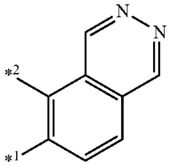
(ii-43)
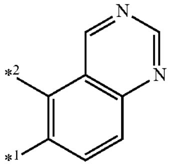
(ii-44)
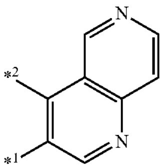
(ii-45)
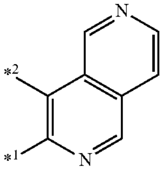
(ii-46)
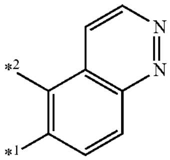
(ii-47)
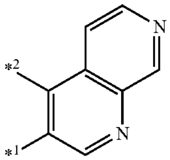

-continued
(ii-48)
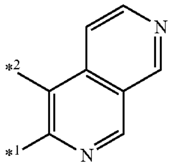
(ii-49)
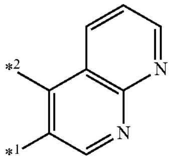
(ii-50)
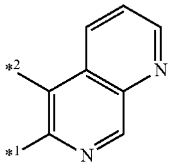
[Chemical Formula 10]
(ii-51)
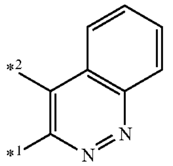
(ii-52)
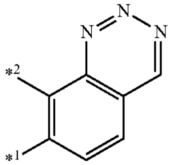
(ii-53)
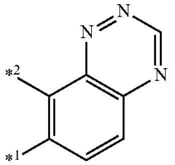
(ii-54)
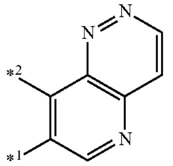
(ii-55)
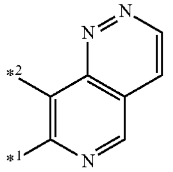
(ii-56)
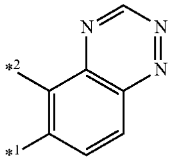
-continued
(ii-57)
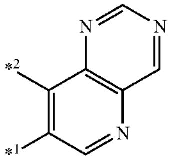
(ii-58)
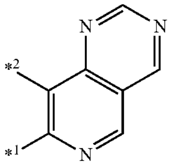
(ii-59)
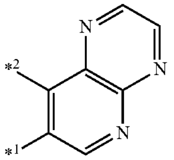
(ii-60)
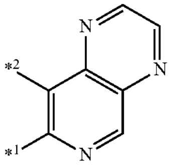
(ii-61)
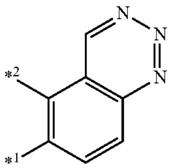
(ii-62)
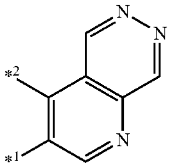
(ii-63)
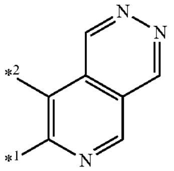
(ii-64)
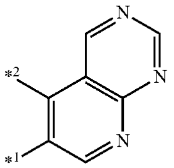
(ii-65)
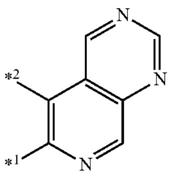

-continued (ii-66)

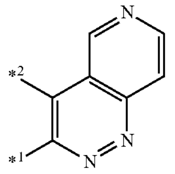

(ii-67)

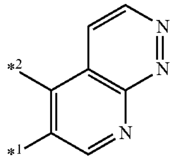

(ii-68)

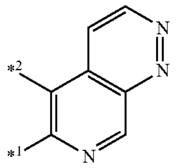

(ii-69)

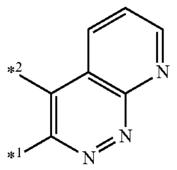

[Case of $Ar^2$ or $Ar^3$ being Aromatic Ring]

For example, aromatic rings (iii-1) to (iii-3) can be used for $Ar^2$. Note that $*^1$ to $*^3$ in the structural formulae represent bonds. $*^1$ is bonded to a nitrogen atom in General Formula (G0). One of $*^2$ and $*^3$ is bonded to a B atom in General Formula (G0), and the other is bonded to $Ar^3$.

For example, aromatic rings (iii-1) to (iii-3) shown below can be used for $Ar^3$. Note that $*^1$ to $*^3$ in the structural formulae represent bonds. $*^1$ is bonded to a nitrogen atom in General Formula (G0). One of $*^2$ and $*^3$ is bonded to a B atom in General Formula (G0), and the other is bonded to $Ar^2$.

With use of the aromatic ring (iii-1), an emission wavelength can be shortened. In addition, the full width at half maximum can be narrowed. For example, the full width at half maximum can be less than or equal to 20 nm. The peak wavelength of an absorption spectrum and the peak wavelength of an emission spectrum can be close to each other, whereby a Stokes shift can be small. For example, the Stokes shift can be less than or equal to 20 nm. The loss of excitation energy due to vibration relaxation can be less than or equal to 0.25 eV. For example, with use of the aromatic ring (iii-3), $*^2$ is bonded to a boron atom, whereby steric hindrance in a molecule can be reduced. The distortion generated in a skeleton of the organic compound can be inhibited. The alteration of the organic compound can be inhibited.

[Chemical Formula 11]

(iii-1)

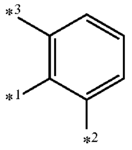

-continued (iii-2)

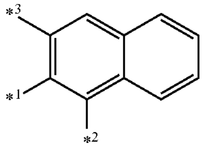

(iii-3)

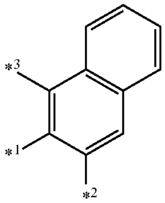

[Case of $Ar^2$ or $Ar^3$ being Nitrogen-Containing Heteroaromatic Ring]

For example, nitrogen-containing heteroaromatic rings (iii-4) to (iii-51) shown below can be used for $Ar^2$. With use of the nitrogen-containing heteroaromatic ring, electron transfer is facilitated. In this case, the organic compound of one embodiment of the present invention can be used for an electron-transport material. Note that $*^1$ to $*^3$ in the structural formulae represent bonds. $*^1$ is bonded to a nitrogen atom in General Formula (G0). One of $*^2$ and $*^3$ is bonded to a B atom in General Formula (G0), and the other is bonded to $Ar^3$.

For example, nitrogen-containing heteroaromatic rings (iii-4) to (iii-51) shown below can be used for $Ar^3$. Note that $*^1$ and $*^3$ in the structural formulae represent bonds. $*^1$ is bonded to a nitrogen atom in General Formula (G0). One of $*^2$ and $*^3$ is bonded to a B atom in General Formula (G0), and the other is bonded to $Ar^2$.

For example, with use of the nitrogen-containing heteroaromatic rings (iii-8) to (iii-26), $*^3$ is bonded to a boron atom, whereby steric hindrance in a molecule can be reduced. The distortion generated in a skeleton of the organic compound can be inhibited. The alteration of the organic compound can be inhibited. For example, with use of the nitrogen-containing heteroaromatic rings (iii-27) to (iii-51), $*^2$ is bonded to a boron atom, whereby steric hindrance in a molecule can be reduced. The distortion generated in a skeleton of the organic compound can be inhibited. The alteration of the organic compound can be inhibited.

[Chemical 12]

(iii-4)

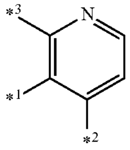

(iii-5)

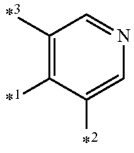

-continued
(iii-6)
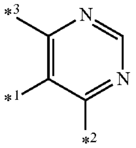
(iii-7)
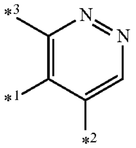
(iii-8)
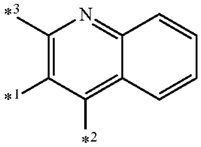
(iii-9)
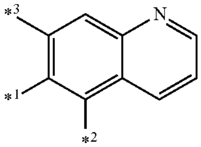
(iii-10)
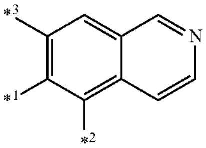
(iii-11)
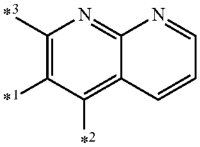
(iii-12)
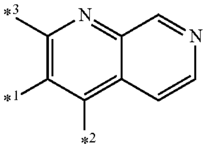
(iii-13)
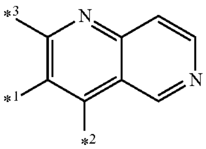
(iii-14)
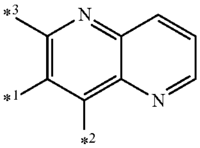
(iii-15)
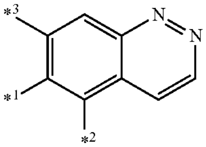
-continued
(iii-16)
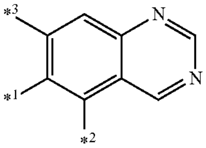
(iii-17)
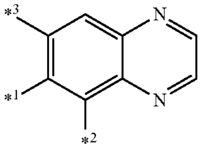
(iii-18)
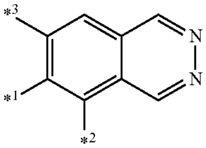
(iii-19)
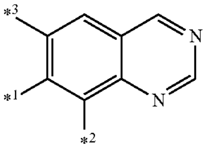
(iii-20)
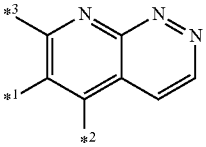
(iii-21)
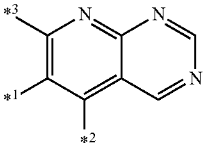
(iii-22)
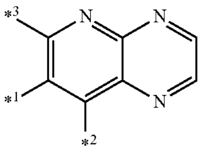
(iii-23)
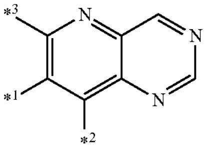
(iii-24)
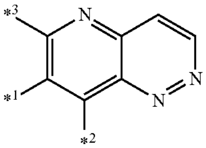
(iii-25)
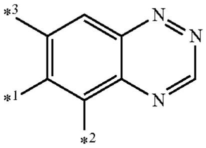

-continued
(iii-26)
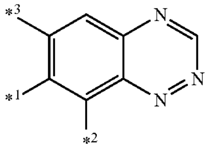
[Chemical Formula 13]
(iii-27)
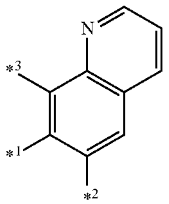
(iii-28)
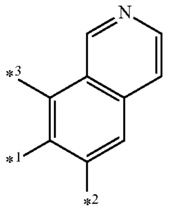
(iii-29)
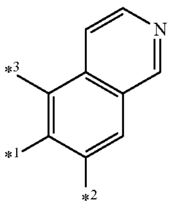
(iii-30)
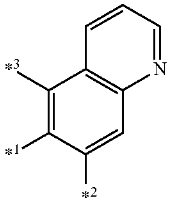
(iii-31)
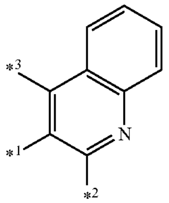
(iii-32)
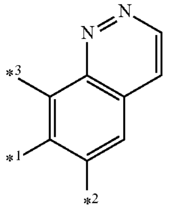
-continued
(iii-33)
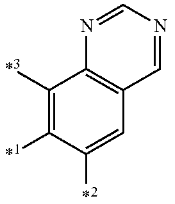
(iii-34)
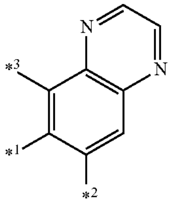
(iii-35)
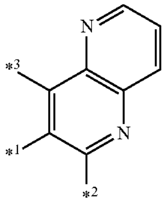
(iii-36)
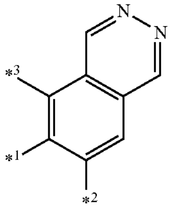
(iii-37)
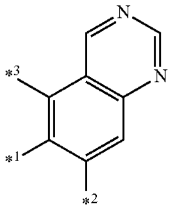
(iii-38)
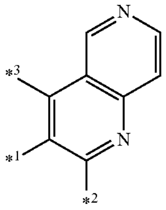
(iii-39)
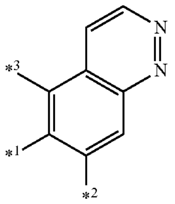

-continued (iii-40)

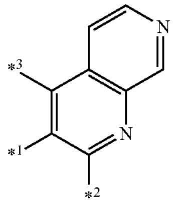

(iii-41)

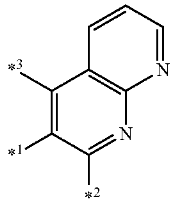

(iii-42)

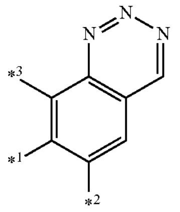

(iii-43)

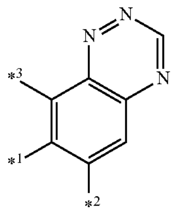

(iii-44)

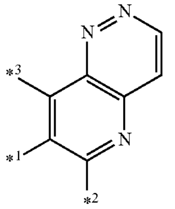

(iii-45)

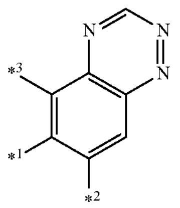

(iii-46)

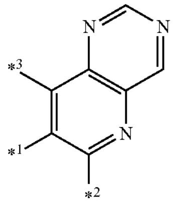

-continued

[Chemical Formula 14]

(iii-47)

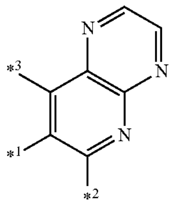

(iii-48)

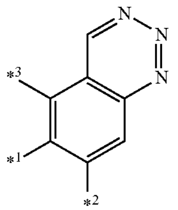

(iii-49)

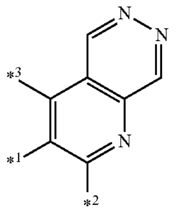

(iii-50)

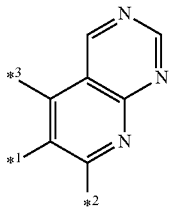

(iii-51)

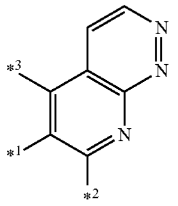

Example of R, $R^{11}$, $R^{12}$, $R^{21}$, $R^{22}$, $R^{31}$, $R^{32}$, $R^{41}$, and $R^{42}$ R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In each of R, $R^{11}$, $R^{12}$, $R^{21}$, $R^{22}$, $R^{31}$, $R^{32}$, $R^{41}$, and $R^{42}$, hydrogen includes deuterium.

For example, a straight-chain alkyl group having 1 to 6 carbon atoms or a branched alkyl group having 3 to 7 carbon atoms, shown below, can be used for a substituent. Note that when a methyl group or a tert-butyl group is used for R, $R^{11}$, $R^{1}$, $R^{21}$, $R^{22}$, $R^{31}$, $R^{32}$, $R^{41}$, and $R^{42}$, a bulky structure can be provided with low fabrication cost.

[Chemical Formula 15]
(R-1)
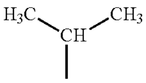
(R-2)
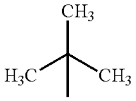
(R-3)
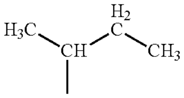
(R-4)
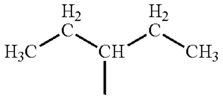
(R-5)
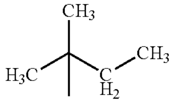
(R-6)
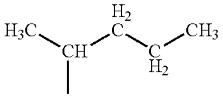
(R-7)
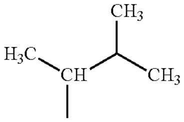
(R-8)
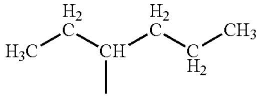
(R-9)
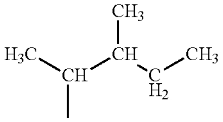
(R-10)
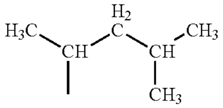
(R-11)
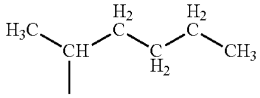
(R-12)
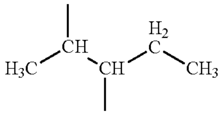
(R-13)
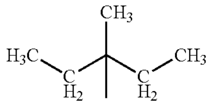
-continued
(R-14)
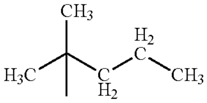
(R-15)
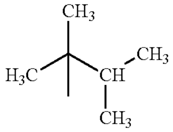
(R-16)
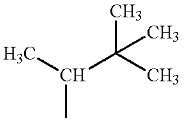
(R-17)
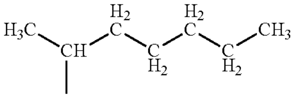
(R-18)
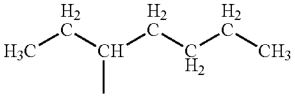
(R-19)
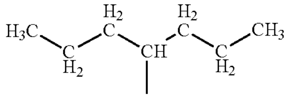
(R-20)
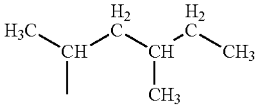
(R-21)
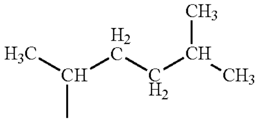
(R-22)
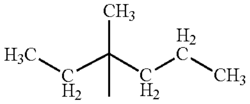
(R-23)
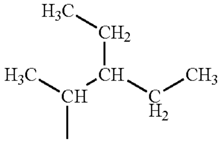
[Chemical Formula 16]
(R-24)
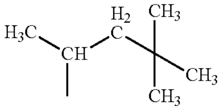
(R-25)
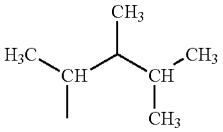

-continued
(R-26)
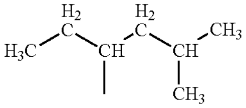
(R-27)
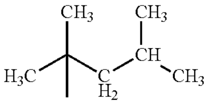
(R-28)
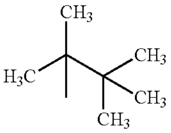
(R-29)
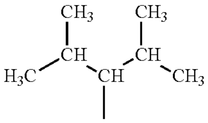
(R-30)
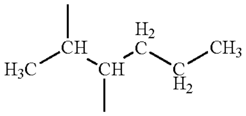
(R-31)
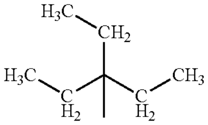
(R-32)
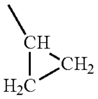
(R-33)
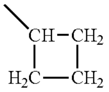
(R-34)
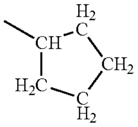
(R-35)
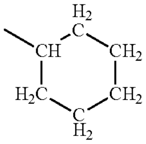
(R-36)
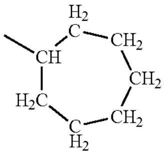
For example, a substituted or unsubstituted aryl group having 6 to 13 carbon atoms shown below can be used for a substituent. For example, a phenyl group, a biphenyl group, a naphthyl group, or a fluorenyl group can be used as the substituent.
[Chemical Formula 17]
(R-37)
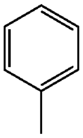
(R-38)
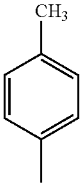
(R-39)
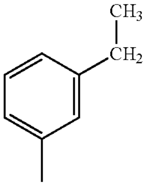
(R-40)
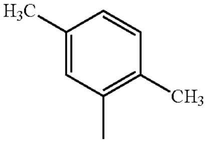
(R-41)
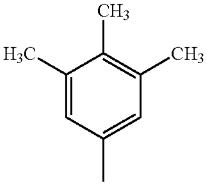
(R-42)
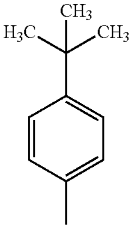
(R-43)
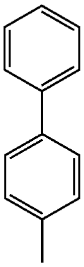

-continued (R-44)

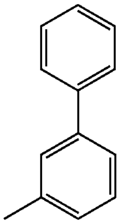

(R-45)

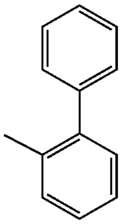

(R-46)

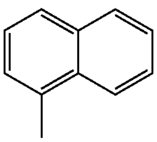

(R-47)

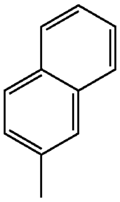

(R-48)

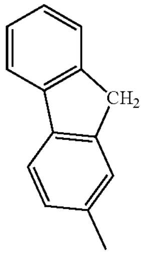

(R-49)

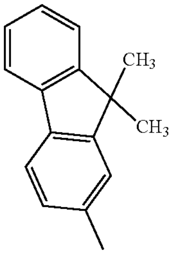

(R-50)

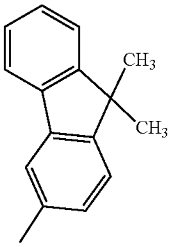

-continued (R-51)

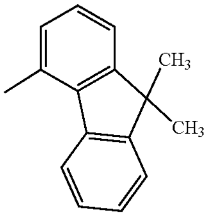

For example, substituted or unsubstituted diarylamine having 6 to 13 carbon atoms shown below can be used for a substituent. With use of diarylamine, hole transfer is facilitated. In this case, the organic compound of one embodiment of the present invention can be used for a hole-transport material. As an aryl group of diarylamine, a phenyl group, a biphenyl group, a naphthyl group, or a fluorenyl group can be used, for example.

For example, as in a substituent (R-52), diphenylamine is used for a substituent, whereby an inexpensive compound can be provided. In addition, an emission wavelength can be shortened. As in substituents (R-53) and (R-64), an amine where para-positioned hydrogen with respect to a nitrogen-atom bonding position is replaced by a biphenyl group is used as a substituent, whereby the alteration of the organic compound due to excitation can be inhibited. Alternatively, for example, an amine including a naphthyl group is used for a substituent, whereby the glass transition temperature can be increased. Furthermore, heat resistance can be improved. For example, as in substituents (R-58), (R-59), and (R-66), an amine including a 2-naphthyl group is used for a substituent, whereby an emission wavelength can be made longer. Furthermore, the alteration of the organic compound due to excitation can be inhibited. As in substituents (R-60), and (R-65), an amine including a 1-naphthyl group is used for a substituent, whereby an emission wavelength can be shortened. For example, as in substituents (R-61) to (R-64), an amine including a fluorenyl group is used for a substituent, whereby the glass transition temperature can be increased. Furthermore, heat resistance can be improved. For example, as in the substituents (R-62) to (R-64), an amine having a fluorine skeleton where two hydrogen atoms at the 9-position are replaced by an alkyl group or an aryl group is used for a substituent, whereby the alteration of the organic compound can be inhibited. In addition, a bulky molecular structure can be provided. Light emission whose emission spectrum has a narrow full width at half maximum can be obtained in a solid phase. For example, as in the substituents (R-55) and (R-56), an amine where meta- or ortho-positioned hydrogen with respect to a nitrogen-atom bonding position is replaced by a phenyl group is used for a substituent, whereby a bulky molecular structure can be provided. In addition, the sublimation temperature can be decreased. For example, as in substituents (R-67) to (R-69), an amine including an alkyl group or a cycloalkyl group is used for a substituent, whereby the red shift of an emission wavelength can be made small. In addition, a bulky molecular structure can be provided. Light emission whose emission spectrum has a narrow full width at half maximum can be obtained in a solid phase. In addition, the sublimation temperature can be decreased.

[Chemical Formula 18]
(R-52)
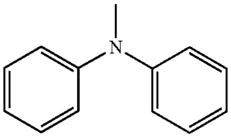
(R-53)
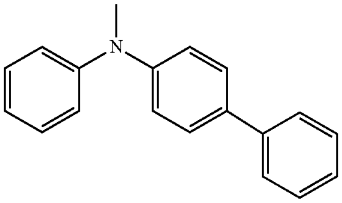
(R-54)
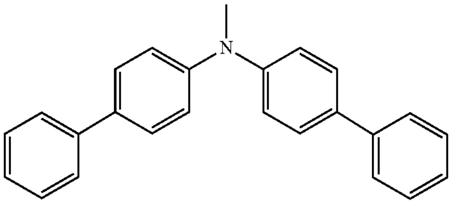
(R-55)
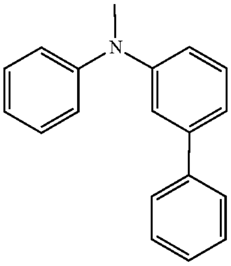
(R-56)
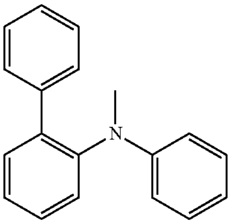
(R-58)
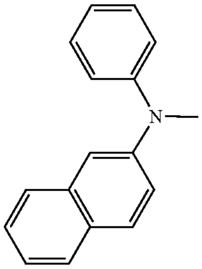
-continued
(R-59)
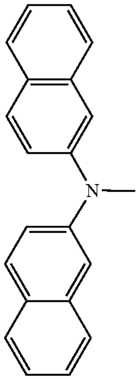
(R-60)
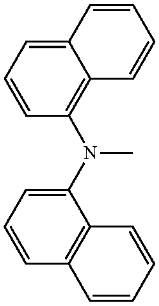
(R-61)
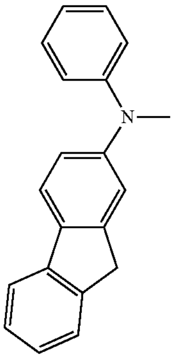
(R-62)
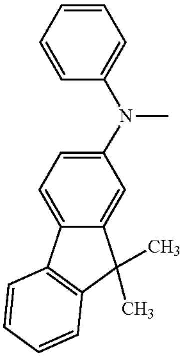

-continued (R-63)

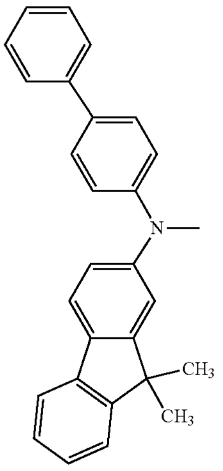

(R-64)

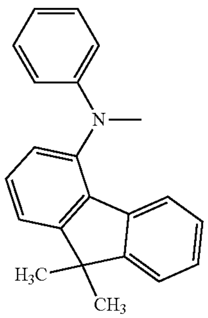

(R-65)

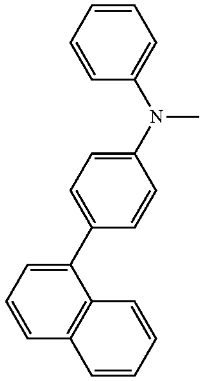

(R-66)

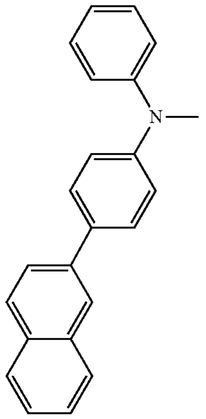

-continued

[Chemical Formula 19]

(R-67)

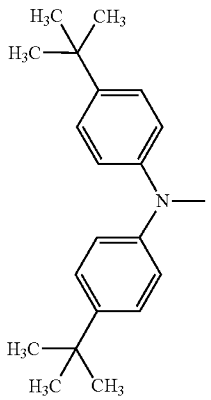

(R-68)

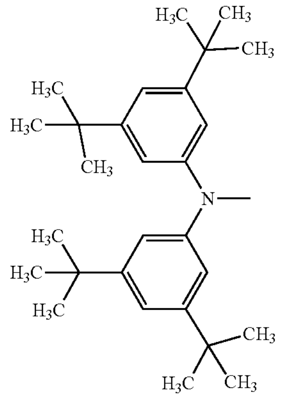

(R-69)

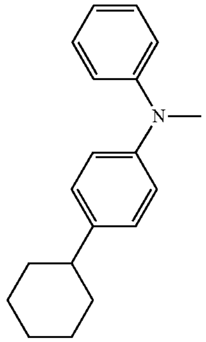

Alternatively, for example substituted or unsubstituted heteroarylamine having 3 to 18 carbon atoms shown below can be used for a substituent. For example, heteroarylamine in which a heteroarly group and an aryl group are bonded can be used. With use of heteroarylamine, hole transfer facilitated. In this case, the organic compound of one embodiment of the present invention can be used for a hole-transport material. As the heteroaryl group, a dibenzofuranyl group, a dibenzothiophenyl group, a carbazolyl group, a benzonaphthofuranyl group, a benzonaphthothiophenyl group, or a benzocarbazolyl group can be used, for example.

For example, as in substituents (R-71), (R-75), (R-79), (R-84) to (R-88), (R-90), and (R-91), an amine where para-positioned hydrogen with respect to a nitrogen-atom bonding position is replaced by a biphenyl group is used for a substituent, whereby the alteration of the organic compound due to excitation can be inhibited. Alternatively, an emission wavelength can be made longer when, for example, any of the following amine is used: an amine with a dibenzofuran skeleton formed by bonding an oxygen atom to a para-positioned carbon atom with respect to a nitrogen-atom bonding position, as in the substituent (R-72); an amine with a dibenzothiophene skeleton formed by bonding a sulfur atom to a para-positioned carbon atom with respect to a nitrogen-atom bonding position, as in the substituent (R-76); and an amine with a carbazole skeleton formed by bonding a nitrogen atom to a para-positioned carbon atom with respect to a nitrogen-atom bonding position, as in a substituent (R-80). In addition, the alteration of the organic compound due to excitation can be inhibited. Alternatively, an emission wavelength can be shortened when, for example, any of the following amine is used: an amine with a dibenzofuran skeleton formed by bonding an oxygen atom to an ortho-positioned carbon atom with respect to a nitrogen-atom bonding position, as in the substituent (R-70) or a substituent (R-82); and an amine with a dibenzothiophene skeleton formed by bonding a sulfur atom to an ortho-positioned carbon atom with respect to a nitrogen-atom bonding position, as in a substituent (R-74) or (R-83). In addition, the alteration of the organic compound due to excitation can be inhibited. For example, as in substituents (R-78) to (R-81) and (R-89) to (R-91), an amine including a carbazolyl group or a benzocarbazolyl group where hydrogen at the 9-position is replaced by an aryl group is used for a substituent, whereby the alteration of the organic compound can be inhibited. As in the substituent (R-90), an amine including an alkyl group or a cycloalkyl group is used for a substituent, whereby the red shift of an emission wavelength can be made small. In addition, a bulky molecular structure can be provided. Light emission whose emission spectrum has a narrow full width at half maximum can be obtained in a solid phase. In addition, the sublimation temperature can be decreased. As in substituents (R-85) to (R-88), an amine including two heteroaryl groups can be used for a substituent.

[Chemical Formula 20]

(R-70)

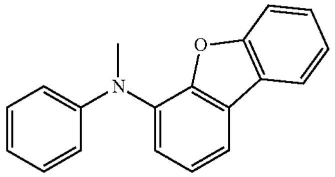

(R-71)

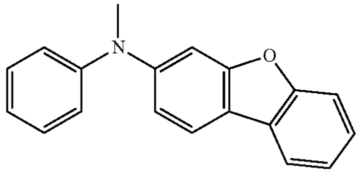

(R-72)

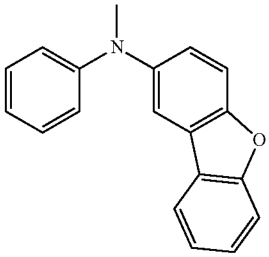

-continued (R-73)

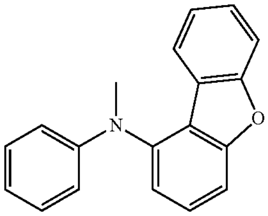

(R-74)

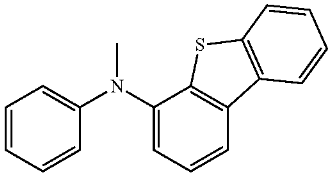

(R-75)

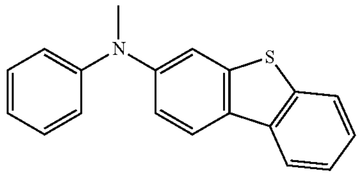

(R-76)

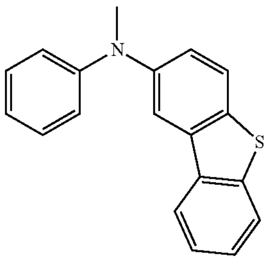

(R-77)

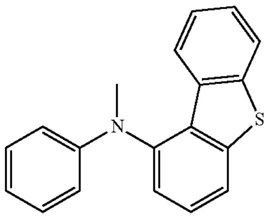

(R-78)

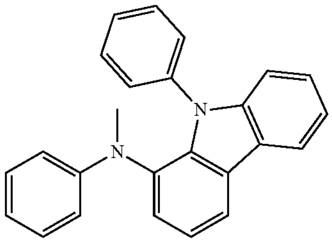

(R-79)

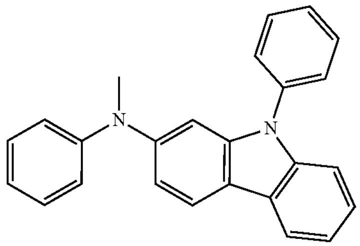

-continued
(R-80)
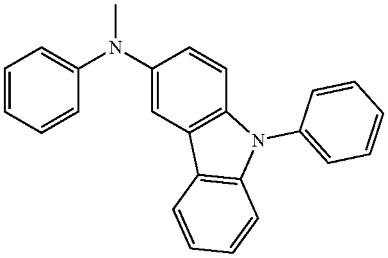
(R-81)
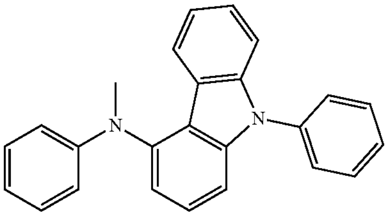
(R-82)
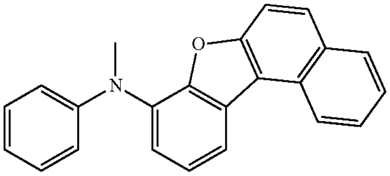
(R-83)
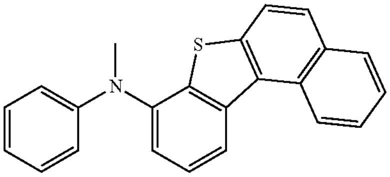
(R-84)
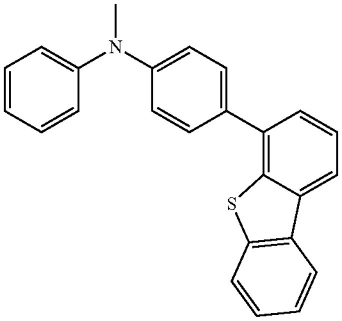
[Chemical Formula 21]
(R-85)
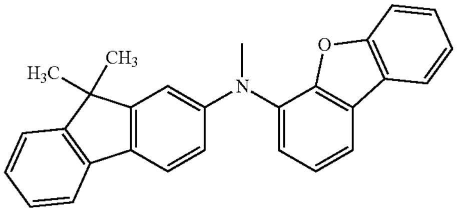
-continued
(R-86)
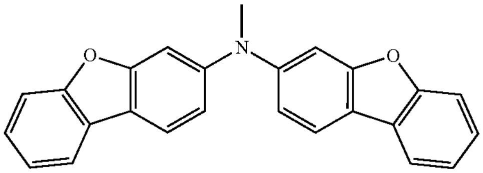
(R-87)
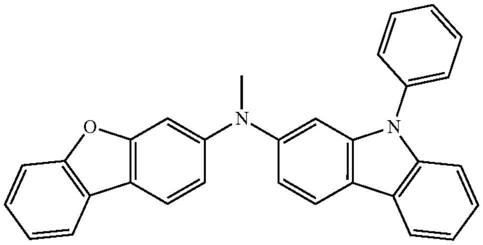
(R-88)
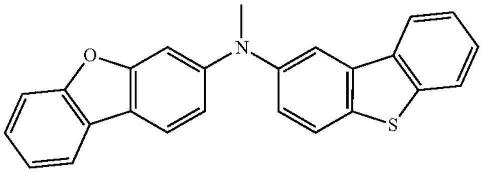
(R-89)
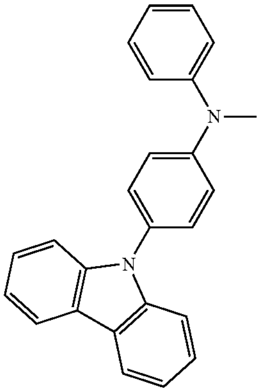
(R-90)
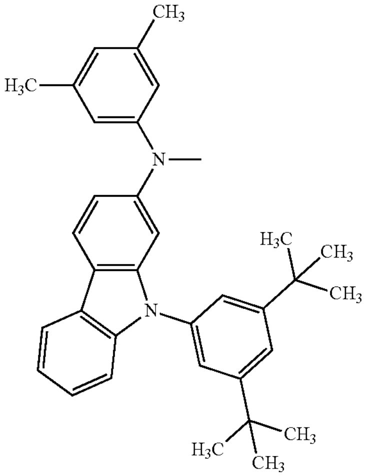

-continued (R-91)

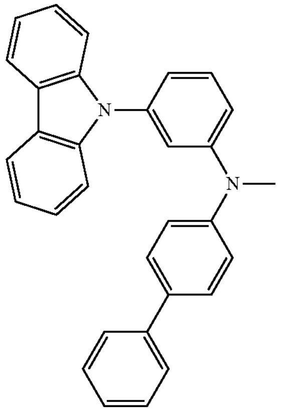

Examples of substituents described above can include an alkyl group, a substituted or unsubstituted cycloalkyl group, a substituted or unsubstituted aromatic hydrocarbon group, and a substituted or unsubstituted heteroaromatic hydrocarbon group. In this case, a bulky molecular structure can be provided. Furthermore, intermolecular interaction can be suppressed. Furthermore, light emission with high efficiency can be obtained in a solid phase. Light emission whose emission spectrum has a narrow full width at half maximum can be obtained in a solid phase. In addition, the sublimation temperature can be decreased.

Note that as the alkyl group, an alkyl group having 1 to 6 carbon atoms can be used. Examples of the alkyl group that can be used include a methyl group, an ethyl group, a propyl group, an isopropyl group, a butyl group, an isobutyl group, a tert-butyl group, and an n-hexyl group.

As the cycloalkyl group, a cycloalkyl group having 3 to 10 carbon atoms can be used. Examples of the cycloalkyl group that can be used include a cyclopropyl group, a cyclobutyl group, a cyclopentyl group, a cyclohexyl group, and an adamantyl group.

As the aromatic hydrocarbon group, an aromatic hydrocarbon group having 6 to 30 carbon atoms can be used. Examples of the aromatic hydrocarbon group that can be used include a phenyl group, a naphthyl group, a biphenyl group, a fluorenyl group, and a spirofluorenyl group.

As the heteroaromatic hydrocarbon group, a heteroaromatic hydrocarbon group having 2 to 30 carbon atoms can be used. Examples of the heteroaromatic hydrocarbon group that can be used include a pyridine ring, a pyrimidine ring, a pyrazine ring, a pyridazine ring, a triazine ring, a quinoline ring, a quinoxaline ring, a quinazoline ring, a benzoquinazoline ring, a phenanthroline ring, an azafluoranthene ring, an imidazole ring, an oxazole ring, an oxadiazole ring, and a triazole ring.

An example of the organic compound is shown below. For example, all of $Ar^1$ to $Ar^4$ have substituents as in an organic compound (113), whereby a bulky molecular structure can be obtained. In addition, in a solid phase, light emission whose emission spectrum has a narrow full width at half maximum can be obtained. In another example, $Ar^1$ and $Ar^3$ have arylamine or heteroarylamine, or $Ar^1$ and $Ar^4$ have arylamine or heteroarylamine as in the organic compound (113), an organic compound (120), and an organic compound (121), whereby high light emission efficiency can be achieved. In another example, deuterium is provided as in an organic compound (119), whereby high light emission efficiency can be achieved. Note that hydrogen positions including a substituent may be replaced by deuterium. Furthermore, a substituent is meta-positioned with respect to a bonding position of an oxygen atom or a sulfur atom as in the organic compound (113), the organic compound (120), and organic compounds (122) to (125), whereby an emission wavelength can be made shorter than that in the case where a substituent is positioned at another portion. This is preferable because steric hindrance is less likely to occur in a molecule. Furthermore, as in the organic compounds (113) and (120) and the organic compounds (122) to (125), two of arylamine groups or heteroarylamine groups are meta-positioned with respect to a bonding portion of an oxygen atom or a sulfur atom, whereby the full width at half maximum of an emission spectrum can be narrowed. In addition, the light emission efficiency can be increased. The peak wavelength of the emission spectrum can be controlled in a range from 450 nm to 480 nm, preferably in a range from 450 nm to 470 nm. Thus, the organic compound can be suitably used for a light-emitting material for a display.

[Chemical Formula 22]

(101)

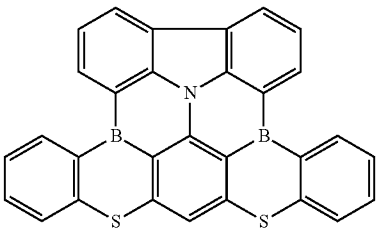

(102)

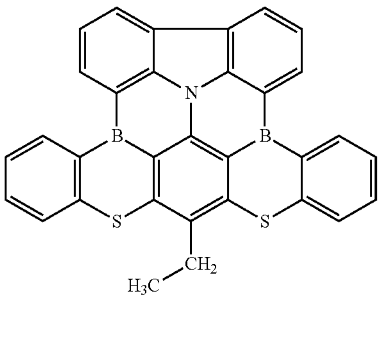

-continued
(103)
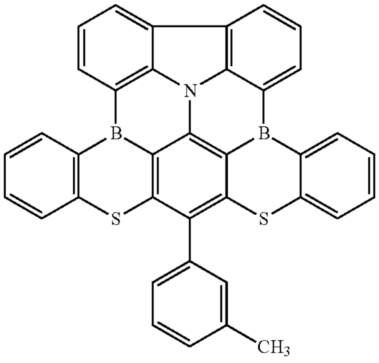
(104)
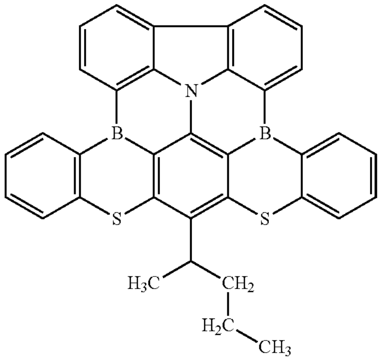
(105)
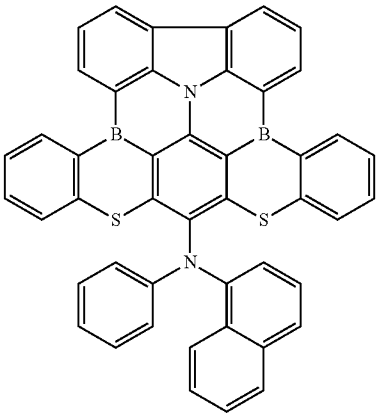
(106)
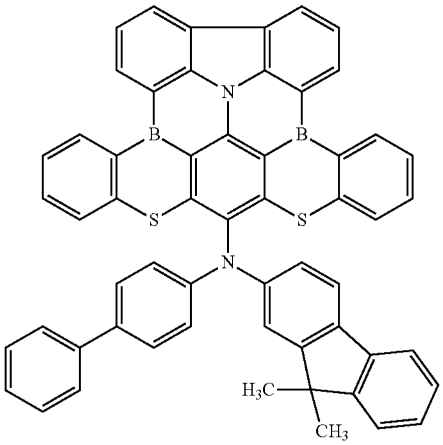
(107)
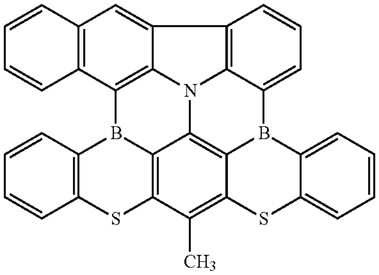
(108)
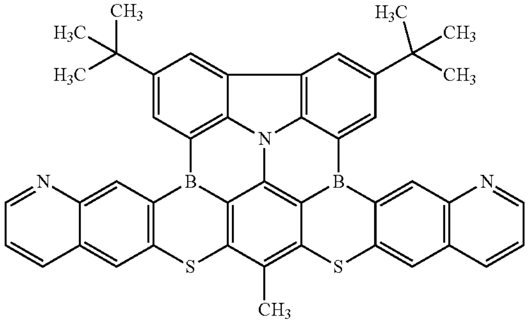
(109)
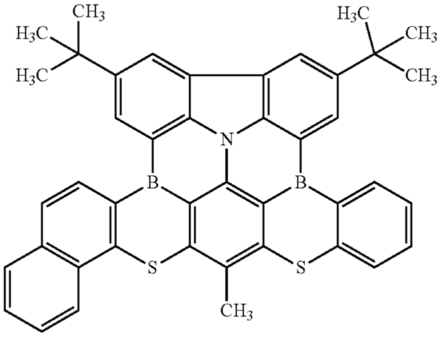
(110)
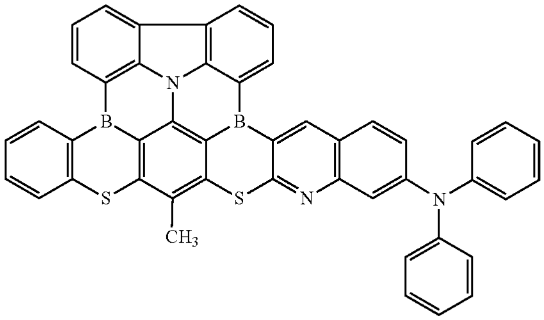

-continued
(111)
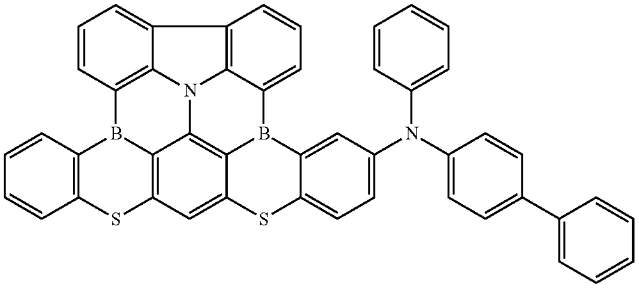
[Chemical Formula 23]
(112)
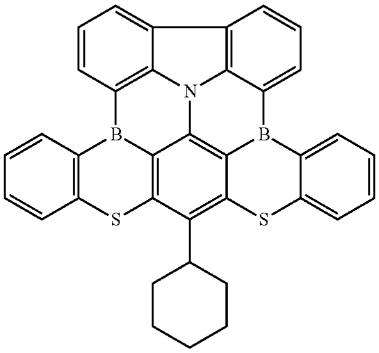
(113)
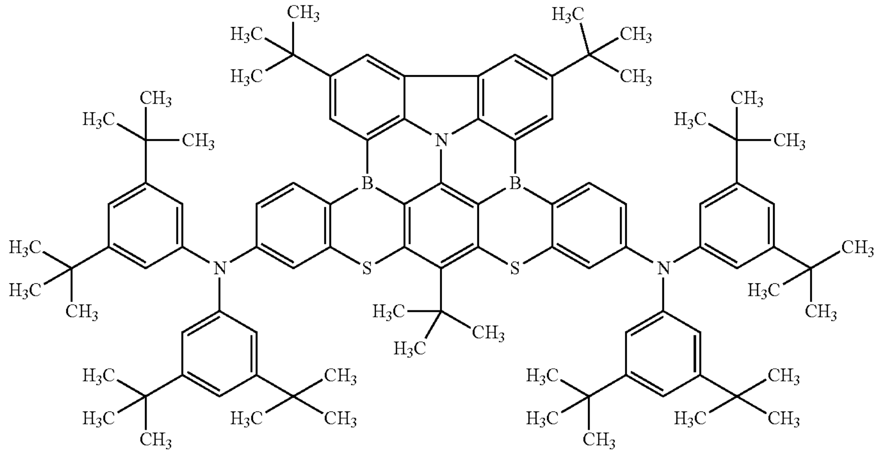
(114)
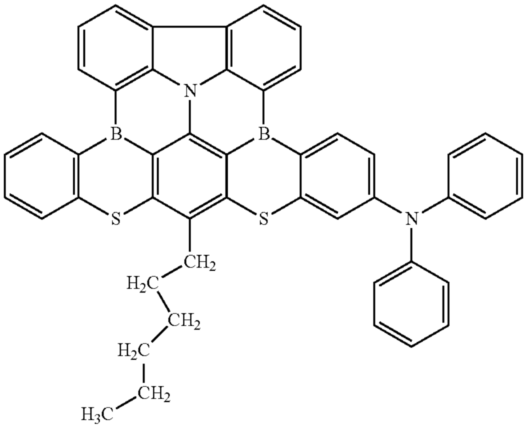
(115)
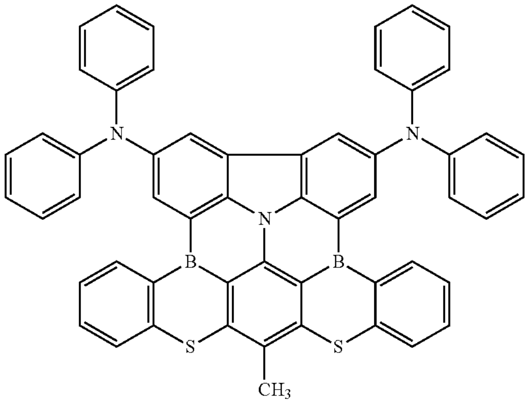

-continued
(116)
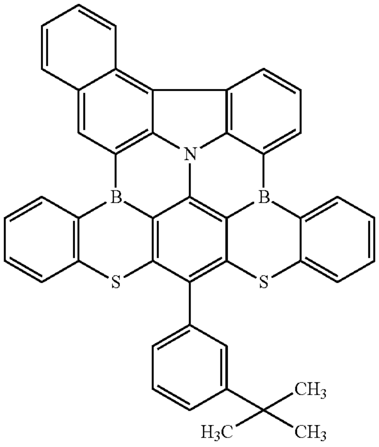
(117)
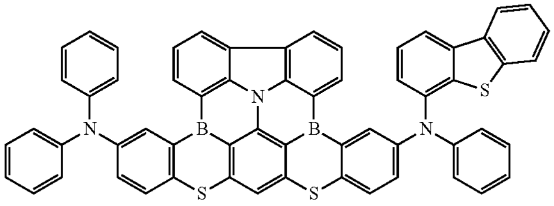
(118)
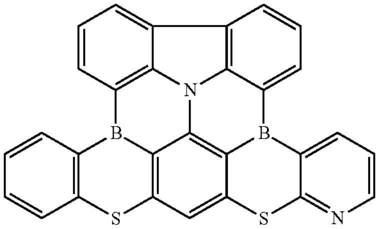
(119)
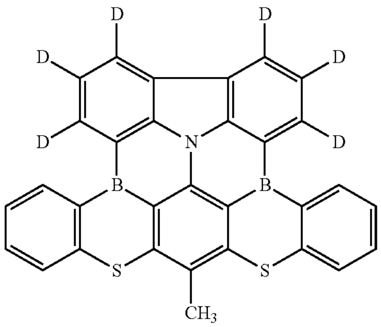
(120)
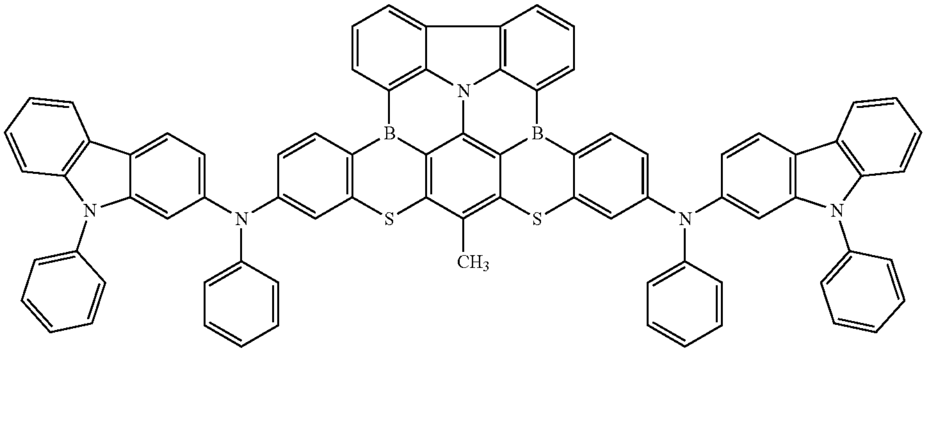
(121)
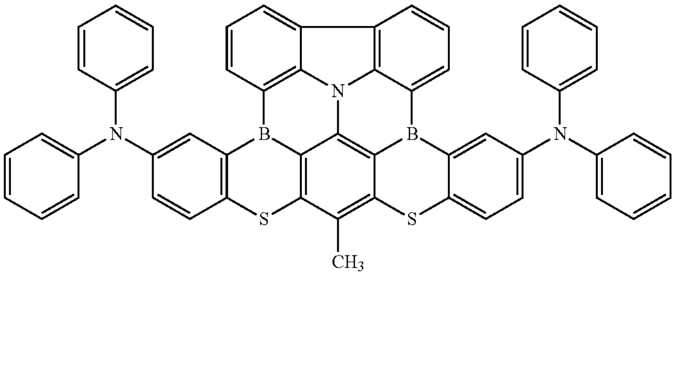

-continued
[Chemical Formula 24]
(122)
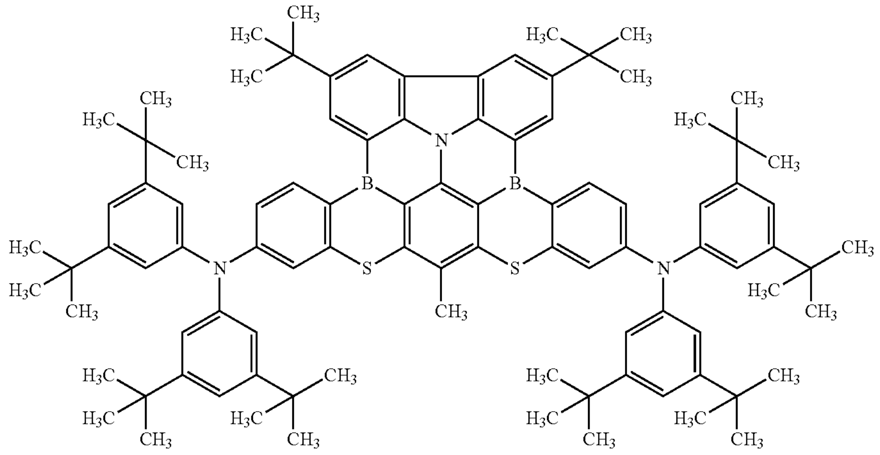
(123)
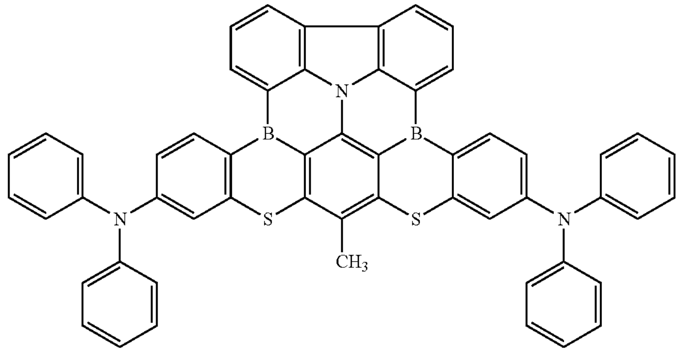
(124)
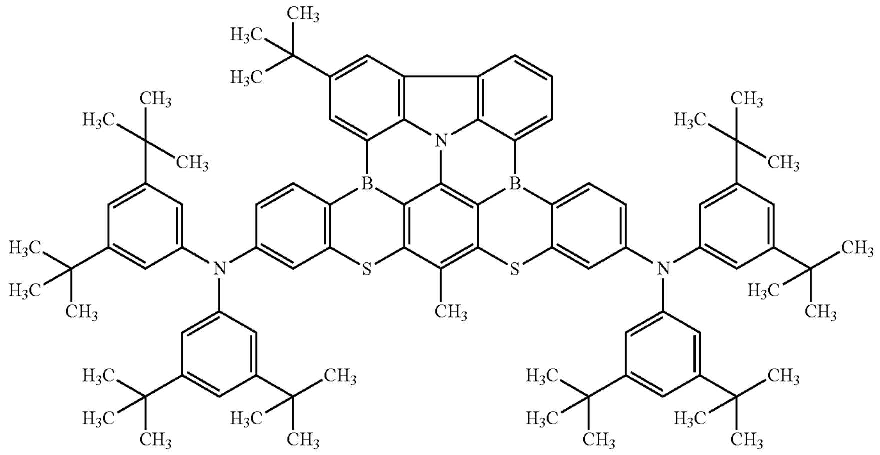

-continued (125)

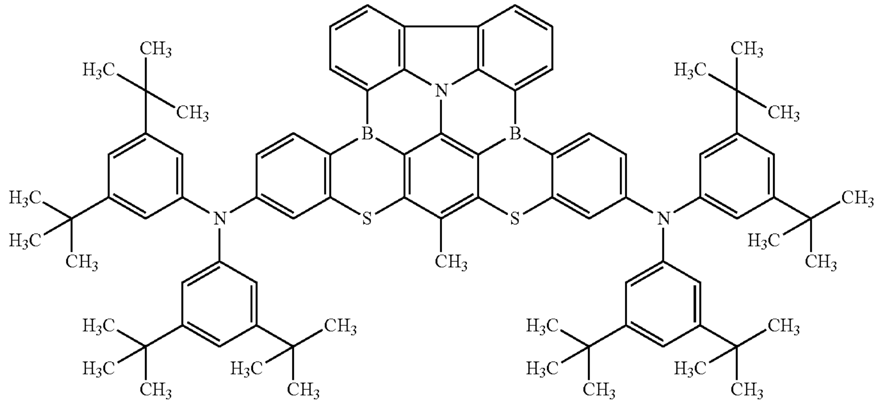

Example 2 of Organic Compound

The organic compound described in this embodiment is an organic compound represented by General Formula (G1) below. Note that General Formula (G1) is different from General Formula (G0) in that one of X and Y in General Formula (G0) is an oxygen atom and the other is a sulfur atom.

[Chemical Formula 25]

(G1)

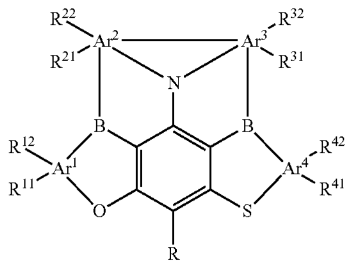

In General Formula (G1), $Ar^1$ to $Ar^4$ each independently represent an aromatic ring or a nitrogen-containing heteroaromatic ring. The aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In General Formula (G1), hydrogen includes deuterium.

In this structure, $Ar^1$ can be bonded to a benzene ring through a B atom and an O atom, and $Ar^4$ can be bonded to the benzene ring through a B atom and an S atom. Furthermore, with the O atom and the S atom, the molecular structure can be made asymmetric, which can inhibit crystallization from occurring. With use of the S atom for one of the bonding of $Ar^1$ and the bonding of $Ar^4$, the emission wavelength can be made longer than that with use of the O atom for the both. Furthermore, the emission color can be adjusted. As a result, a novel organic compound that is highly convenient, useful, or reliable can be provided.

An example of the organic compound is shown below. For example, a substituent is meta-positioned with respect to a bonding position of an oxygen atom or a sulfur atom as in organic compounds (143), (144), and (147) to (149), whereby an emission wavelength can be shortened. This is preferable because steric hindrance is less likely to occur. In another example, $Ar^1$ and $Ar^3$ have arylamine or heteroarylamine, or $Ar^2$ and $Ar^4$ have arylamine or heteroarylamine as in an organic compounds (142) and the organic compounds (143), (144), and (147) to (149), whereby high light emission efficiency can be achieved.

[Chemical Formula 26]

(131)

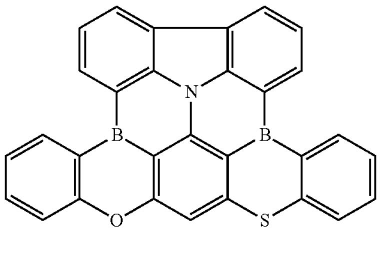

(132)

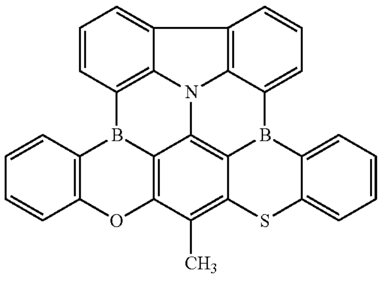

-continued
(133)
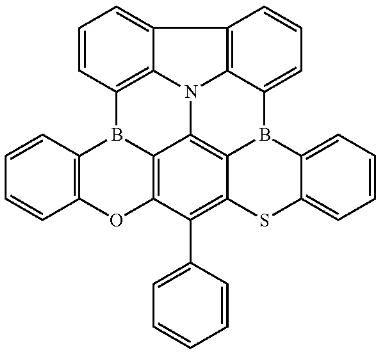
(134)
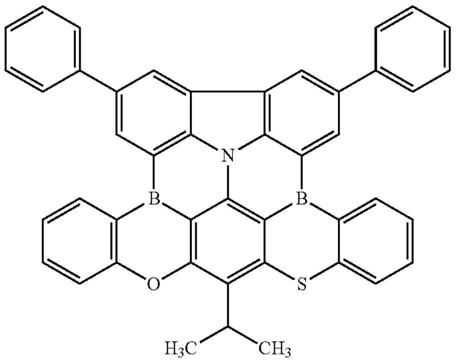
(135)
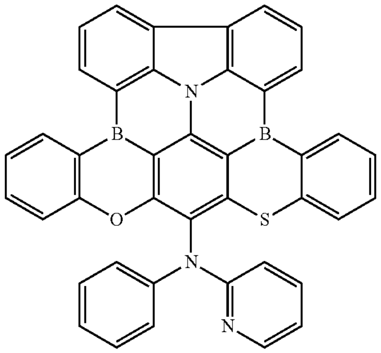
(136)
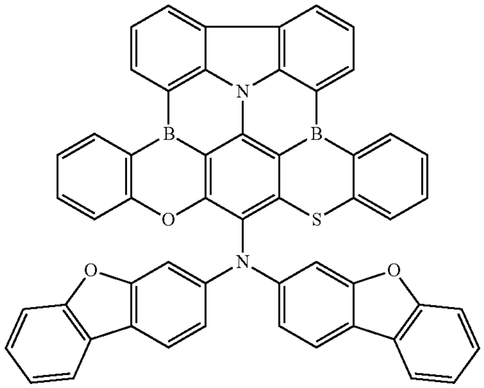
(137)
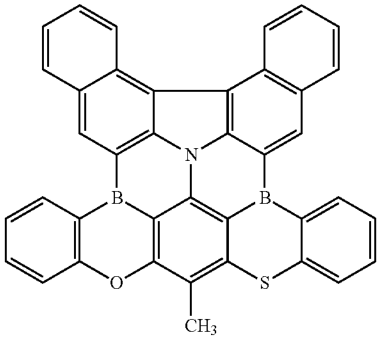
(138)
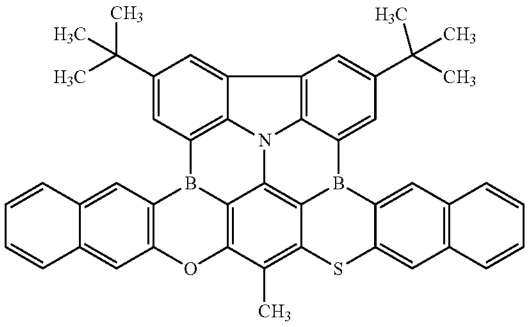
(139)
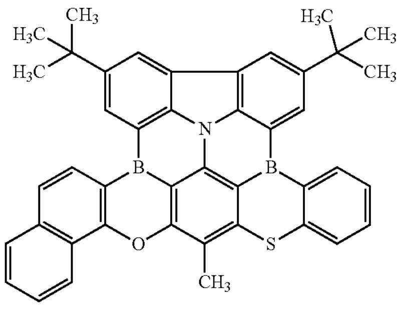
(140)
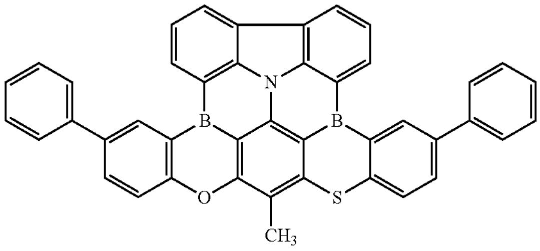

-continued
[Chemical Formula 27]
(141)
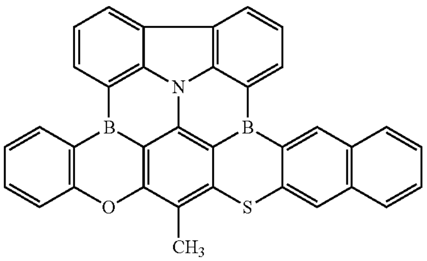
(142)
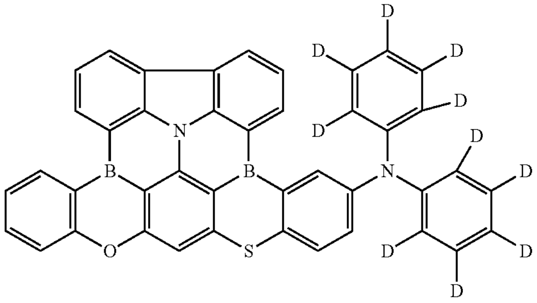
(143)
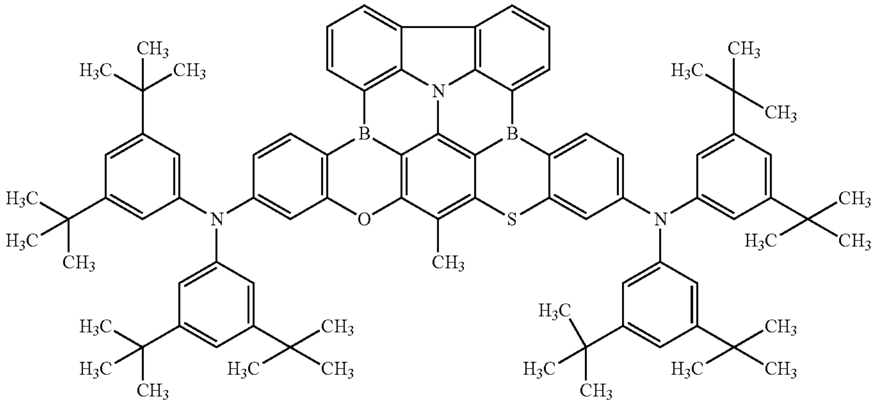
(144)
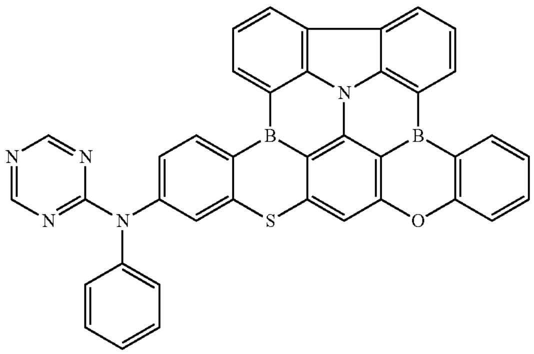
(145)
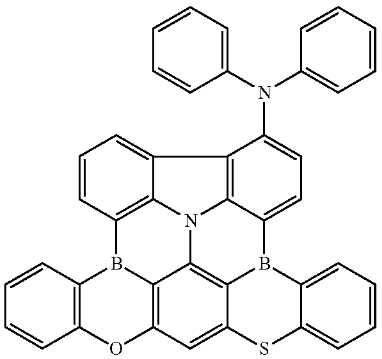
(146)
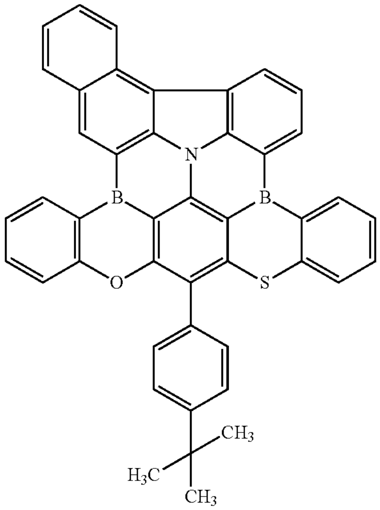

-continued

[Chemical Formula 28]

(147)

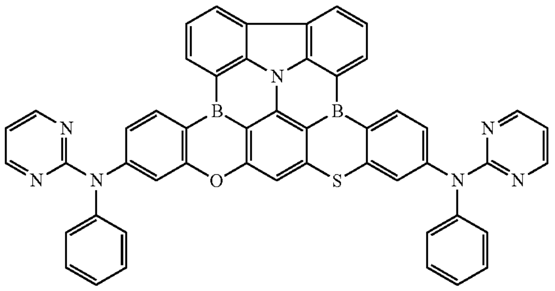

(148)

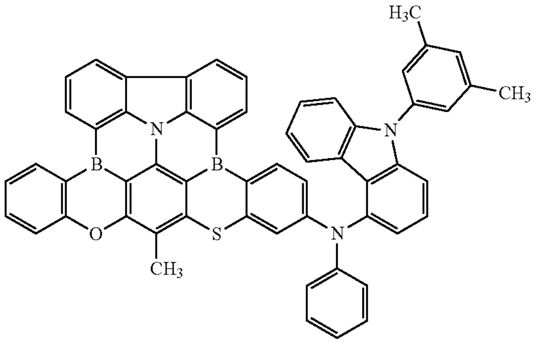

(149)

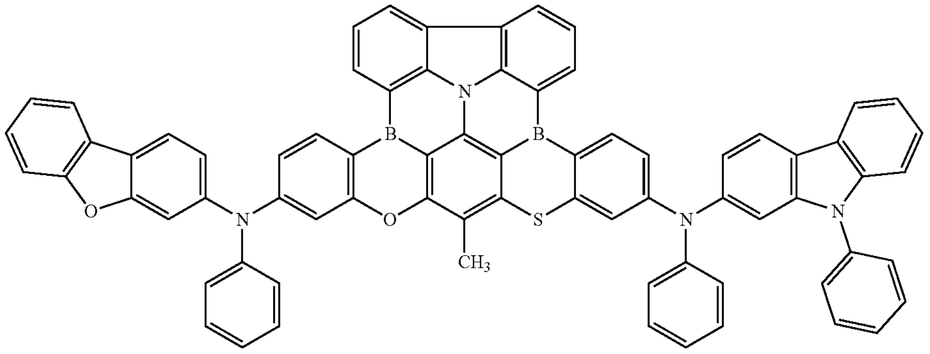

Example 3 of Organic Compound

The organic compound described in this embodiment is an organic compound represented by General Formula (G2). Note that General Formula (G2) is different from General Formula (G0) in that both of X and Y in General Formula (G0) are an oxygen atom.

[Chemical Formula 29]

(G2)

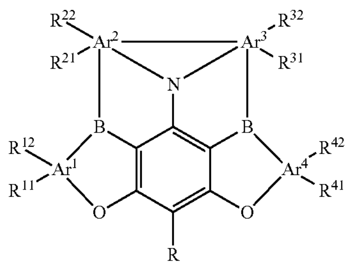

In General Formula (G2), $Ar^1$ to $Ar^4$ each independently represent an aromatic ring or a nitrogen-containing heteroaromatic ring. The aromatic ring contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In General Formula (G2), hydrogen includes deuterium.

In this structure, $Ar^1$ can be bonded to a benzene ring through a B atom and an O atom, and $Ar^4$ can be bonded to the benzene ring through a B atom and an O atom. With use of the O atom for both the bonding of $Ar^1$ and the bonding of $Ar^4$, the emission wavelength can be made shorter than that with use of an S atom for one or both of them. Furthermore, the level of difficulty of synthesis can be lowered. Furthermore, the cost of synthesis can below. As a result, a novel organic compound that is highly convenient, useful, or reliable can be provided.

An example of the above organic compound is shown below.

[Chemical Formula 30]

(161)

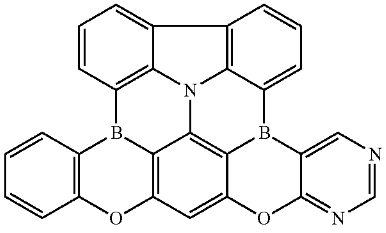

-continued (162)

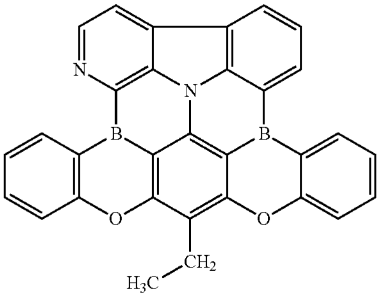

(163)

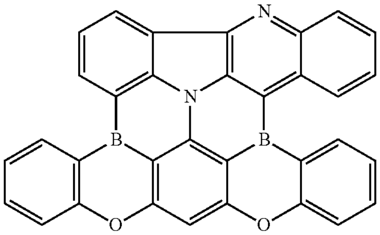

(164)

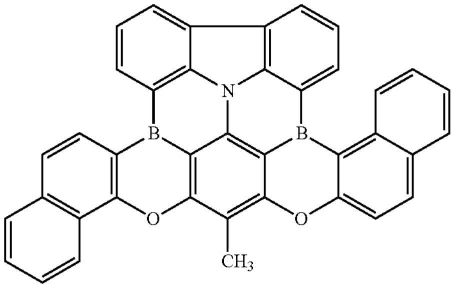

(165)

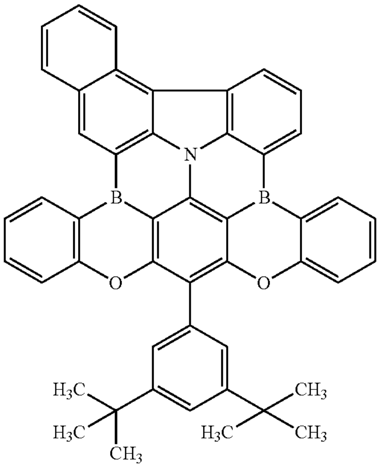

Example 4 of Organic Compound

The organic compound described in this embodiment is an organic compound represented by General Formula (G3). Note that General Formula (G3) is different from General Formula (G2) in that $Ar^4$ and $Ar^3$ in General Formula (G2) have the same skeleton as $Ar^1$ and $Ar^2$, respectively.

[Chemical Formula 31]

(G3)

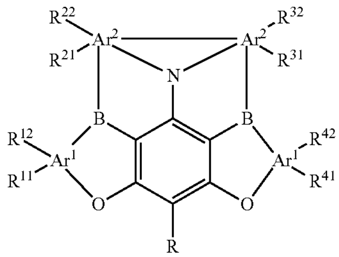

In General Formula (G3), $Ar^1$ and $Ar^2$ each independently represent an aromatic ring or a nitrogen-containing heteroaromatic ring. The aromatic ring is composed only of one or more six-membered rings and contains 6 to 10 carbon atoms, and the nitrogen-containing heteroaromatic ring is composed only of one or more six-membered rings and contains 4 to 9 carbon atoms. R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In General Formula (G3), hydrogen includes deuterium.

In this structure, the molecular structure can have high symmetry and the synthesis can be facilitated. Furthermore, the yield of synthesis can be increased. Furthermore, the six-membered ring forms the organic compound, and the bonding of the organic compound can be stabilized. Furthermore, the degradation due to excitation is less likely to occur. Furthermore, the degradation due to a redox reaction is less likely to occur. As a result, a novel organic compound that is highly convenient, useful, or reliable can be provided.

An example of the above organic compound is shown below.

[Chemical Formula 32]

(166)

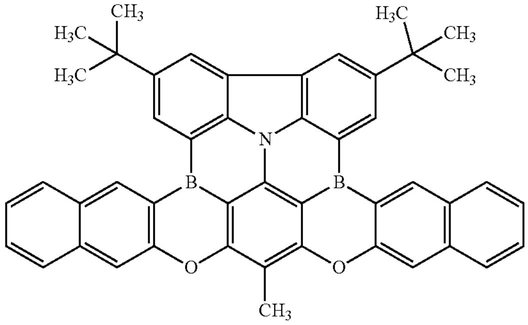

-continued (167)

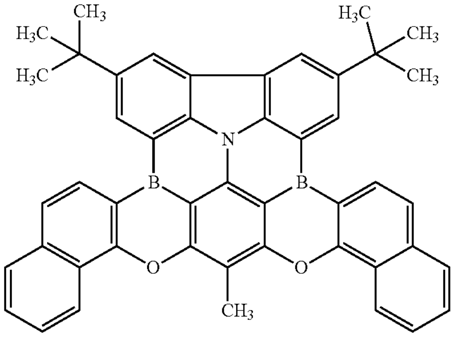

(168)

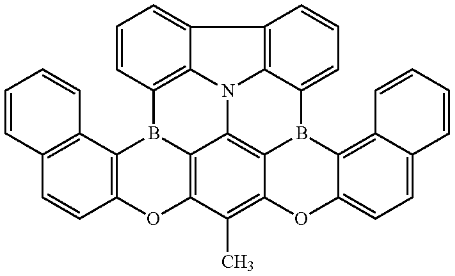

(169)

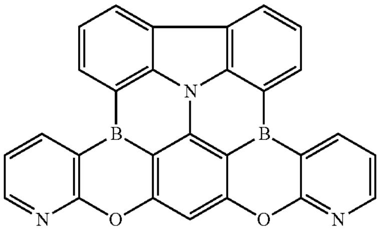

Example 5 of Organic Compound

In the organic compound described in this embodiment and shown in General Formula (G3), at least one of R, $R^{11}$, $R^{12}$, $R^{21}$, $R^{22}$, $R^{31}$, $R^{32}$, $R^{41}$, and $R^{42}$ represents a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms.

In this structure, at least one of, preferably three or more of, R, $R^{11}$, $R^{12}$, $R^{21}$, $R^{22}$, $R^{31}$, $R^{32}$, $R^{41}$, and $R^{42}$ can be a substituent. Furthermore, a bulky molecular structure can be provided. Furthermore, intermolecular interaction can be suppressed. Furthermore, light emission with high efficiency can be obtained in a solid phase. Furthermore, light emission whose emission spectrum has a narrow full width at half maximum can be obtained in a solid phase. Furthermore, at least one of R, $R^{11}$, $R^{12}$, $R^{21}$, $R^{22}$, $R^{31}$, $R^{32}$, $R^{41}$, and $R^{42}$ can be diarylamine or heteroarylamine. Furthermore, hole transfer can be facilitated. Furthermore, the emission efficiency of a light-emitting device can be increased. Furthermore, four or less, preferably two or less, of R, $R^{11}$, $R^{12}$, $R^{21}$, $R^{22}$, $R^{31}$, $R^{32}$, $R^{41}$, and $R^{42}$ can be a substituent. Furthermore, the evaporation temperature can be lowered. As a result, a novel organic compound that is highly convenient, useful, or reliable can be provided.

An example of the above organic compound is shown below. For example, $Ar^1$ to $Ar^4$ have substituents as in an organic compound (171), whereby a bulky molecular structure can be obtained. In addition, a light emission whose emission spectrum has a narrow full width at half maximum can be obtained in a solid phase.

[Chemical Formula 33]

(170)

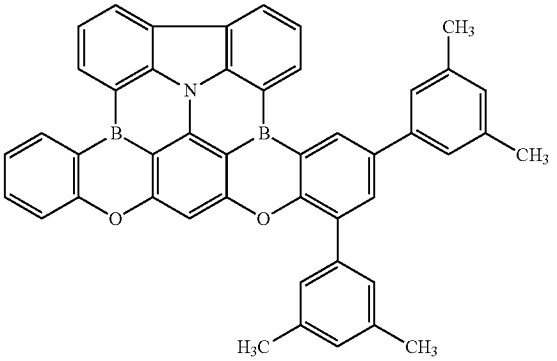

-continued
(171)
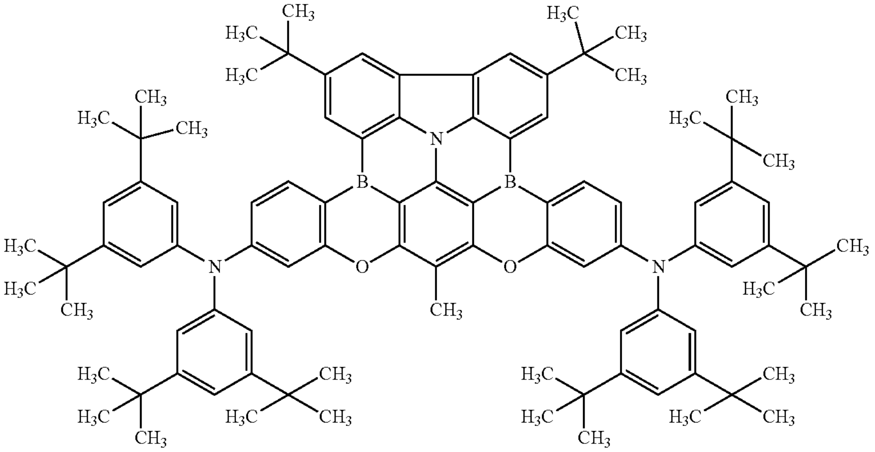
(172)
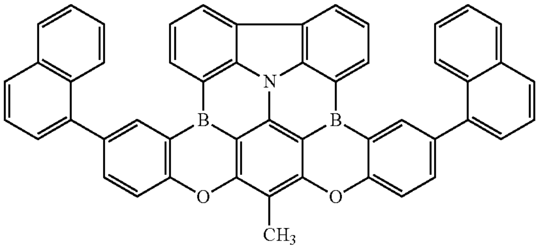
(173)
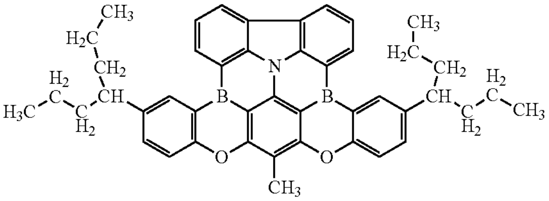
(174)
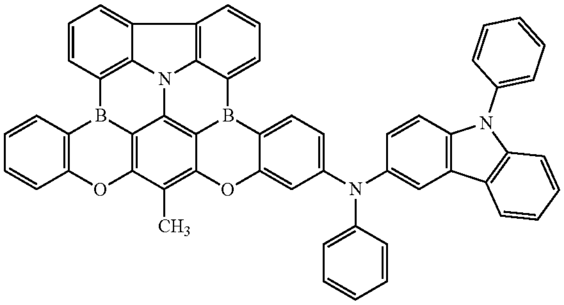
(175)
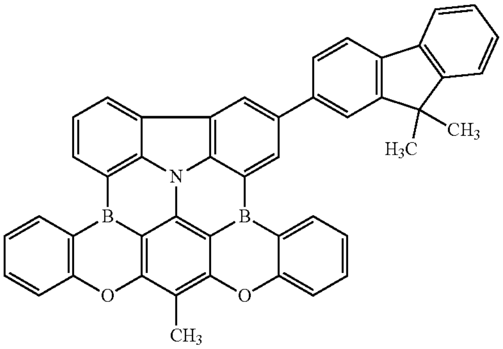
[Chemical Formula 34]
(176)
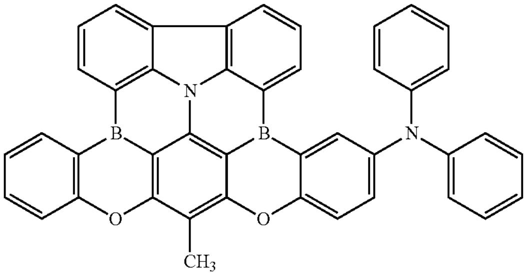
(177)
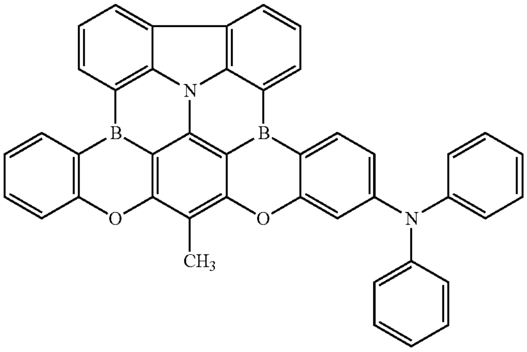

-continued (178)

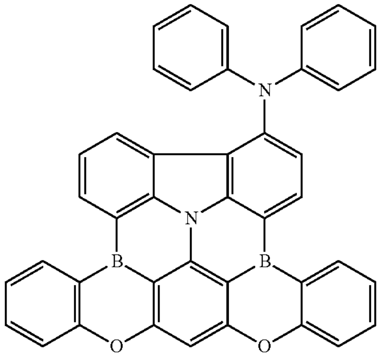

Example 6 of Organic Compound

In the organic compound described in this embodiment and shown in General Formula (G3), $Ar^1$ is a benzene ring, and $Ar^2$ is a benzene ring or a naphthalene ring. In General Formula (G3), hydrogen includes deuterium.

In this structure, the level of difficulty of synthesis can be lowered. Furthermore, the yield of synthesis can be increased. Furthermore, the evaporation temperature can be lowered. Furthermore, the alternation or degradation caused by the evaporation can be suppressed. Furthermore, the emission efficiency can be increased. Furthermore, the full width at half maximum of an emission spectrum can be narrowed. Furthermore, the color purity of an emission color can be increased. Furthermore, with use of a naphthalene ring for $Ar^2$, an emission wavelength can be made longer. Furthermore, blue emission suitable for display usage can be exhibited. As a result, a novel organic compound that is highly convenient, useful, or reliable can be provided.

An example of the above organic compound is shown below.

[Chemical Formula 35]

(179)

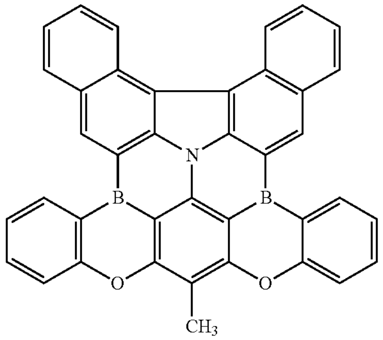

(180)

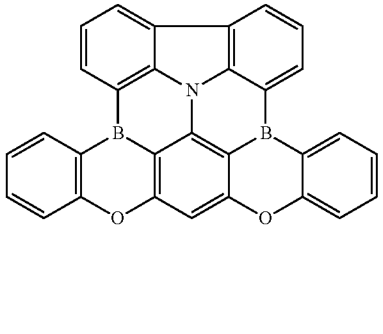

-continued (181)

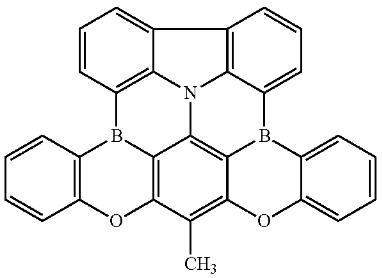

Example 7 of Organic Compound

In the organic compound described in this embodiment and shown in General Formula (G3), $Ar^1$ is a benzene ring and $Ar^2$ is a benzene ring or a naphthalene ring. R represents hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine having 6 to 13 carbon atoms, or substituted or unsubstituted heteroarylamine having 3 to 18 carbon atoms. In General Formula (G3), hydrogen includes deuterium.

Note that, when hydrogen is used for R, $R^{11}$, $R^{12}$, $R^{21}$, $R^{22}$, $R^{31}$, $R^{32}$, $R^{41}$, and $R^{42}$, synthesis can be performed at low cost. Furthermore, the emission wavelength can be shortened. Furthermore, the full width at half maximum of an emission spectrum can be narrowed. As a result, a novel organic compound that is highly convenient, useful, or reliable can be provided.

An example of the above organic compound is shown below.
[Chemical Formula 36]
(182)
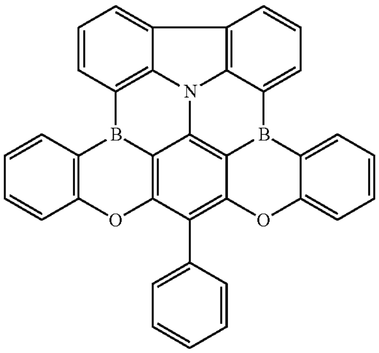
(183)
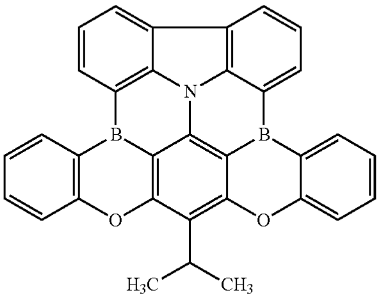
(184)
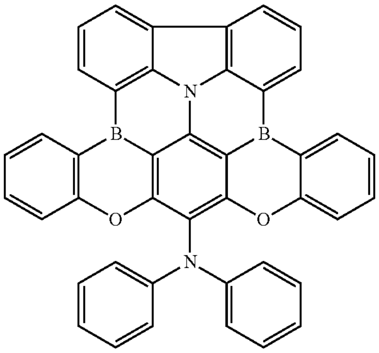
(185)
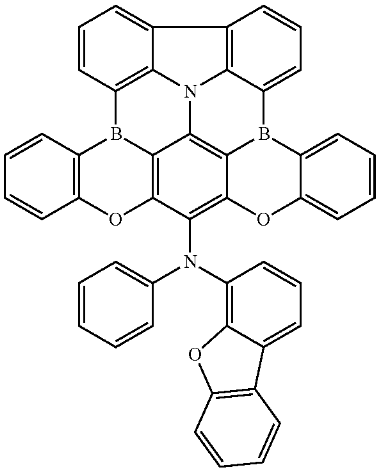
(186)
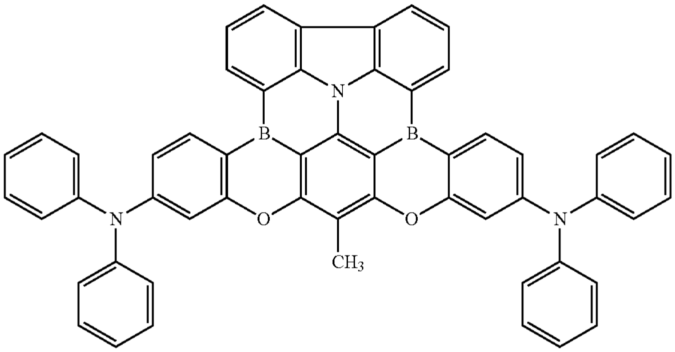

-continued (187)

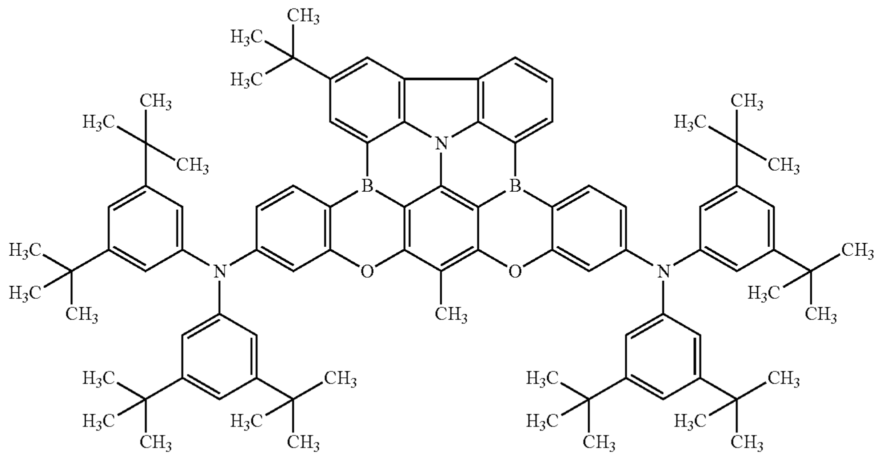

(188)

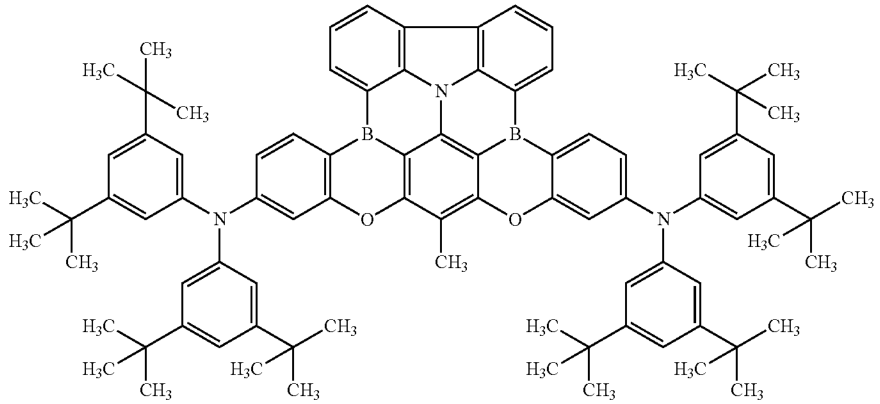

Synthesis Method of Organic Compound

A method for synthesizing the organic compound of one embodiment of the present invention is described. Specifically, a method for synthesizing the organic compound represented by General Formula (G0) is described.

Example 1 of Synthesis Method

The synthesis method described in this embodiment includes first to third steps.

[First Step]

As shown in a synthesis scheme below, a compound (a4) containing ether or sulfide can be obtained with use of a compound (a1), a compound (a2), and a compound (a3). Examples of $A_1$ include a halogen group such as chlorine, bromine, or iodine. Examples of $A_2$ and $A_3$ include a halogen group such as fluorine, chlorine, or bromine.

[Chemical Formula 37]

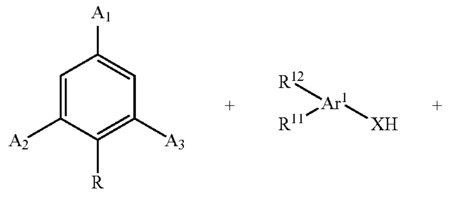

(a1) (a2)

-continued

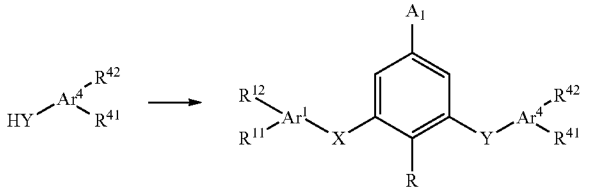

(a3) (a4)

This reaction can proceed under various conditions. Examples of applicable synthesis methods include $S_N2$ reaction using a base and coupling reaction using a metal catalyst under the presence of a base.

Furthermore, the compound (a4) can be obtained with use of a compound (a1-2), a compound (a2-2), and a compound (a3-2) as shown in a synthesis scheme below. Examples of $A_1$ include a halogen group such as chlorine, bromine, or iodine. Examples of $A_2$ and $A_3$ include a halogen group such as fluorine, chlorine, or bromine.

[Chemical Formula 38]

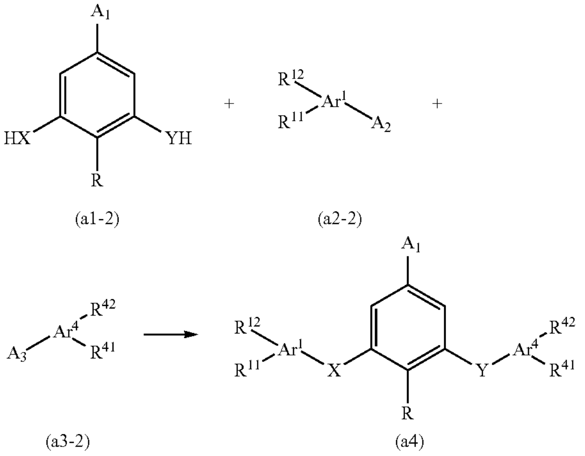

(a1-2) (a2-2) (a3-2) (a4)

[Second Step]

Next, as shown in a synthesis scheme below, the compound (a4) and a carbazole derivative or a condensed polycyclic carbazole derivative (a5) are subjected to cross coupling reaction, so that a compound (a6) can be obtained. Examples of $A_1$ include a halogen group such as chlorine, bromine, or iodine.

[Chemical Formula 39]

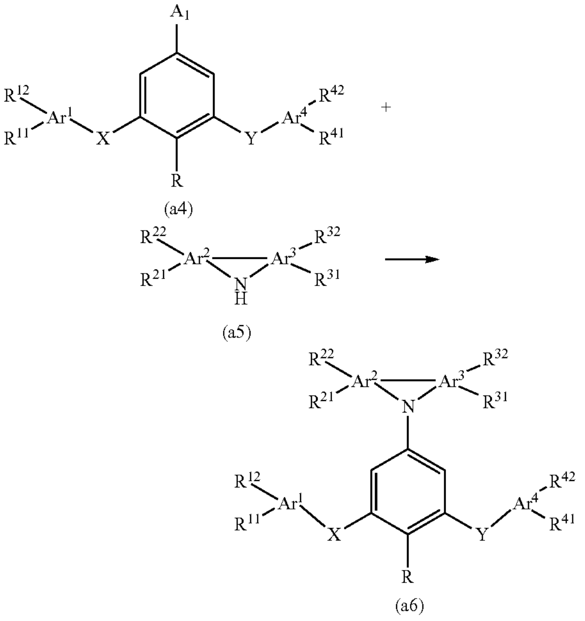

(a4) (a5) (a6)

This reaction can proceed under various conditions. For example, a synthesis method in which a metal catalyst is used under the presence of a base can be employed. Specifically, the Ullmann coupling or the Buchwald-Hartwig reaction can be used.

[Third Step]

Next, as shown in a synthesis scheme below, the compound (a6) is reacted with boron triiodide, boron tribromide, boron trichloride, or the like, so that the organic compound represented by General Formula (G0) can be obtained.

[Chemical Formula 40]

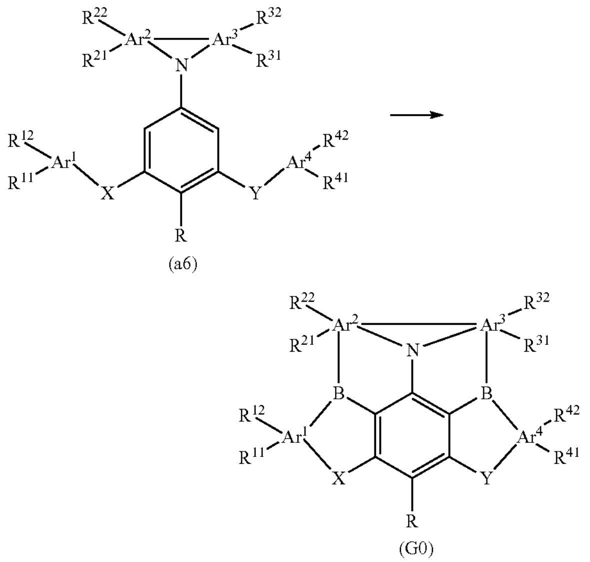

(a6) (G0)

This reaction can proceed under various conditions. For example, a synthesis method using aluminum chloride or the like can be used.

Note that an organolithium reagent in which lithium is bonded to $Ar^1$ and $Ar^4$ can be used for the compound (a6). Alternatively, an organolithium in which two hydrogen atoms in the benzene ring are replaced by lithium can be used for the compound (a6).

Example 2 of Synthesis Method

To synthesis the organic compound represented by General Formula (G0), a boron atom is introduced to a condensed polycyclic skeleton, and then substituents $R^{11}$ to $R^{42}$ can be introduced. An example of the synthesis method is described.

[First Step]

As shown in a synthesis scheme below, a compound (b4) containing ether or sulfide can be obtained with use of a compound (b1), a compound (b2), and a compound (b3). Examples of $A_1$ include a halogen group such as chlorine, bromine, or iodine. Examples of $A_2$ and $A_3$ include a halogen group such as fluorine, chlorine, or bromine. Examples of $B_1$ and $B_2$ include a halogen group such as chlorine or bromine.

[Chemical Formula 41]

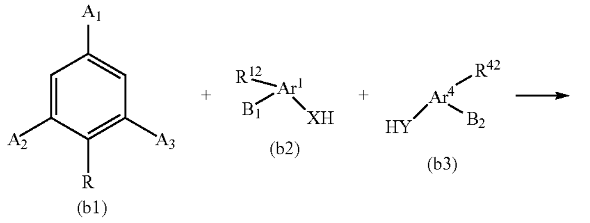

(b1) (b2) (b3)

-continued

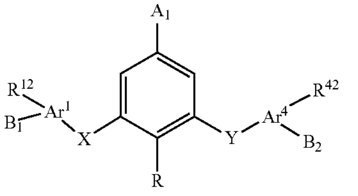

(b4)

This reaction can proceed under various conditions. Examples of applicable synthesis methods include $S_N2$ reaction using a base and coupling reaction using a metal catalyst under the presence of a base.

[Second Step]

Next, as shown in a synthesis scheme below, the compound (b4) and a carbazole derivative or condensed polycyclic carbazole derivative (b5) are subjected to cross coupling reaction, so that a compound (b6) can be obtained. Examples of $A_1$ include a halogen group such as chlorine, bromine, or iodine. Examples of $B_1$ and $B_2$ include a halogen group such as chlorine or bromine.

[Chemical Formula 42]

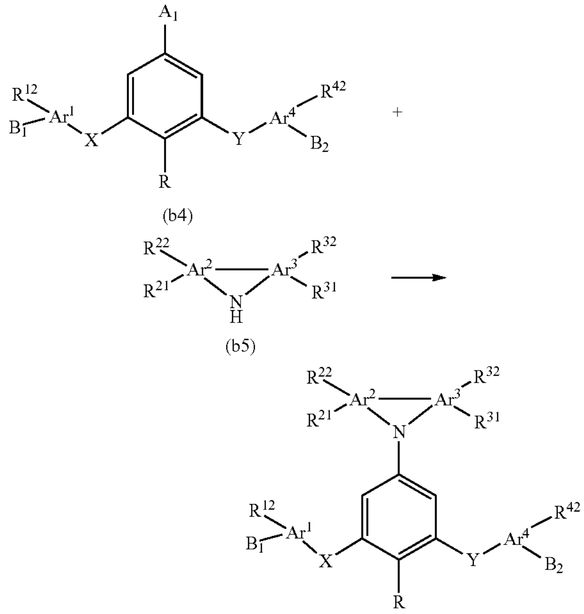

(b4)

(b5)

(b6)

This reaction can proceed under various conditions. For example, a synthesis method in which a metal catalyst is used under the presence of a base can be employed. For example, the Ullmann coupling or the Buchwald-Hartwig reaction can be used.

[Third Step]

Next, as shown in a synthesis scheme below, the compound (b6) is reacted with boron triiodide, boron tribromide, boron trichloride, or the like, so that a compound (b7) can be obtained. Examples of $B_1$ and $B_2$ include a halogen group such as chlorine or bromine.

[Chemical Formula 43]

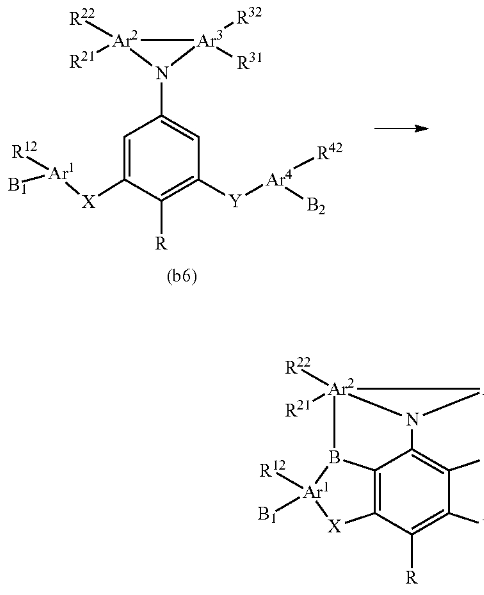

(b6)

(b7)

This reaction can proceed under various conditions. For example, a synthesis method using aluminum chloride or the like can be used.

Note that an organolithium reagent in which lithium is bonded to $Ar^1$ and $Ar^4$ can be used for the compound (b6). Alternatively, a reagent in which two hydrogen atoms in the benzene ring are replaced by lithium can be used for the compound (b6).

[Fourth Step]

As shown in a synthesis scheme below, the compound (b7), a compound (b8), and a compound (b9) are subjected to cross coupling reaction, so that the organic compound represented by General Formula (G0) can be obtained.

Examples of $B_1$ and $B_2$ include a halogen group such as chlorine or bromine. When $R^{11}$ or $R^{41}$ is diarylamine or heteroarylamine (that is, the compound (b8) or (b9) is a secondary amine), $B_3$ and $B_4$ each represent hydrogen. When $R^{11}$ and $R^{41}$ are each a straight-chain alkyl group, a branched alkyl group, or an aryl group, $B_3$ and $B_4$ each represent a boron compound such as boronic acid or dialkoxyboronic acid or a metal compound of aluminum, zirconium, zinc, or aryl tin.

[Chemical Formula 44]

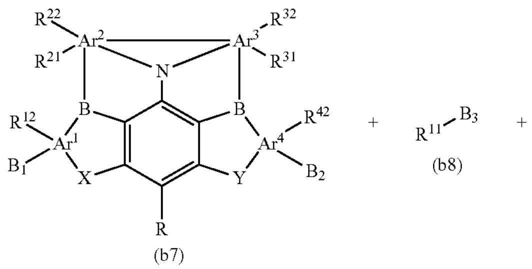

(b7)

(b8)

-continued

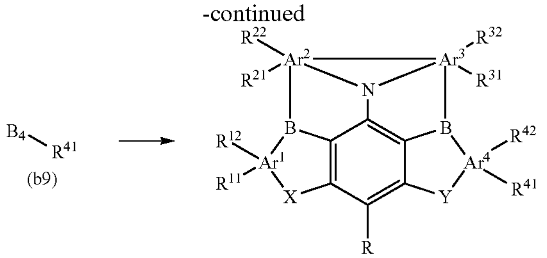

(b9)

(G0)

This reaction can proceed under various conditions. For example, a synthesis method in which a metal catalyst is used under the presence of a base can be employed. Specifically, when $R^{11}$ and $R^{41}$ are diarylamine or heteroarylamine, the Ullmann coupling or the Buchwald-Hartwig reaction can be used, for example. When $R^{11}$ and $R^{41}$ are each a straight-chain alkyl group, a branched alkyl group, or an aryl group, the Suzuki-Miyaura reaction, or the like can be used.

Note that this embodiment can be combined with any of the other embodiments in this specification as appropriate.

Embodiment 2

In this embodiment, a structure of a light-emitting device 550X of one embodiment of the present invention will be described with reference to FIGS. 1A and 1B.

Figure 1B:
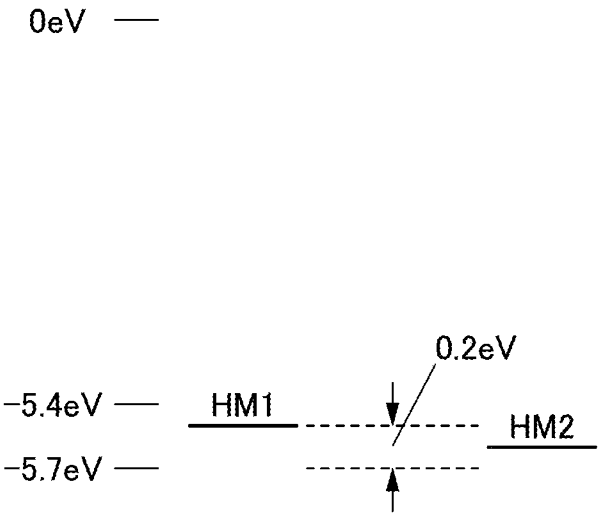

FIG. 1A is a cross-sectional view illustrating a structure of a light-emitting device of one embodiment of the present invention, and FIG. 1B is a diagram illustrating energy levels of materials used for the light-emitting device of one embodiment of the present invention.

Structure Example of Light-Emitting Device 550X

The light-emitting device 550X described in this embodiment includes an electrode 551X, an electrode 552X, and a unit 103X. The electrode 552X overlaps with the electrode 551X, and the unit 103X is located between the electrode 552X and the electrode 551X.

Structure Example of Unit 103X

The unit 103X has a single-layer structure or a stacked-layer structure. The unit 103X includes a layer 111X, a layer 112X, and a layer 113X, for example (see FIG. 1A). The unit 103X has a function of emitting light ELX.

The layer 111X is positioned between the layer 113X and the layer 112X, the layer 113X is positioned between the electrode 552X and the layer 111X, and the layer 112X is positioned between the layer 111X and the electrode 551X.

For example, a layer selected from functional layers such as a light-emitting layer, a hole-transport layer, an electron-transport layer, and a carrier-blocking layer can be used for the unit 103X. A layer selected from functional layers such as a hole-injection layer, an electron-injection layer, an exciton-blocking layer, and a charge-generation layer can also be used for the unit 103X.

Structure Example of Layer 112X

A hole-transport material can be used for the layer 112X, for example. The layer 112X can be referred to as a hole-transport layer. A material having a wider bandgap than the light-emitting material contained in the layer 111X is preferably used for the layer 112X. In that case, transfer of energy from excitons generated in the layer 111X to the layer 112X can be inhibited.

[Hole-Transport Material]

A material having a hole mobility that is $1\times10^{-6}$ $cm^2/Vs$ or higher can be suitably used as the hole-transport material.

As the hole-transport material, an amine compound or an organic compound having a π-electron rich heteroaromatic ring skeleton can be used, for example. Specifically, a compound having an aromatic amine skeleton, a compound having a carbazole skeleton, a compound having a thiophene skeleton, a compound having a furan skeleton, or the like can be used. The compound having an aromatic amine skeleton and the compound having a carbazole skeleton are particularly preferable because these compounds are highly reliable and have high hole-transport properties to contribute to a reduction in driving voltage.

The following are examples that can be used as a compound having an aromatic amine skeleton: 4,4'-bis[N-(1-naphthyl)-N-phenylamino]biphenyl (abbreviation: NPB), N,N'-diphenyl-N,N'-bis(3-methylphenyl)-4,4'-diaminobiphenyl (abbreviation: TPD), N,N-bis(9,9'-spirobi[9H-fluoren]-2-yl)-N,N-diphenyl-4,4'-diaminobiphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), and N-phenyl-N-[4-(9-phenyl-9H-carbazol-3-yl)phenyl]-9,9'-spirobi[9H-fluoren]-2-amine (abbreviation: PCBASF).

As a compound having a carbazole skeleton, for example, 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), or 3,3'-bis(9-phenyl-9H-carbazole) (abbreviation: PCCP) can be used.

As a compound having a thiophene skeleton, for example, 4,4',4"-(benzene-1,3,5-triyl)tri(dibenzothiophene) (abbreviation: DBT3P-II), 2,8-diphenyl-4-[4-(9-phenyl-9H-fluoren-9-yl)phenyl]dibenzothiophene (abbreviation: DBTFLP-III), or 4-[4-(9-phenyl-9H-fluoren-9-yl)phenyl]-6-phenyldibenzothiophene (abbreviation: DBTFLP-IV) can be used.

As a compound having a furan skeleton, for example, 4,4',4"-(benzene-1,3,5-triyl)tri(dibenzofuran) (abbreviation: DBF3P-II) or 4-{3-[3-(9-phenyl-9H-fluoren-9-yl)phenyl]phenyl}dibenzofuran (abbreviation: mmDBFFLBi-II) can be used.

Structure Example of Layer 113X

An electron-transport material, a material having an anthracene skeleton, and a mixed material can be used for the layer 113X, for example. The layer 113X can be referred to as an electron-transport layer. A material having a wider bandgap than the light-emitting material contained in the layer 111X is preferably used for the layer 113X. In that case, energy transfer from excitons generated in the layer 111X to the layer 113X can be inhibited.

[Electron-Transport Material]

For example, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the electron-transport property in the electron-transport layer can be suppressed. The amount of electrons injected into the light-emitting layer can be controlled. The light-emitting layer can be prevented from having excess electrons.

For example, a metal complex or an organic compound having a π-electron deficient heteroaromatic ring skeleton can be used as the electron-transport material.

As a metal complex, bis(10-hydroxybenzo[h]quinolinato)beryllium(II) (abbreviation: BeBq2), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ) can be used, for example.

As an organic compound having a π-electron deficient heteroaromatic ring skeleton, a heterocyclic compound having a polyazole skeleton, a heterocyclic compound having a diazine skeleton, a heterocyclic compound having a pyridine skeleton, a heterocyclic compound having a triazine skeleton, or the like can be used, for example. In particular, the heterocyclic compound having a diazine skeleton or the heterocyclic compound having a pyridine skeleton has favorable reliability and thus is preferable. In addition, the heterocyclic compound having a diazine (pyrimidine or pyrazine) skeleton has a high electron-transport property to contribute to a reduction in driving voltage.

As a heterocyclic compound having a polyazole skeleton, 2-(4-biphenylyl)-5-(4-tert-butylphenyl)-1,3,4-oxadiazole (abbreviation: PBD), 3-(4-biphenylyl)-4-phenyl-5-(4-tert-butylphenyl)-1,2,4-triazole (abbreviation: TAZ), 1,3-bis[5-(p-tert-butylphenyl)-1,3,4-oxadiazol-2-yl]benzene (abbreviation: OXD-7), 9-[4-(5-phenyl-1,3,4-oxadiazol-2-yl)phenyl]-9H-carbazole (abbreviation: CO11), 2,2',2"-(1,3,5-benzenetriyl)tris(1-phenyl-1H-benzimidazole) (abbreviation: TPBI), or 2-[3-(dibenzothiophen-4-yl)phenyl]-1-phenyl-1H-benzimidazole (abbreviation: mDBT-BIm-II) can be used, for example.

As a heterocyclic compound having a diazine skeleton, 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[3'-(9H-carbazol-9-yl)biphenyl-3-yl]dibenzo[f,h]quinoxaline (abbreviation: 2mCzBPDBq), 4,6-bis[3-(phenanthren-9-yl)phenyl]pyrimidine (abbreviation: 4,6mPnP2Pm), 4,6-bis[3-(4-dibenzothienyl)phenyl]pyrimidine (abbreviation: 4,6mDBTP2Pm-II), or 4,8-bis[3-(dibenzothiophen-4-yl)phenyl]benzo[h]quinazoline (abbreviation: 4,8mDBtP2Bqn) can be used, for example.

As a heterocyclic compound having a pyridine skeleton, 3,5-bis[3-(9H-carbazol-9-yl)phenyl]pyridine (abbreviation: 35DCzPPy) or 1,3,5-tri[3-(3-pyridyl)phenyl]benzene (abbreviation: TmPyPB) can be used, for example.

As a heterocyclic compound having a triazine skeleton, 2-[3'-(9,9-dimethyl-9H-fluoren-2-yl)biphenyl-3-yl]-4,6-diphenyl-1,3,5-triazine (abbreviation: mFBPTzn), 2-(biphenyl-4-yl)-4-phenyl-6-(9,9'-spirobi[9H-fluoren]-2-yl)-1,3,5-triazine (abbreviation: BP-SFTzn), 2-{3-[3-(benzo[b]naphtho[1,2-d]furan-8-yl)phenyl]phenyl}-4,6-diphenyl-1,3,5-triazine (abbreviation: mBnfBPTzn), or 2-{3-[3-(benzo[b]naphtho[1,2-d]furan-6-yl)phenyl]phenyl}-4,6-diphenyl-1,3,5-triazine (abbreviation: mBnfBPTzn-02) can be used, for example.

[Material Having Anthracene Skeleton]

An organic compound having an anthracene skeleton can be used for the layer 113X. In particular, an organic compound having both an anthracene skeleton and a heterocyclic skeleton can be suitably used.

For example, an organic compound having both an anthracene skeleton and a nitrogen-containing five-membered ring skeleton can be used for the layer 113X. Alternatively, an organic compound having both an anthracene skeleton and a nitrogen-containing five-membered ring skeleton where two heteroatoms are included in a ring can be used for the layer 113X. Specifically, it is preferable to use, as the heterocyclic skeleton, a pyrazole ring, an imidazole ring, an oxazole ring, a thiazole ring, or the like.

For example, an organic compound having both an anthracene skeleton and a nitrogen-containing six-membered ring skeleton can be used for the layer 113X. Alternatively, an organic compound having both an anthracene skeleton and a nitrogen-containing six-membered ring skeleton where two heteroatoms are included in a ring can be used for the layer 113X. Specifically, it is preferable to use, as the heterocyclic skeleton, a pyrazine ring, a pyrimidine ring, a pyridazine ring, or the like.

[Structure Example of Mixed Material]

A material in which a plurality of kinds of substances are mixed can be used for the layer 113X. Specifically, a mixed material which contains an alkali metal, an alkali metal compound, or an alkali metal complex and an electron-transport substance can be used for the layer 113X. Note that the electron-transport material preferably has a highest occupied molecular orbital (HOMO) level of −6.0 eV or higher.

The mixed material can be suitably used for the layer 113X in combination with a structure using a composite material, which is separately described, for the layer 104X. For example, a composite material of an electron-accepting substance and a hole-transport material can be used for the layer 104X. Specifically, a composite material of an electron-accepting substance and a substance having a relatively deep HOMO level HM1, which is higher than or equal to −5.7 eV and lower than or equal to −5.4 eV, can be used for the layer 104X (see FIG. 1). Using the mixed material for the layer 113X in combination with the structure using such a composite material for the layer 104X leads to an increase in the reliability of the light-emitting device.

Furthermore, a structure using a hole-transport material for the layer 112X is preferably combined with the structure using the mixed material for the layer 113X and the composite material for the layer 104X. For example, a substance having a HOMO level HM2, which differs by −0.2 eV to 0 eV from the relatively deep HOMO level HM1, can be used for the layer 112X (see FIG. 1). This leads to an increase in the reliability of the light-emitting device. Note that in this specification and the like, the structure of the above-described light-emitting device may be referred to as a Recombination-Site Tailoring Injection structure (ReSTI structure).

The concentration of the alkali metal, the alkali metal compound, or the alkali metal complex preferably changes in the thickness direction of the layer 113X (including the case where change of the concentration is 0).

For example, a metal complex having an 8-hydroxyquinolinato structure can be used. A methyl-substituted product of the metal complex having an 8-hydroxyquinolinato structure (e.g., a 2-methyl-substituted product or a 5-methyl-substituted product) or the like can also be used.

As the metal complex having an 8-hydroxyquinolinato structure, 8-hydroxyquinolinato-lithium (abbreviation: Liq), 8-hydroxyquinolinato-sodium (abbreviation: Naq), or the like can be used. In particular, a complex of a monovalent metal ion, especially a complex of lithium is preferable, and Liq is further preferable.

Structure Example 1 of Layer 111X

Either a structure containing a light-emitting material or a structure containing a light-emitting material and a host material can be employed for the layer 111X, for example. The layer 111X can be referred to as a light-emitting layer. The layer 111X is preferably provided in a region where holes and electrons are recombined. This allows efficient conversion of energy generated by recombination of carriers into light and emission of the light.

Furthermore, the layer 111X is preferably provided apart from a metal used for the electrode or the like. In that case, a quenching phenomenon caused by the metal used for the electrode or the like can be inhibited.

It is preferable that a distance from an electrode or the like having reflectivity to the layer 111X be adjusted and the layer 111X be placed in an appropriate position in accordance with an emission wavelength. With this structure, the amplitude can be increased by utilizing an interference phenomenon between light reflected by the electrode or the like and light emitted from the layer 111X. Light with a predetermined wavelength can be intensified and the spectrum of the light can be narrowed. In addition, bright light emission colors with high intensity can be obtained. In other words, the layer 111X is placed in an appropriate position, for example, between electrodes and the like, and thus a microcavity structure can be formed.

The organic compound of one embodiment of the present invention can be used for a light-emitting material, for example. Thus, energy generated by recombination of carriers can be released as light ELX from the light-emitting material (see FIG. 1A).

Structure Example 2 of Layer 111X

A carrier-transport material can be used as the host material. For example, a hole-transport material, an electron-transport material, a substance exhibiting thermally activated delayed fluorescence (TADF), a material having an anthracene skeleton, or a mixed material can be used as the host material. A material having a wider bandgap than the light-emitting material contained in the layer 111X is preferably used as the host material. Thus, transfer of energy from excitons generated in the layer 111X to the host material can be inhibited.

[Hole-Transport Material]

A material having a hole mobility of $1\times10^{-6}$ $cm^2/Vs$ or higher can be suitably used as the hole-transport material. For example, a hole-transport material that can be used for the layer 112X can be used for the layer 111X.

[Electron-Transport Material]

A metal complex or an organic compound having a π-electron deficient heteroaromatic ring skeleton can be used as the electron-transport material. For example, an electron-transport material that can be used for the layer 113X can be used for the layer 111X.

[Material Having Anthracene Skeleton]

An organic compound having an anthracene skeleton can be used as the host material. An organic compound having an anthracene skeleton is particularly preferable in the case where a fluorescent substance is used as the light-emitting substance. Thus, a light-emitting device with high emission efficiency and high durability can be obtained.

Among the organic compounds having an anthracene skeleton, an organic compound having a diphenylanthracene skeleton, in particular, a 9,10-diphenylanthracene skeleton, is chemically stable and thus is preferable. The host material preferably has a carbazole skeleton because the hole-injection and hole-transport properties are improved. In particular, the host material preferably has a dibenzocarbazole skeleton because the HOMO level thereof is shallower than that of carbazole by approximately 0.1 eV so that holes enter the host material easily, the hole-transport property is improved, and the heat resistance is increased. Note that in terms of the hole-injection and hole-transport properties, instead of a carbazole skeleton, a benzofluorene skeleton or a dibenzofluorene skeleton may be used.

Thus, a substance having both a 9,10-diphenylanthracene skeleton and a carbazole skeleton, a substance having both a 9,10-diphenylanthracene skeleton and a benzocarbazole skeleton, or a substance having both a 9,10-diphenylanthracene skeleton and a dibenzocarbazole skeleton is preferable as the host material.

Examples of the substances that can be used include 6-[3-(9,10-diphenyl-2-anthryl)phenyl]benzo[b]naphtho[1,2-d]furan (abbreviation: 2mBnfPPA), 9-phenyl-10-[4-(9-phenyl-9H-fluoren-9-yl)biphenyl-4'-yl]anthracene (abbreviation: FLPPA), 9-(1-naphthyl)-10-[4-(2-naphthyl)phenyl]anthracene (abbreviation: αN-QNPAnth), 9-phenyl-3-[4-(10-phenyl-9-anthryl)phenyl]-9H-carbazole (abbreviation: PCzPA), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), and 3-[4-(1-naphthyl)-phenyl]-9-phenyl-9H-carbazole (abbreviation: PCPN).

In particular, CzPA, cgDBCzPA, 2mBnfPPA, and PCzPA have excellent characteristics.

[Substance Exhibiting Thermally Activated Delayed Fluorescence (TADF)]

A TADF material can be used as the host material. When the TADF material is used as the host material, triplet excitation energy generated in the TADF material can be converted into singlet excitation energy by reverse intersystem crossing. Moreover, excitation energy can be transferred to the light-emitting substance. In other words, the TADF material functions as an energy donor, and the light-emitting substance functions as an energy acceptor. Thus, the emission efficiency of the light-emitting device can be increased.

This is very effective in the case where the light-emitting substance is a fluorescent substance. In that case, the S1 level of the TADF material is preferably higher than that of the fluorescent substance in order that high emission efficiency can be achieved. Furthermore, the T1 level of the TADF material is preferably higher than the S1 level of the fluorescent substance. Therefore, the T1 level of the TADF material is preferably higher than that of the fluorescent substance.

It is also preferable to use a TADF material that emits light whose wavelength overlaps with the wavelength on a lowest-energy-side absorption band of the fluorescent substance. This enables smooth transfer of excitation energy from the TADF material to the fluorescent substance and accordingly enables efficient light emission, which is preferable.

In addition, in order to efficiently generate singlet excitation energy from the triplet excitation energy by reverse intersystem crossing, carrier recombination preferably occurs in the TADF material. It is also preferable that the triplet excitation energy generated in the TADF material not be transferred to the triplet excitation energy of the fluorescent substance. For that reason, the fluorescent substance preferably has a protective group around a luminophore (a skeleton which causes light emission) of the fluorescent substance. As the protective group, a substituent having no π bond and a saturated hydrocarbon are preferably used. Specific examples include an alkyl group having 3 to 10 carbon atoms, a substituted or unsubstituted cycloalkyl group having 3 to 10 carbon atoms, and a trialkylsilyl group having 3 to 10 carbon atoms. It is further preferable that the fluorescent substance have a plurality of protective groups. The substituents having no π bond are poor in carrier transport performance, whereby the TADF material and the luminophore of the fluorescent substance can be made away from each other with little influence on carrier transportation or carrier recombination.

Here, the luminophore refers to an atomic group (skeleton) that causes light emission in a fluorescent substance. The luminophore is preferably a skeleton having a π bond, further preferably includes an aromatic ring, and still further preferably includes a fused aromatic ring or a fused heteroaromatic ring.

Examples of the fused aromatic ring or the fused heteroaromatic ring include a phenanthrene skeleton, a stilbene skeleton, an acridone skeleton, a phenoxazine skeleton, and a phenothiazine skeleton. In particular, a fluorescent substance having any of a naphthalene skeleton, an anthracene skeleton, a fluorene skeleton, a chrysene skeleton, a triphenylene skeleton, a tetracene skeleton, a pyrene skeleton, a perylene skeleton, a coumarin skeleton, a quinacridone skeleton, and a naphthobisbenzofuran skeleton is preferred because of its high fluorescence quantum yield.

For example, any of the TADF materials given below can be used as the host material. Note that without being limited thereto, a variety of known TADF materials can be used.

In the TADF material, the difference between the S1 level and the T1 level is small, and reverse intersystem crossing (upconversion) from the triplet excited state into the singlet excited state can be achieved by a small amount of thermal energy. Thus, the singlet excited state can be efficiently generated from the triplet excited state. In addition, the triplet excitation energy can be converted into light emission.

An exciplex whose excited state is formed of two kinds of substances has an extremely small difference between the S1 level and the T1 level and functions as a TADF material capable of converting triplet excitation energy into singlet excitation energy.

A phosphorescent spectrum observed at a low temperature (e.g., 10 K to 77 K) is used for an index of the T1 level. When the level of energy with a wavelength of the line obtained by extrapolating a tangent to the fluorescent spectrum at a tail on the short wavelength side is the S1 level and the level of energy with a wavelength of the line obtained by extrapolating a tangent to the phosphorescent spectrum at a tail on the short wavelength side is the T1 level, the difference between the S1 level and the T1 level of the TADF material is preferably smaller than or equal to 0.3 eV, further preferably smaller than or equal to 0.2 eV.

Examples of the TADF material include a fullerene, a derivative thereof, an acridine, a derivative thereof, and an eosin derivative. Furthermore, porphyrin containing a metal such as magnesium (Mg), zinc (Zn), cadmium (Cd), tin (Sn), platinum (Pt), indium (In), or palladium (Pd) can be also used as the TADF material.

Specifically, the following materials whose structural formulae are shown below can be used: a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), an octaethylporphyrin-platinum chloride complex ($PtCl_2OEP$), and the like.

[Chemical Formula 45]

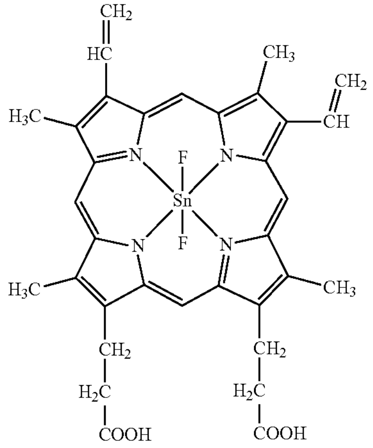

$SnF_2$(Proto IX)

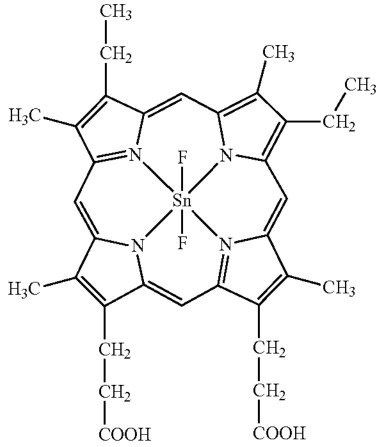

$SnF_2$(Meso IX)

-continued

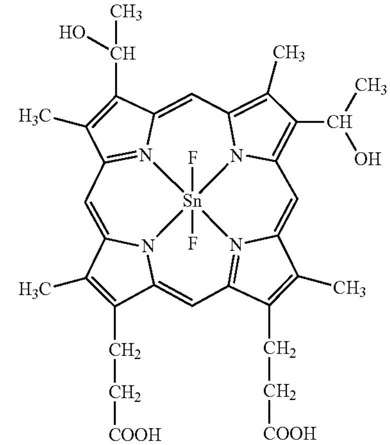

SnF$_2$(Hemato IX)

-continued

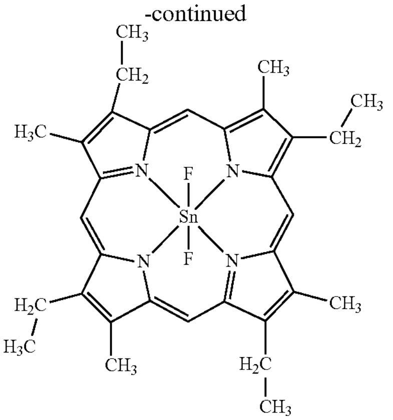

SnF$_2$(Etio I)

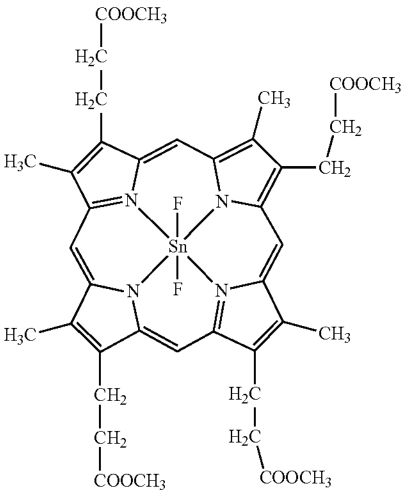

SnF$_2$(Copro III-4Me)

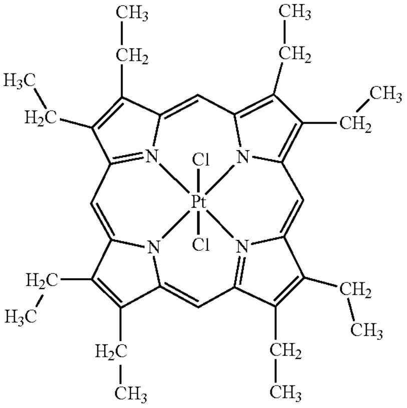

PtCl$_2$OEP

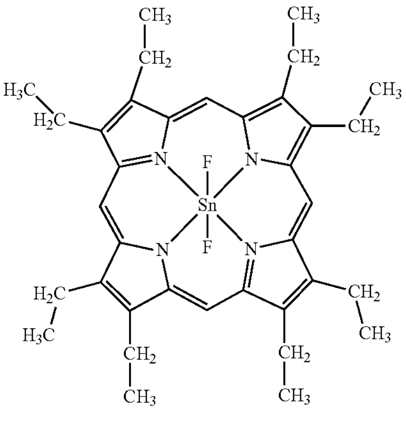

SnF$_2$(OEP)

Furthermore, a heterocyclic compound including one or both of a π-electron rich heteroaromatic ring and a π-electron deficient heteroaromatic ring can be used, for example, as the TADF material.

Specifically, the following compounds whose structural formulae are shown below can be used: 2-(biphenyl-4-yl)-4,6-bis(12-phenylindolo[2,3-a]carbazol-11-yl)-1,3,5-triazine (abbreviation: PIC-TRZ), 9-(4,6-diphenyl-1,3,5-triazin-2-yl)-9'-phenyl-9H,9'H-3,3'-bicarbazole (abbreviation: PCCzTzn), 2-{4-[3-(N-phenyl-9H-carbazol-3-yl)-9H-carbazol-9-yl]phenyl}-4,6-diphenyl-1,3,5-triazine (abbreviation: PCCzPTzn), 2-[4-(10H-phenoxazin-10-yl)phenyl]-4,6-diphenyl-1,3,5-triazine (abbreviation: PXZ-TRZ), 3-[4-(5-phenyl-5,10-dihydrophenazin-10-yl)phenyl]-4,5-diphenyl-1,2,4-triazole (abbreviation: PPZ-3TPT), 3-(9,9-dimethyl-9H-acridin-10-yl)-9H-xanthen-9-one (abbreviation: ACRXTN), bis[4-(9,9-dimethyl-9,10-dihydroacridine)phenyl]sulfone (abbreviation: DMAC-DPS), 10-phenyl-10H,10'H-spiro[acridin-9,9'-anthracen]-10'-one (abbreviation: ACRSA), and the like.

[Chemical Formula 46]
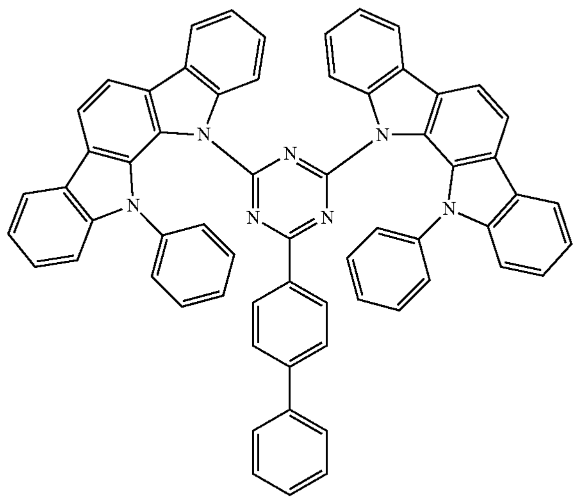
PIC-TRZ
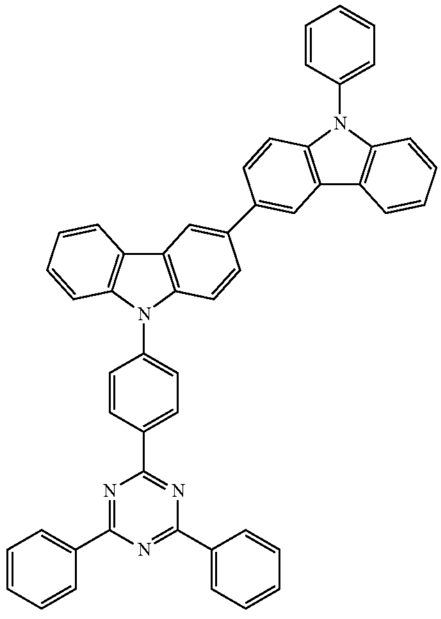
PCCzPTzn
-continued
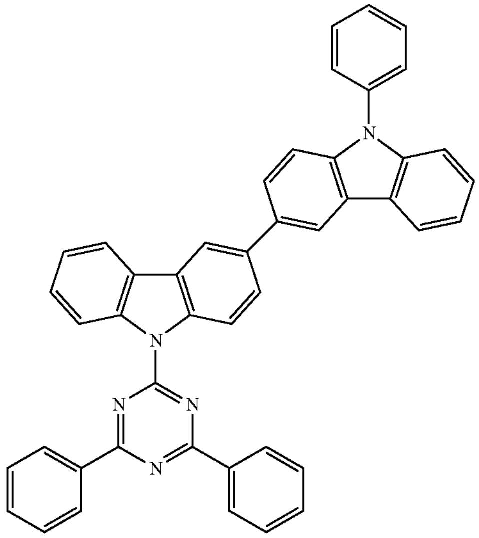
PCCzTzn
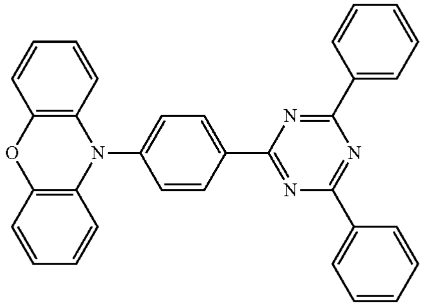
PXZ-TRZ
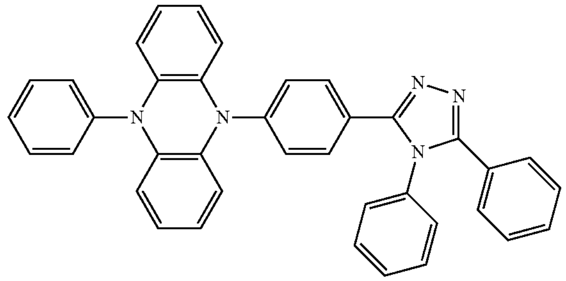
PPZ-3TPT
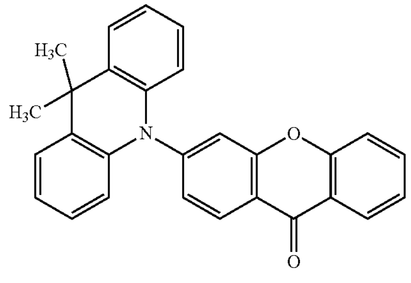
ACRXTN -continued

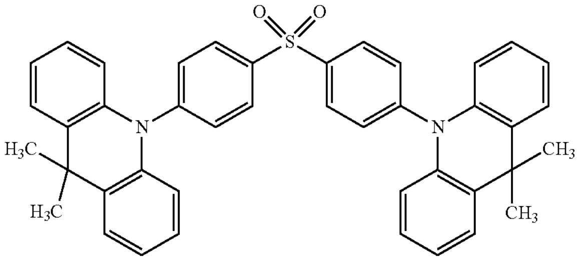

DMAC-DPS

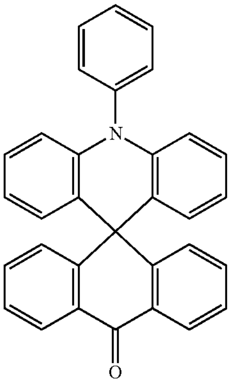

ACRSA

Such a heterocyclic compound is preferable because of having high electron-transport and hole-transport properties owing to a π-electron rich heteroaromatic ring and a π-electron deficient heteroaromatic ring. Among skeletons having the π-electron deficient heteroaromatic ring, in particular, a pyridine skeleton, a diazine skeleton (a pyrimidine skeleton, a pyrazine skeleton, and a pyridazine skeleton), and a triazine skeleton are preferred because of their high stability and reliability. In particular, a benzofuropyrimidine skeleton, a benzothienopyrimidine skeleton, a benzofuropyrazine skeleton, and a benzothienopyrazine skeleton are preferred because of their high electron-accepting properties and high reliability.

Among skeletons having the π-electron rich heteroaromatic ring, an acridine skeleton, a phenoxazine skeleton, a phenothiazine skeleton, a furan skeleton, a thiophene skeleton, and a pyrrole skeleton have high stability and reliability; thus, at least one of these skeletons is preferably included. A dibenzofuran skeleton is preferable as a furan skeleton, and a dibenzothiophene skeleton is preferable as a thiophene skeleton. As a pyrrole skeleton, an indole skeleton, a carbazole skeleton, an indolocarbazole skeleton, a bicarbazole skeleton, and a 3-(9-phenyl-9H-carbazol-3-yl)-9H-carbazole skeleton are particularly preferable.

Note that a substance in which the π-electron rich heteroaromatic ring is directly bonded to the π-electron deficient heteroaromatic ring is particularly preferable because the electron-donating property of the π-electron rich heteroaromatic ring and the electron-accepting property of the π-electron deficient heteroaromatic ring are both improved, the energy difference between the S1 level and the T1 level becomes small, and thus thermally activated delayed fluorescence can be obtained with high efficiency. Note that an aromatic ring to which an electron-withdrawing group such as a cyano group is bonded may be used instead of the π-electron deficient heteroaromatic ring. As a π-electron rich skeleton, an aromatic amine skeleton, a phenazine skeleton, or the like can be used.

As a π-electron deficient skeleton, a xanthene skeleton, a thioxanthene dioxide skeleton, an oxadiazole skeleton, a triazole skeleton, an imidazole skeleton, an anthraquinone skeleton, a skeleton containing boron such as phenylborane and boranthrene, an aromatic ring or a heteroaromatic ring having a nitrile group or a cyano group such as benzonitrile or cyanobenzene, a carbonyl skeleton such as benzophenone, a phosphine oxide skeleton, a sulfone skeleton, or the like can be used.

As described above, a π-electron deficient skeleton and a π-electron rich skeleton can be used instead of at least one of the π-electron deficient heteroaromatic ring and the π-electron rich heteroaromatic ring.

Structure Example 1 of Mixed Material

A material in which a plurality of kinds of substances are mixed can be used as the host material. For example, a material which includes an electron-transport material and a hole-transport material can be used as the mixed material. The weight ratio between the hole-transport material and the electron-transport material contained in the mixed material may be (the hole-transport material/the electron-transport material)=(1/19) or more and (19/1) or less. Accordingly, the carrier-transport property of the layer 111X can be easily adjusted. A recombination region can also be controlled easily.

Structure Example 2 of Mixed Material

In addition, a material mixed with a phosphorescent substance can be used as the host material. When a fluorescent substance is used as the light-emitting substance, a phosphorescent substance can be used as an energy donor for supplying excitation energy to the fluorescent substance.

Structure Example 3 of Mixed Material

A mixed material containing a material to form an exciplex can be used as the host material. For example, a material in which an emission spectrum of a formed exciplex overlaps with a wavelength on the lowest-energy-side absorption band of the light-emitting substance can be used as the host material. This enables smooth energy transfer and improves emission efficiency. The driving voltage can be suppressed. With such a structure, light emission can be efficiently obtained by exciplex-triplet energy transfer (ExTET), which is energy transfer from the exciplex to the light-emitting substance (phosphorescent material).

A phosphorescent substance can be used as at least one of the materials forming an exciplex. Accordingly, reverse intersystem crossing can be used. Triplet excitation energy can be efficiently converted into singlet excitation energy.

Combination of an electron-transport material and a hole-transport material whose HOMO level is higher than or equal to that of the electron-transport material is preferable for forming an exciplex. The LUMO level of the hole-transport material is preferably higher than or equal to the LUMO level of the electron-transport material. Thus, an exciplex can be efficiently formed. Note that the LUMO levels and the HOMO levels of the materials can be derived from the electrochemical characteristics (the reduction potentials and the oxidation potentials). Specifically, the reduction potentials and the oxidation potentials can be measured by cyclic voltammetry (CV).

The formation of an exciplex can be confirmed by a phenomenon in which the emission spectrum of the mixed film in which the material having a hole-transport property and the material having an electron-transport property are mixed is shifted to the longer wavelength side than the emission spectrum of each of the materials (or has another peak on the longer wavelength side) observed by comparison of the emission spectra of the material having a hole-transport property, the material having an electron-transport property, and the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of transient PL of the material having a hole-transport property, the material having an electron-transport property, and the mixed film of these materials. The transient PL can be rephrased as transient electroluminescence (EL). That is, the formation of an exciplex can also be confirmed by a difference in transient response observed by comparison of the transient EL of the material having a hole-transport property, the material having an electron-transport property, and the mixed film of these materials.

Note that this embodiment can be combined with any of the other embodiments in this specification as appropriate.

Embodiment 3

In this embodiment, a structure of the light-emitting device 550X of one embodiment of the present invention will described with reference to FIGS. 1A and 1B.

Structure Example of Light-Emitting Device 550X

The light-emitting device 550X described in this embodiment includes the electrode 551X, the electrode 552X, the unit 103X, and the layer 104X. The electrode 552X overlaps with the electrode 551X, and the unit 103X is located between the electrode 551X and the electrode 552X. The layer 104X is located between the electrode 551X and the unit 103X. For example, the structure described in Embodiment 2 can be employed for the unit 103X.

Structure Example of Electrode 551X

For example, a conductive material can be used for the electrode 551X. Specifically, a single layer or a stack using a metal, an alloy, or a film containing a conductive compound can be used for the electrode 551X.

A film that efficiently reflects light can be used for the electrode 551X, for example. Specifically, an alloy containing silver, copper, and the like, an alloy containing silver, palladium, and the like, or a metal film of aluminum or the like can be used for the electrode 551X.

For example, a metal film that transmits part of light and reflects another part of light can be used for the electrode 551X. Thus, a microcavity structure can be provided in the light-emitting device 550X. Alternatively, light with a predetermined wavelength can be extracted more efficiently than light with the other wavelengths. Alternatively, light with a narrow spectral half-width can be extracted. Alternatively, light of a bright color can be extracted. In addition, since the organic compound of one embodiment of the present invention has an extremely narrow at half maximum of an emission spectrum, a reduction in light extraction efficiency is less likely occur even when a microcavity structure is employed. Accordingly, an element with high light-emitting efficiency can be provided.

A film having a visible-light-transmitting property can be used for the electrode 551X, for example. Specifically, a single layer or a stack using a metal film, an alloy film, a conductive oxide film, or the like that is thin enough to transmit light can be used for the electrode 551X.

In particular, a material having a work function higher than or equal to 4.0 eV can be suitably used for the electrode 551X.

For example, a conductive oxide containing indium can be used. Specifically, indium oxide, indium oxide-tin oxide (abbreviation: ITO), indium oxide-tin oxide containing silicon or silicon oxide (abbreviation: ITSO), indium oxide-zinc oxide, indium oxide containing tungsten oxide and zinc oxide (abbreviation: IWZO), or the like can be used.

For another example, a conductive oxide containing zinc can be used. Specifically, zinc oxide, zinc oxide to which gallium is added, zinc oxide to which aluminum is added, or the like can be used.

Furthermore, for example, gold (Au), platinum (Pt), nickel (Ni), tungsten (W), chromium (Cr), molybdenum (Mo), iron (Fe), cobalt (Co), copper (Cu), palladium (Pd), or a nitride of a metal material (e.g., titanium nitride) can be used. Graphene can also be used.

Structure Example 1 of Layer 104X

A hole-injection material can be used for the layer 104X, for example. The layer 104X can be referred to as a hole-injection layer.

For example, a material having a hole mobility lower than or equal to $1\times10^{-3}$ $cm^2/Vs$ when the square root of the electric field strength [V/cm] is 600 can be used for the layer 104X. A film having an electrical resistivity greater than or equal to $1\times10^4$ $\Omega\cdot cm$ and less than or equal to $1\times10^7$ $\Omega\cdot cm$ can be used as the layer 104X. The electrical resistivity of the layer 104X is preferably greater than or equal to $5\times10^4$ $\Omega\cdot cm$ and less than or equal to $1\times10^7$ $\Omega\cdot cm$, further preferably greater than or equal to $1\times10^5$ $\Omega\cdot cm$ and less than or equal to $1\times10^7$ $\Omega\cdot cm$.

Structure Example 2 of Layer 104X

Specifically, an electron-accepting substance can be used for the layer 104X. Alternatively, a composite material containing a plurality of kinds of substances can be used for the layer 104X. This can facilitate the injection of holes from the electrode 551X, for example. Alternatively, the driving voltage of the light-emitting device 550X can be reduced.

[Electron-Accepting Substance]

An organic compound or an inorganic compound can be used as the electron-accepting substance. The electron-accepting substance can extract electrons from an adjacent hole-transport layer or a hole-transport material by the application of an electric field.

For example, a compound having an electron-withdrawing group (a halogen or cyano group) can be used as the electron-accepting substance. Note that an electron-accepting organic compound is easily evaporated, which facilitates film deposition. Thus, the productivity of the light-emitting device 550X can be increased.

Specifically, 7,7,8,8-tetracyano-2,3,5,6-tetrafluoroquinodimethane (abbreviation: F4-TCNQ), chloranil, 2,3,6,7,10,11-hexacyano-1,4,5,8,9,12-hexaazatriphenylene (abbreviation: HAT-CN), 1,3,4,5,7,8-hexafluorotetracyanonaphthoquinodimethane (abbreviation: F6-TCNNQ), 2-(7-dicyanomethylene-1,3,4,5,6,8,9,10-octafluoro-7H-pyren-2-ylidene)malononitrile, or the like can be used.

A compound in which electron-withdrawing groups are bonded to a condensed aromatic ring having a plurality of heteroatoms, such as HAT-CN, is particularly preferable because it is thermally stable.

A [3]radialene derivative having an electron-withdrawing group (in particular, a cyano group or a halogen group such as a fluoro group) has a very high electron-accepting property and thus is preferred.

Specifically, α,α',α"-1,2,3-cyclopropanetriylidenetris[4-cyano-2,3,5,6-tetrafluorobenzeneacetonitrile], α,α',α"-1,2,3-cyclopropanetriylidenetris[2,6-dichloro-3,5-difluoro-4-(trifluoromethyl)benzeneacetonitrile], α,α',α"-1,2,3-cyclopropanetriylidenetris[2,3,4,5,6-pentafluorobenzeneacetonitrile], or the like can be used.

For the electron-accepting substance, a transition metal oxide such as a molybdenum oxide, a vanadium oxide, a ruthenium oxide, a tungsten oxide, or a manganese oxide can be used.

It is possible to use any of the following materials: phthalocyanine-based compounds such as phthalocyanine (abbreviation: $H_2Pc$); phthalocyanine-based complex compounds such as copper(II) phthalocyanine (abbreviation: CuPc); and compounds having an aromatic amine skeleton such as 4,4'-bis[N-(4-diphenylaminophenyl)-N-phenylamino]biphenyl (abbreviation: DPAB) and N,N-bis[4-bis(3-methylphenyl)aminophenyl]-N,N-diphenyl-4,4'-diaminobiphenyl (abbreviation: DNTPD).

In addition, high molecular compounds such as poly(3,4-ethylenedioxythiophene)/poly(styrenesulfonic acid) (abbreviation: PEDOT/PSS), and the like can be used.

Structure Example 1 of Composite Material

For example, a composite material containing an electron-accepting substance and a hole-transport material can be used for the layer 104X. Alternatively, a material used for the electrode 551X can be selected from a wide range of materials regardless of its work function.

For the hole-transport material in the composite material, for example, a compound having an aromatic amine skeleton, a carbazole derivative, an aromatic hydrocarbon, an aromatic hydrocarbon having a vinyl group, or a high molecular compound (such as an oligomer, a dendrimer, or a polymer) can be used. A material having a hole mobility of $1\times10^{-6}$ $cm^2/Vs$ or higher can be suitably used as the hole-transport material in the composite material. For example, a hole-transport material that can be used for the layer 112X can be used for the composite material.

A substance having a relatively deep HOMO level can be suitably used as the hole-transport material in the composite material. Specifically, the HOMO level is preferably higher than or equal to −5.7 eV and lower than or equal to −5.4 eV. Accordingly, hole injection to the unit 103X can be facilitated. Hole injection to the layer 112X can be facilitated. The reliability of the light-emitting device 550X can be increased.

As the compound having an aromatic amine skeleton, for example, N,N-di(p-tolyl)-N,N-diphenyl-p-phenylenediamine (abbreviation: DTDPPA), 4,4'-bis[N-(4-diphenylaminophenyl)-N-phenylamino]biphenyl (abbreviation: DPAB), N,N-bis[4-bis(3-methylphenyl)aminophenyl]-N,N-diphenyl-4,4'-diaminobiphenyl (abbreviation: DNTPD), or 1,3,5-tris[N-(4-diphenylaminophenyl)-N-phenylamino]benzene (abbreviation: DPA3B) can be used.

As the carbazole derivative, for example, 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 4,4'-di(N-carbazolyl)biphenyl (abbreviation: CBP), 1,3,5-tris[4-(N-carbazolyl)phenyl]benzene (abbreviation: TCPB), 9-[4-(10-phenyl-9-anthracenyl)phenyl]-9H-carbazole (abbreviation: CzPA), or 1,4-bis[4-(N-carbazolyl)phenyl]-2,3,5,6-tetraphenylbenzene can be used.

As the aromatic hydrocarbon, for example, 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 2-tert-butyl-9,10-bis[2-(1-naphthyl)phenyl]anthracene, 9,10-bis[2-(1-naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracene, tetracene, rubrene, perylene, 2,5,8,11-tetra(tert-butyl)perylene, pentacene, or coronene can be used.

As the aromatic hydrocarbon having a vinyl group, for example, 4,4'-bis(2,2-diphenylvinyl)biphenyl (abbreviation: DPVBi) or 9,10-bis[4-(2,2-diphenylvinyl)phenyl]anthracene (abbreviation: DPVPA) can be used.

As the high molecular compound, for example, poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide](abbreviation: PTPDMA), or poly[N,N'-bis(4-butylphenyl)-N,N'-bis(phenyl)benzidine](abbreviation: Poly-TPD) can be used.

Furthermore, a substance having any of a carbazole skeleton, a dibenzofuran skeleton, a dibenzothiophene skeleton, and an anthracene skeleton can be suitably used as the hole-transport material in the composite material, for example. Moreover, a substance including any of the following can be used as the hole-transport material in the composite material: an aromatic amine having a substituent that includes a dibenzofuran ring or a dibenzothiophene ring, an aromatic monoamine that includes a naphthalene ring, and an aromatic monoamine in which a 9-fluorenyl group is bonded to nitrogen of amine through an arylene group. With use of a substance including an N,N-bis(4-biphenyl)amino group, the reliability of the light-emitting device 550X can be increased.

Specific examples of the above-described substances include N-(4-biphenyl)-6,N-diphenylbenzo[b]naphtho[1,2-d]furan-8-amine (abbreviation: BnfABP), N,N-bis(4-biphenyl)-6-phenylbenzo[b]naphtho[1,2-d]furan-8-amine (abbreviation: BBABnf), 4,4'-bis(6-phenylbenzo[b]naphtho[1,2-d]furan-8-yl)-4"-phenyltriphenylamine (abbreviation: BnfBB1BP), N,N-bis(4-biphenyl)benzo[b]naphtho[1,2-d]furan-6-amine (abbreviation: BBABnf(6)), N,N-bis(4-biphenyl)benzo[b]naphtho[1,2-d]furan-8-amine (abbreviation: BBABnf(8)), N,N-bis(4-biphenyl)benzo[b]naphtho[2,3-d]furan-4-amine (abbreviation: BBABnf(II)0275(4)), N,N-bis[4-(dibenzofuran-4-yl)phenyl]-4-amino-p-terphenyl (abbreviation: DBfBB1TP), N-[4-(dibenzothiophen-4-yl)

phenyl]-N-phenyl-4-biphenylamine (abbreviation: ThBA1BP), 4-(2-naphthyl)-4',4''-diphenyltriphenylamine (abbreviation: BBAβNB), 4-[4-(2-naphthyl)phenyl]-4',4''-diphenyltriphenylamine (abbreviation: BBAβNBi), 4,4'-diphenyl-4''-(6;1'-binaphthyl-2-yl)triphenylamine (abbreviation: BBAαNβNB), 4,4'-diphenyl-4''-(7;1'-binaphthyl-2-yl) triphenylamine (abbreviation: BBAαNβNB-03), 4,4'-diphenyl-4''-(7-phenyl)naphthyl-2-yltriphenylamine (abbreviation: BBAPβNB-03), 4,4'-diphenyl-4''-(6;2'-binaphthyl-2-yl)triphenylamine (abbreviation: BBA(βN2)B), 4,4'-diphenyl-4''-(7;2'-binaphthyl-2-yl)triphenylamine (abbreviation: BBA(βN2)B-03), 4,4'-diphenyl-4''-(4;2'-binaphthyl-1-yl)triphenylamine (abbreviation: BBAβNαNB), 4,4'-diphenyl-4''-(5;2'-binaphthyl-1-yl)triphenylamine (abbreviation: BBAβNαNB-02), 4-(4-biphenylyl)-4'-(2-naphthyl)-4''-phenyltriphenylamine (abbreviation: TPBiAβNB), 4-(3-biphenylyl)-4'-[4-(2-naphthyl)phenyl]-4''-phenyltriphenylamine (abbreviation: mTPBiAβNBi), 4-(4-biphenylyl)-4'-[4-(2-naphthyl)phenyl]-4''-phenyltriphenylamine (abbreviation: TPBiAβNBi), 4-phenyl-4'-(1-naphthyl)triphenylamine (abbreviation: αNBA1BP), 4,4'-bis(1-naphthyl)triphenylamine (abbreviation: αNBB1BP), 4,4'-diphenyl-4''-[4'-(carbazol-9-yl)biphenyl-4-yl]triphenylamine (abbreviation: YGTBi1BP), 4'-[4-(3-phenyl-9H-carbazol-9-yl)phenyl]tris(biphenyl-4-yl)amine (abbreviation: YGTBi1BP-02), 4-[4'-(carbazol-9-yl)biphenyl-4-yl]-4'-(2-naphthyl)-4''-phenyltriphenylamine (abbreviation: YGTBiβNB), N-[4-(9-phenyl-9H-carbazol-3-yl)phenyl]-N-[4-(1-naphthyl)phenyl]-9,9'-spirobi[9H-fluoren]-2-amine (abbreviation: PCBNBSF), N,N-bis(biphenyl-4-yl)-9,9'-spirobi[9H-fluoren]-2-amine (abbreviation: BBASF), N,N-bis (biphenyl-4-yl)-9,9'-spirobi[9H-fluoren]-4-amine (abbreviation: BBASF(4)), N-(biphenyl-2-yl)-N-(9,9-dimethyl-9H-fluoren-2-yl)-9,9'-spirobi[9H-fluoren]-4-amine (abbreviation: oFBiSF), N-(biphenyl-4-yl)-N-(9,9-dimethyl-9H-fluoren-2-yl)dibenzofuran-4-amine (abbreviation: FrBiF), N-[4-(1-naphthyl)phenyl]-N-[3-(6-phenyldibenzofuran-4-yl)phenyl]-1-naphthylamine (abbreviation: mPDBfBNBN), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-[4-(9-phenylfluoren-9-yl)phenyl]triphenylamine (abbreviation: BPAFLBi), 4-phenyl-4'-(9-phenyl-9H-carbazol-3-yl)triphenylamine (abbreviation: PCBA1BP), 4,4'-diphenyl-4''-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4''-(9-phenyl-9H-carbazol-3-yl)triphenylamine (abbreviation: PCBNBB), N-phenyl-N-[4-(9-phenyl-9H-carbazol-3-yl)phenyl]-9,9'-spirobi[9H-fluoren]-2-amine (abbreviation: PCBASF), N-(biphenyl-4-yl)-N-[4-(9-phenyl-9H-carbazol-3-yl)phenyl]-9,9-dimethyl-9H-fluoren-2-amine (abbreviation: PCBBiF), N,N-bis(9,9-dimethyl-9H-fluoren-2-yl)-9,9'-spirobi-9H-fluoren-4-amine, N,N-bis(9,9-dimethyl-9H-fluoren-2-yl)-9,9'-spirobi-9H-fluoren-3-amine, N,N-bis(9,9-dimethyl-9H-fluoren-2-yl)-9,9'-spirobi-9H-fluoren-2-amine, and N,N-bis(9,9-dimethyl-9H-fluoren-2-yl)-9,9'-spirobi-9H-fluoren-1-amine.

Structure Example 2 of Composite Material

For example, a composite material including an electron-accepting substance, a hole-transport material, and a fluoride of an alkali metal or a fluoride of an alkaline earth metal can be used as the hole-injection material. In particular, a composite material in which the proportion of fluorine atoms is higher than or equal to 20% can be suitably used. Thus, the refractive index of the layer 104X can be reduced. A layer with a low refractive index can be formed inside the light-emitting device 550X. The external quantum efficiency of the light-emitting device 550X can be improved.

Note that this embodiment can be combined with any of the other embodiments in this specification as appropriate.

Embodiment 4

In this embodiment, a structure of the light-emitting device 550X of one embodiment of the present invention will described with reference to FIGS. 1A and 1B.

Structure Example of Light-Emitting Device 550X

The light-emitting device 550X described in this embodiment includes the electrode 551X, the electrode 552X, the unit 103X, and a layer 105X. The electrode 552X includes a region overlapping with the electrode 551X, and the unit 103X includes a region located between the electrode 551X and the electrode 552X. The layer 105X includes a region located between the unit 103X and the electrode 552X. For example, the structure described in Embodiment 2 can be employed for the unit 103X.

Structure Example of Electrode 552X

For example, a conductive material can be used for the electrode 552X. Specifically, a single layer or a stack using a metal, an alloy, or a material containing a conductive compound can be used for the electrode 552X.

For example, the material that can be used for the electrode 551X described in Embodiment 3 can be used for the electrode 552X. In particular, a material having a lower work function than the electrode 551X can be suitably used for the electrode 552X. Specifically, a material having a work function lower than or equal to 3.8 eV is preferably used.

For example, an element belonging to Group 1 of the periodic table, an element belonging to Group 2 of the periodic table, a rare earth metal, or an alloy containing any of these elements can be used for the electrode 552X.

Specifically, an element such as lithium (Li) or cesium (Cs), an element such as magnesium (Mg), calcium (Ca), or strontium (Sr), an element such as europium (Eu) or ytterbium (Yb), or an alloy containing any of these elements such as an alloy of magnesium and silver or an alloy of aluminum and lithium can be used for the electrode 552X.

Structure Example of Layer 105X

An electron-injection material can be used for the layer 105X, for example. The layer 105X can be referred to as an electron-injection layer.

Specifically, an electron-donating substance can be used for the layer 105X. Alternatively, a material in which an electron-donating substance and an electron-transport material are combined can be used for the layer 105X. Alternatively, electride can be used for the layer 105X. This can facilitate the injection of electrons from the electrode 552X, for example. Alternatively, not only a material having a low work function but also a material having a high work function can also be used for the electrode 552X. Alternatively, a material used for the electrode 552X can be selected from a wide range of materials regardless of its work function. Specifically, aluminum (Al), silver (Ag), indium oxide-tin oxide (abbreviation: ITO), indium oxide-tin oxide containing silicon or silicon oxide, or the like can be used for the electrode 552X. Alternatively, the driving voltage of the light-emitting device 550X can be reduced.

[Electron-Donating Substance]

For example, an alkali metal, an alkaline earth metal, a rare earth metal, or a compound thereof (an oxide, a halide, a carbonate, or the like) can be used as the electron-donating substance. Alternatively, an organic compound such as tetrathianaphthacene (abbreviation: TTN), nickelocene, or decamethylnickelocene can be used as the electron-donating substance.

As an alkali metal compound (including an oxide, a halide, and a carbonate), lithium oxide, lithium fluoride (LiF), cesium fluoride (CsF), lithium carbonate, cesium carbonate, 8-hydroxyquinolinato-lithium (abbreviation: Liq), or the like can be used.

As an alkaline earth metal compound (including an oxide, a halide, and a carbonate), calcium fluoride ($CaF_2$) or the like can be used.

Structure Example 1 of Composite Material

A material composed of two or more kinds of substances can be used as the electron-injection material. For example, an electron-donating substance and an electron-transport material can be used for the composite material.

[Electron-Transport Material]

For example, a material having an electron mobility higher than or equal to $1\times10^{-7}$ $cm^2/Vs$ and lower than or equal to $5\times10^{-5}$ $cm^2/Vs$ when the square root of the electric field strength [V/cm] is 600 can be suitably used as the electron-transport material. In this case, the amount of electrons injected into the light-emitting layer can be controlled. The light-emitting layer can be prevented from having excess electrons.

A metal complex or an organic compound having a π-electron deficient heteroaromatic ring skeleton can be used as the electron-transport material. For example, an electron-transport material that can be used for the layer 113X can be used for the layer 105X.

Structure Example 2 of Composite Material

A material including a fluoride of an alkali metal in a microcrystalline state and an electron-transport material can be used for the composite material. Alternatively, a material including a fluoride of an alkaline earth metal in a microcrystalline state and an electron-transport material can be used for the composite material. In particular, a composite material including a fluoride of an alkali metal or a fluoride of an alkaline earth metal at 50 wt % or higher can be suitably used. Alternatively, a composite material including an organic compound having a bipyridine skeleton can be suitably used. Thus, the refractive index of the layer 105X can be reduced. The external quantum efficiency of the light-emitting device 550X can be improved.

Structure Example 3 of Composite Material

For example, a composite material of a first organic compound including an unshared electron pair and a first metal can be used for the layer 105X. The sum of the number of electrons of the first organic compound and the number of electrons of the first metal is preferably an odd number. The molar ratio of the first metal to 1 mol of the first organic compound is preferably greater than or equal to 0.1 and less than or equal to 10, further preferably greater than or equal to 0.2 and less than or equal to 2, still further preferably greater than or equal to 0.2 and less than or equal to 0.8.

Accordingly, the first organic compound including an unshared electron pair interacts with the first metal and thus can form a singly occupied molecular orbital (SOMO). Furthermore, in the case where electrons are injected from the electrode 552X into the layer 105X, a barrier therebetween can be reduced.

The layer 105X can adopt a composite material that allows the spin density measured by an electron spin resonance (ESR) method to be preferably greater than or equal to $1\times10^{16}$ $spins/cm^3$, further preferably greater than or equal to $5\times10^{16}$ $spins/cm^3$, still further preferably greater than or equal to $1\times10^{17}$ $spins/cm^3$.

[Organic Compound Including Unshared Electron Pair]

For example, an electron-transport material can be used for the organic compound including an unshared electron pair. For example, a compound having an electron deficient heteroaromatic ring can be used. Specifically, a compound with at least one of a pyridine ring, a diazine ring (a pyrimidine ring, a pyrazine ring, and a pyridazine ring), and a triazine ring can be used. Accordingly, the driving voltage of the light-emitting device 550X can be reduced.

Note that the lowest unoccupied molecular orbital (LUMO) level of the organic compound including an unshared electron pair is preferably higher than or equal to −3.6 eV and lower than or equal to −2.3 eV. In general, the HOMO level and the LUMO level of an organic compound can be estimated by cyclic voltammetry (CV), photoelectron spectroscopy, optical absorption spectroscopy, inverse photoelectron spectroscopy, or the like.

For example, 4,7-diphenyl-1,10-phenanthroline (abbreviation: BPhen), 2,9-di(naphthalen-2-yl)-4,7-diphenyl-1,10-phenanthroline (abbreviation: NBPhen), diquinoxalino[2,3-a:2',3'-c]phenazine (abbreviation: HATNA), 2,4,6-tris[3'-(pyridin-3-yl)biphenyl-3-yl]-1,3,5-triazine (abbreviation: TmPPPyTz), 2,2'-(1,3-phenylene)bis(9-phenyl-1,10-phenanthroline) (abbreviation: mPPhen2P), or the like can be used as the organic compound including an unshared electron pair. Note that NBPhen has a higher glass transition temperature (Tg) than BPhen and thus has high heat resistance.

Alternatively, for example, copper phthalocyanine can be used as the organic compound including an unshared electron pair. The number of electrons of the copper phthalocyanine is an odd number.

[First Metal]

When the number of electrons of the first organic compound including an unshared electron pair is an even number, for example, a composite material of the first organic compound and the metal that belongs to an odd-numbered group in the periodic table can be used for the layer 105X.

For example, manganese (Mn), which is a metal belonging to Group 7, cobalt (Co), which is a metal belonging to Group 9, copper (Cu), silver (Ag), and gold (Au), which are metals belonging to Group 11, aluminum (Al) and indium (In), which are metals belonging to Group 13 are odd-numbered groups in the periodic table. Note that elements belonging to Group 11 have a lower melting point than elements belonging to Group 7 or Group 9 and thus are suitable for vacuum evaporation. In particular, Ag is preferable because of its low melting point. By using a metal having a low reactivity with water or oxygen as the first metal, the moisture resistance of the light-emitting device 550X can be improved.

The use of Ag for the electrode 552X and the layer 105X can increase the adhesion between the layer 105X and the electrode 552X.

When the number of electrons of the first organic compound including an unshared electron pair is an odd number, a composite material of the first organic compound and the first metal that belongs to an even-numbered group in the periodic table can be used for the layer 105X. For example, iron (Fe), which is a metal belonging to Group 8, is an element belonging to an even-numbered group in the periodic table.

[Electride]

For example, a substance obtained by adding electrons at high concentration to an oxide where calcium and aluminum are mixed can be used, for example, as the electron-injection material.

Note that this embodiment can be combined with any of the other embodiments in this specification as appropriate.

Embodiment 5

In this embodiment, a structure of the light-emitting device 550X of one embodiment of the present invention will be described with reference to FIG. 2A.

Figure 2A:
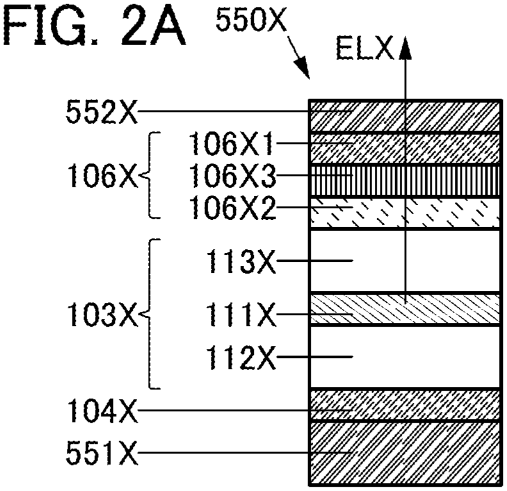
FIGS. 2A and 2B illustrate a structure of a light-emitting device of an embodiment.

FIG. 2A is a cross-sectional view illustrating a structure of a light-emitting device of one embodiment of the present invention.

Structure Example of Light-Emitting Device 550X

The light-emitting device 550X described in this embodiment includes the electrode 551X, the electrode 552X, the unit 103X, and an intermediate layer 106X (see FIG. 2A). The electrode 552X includes a region overlapping with the electrode 551X, and the unit 103X includes a region located between the electrode 551X and the electrode 552X. The intermediate layer 106X includes a region positioned between the electrode 552X and the unit 103X.

Structure Example 1 of Intermediate Layer 106X

The intermediate layer 106X has a function of supplying electrons to the anode side and supplying holes to the cathode side when voltage is applied. The intermediate layer 106X can be referred to as a charge-generation layer.

For example, a hole-injection material that can be used for the layer 104X described in Embodiment 3 can be used for the intermediate layer 106X. Specifically, the composite material can be used for the intermediate layer 106X.

Alternatively, for example, a stacked film in which a film containing the composite material and a film containing a hole-transport material are stacked can be used for the intermediate layer 106X. Note that the film containing a hole-transport material is positioned between the film containing the composite material and the cathode.

Structure Example 2 of Intermediate Layer 106X

A stacked film in which a layer 106X1 and a layer 106X2 are stacked can be used for the intermediate layer 106X. The layer 106X1 includes a region positioned between the unit 103X and the electrode 552X and the layer 106X2 includes a region positioned between the unit 103X and the layer 106X1.

Structure Example of Layer 106X1

For example, a hole-injection material that can be used for the layer 104X described in Embodiment 3 can be used for the layer 106X1. Specifically, the composite material can be used for the layer 106X1. A film having an electrical resistivity greater than or equal to $1\times10^4$ Ω·cm and less than or equal to $1\times10^7$ Ω·cm can be used as the layer 106X1. The electrical resistivity of the layer 106X1 is preferably greater than or equal to $5\times10^4$ Ω·cm and less than or equal to $1\times10^7$ Ω·cm, further preferably greater than or equal to $1\times10^5$ Ω·cm and less than or equal to $1\times10^7$ Ω·cm.

Structure Example of Layer 106X2

For example, a material that can be used for the layer 105X described in Embodiment 4 can be used for the layer 106X2.

Structure Example 3 of Intermediate Layer 106X

A stacked film in which the layer 106X1, the layer 106X2, and a layer 106X3 are stacked can be used for the intermediate layer 106X. The layer 106X3 includes a region positioned between the layer 106X1 and the layer 106X2.

Structure Example of Layer 106X3

For example, an electron-transport material can be used for the layer 106X3. The layer 106X3 can be referred to as an electron-relay layer. With the layer 106X3, a layer that is on the anode side and in contact with the layer 106X3 can be distanced from a layer that is on the cathode side and in contact with the layer 106X3. Interaction between the layer that is on the anode side and in contact with the layer 106X3 and the layer that is on the cathode side and in contact with the layer 106X3 can be reduced. Electrons can be smoothly supplied to the layer that is on the anode side and in contact with the layer 106X3.

A substance whose LUMO level is positioned between the LUMO level of an electron-accepting substance contained in the layer 106X1 and the LUMO level of the substance contained in the layer 106X2 can be suitably used for the layer 106X3.

For example, a material having a LUMO level in a range higher than or equal to −5.0 eV, preferably higher than or equal to −5.0 eV and lower than or equal to −3.0 eV, can be used for the layer 106X3.

Specifically, a phthalocyanine-based material can be used for the layer 106X3. For example, copper(II) phthalocyanine (abbreviation: CuPc) or a metal complex having a metal-oxygen bond and an aromatic ligand can be used for the layer 106X3.

Note that this embodiment can be combined with any of the other embodiments in this specification as appropriate.

Embodiment 6

In this embodiment, a structure of the light-emitting device 550X of one embodiment of the present invention will be described with reference to FIG. 2B.

Figure 2B:
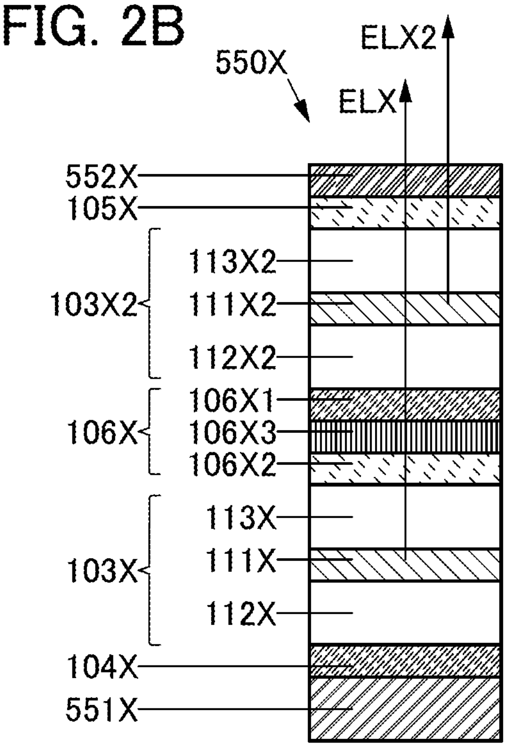

FIG. 2B is a cross-sectional view illustrating a structure of a light-emitting device of one embodiment of the present invention, which is different from that in FIG. 2A.

Structure Example of Light-Emitting Device 550X

The light-emitting device 550X described in this embodiment includes the electrode 551X, the electrode 552X, the unit 103X, the intermediate layer 106, and a unit 103X2 (see FIG. 2B).

The unit 103X is located between the electrode 552X and the electrode 551X, and the intermediate layer 106X is located between the electrode 552X and the unit 103X.

The unit 103X2 is positioned between the electrode 552X and the intermediate layer 106X. The unit 103X2 has a function of emitting light ELX2.

In other words, the light-emitting device 550X includes the stacked units between the electrode 551X and the electrode 552X. The number of stacked units is not limited to two and may be three or more. A structure including the stacked units positioned between the electrode 551X and the electrode 552X and the intermediate layer 106X positioned between the units is referred to as a stacked light-emitting device or a tandem light-emitting device in some cases.

This structure enables high luminance emission while the current density is kept low. Reliability can be improved. The driving voltage can be reduced in comparison with that of the light-emitting device with the same luminance. The power consumption can be reduced.

Structure Example 1 of Unit 103X2

The unit 103X2 includes a layer 111X2, a layer 112X2, and a layer 113X2. The layer 111X2 is positioned between the layer 112X2 and the layer 113X2.

The structure that can be employed for the unit 103X can be employed for the unit 103X2. For example, the same structure as the unit 103X can be employed for the unit 103X2.

Structure Example 2 of Unit 103X2

The structure that is different from the structure of the unit 103X can be employed for the unit 103X2. For example, the unit 103X2 can have a structure emitting light whose hue is different from that of light emitted from the unit 103X.

Specifically, a stack including the unit 103X emitting red light and green light and the unit 103X2 emitting blue light can be employed. With this structure, a light-emitting device emitting light of a desired color can be provided. A light-emitting device emitting white light can be provided, for example.

Structure Example of Intermediate Layer 106X

The intermediate layer 106X has a function of supplying electrons to one of the unit 103X and the unit 103X2 and supplying holes to the other. For example, the intermediate layer 106X described in Embodiment 5 can be used.

Fabrication Method of Light-Emitting Device 550X

For example, each of the electrode 551X, the electrode 552X, the unit 103X, the intermediate layer 106X, and the unit 103X2 can be formed by a dry process, a wet process, an evaporation method, a droplet discharging method, a coating method, a printing method, or the like. A formation method may differ between components of the device.

Specifically, the light-emitting device 550X can be fabricated with a vacuum evaporation machine, an ink-jet machine, a coating machine such as a spin coater, a gravure printing machine, an offset printing machine, a screen printing machine, or the like.

For example, the electrode can be formed by a wet process or a sol-gel method using a paste of a metal material. In addition, an indium oxide-zinc oxide film can be formed by a sputtering method using a target obtained by adding zinc oxide to indium oxide at a concentration higher than or equal to 1 wt % and lower than or equal to 20 wt %. Furthermore, an indium oxide film containing tungsten oxide and zinc oxide (IWZO) can be formed by a sputtering method using a target containing, with respect to indium oxide, tungsten oxide at a concentration higher than or equal to 0.5 wt % and lower than or equal to 5 wt % and zinc oxide at a concentration higher than or equal to 0.1 wt % and lower than or equal to 1 wt %.

Note that this embodiment can be combined with any of the other embodiments in this specification as appropriate.

Embodiment 7

In this embodiment, structures of a display device of one embodiment of the present invention will be described with reference to FIGS. 3A and 3B and FIGS. 4A and 4B.

Figure 3A:
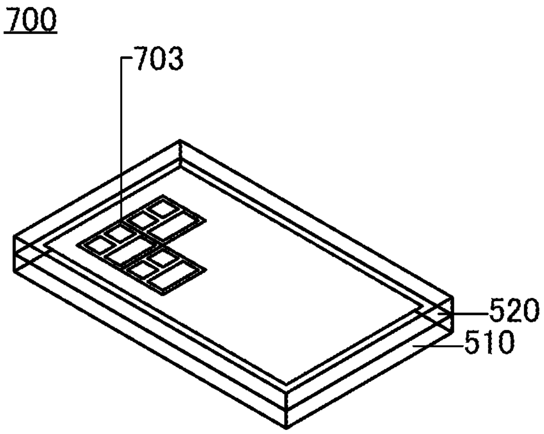
FIGS. 3A to 3C illustrate a structure of a display device of an embodiment.
Figure 3B:
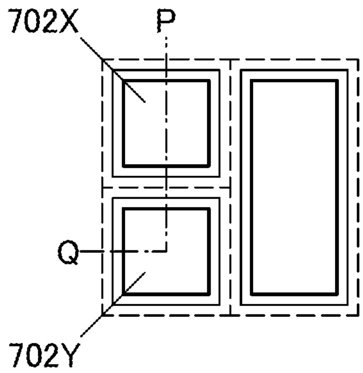

FIG. 3A is schematic view illustrating a structure of a display device of one embodiment of the present invention, and FIG. 3B is a front view illustrating a structure of a pixel 703 in the display device.

Figure 4A:
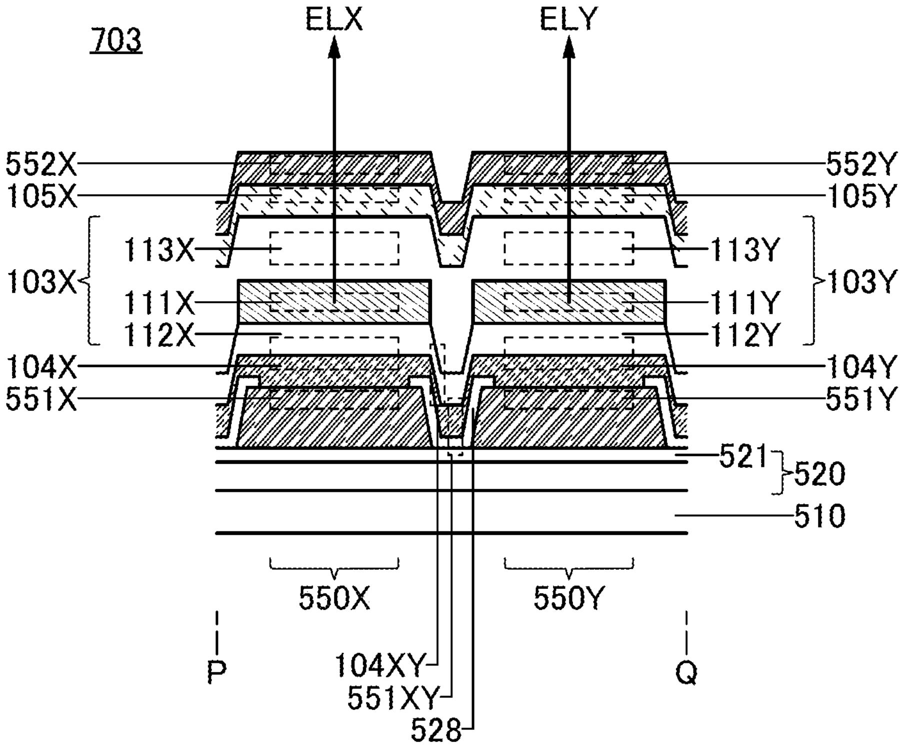
FIGS. 4A and 4B each illustrate a structure of a display device of an embodiment.
Figure 4B:
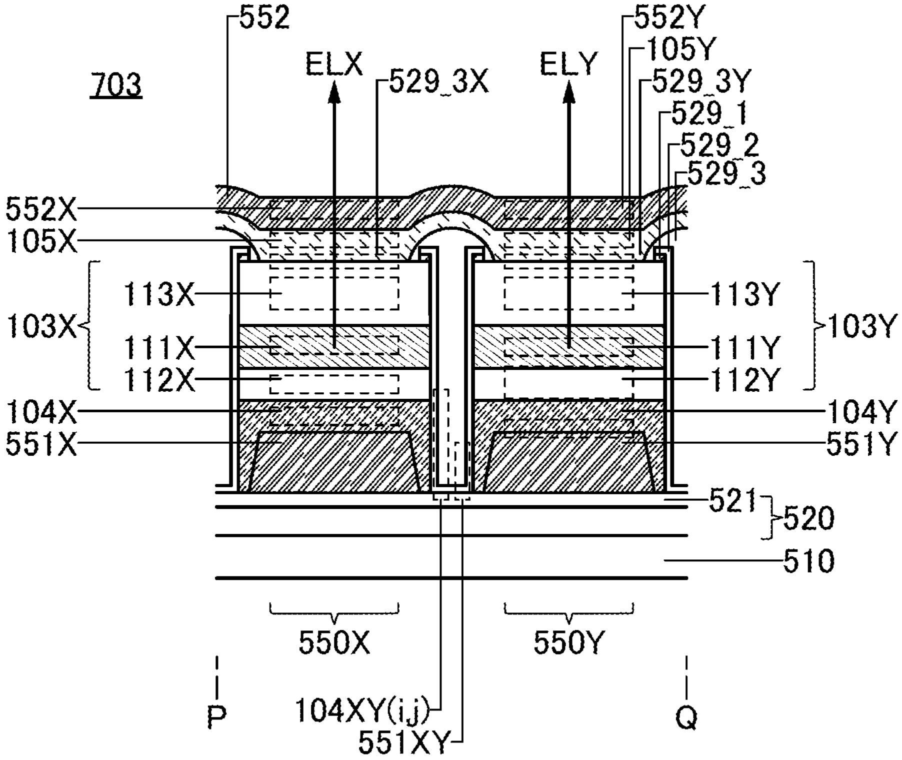

FIG. 4A is a cross-sectional view taken along a cutting plane line P-Q in FIG. 3B, and FIG. 4B is a cross-sectional view illustrating a structure different from that in FIG. 4A.

Structure Example 1 of Display Device 700

A display device 700 described in this embodiment includes the pixel 703. The pixel 703 includes the light-emitting device 550X and a light-emitting device 550Y (see FIG. 4A). The light-emitting device 550Y is adjacent to the light-emitting device 550X.

Note that the display device 700 includes a substrate 510 and a functional layer 520. The functional layer 520 includes an insulating film 521, and the light-emitting devices 550X and 550Y are formed over the insulating film 521. The functional layer 520 is positioned between the substrate 510 and the light-emitting device 550X.

Structure Example of Light-Emitting Device 550X

The light-emitting device 550X includes the electrode 551X, the electrode 552X, and the unit 103X. The electrode 552X overlaps with the electrode 551X, and the unit 103X is located between the electrode 552X and the electrode 551X. The light-emitting device 550X includes the layer 104X and the layer 105X, the layer 104X is located between the electrode 551X and the unit 103X, and the layer 105X is located between the electrode 552X and the unit 103X. For example, the unit 103X includes the layer 111X, the layer 112X, and the layer 113X.

For example, the structure described in any one of Embodiments 2 to 6 can be used as the light-emitting device 550X.

Structure Example of Light-Emitting Device 550Y

The light-emitting device 550Y includes an electrode 551Y, an electrode 552Y, and a unit 103Y. The electrode 552Y overlaps with the electrode 551Y, and the unit 103Y is located between the electrode 551Y and the electrode 552Y. The light-emitting device 550Y includes the layer 104Y and the layer 105Y, the layer 104Y is located between the electrode 551Y and the unit 103Y, and the layer 105Y is located between the electrode 552Y and the unit 103Y.

The electrode 551Y is adjacent to the electrode 551X and a space 551XY is positioned between the electrode 551Y and the electrode 551X.

Note that part of a structure that can be employed as the structure of the light-emitting device 550X can be employed as the structure of the light-emitting device 550Y. For example, part of a conductive film that can be used for the electrode 552X can be used for the electrode 552Y. A structure that can be employed for the electrode 551X can be employed for the electrode 551Y. A structure that can be used for the layer 104X and a structure that can be used for the layer 105X can be respectively employed for the layer 104Y and the layer 105Y. Thus, common structures can be formed in one step in some cases. In addition, the manufacturing process can be simplified.

Moreover, the light-emitting device 550Y can have a structure emitting light whose hue is the same as that of light emitted from the light-emitting device 550X.

For example, both the light-emitting device 550X and the light-emitting device 550Y may emit white light. A coloring layer is provided to overlap with the light-emitting device 550X, whereby light of a predetermined hue can be extracted from white light. Another coloring layer is provided to overlap with the light-emitting device 550Y, whereby light of another predetermined hue can be extracted from white light.

For example, both the light-emitting device 550X and the light-emitting device 550Y may emit blue light. A color conversion layer is provided to overlap with the light-emitting device 550X, whereby blue light can be converted into light of a predetermined hue. Another coloring layer is provided to overlap with the light-emitting device 550Y, whereby blue light can be converted into light of another predetermined hue. Blue light can be converted into green light or red light, for example.

Moreover, the light-emitting device 550Y can have a structure emitting light whose hue is different from that of light emitted from the light-emitting device 550X. For example, the hue of light ELY emitted from the unit 103Y can be differentiated from that of the light ELX.

Structure Example of Unit 103Y

The light-emitting device 550Y is different from the light-emitting device 550X in the structure of a layer 111Y. Specifically, a light-emitting material is different. Different parts will be described in detail below, and the above description is referred to for parts having the same structure as the above.

Structure Example of Layer 111Y

For example, the layer 111Y contains a light-emitting material. Alternatively, a light-emitting material and a host material can be used for the layer 111Y. The layer 111Y can be referred to as a light-emitting layer. The layer 111Y is preferably provided in a region where holes and electrons are recombined. This allows efficient conversion of energy generated by recombination of carriers into light and emission of the light.

Furthermore, the layer 111Y is preferably provided apart from a metal used for the electrode or the like. In that case, a quenching phenomenon caused by the metal used for the electrode or the like can be inhibited.

It is preferable that a distance from an electrode or the like having reflectivity to the layer 111Y be adjusted and the layer 111Y be placed in an appropriate position in accordance with an emission wavelength. With this structure, the amplitude can be increased by utilizing an interference phenomenon between light reflected by the electrode or the like and light emitted from the layer 111Y. Light with a predetermined wavelength can be intensified and the spectrum of the light can be narrowed. In addition, bright light emission colors with high intensity can be obtained. In other words, the layer 111Y is placed in an appropriate position, for example, between electrodes and the like, and thus a microcavity structure can be formed.

For example, a fluorescent substance, a phosphorescent substance, or a substance exhibiting thermally activated delayed fluorescence (TADF) (also referred to as a TADF material) can be used for the light-emitting material. Thus, energy generated by recombination of carriers can be released as the light ELY from the light-emitting material (see FIG. 4A).

[Fluorescent Substance]

A fluorescent substance can be used for the layer 111X. For example, the following fluorescent substances can be used for the layer 111X. Note that fluorescent substances that can be used for the layer 111X are not limited to the following, and a variety of known fluorescent substances can be used.

Specifically, any of the following fluorescent substances can be used: 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N-diphenyl-N,N-bis[4-(9-phenyl-9H-fluoren-9-yl)phenyl]pyrene-1,6-diamine (abbreviation: 1,6FLPAPrn), N,N-bis(3-methylphenyl)-N,N-bis[3-(9-phenyl-9H-fluoren-9-yl)phenyl]pyrene-1,6-diamine (abbreviation: 1,6mMemFLPAPrn), N,N-bis[4-(9H-carbazol-9-yl)phenyl]-N,N-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), perylene, 2,5,8,11-tetra(tert-butyl)perylene (abbreviation: TBP), 4-(10-phenyl-9-anthryl)-4'-(9-phenyl-9H-carbazol-3-yl)triphenylamine (abbreviation: PCBAPA), N,N''-(2-tert-butylanthracene-9,10-diyldi-4,1-phenylene)bis(N,N',N'-triphenyl-1,4-phenylenediamine) (abbreviation: DPABPA), N,9-diphenyl-N-[4-(9,10-diphenyl-2-anthryl)phenyl]-9H-carbazol-3-amine (abbreviation: 2PCAPPA), N,N'-(pyrene-1,6-diyl)bis[(6,N-diphenylbenzo[b]naphtho[1,2-d]furan)-8-amine](abbreviation: 1,6BnfAPrn-03), 3,10-bis[N-(9-phenyl-9H-carbazol-2-yl)-N-phenylamino]naphtho[2,3-b;6,7-b']bisbenzofuran (abbreviation: 3,10PCA2Nbf(IV)-02), 3,10-bis[N-(dibenzofuran-3-yl)-N-phenylamino]naphtho[2,3-b;6,7-b']bisbenzofuran (abbreviation: 3,10FrA2Nbf(IV)-02), and the like.

Condensed aromatic diamine compounds typified by pyrenediamine compounds such as 1,6FLPAPrn, 1,6mMemFLPAPrn, and 1,6BnfAPrn-03 are particularly preferable because of their high hole-trapping properties, high emission efficiency, or high reliability.

Other examples of fluorescent substances include N-[4-(9,10-diphenyl-2-anthryl)phenyl]-N,N','N-triphenyl-1,4-phenylenediamine (abbreviation: 2DPAPPA), N,N,N',N', N ,N'',N''',N'''-octaphenyldibenzo[g,p]chrysene-2,7,10,15-tetraamine (abbreviation: DBC1), coumarin 30, N-(9,10-diphenyl-2-anthryl)-N,9-diphenyl-9H-carbazol-3-amine (abbreviation: 2PCAPA), N-[9,10-bis(biphenyl-2-yl)-2-anthryl]-N,9-diphenyl-9H-carbazol-3-amine (abbreviation: 2PCABPhA), N-(9,10-diphenyl-2-anthryl)-N,N','N-triphenyl-1,4-phenylenediamine (abbreviation: 2DPAPA), N-[9,10-bis(biphenyl-2-yl)-2-anthryl]-N,N',N'-triphenyl-1,4-phenylenediamine (abbreviation: 2DPABPhA), 9,10-bis(biphenyl-2-yl)-N-[4-(9H-carbazol-9-yl)phenyl]-N-phenylanthracene-2-amine (abbreviation: 2YGABPhA), N,N,9-triphenylanthracene-9-amine (abbreviation: DPhAPhA), coumarin 545T, N,N-diphenylquinacridone (abbreviation: DPQd), rubrene, and 5,12-bis(1,1'-biphenyl-4-yl)-6,11-diphenyltetracene (abbreviation: BPT).

Other examples of fluorescent substances include 2-(2-{2-[4-(dimethylamino)phenyl]ethenyl}-6-methyl-4H-pyran-4-ylidene)propanedinitrile (abbreviation: DCM1), 2-{2-methyl-6-[2-(2,3,6,7-tetrahydro-1H,5H-benzo[ij]quinolizin-9-yl)ethenyl]-4H-pyran-4-ylidene}propanedinitrile (abbreviation: DCM2), N,N,N',N'-tetrakis(4-methylphenyl)tetracene-5,11-diamine (abbreviation: p-mPhTD), 7,14-diphenyl-N,N,N',N'-tetrakis(4-methylphenyl)acenaphtho[1,2-a]fluoranthene-3,10-diamine (abbreviation: p-mPhAFD), 2-{2-isopropyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTI), 2-{2-tert-butyl-6-[2-(1,1,7,7-tetramethyl-2,3,6,7-tetrahydro-1H,5H-benzo[ij]quinolizin-9-yl)ethenyl]-4H-pyran-4-ylidene}propanedinitrile (abbreviation: DCJTB), 2-(2,6-bis{2-[4-(dimethylamino)phenyl]ethenyl}-4H-pyran-4-ylidene)propanedinitrile (abbreviation: BisDCM), and 2-{2,6-bis[2-(8-methoxy-1,1,7,7-tetramethyl-2,3,6,7-tetrahydro-1H,5H-benzo[ij]quinolizin-9-yl)ethenyl]-4H-pyran-4-ylidene}propanedinitrile (abbreviation: BisDCJTM).

[Phosphorescent Substance]

A phosphorescent substance can be used for the layer 111X. For example, phosphorescent substances described below as examples can be used for the layer 111X. Note that phosphorescent substances that can be used for the layer 111X are not limited to the following, and a variety of known phosphorescent substances can be used for the layer 111X.

For example, any of the following can be used for the layer 111X: an organometallic iridium complex having a 4H-triazole skeleton, an organometallic iridium complex having a 1H-triazole skeleton, an organometallic iridium complex having an imidazole skeleton, an organometallic iridium complex having a phenylpyridine derivative with an electron-withdrawing group as a ligand, an organometallic iridium complex having a pyrimidine skeleton, an organometallic iridium complex having a pyrazine skeleton, an organometallic iridium complex having a pyridine skeleton, a rare earth metal complex, a platinum complex, and the like.

[Phosphorescent Substance (Blue)]

As an organometallic iridium complex having a 4H-triazole skeleton or the like, tris{2-[5-(2-methylphenyl)-4-(2,6-dimethylphenyl)-4H-1,2,4-triazol-3-yl-κ$N^2$]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), or the like can be used.

As an organometallic iridium complex having a 1H-triazole skeleton or the like, tris[3-methyl-1-(2-methylphenyl)-5-phenyl-1H-1,2,4-triazolato]iridium(III) (abbreviation: [Ir(Mptz1-mp)$_3$]), tris(1-methyl-5-phenyl-3-propyl-1H-1,2,4-triazolato)iridium(III) (abbreviation: [Ir(Prptz1-Me)$_3$]), or the like can be used.

As an organometallic iridium complex having an imidazole skeleton or the like, fac-tris[1-(2,6-diisopropylphenyl)-2-phenyl-1H-imidazole]iridium(III) (abbreviation: [Ir(iPrpim)$_3$]), tris[3-(2,6-dimethylphenyl)-7-methylimidazo[1,2-f]phenanthridinato]iridium(III) (abbreviation: [Ir(dmpimpt-Me)$_3$]), or the like can be used.

As an organometallic iridium complex having a phenylpyridine derivative with an electron-withdrawing group as a ligand, or the like, bis[2-(4',6'-difluorophenyl)pyridinato-N,$C^{2'}$]iridium(III) tetrakis(1-pyrazolyl)borate (abbreviation: FIr6), bis[2-(4',6'-difluorophenyl)pyridinato-N,$C^{2'}$]iridium(III) picolinate (abbreviation: FIrpic), bis{2-[3',5'-bis(trifluoromethyl)phenyl]pyridinato-N,$C^{2'}$}iridium(III) picolinate (abbreviation: Ir($CF_3$ppy)$_2$(pic)), bis[2-(4',6'-difluorophenyl)pyridinato-N,$C^{2'}$]iridium(III) acetylacetonate (abbreviation: FIracac), or the like can be used.

These substances are compounds exhibiting blue phosphorescence and having an emission wavelength peak at 440 nm to 520 nm.

[Phosphorescent Substance (Green)]

As an organometallic iridium complex having a pyrimidine skeleton or the like, tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)]), (acetylacetonato)bis[5-methyl-6-(2-methylphenyl)-4-phenylpyrimidinato]iridium(III) (abbreviation: [Ir(mpmppm)$_2$(acac)]), (acetylacetonato)bis(4,6-diphenylpyrimidinato)iridium(III) (abbreviation: [Ir(dppm)$_2$(acac)]), or the like can be used.

As an organometallic iridium complex having a pyrazine skeleton or the like, (acetylacetonato)bis(3,5-dimethyl-2-phenylpyrazinato)iridium(III) (abbreviation: [Ir(mppr-Me)$_2$(acac)]), (acetylacetonato)bis(5-isopropyl-3-methyl-2-phenylpyrazinato)iridium(III) (abbreviation: [Ir(mppr-iPr)$_2$(acac)]), or the like can be used.

As an organometallic iridium complex having a pyridine skeleton or the like, tris(2-phenylpyridinato-N,$C^{2'}$)iridium(III) (abbreviation: [Ir(ppy)$_3$]), bis(2-phenylpyridinato-N,$C^{2'}$)iridium(III) acetylacetonate (abbreviation: [Ir(ppy)$_2$(acac)]), bis(benzo[h]quinolinato)iridium(III) acetylacetonate (abbreviation: [Ir(bzq)$_2$(acac)]), tris(benzo[h]quinolinato)iridium(III) (abbreviation: [Ir(bzq)$_3$]), tris(2-phenylquinolinato-N,$C^{2'}$)iridium(III) (abbreviation: [Ir(pq)$_3$]), bis(2-phenylquinolinato-N,$C^{2'}$)iridium(III) acetylacetonate (abbreviation: [Ir(pq)$_2$(acac)]), [2-$d_3$-methyl-8-(2-pyridinyl-κN)benzofuro[2,3-b]pyridine-κC]bis[2-(5-$d_3$-methyl-2-pyridinyl-κ$N^2$)phenyl-κC]iridium(III) (abbreviation: [Ir(5mppy-$d_3$)$_2$(mbfpypy-$d_3$)]), [2-$d_3$-methyl-(2-pyridinyl-xN)benzofuro[2,3-b]pyridine-κC]bis[2-(2-pyridinyl-κN)phenyl-κC]iridium(III) (abbreviation: [Ir(ppy)$_2$(mbfpypy-$d_3$)]), or the like can be used.

Examples of a rare earth metal complex are tris(acetylacetonato) (monophenanthroline)terbium(III) (abbreviation: [Tb(acac)$_3$(Phen)]), and the like.

These are compounds that mainly exhibit green phosphorescence and have an emission wavelength peak at 500 nm to 600 nm. Note that an organometallic iridium complex having a pyrimidine skeleton has distinctively high reliability or emission efficiency.

[Phosphorescent Substance (Red)]

As an organometallic iridium complex having a pyrimidine skeleton or the like, (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl)pyrimidinato](dipivaloylmethanato)iridium(III) (abbreviation: [Ir $(5mdppm)_2(dpm)$]), bis[4,6-di(naphthalen-1-yl)pyrimidinato] (dipivaloylmethanato)iridium(III) (abbreviation: [Ir $(d1npm)_2(dpm)$]), or the like can be used.

As an organometallic iridium complex having a pyrazine skeleton or the like, (acetylacetonato)bis(2,3,5-triphenylpyrazinato)iridium(III) (abbreviation: [Ir$(tppr)_2(acac)$]), bis(2,3,5-triphenylpyrazinato)(dipivaloylmethanato)iridium (III) (abbreviation: [Ir$(tppr)_2(dpm)$]), (acetylacetonato)bis [2,3-bis(4-fluorophenyl)quinoxalinato]iridium(III) (abbreviation: [Ir$(Fdpq)_2(acac)$]), or the like can be used.

As an organometallic iridium complex having a pyridine skeleton or the like, tris(1-phenylisoquinolinato-N,$C^{2'}$) iridium(III) (abbreviation: [Ir$(piq)_3$]), bis(1-phenylisoquinolinato-N,$C^{2'}$)iridium(III) acetylacetonate (abbreviation: [Ir $(piq)_2(acac)$]), or the like can be used.

As a rare earth metal complex or the like, tris(1,3-diphenyl-1,3-propanedionato)(monophenanthroline)europium(III) (abbreviation: [Eu$(DBM)_3$(Phen)]), tris[1-(2-thenoyl)-3,3,3-trifluoroacetonato] (monophenanthroline) europium(III) (abbreviation: [Eu$(TTA)_3$(Phen)]), or the like can be used.

As a platinum complex or the like, 2,3,7,8,12,13,17,18-octaethyl-21H,23H-porphyrin platinum(II) (abbreviation: PtOEP) or the like can be used.

These are compounds that exhibit red phosphorescence and have an emission peak at 600 nm to 700 nm. Furthermore, the organometallic iridium complexes having a pyrazine skeleton can provide red light emission with chromaticity favorably used for display devices.

[Substance Exhibiting Thermally Activated Delayed Fluorescence (TADF)]

A TADF material can be used for the layer 111X. When a TADF material is used as the light-emitting substance, the S1 level of a host material is preferably higher than that of the TADF material. In addition, the T1 level of the host material is preferably higher than that of the TADF material.

For example, the TADF material that can be used for the host material can be used as the light-emitting material.

Structure Example 2 of Display Device 700

The display device 700 described in this embodiment includes an insulating film 528 (see FIG. 4A).

Structure Example of Insulating Film 528

The insulating film 528 has openings; one opening overlaps with the electrode 551X and the other opening overlaps with the electrode 551Y. The insulating film 528 overlaps with the space 551XY.

Structure Example of Space 551XY

The space 551XY positioned between the electrode 551X and the electrode 551Y has a groove-like shape, for example. Thus, a step is formed along the groove. A deposited film is partly split or thinned between the space 551XY and the electrode 551X.

When an anisotropic deposition method such as a thermal evaporation method is employed, a split or thinned portion is formed along the step in a region 104XY positioned between the layer 104X and the layer 104Y.

Thus, current flowing through the region 104XY can be suppressed, for example. Moreover, current flowing between the layer 104X and the layer 104Y can be suppressed. Furthermore, a phenomenon in which the light-emitting device 550Y that is adjacent to the light-emitting device 550X unintentionally emits light in accordance with the operation of the light-emitting device 550X can be suppressed.

Structure Example 3 of Display Device 700

The display device 700 described in this embodiment includes the light-emitting device 550X and the light-emitting device 550Y (see FIG. 4B). The light-emitting device 550Y is adjacent to the light-emitting device 550X.

The display device 700 is different from the display device 700 described with reference to FIG. 4A in that part or the whole of the structure of the light-emitting device 550X or the light-emitting device 550Y is removed from a portion overlapping with the space 551XY and a film 529_1, a film 529_2, and a film 529_3 are provided instead of the insulating film 528. Different parts will be described in detail below, and the above description is referred to for parts having the same structure as the above.

In this specification and the like, a device formed using a metal mask or a fine metal mask (FMM) may be referred to as a device having a metal mask (MM) structure. In this specification and the like, a device formed without using a metal mask or an FMM may be referred to as a device having a metal maskless (MML) structure.

Structure Example of Film 529_1

The film 529_1 has openings; one opening overlaps with the electrode 551X and another opening overlaps with the electrode 551Y (see FIG. 4B). The film 529_1 has an opening overlapping with the space 551XY. For example, a film containing a metal, a metal oxide, an organic material, or an inorganic insulating material can be used as the film 529_1. Specifically, a light-blocking metal film can be used. This can block light emitted in the processing process to inhibit the characteristics of the light-emitting device from being degraded by the light.

Structure Example of Insulating Film 529_2

The insulating film 529_2 has openings; one opening overlaps with the electrode 551X and the other opening overlaps with the electrode 551Y. The film 529_2 overlaps with the space 551XY.

The film 529_2 includes a region in contact with the layer 104X and the unit 103X.

The film 529_2 includes a region in contact with the layer 104Y and the unit 103Y.

The film 5292 includes a region in contact with the insulating film 521. The film 529_2 can be formed by an atomic layer deposition (ALD) method, for example. Thus, a film with favorable coverage can be formed. Specifically, a metal oxide film or the like can be used as the film 529_2. Aluminum oxide can be used, for example.

Structure Example of Film 529_3

The film 529_3 has openings; an opening 529_3X overlaps with the electrode 551X and an opening 529_3Y overlaps with the electrode 551Y. A groove formed in a region overlapping with the space 551XY is filled with the film 529_3. The film 529_3 can be formed using a photosensitive resin, for example. Specifically, an acrylic resin or the like can be used.

Thus, the layer 104X can be electrically isolated from the layer 104Y, for example. In addition, current flowing through the region 104XY can be suppressed, for example. Furthermore, a phenomenon in which the light-emitting device 550Y that is adjacent to the light-emitting device 550X unintentionally emits light in accordance with the operation of the light-emitting device 550X can be suppressed. A step formed between a top surface of the unit 103X and a top surface of the unit 103Y can be reduced. Occurrence of a phenomenon in which a split or thinned portion due to the step is formed between the electrode 552X and the electrode 552Y can be suppressed. A continuous conductive film can be used for the electrode 552X and the electrode 552Y.

Note that part or the whole of the structure that can be employed for the light-emitting device 550X or the light-emitting device 550Y can be removed from a portion overlapping with the space 551XY by using a photolithography technique, for example.

Specifically, in a first step, a first film to be the unit 103Y later is formed over the space 551XY.

In a second step, a second film to be the film 529_1 later is formed over the first film.

In a third step, an opening overlapping with the space 551XY is formed in the second film by a photolithography method.

In a fourth step, part of the first film is removed using the second film as a resist. For example, the first film is removed from a region overlapping with the space 551XY by a dry etching method. Specifically, the first film can be removed using an oxygen-containing gas. Accordingly, a groove-like structure is formed in the region overlapping with the space 551XY.

In a fifth step, for example, a third film that is to be the film 5292 is formed by an atomic layer deposition (ALD) method over the second film.

In a sixth step, the film 529_3 is formed with the use of a photosensitive polymer, for example. Accordingly, the groove-like structure formed in the region overlapping with the space 551XY is filled with the film 529_3.

In a seventh step, an opening overlapping with the electrode 551Y is formed in 25 the second film and the third film by an etching method, whereby the film 529_2 and the film 529_1 are formed.

In an eighth step, the layer 105Y is formed over the unit 103Y and the electrode 552Y is formed over the layer 105Y.

Note that this embodiment can be combined with any of the other embodiments in this specification as appropriate.

Embodiment 8

In this embodiment, structures of a display device 700 of one embodiment of the present invention will be described with reference to FIG. 3C and FIGS. 5A and 5B.

Figure 3C:
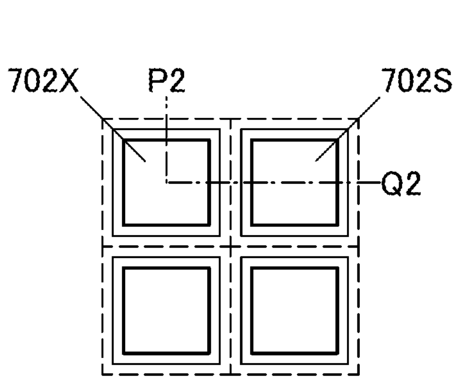

FIG. 3C is a front view illustrating a structure of the pixel 703 in the display device 700 of one embodiment of the present invention.

Figure 5A:
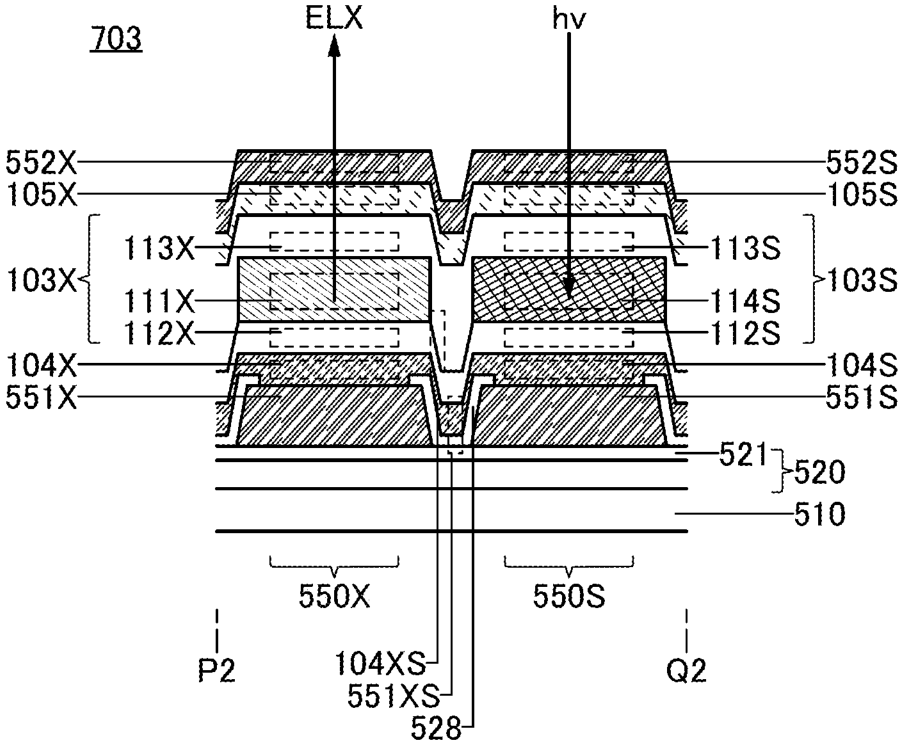
FIGS. 5A and 5B each illustrate a structure of a display device of an embodiment.
Figure 5B:
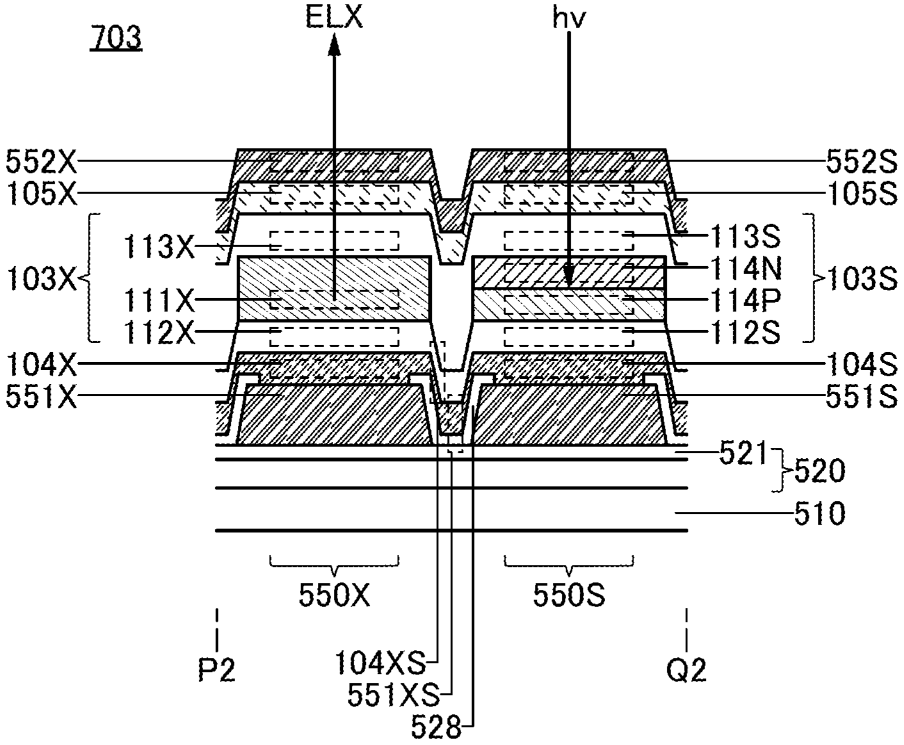

FIG. 5A is a cross-sectional view taken along a cutting plane line P-Q in FIG. 3C, and FIG. 5B is a cross-sectional view illustrating a structure different from that in FIG. 5A.

Structure Example 1 of Display Device 700

The display device 700 described in this embodiment includes the pixel 703. The pixel 703 includes the light-emitting device 550X and a photoelectric conversion device 550S (see FIG. 5A). The photoelectric conversion device 550S is adjacent to the light-emitting device 550X.

The display device 700 includes the substrate 510 and the functional layer 520. The functional layer 520 includes an insulating film 521, and the light-emitting device 550X and the photoelectric conversion device 550S are formed over the insulating film 521. The functional layer 520 is positioned between the substrate 510 and the light-emitting device 550X.

Structure Example of Light-Emitting Device 550X

The light-emitting device 550X includes the electrode 551X, the electrode 552X, and the unit 103X. The electrode 552X overlaps with the electrode 551X, and the unit 103X is located between the electrode 552X and the electrode 551X. The light-emitting device 550X includes the layer 104X and the layer 105X, the layer 104X is located between the electrode 551X and the unit 103X, and the layer 105X is located between the electrode 552X and the unit 103X.

For example, the light-emitting device 550X described in any one of Embodiments 2 to 6 can be used as the light-emitting device 550X.

Structure Example 1 of Photoelectric Conversion Device 550S

The photoelectric conversion device 550S includes an electrode 551S, an electrode 552S, and a unit 103S. The electrode 552S overlaps with the electrode 551S, and the unit 103S is located between the electrode 551S and the electrode 552S. The photoelectric conversion device 550S includes a layer 104S and a layer 105S. The layer 104S is located between the unit 103S and the electrode 551S, and the layer 105S is located between the electrode 552S and the unit 103S.

The electrode 551S is adjacent to the electrode 551X, and a space 551XS is positioned between the electrode 551S and the electrode 551X.

Note that part of a structure that can be employed as a structure of the light-emitting device 550X described in any one of Embodiments 2 to 6 can be employed as a structure of the photoelectric conversion device 550S. For example, part of a conductive film that can be used for the electrode 552X can be used for the electrode 552S. A structure that can be employed for the electrode 551X can be employed for the electrode 551S. A structure that can be used for the layer 104X and a structure that can be used for the layer 105X can be respectively employed for the layer 104S and the layer 105S. Thus, the structure can be employed in common. In addition, the manufacturing process can be simplified.

Note that the photoelectric conversion device 550S is different from the light-emitting device 550X in that the unit 103S having a function of converting light into current is included instead of the unit 103X having a function of emitting light. Different parts will be described in detail below, and the above description is referred to for parts having the same structure as the above.

Structure Example 1 of Unit 103S

The unit 103S has a single-layer structure or a stacked-layer structure. The unit 103S can include, for example, a layer selected from functional layers such as a photoelectric conversion layer, a hole-transport layer, an electron-transport layer, and a carrier-blocking layer.

The unit 103S includes a layer 114S, a layer 112S, and a layer 113S, for example (see FIG. 5A). The layer 114S is located between the layer 112S and the layer 113S. Note that the layer 112S is located between the electrode 551S and the layer 114S, and the layer 113S is located between the electrode 552S and the layer 114S.

Note that the unit 103S has a function of absorbing light hv and supplying electrons to one electrode and supplying holes to the other. For example, the unit 103S supplies holes to the electrode 551S and supplies electrons to the electrode 552S.

Note that part of a structure that can be employed as a structure of the unit 103X described in Embodiment 2 can be employed as a structure of the unit 103S. For example, a structure that can be employed for the layer 112X and a structure that can be employed for the layer 113X can be respectively employed for the layer 112S and the layer 113S. Thus, the structure can be employed in common. In addition, the manufacturing process can be simplified.

Structure Example 1 of Layer 114S

In addition, the layer 114S can be referred to as a photoelectric conversion layer. The layer 114S absorbs the light hv, supplies electrons to a layer in contact with one side of the layer 114S, and supplies holes to a layer in contact with the other side of the layer 114S. For example, the layer 114S supplies holes to the layer 112S, and supplies electrons to the layer 113S. For example, a material that can be used for an organic solar cell can be used for the layer 114S. Specifically, an electron-accepting material and an electron-donating material can be used for the layer 114S.

[Example of Electron-Accepting Material]

As the electron-accepting material, a fullerene derivative or a non-fullerene electron acceptor can be used, for example.

As the electron-accepting material, a $C_{60}$ fullerene, a $C_{70}$ fullerene, [6,6]-phenyl-$C_{71}$-butyric acid methyl ester (abbreviation: PC71BM), [6,6]-phenyl-$C_{61}$-butyric acid methyl ester (abbreviation: PC61BM), 1',1",4',4"-tetrahydro-di[1,4]methanonaphthaleno[1,2:2',3',56,60:2",3" ][5,6]fullerene-$C_{60}$ (abbreviation: ICBA), or the like can be used.

As the non-fullerene electron acceptor, a perylene derivative, a compound having a dicyanomethyleneindanone group, or the like can be used. For example, N,N-dimethyl-3,4,9,10-perylenedicarboximide (abbreviation: Me-PTCDI) can be used.

[Example of Electron-Donating Material]

As the electron-donating material, a phthalocyanine compound, a tetracene derivative, a quinacridone derivative, a rubrene derivative, or the like can be used.

As the electron-donating material, copper(II) phthalocyanine (abbreviation: CuPc), tin(II) phthalocyanine (SnPc), zinc phthalocyanine (ZnPc), tetraphenyldibenzoperiflanthene (DBP), rubrene, or the like can be used.

Structure Example 2 of Layer 114S

The layer 114S can have a single-layer structure or a stacked-layer structure, for example. Specifically, the layer 114S can have a bulk heterojunction structure. Alternatively, the layer 114S can have a heterojunction structure.

[Structure Example of Mixed Material]

A mixed material containing an electron-accepting material and an electron-donating material can be used for the layer 114S, for example (see FIG. 5A). Note that a structure in which such a mixed material containing an electron-accepting material and an electron-donating material is used for the layer 114S can be referred to as a bulk heterojunction structure.

Specifically, a mixed material containing a $C_{70}$ fullerene and DBP can be used for the layer 114S.

[Example of Heterojunction Structure]

A layer 114N and a layer 114P can be used for the layer 114S (see FIG. 5B). The layer 114N is located between one electrode and the layer 114P, and the layer 114P is located between the layer 114N and the other electrode. For example, the layer 114N is located between the electrode 552S and the layer 114P, and the layer 114P is located between the layer 114N and the electrode 551S.

An n-type semiconductor can be used for the layer 114N. For example, Me-PTCDI can be used for the layer 114N.

A p-type semiconductor can be used for the layer 114P. For example, rubrene can be used for the layer 114P.

Note that the photoelectric conversion device 550S in which the layer 114P is in contact with the layer 114N can be referred to as a pn-junction photodiode.

Note that this embodiment can be combined with any of the other embodiments in this specification as appropriate.

Embodiment 9

In this embodiment, a light-emitting apparatus including the light-emitting device described in any one of Embodiments 2 to 6 will be described.

Figure 6A:
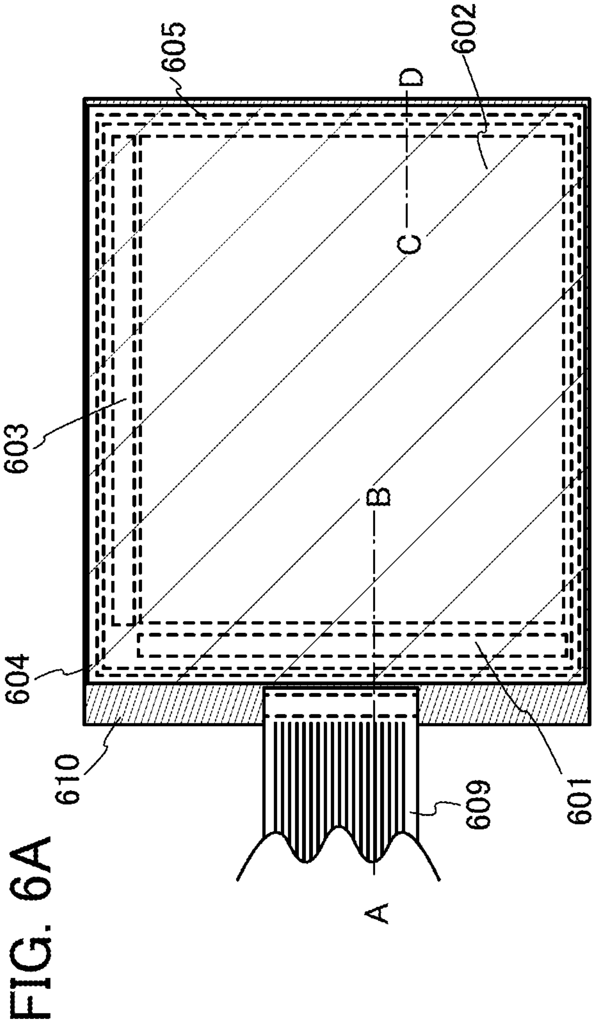
FIGS. 6A and 6B illustrate an active matrix light-emitting apparatus of an embodiment.
Figure 6B:
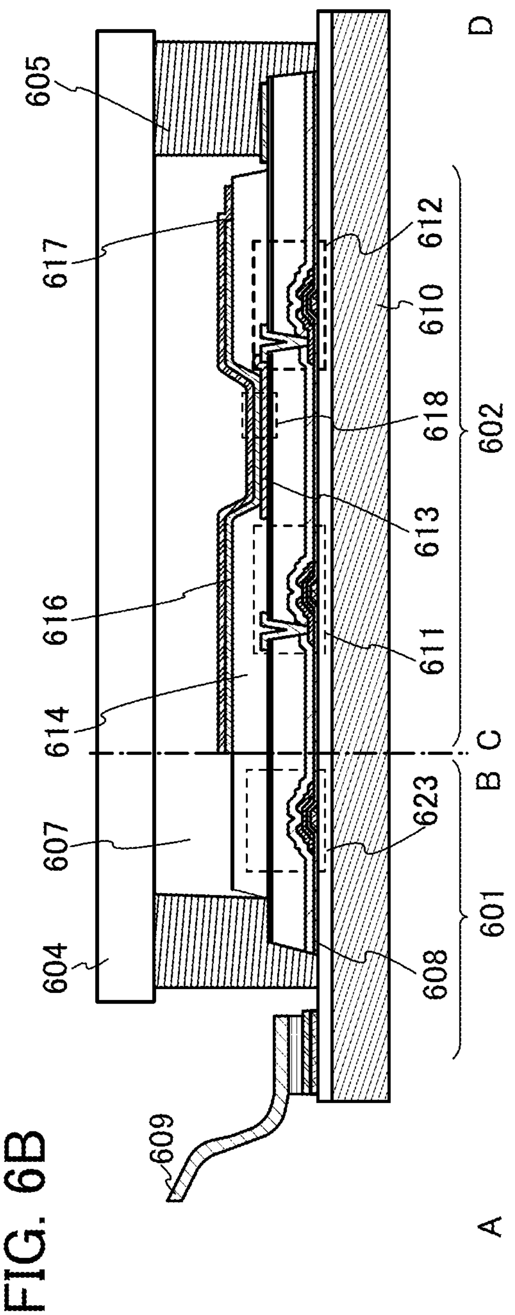

In this embodiment, the light-emitting apparatus fabricated using the light-emitting device described in any one of Embodiments 2 to 6 is described with reference to FIGS. 6A and 6B. Note that FIG. 6A is atop view of the light-emitting apparatus and FIG. 6B is a cross-sectional view taken along the lines A-B and C-D in FIG. 6A. This light-emitting apparatus includes a pixel portion 602 and a driver circuit portion (including a source line driver circuit 601 and a gate line driver circuit 603) shown with a dotted line, which are to control light emission of the light-emitting device. The light-emitting apparatus is provided with a sealing substrate 604 and a sealing material 605, and a space 607 is surrounded by the sealing material 605.

A lead wiring 608 is a wiring for transmitting signals to be input to the source line driver circuit 601 and the gate line driver circuit 603 and receives signals such as a video signal, a clock signal, a start signal, and a reset signal from a flexible printed circuit (FPC) serving as an external input terminal 609. Although only the FPC is illustrated here, a printed wiring board (PWB) may be attached to the FPC. The light-emitting apparatus in this specification includes, in its category, not only the light-emitting apparatus itself but also the light-emitting apparatus provided with the FPC or the PWB.

Next, a cross-sectional structure is described with reference to FIG. 6B. The driver circuit portions and the pixel portion are formed over an element substrate 610; FIG. 6B shows the source line driver circuit 601, which is a driver circuit portion, and one pixel in the pixel portion 602.

The element substrate 610 may be a substrate containing glass, quartz, an organic resin, a metal, an alloy, or a semiconductor or a plastic substrate formed of fiber reinforced plastic (FRP), poly(vinyl fluoride) (PVF), polyester, or an acrylic resin.

The structures of transistors used in pixels or driver circuits are not particularly limited. For example, inverted staggered transistors may be used, or staggered transistors may be used. Furthermore, top-gate transistors or bottom-gate transistors may be used. A semiconductor material used for the transistors is not particularly limited, and for example, silicon, germanium, silicon carbide, gallium nitride, or the like can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and either an amorphous semiconductor or a semiconductor having crystallinity (a microcrystalline semiconductor, a polycrystalline semiconductor, a single crystal semiconductor, or a semiconductor partly including crystal regions) can be used. A semiconductor having crystallinity is preferably used, in which case deterioration of transistor characteristics can be suppressed.

Here, an oxide semiconductor is preferably used for semiconductor devices such as the transistors provided in the pixels or driver circuits and transistors used for touch sensors described later, and the like. In particular, an oxide semiconductor having a wider band gap than silicon is preferably used. When an oxide semiconductor having a wider band gap than silicon is used, off-state current of the transistors can be reduced.

The oxide semiconductor preferably contains at least indium (In) or zinc (Zn). Further preferably, the oxide semiconductor contains an oxide represented by an In-M-Zn-based oxide (M represents a metal such as Al, Ti, Ga, Ge, Y, Zr, Sn, La, Ce, or Hf).

As a semiconductor layer, it is particularly preferable to use an oxide semiconductor film including a plurality of crystal parts whose c-axes are aligned perpendicular to a surface on which the semiconductor layer is formed or the top surface of the semiconductor layer and in which the adjacent crystal parts have no grain boundary.

The use of such materials for the semiconductor layer makes it possible to provide a highly reliable transistor in which a change in the electrical characteristics is suppressed.

Charge accumulated in a capacitor through a transistor including the above-described semiconductor layer can be held for a long time because of the low off-state current of the transistor. When such a transistor is used in a pixel, operation of a driver circuit can be stopped while a gray scale of an image displayed in each display region is maintained. As a result, an electronic device with extremely low power consumption can be obtained.

For stable characteristics of the transistor and the like, a base film is preferably provided. The base film can be formed with a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided.

Note that an FET 623 is illustrated as a transistor formed in the source line driver circuit 601. In addition, the driver circuit may be formed with any of a variety of circuits such as a CMOS circuit, a PMOS circuit, or an NMOS circuit. Although a driver integrated type in which the driver circuit is formed over the substrate is illustrated in this embodiment, the driver circuit is not necessarily formed over the substrate, and the driver circuit can be formed outside, not over the substrate.

The pixel portion 602 includes a plurality of pixels including a switching FET 611, a current controlling FET 612, and a first electrode 613 electrically connected to a drain of the current controlling FET 612. One embodiment of the present invention is not limited to the structure. The pixel portion 602 may include three or more FETs and a capacitor in combination.

Note that an insulator 614 is formed to cover an end portion of the first electrode 613. Here, the insulator 614 can be formed using a positive photosensitive acrylic resin film.

In order to improve the coverage with an EL layer or the like that is formed later, the insulator 614 is formed to have a curved surface with curvature at its upper or lower end portion. For example, in the case where a positive photosensitive acrylic resin is used for a material of the insulator 614, only the upper end portion of the insulator 614 preferably has a surface with a curvature radius (greater than or equal to 0.2 μm and less than or equal to 3 μm). As the insulator 614, either a negative photosensitive resin or a positive photosensitive resin can be used.

An EL layer 616 and a second electrode 617 are formed over the first electrode 613. Here, as a material used for the first electrode 613 functioning as an anode, a material having a high work function is preferably used. For example, a single-layer film of an ITO film, an indium tin oxide film containing silicon, an indium oxide film containing zinc oxide at 2 wt % to 20 wt %, a titanium nitride film, a chromium film, a tungsten film, a Zn film, a Pt film, or the like, a stack of a titanium nitride film and a film containing aluminum as its main component, or a stack of three layers of a titanium nitride film, a film containing aluminum as its main component, and a titanium nitride film can be used. The stacked-layer structure enables low wiring resistance, favorable ohmic contact, and a function as an anode.

The EL layer 616 is formed by any of a variety of methods such as an evaporation method using an evaporation mask, an inkjet method, and a spin coating method. The EL layer 616 has the structure described in any one of Embodiments 2 to 6. As another material included in the EL layer 616, a low molecular compound or a high molecular compound (including an oligomer or a dendrimer) may be used.

As a material used for the second electrode 617, which is formed over the EL layer 616 and functions as a cathode, a material having a low work function (e.g., Al, Mg, Li, and Ca, or an alloy or a compound thereof, such as MgAg, MgIn, and AlLi) is preferably used. In the case where light generated in the EL layer 616 passes through the second electrode 617, a stack including a thin metal film and a transparent conductive film (e.g., ITO, indium oxide containing zinc oxide at 2 wt % or higher and 20 wt % or lower, indium tin oxide containing silicon, or zinc oxide (ZnO)) is preferably used for the second electrode 617.

Note that the light-emitting device is formed with the first electrode 613, the EL layer 616, and the second electrode 617. The light-emitting device is the light-emitting device described in any one of Embodiments 2 to 6. In the light-emitting apparatus of this embodiment, the pixel portion, which includes a plurality of light-emitting devices, may include both the light-emitting device described in any one of Embodiments 2 to 6 and a light-emitting device having a different structure.

The sealing substrate 604 is attached to the element substrate 610 with the sealing material 605, so that a light-emitting device 618 is provided in the space 607 surrounded by the element substrate 610, the sealing substrate 604, and the sealing material 605. The space 607 is filled with a filler, and may be filled with an inert gas (such as nitrogen or argon) or the sealing material. It is preferable that the sealing substrate be provided with a recessed portion and a drying agent be provided in the recessed portion, in which case deterioration due to influence of moisture can be suppressed.

An epoxy-based resin or glass frit is preferably used for the sealing material 605. It is preferable that such a material not be permeable to moisture or oxygen as much as possible. As the sealing substrate 604, a glass substrate, a quartz substrate, or a plastic substrate formed of fiber reinforced plastics (FRP), poly(vinyl fluoride) (PVF), polyester, an acrylic resin, or the like can be used.

Although not illustrated in FIGS. 6A and 6B, a protective film may be provided over the second electrode. As the protective film, an organic resin film or an inorganic insulating film may be formed. The protective film may be formed so as to cover an exposed portion of the sealing material 605. The protective film may be provided so as to cover surfaces and side surfaces of the pair of substrates and exposed side surfaces of a sealing layer, an insulating layer, and the like.

The protective film can be formed using a material through which an impurity such as water does not permeate easily. Thus, diffusion of an impurity such as water from the outside into the inside can be effectively suppressed.

As a material of the protective film, an oxide, a nitride, a fluoride, a sulfide, a ternary compound, a metal, a polymer, or the like can be used. For example, a material containing aluminum oxide, hafnium oxide, hafnium silicate, lanthanum oxide, silicon oxide, strontium titanate, tantalum oxide, titanium oxide, zinc oxide, niobium oxide, zirconium oxide, tin oxide, yttrium oxide, cerium oxide, scandium oxide, erbium oxide, vanadium oxide, or indium oxide; a material containing aluminum nitride, hafnium nitride, silicon nitride, tantalum nitride, titanium nitride, niobium nitride, molybdenum nitride, zirconium nitride, or gallium nitride; or a material containing a nitride containing titanium and aluminum, an oxide containing titanium and aluminum, an oxide containing aluminum and zinc, a sulfide containing manganese and zinc, a sulfide containing cerium and strontium, an oxide containing erbium and aluminum, or an oxide containing yttrium and zirconium can be used.

The protective film is preferably formed using a deposition method with favorable step coverage. One such method is an atomic layer deposition (ALD) method. A material that can be deposited by an ALD method is preferably used for the protective film. A dense protective film having reduced defects such as cracks or pinholes or a uniform thickness can be formed by an ALD method. Furthermore, damage caused to a process member in forming the protective film can be reduced.

By an ALD method, a uniform protective film with few defects can be formed even on, for example, a surface with a complex uneven shape or upper, side, and rear surfaces of a touch panel.

As described above, the light-emitting apparatus fabricated using the light-emitting device described in any one of Embodiments 2 to 6 can be obtained.

The light-emitting apparatus in this embodiment is fabricated using the light-emitting device described in any one of Embodiments 2 to 6 and thus can have favorable characteristics. Specifically, since the light-emitting device described in any one of Embodiments 2 to 6 has high emission efficiency, the light-emitting apparatus can achieve low power consumption.

Figure 7A:
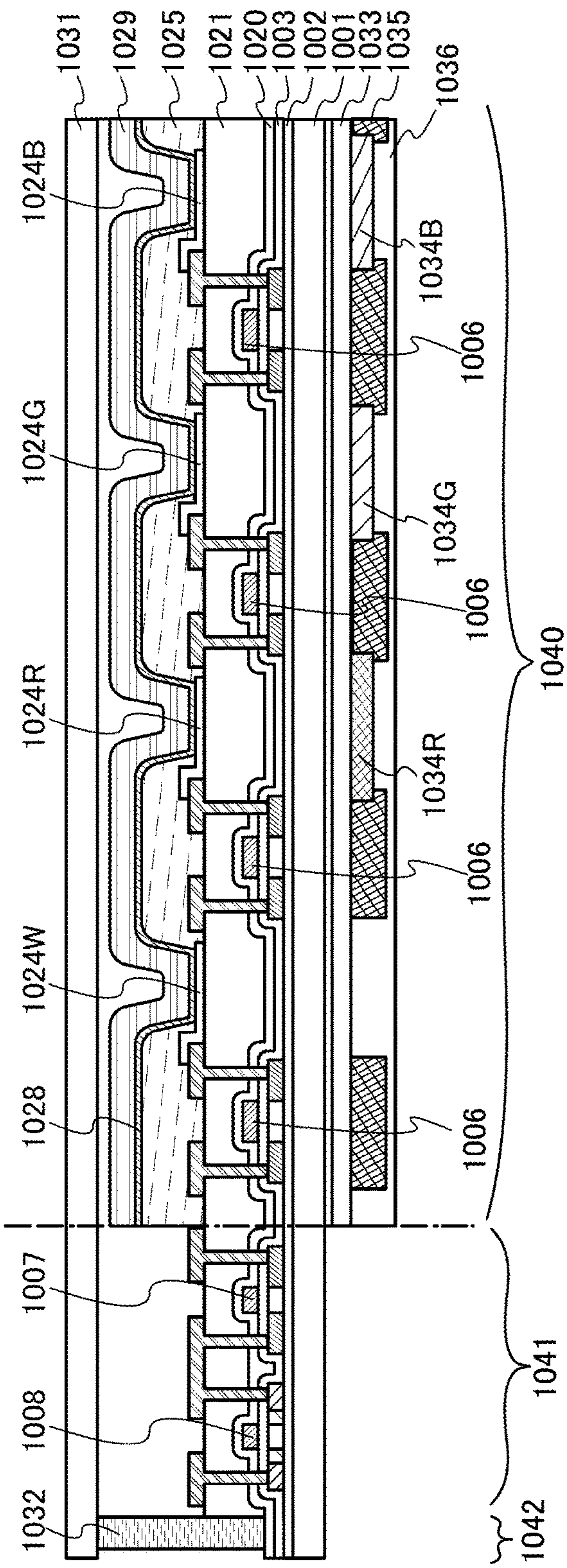
FIGS. 7A and 7B illustrate active matrix light-emitting apparatuses of an embodiment.
Figure 7B:
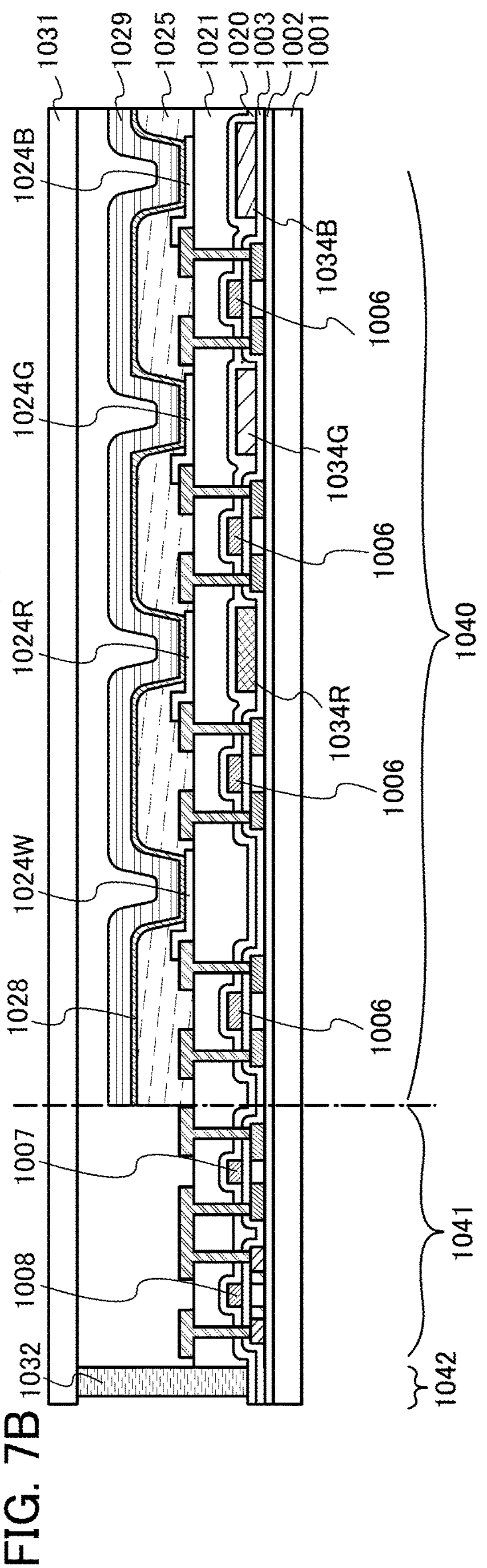

FIGS. 7A and 7B each illustrate an example of a light-emitting apparatus that includes a light-emitting device exhibiting white light emission, coloring layers (color filters), and the like to display a full-color image. In FIG. 7A, a substrate 1001, a base insulating film 1002, a gate insulating film 1003, a gate electrode 1006, a gate electrode 1007, a gate electrode 1008, a first interlayer insulating film 1020, a second interlayer insulating film 1021, a peripheral portion 1042, a pixel portion 1040, a driver circuit portion 1041, electrodes 1024W, 1024R, 1024G, and 1024B of light-emitting devices, a partition 1025, an EL layer 1028, an electrode 1029 of the light-emitting devices, a sealing substrate 1031, a sealing material 1032, and the like are illustrated.

In FIG. 7A, coloring layers (a red coloring layer 1034R, a green coloring layer 1034G, and a blue coloring layer 1034B) are provided on a transparent base material 1033. A black matrix 1035 may be additionally provided. The transparent base material 1033 provided with the coloring layers and the black matrix is aligned and fixed to the substrate 1001. Note that the coloring layers and the black matrix 1035 are covered with an overcoat layer 1036. In FIG. 7A, light emitted from part of the light-emitting layer does not pass through the coloring layers, while light emitted from the other part of the light-emitting layer passes through the coloring layers. The light that does not pass through the coloring layers is white and the light that passes through any one of the coloring layers is red, green, or blue; thus, an image can be displayed using pixels of the four colors.

FIG. 7B shows an example in which the coloring layers (the red coloring layer 1034R, the green coloring layer 1034G, and the blue coloring layer 1034B) are provided between the gate insulating film 1003 and the first interlayer insulating film 1020. As in the structure, the coloring layers may be provided between the substrate 1001 and the sealing substrate 1031.

Figure 8:
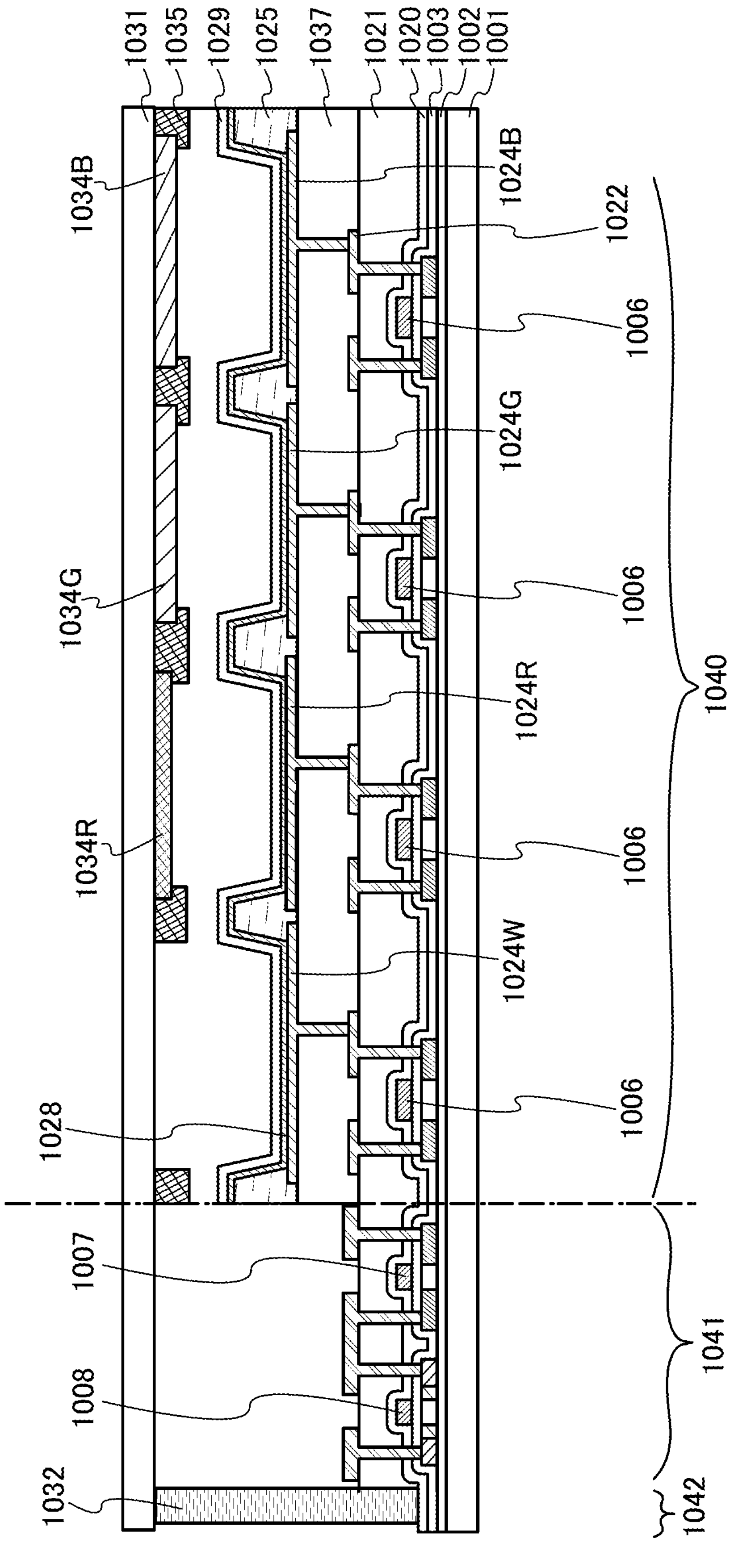
FIG. 8 illustrates an active matrix light-emitting apparatus of an embodiment.

The above-described light-emitting apparatus has a structure in which light is extracted to the substrate 1001 side where FETs are formed (a bottom emission structure), but may have a structure in which light is extracted to the sealing substrate 1031 side (a top emission structure). FIG. 8 is a cross-sectional view of a light-emitting apparatus having a top emission structure. In this case, a substrate that does not transmit light can be used as the substrate 1001. The process up to the step of forming a connection electrode which connects the FET and the anode of the light-emitting device is performed in a manner similar to that of the bottom-emission light-emitting apparatus. Then, a third interlayer insulating film 1037 is formed to cover an electrode 1022. This insulating film may have a planarization function. The third interlayer insulating film 1037 can be formed using a material similar to that of the second interlayer insulating film, and can alternatively be formed using any of other known materials.

The electrodes 1024W, 1024R, 1024G, and 1024B of the light-emitting devices each serve as an anode here, but may serve as a cathode. Furthermore, in the case of the top-emission light-emitting apparatus illustrated in FIG. 8, the electrodes 1024W, 1024R, 1024G, and 1024B are preferably reflective electrodes. The EL layer 1028 is formed to have a structure similar to the structure of the unit 103X, which is described in any one of Embodiments 2 to 6, with which white light emission can be obtained.

In the case of a top emission structure as illustrated in FIG. 8, sealing can be performed with the sealing substrate 1031 on which the coloring layers (the red coloring layer 1034R, the green coloring layer 1034G, and the blue coloring layer 1034B) are provided. The sealing substrate 1031 may be provided with the black matrix 1035 that is positioned between pixels. The coloring layers (the red coloring layer 1034R, the green coloring layer 1034G, and the blue coloring layer 1034B) or the black matrix 1035 may be covered with an overcoat layer. Note that a light-transmitting substrate is used as the sealing substrate 1031. Although an example in which full color display is performed using four colors of red, green, blue, and white is shown here, there is no particular limitation and full color display using four colors of red, yellow, green, and blue or three colors of red, green, and blue may be performed.

In the light-emitting apparatus having a top emission structure, a microcavity structure can be favorably employed. A light-emitting device with a microcavity structure is formed with use of a reflective electrode as the first electrode and a semi-transmissive and semi-reflective electrode as the second electrode. The light-emitting device with a microcavity structure includes at least an EL layer between the reflective electrode and the semi-transmissive and semi-reflective electrode, which includes at least a light-emitting layer serving as a light-emitting region.

Note that the reflective electrode has a visible light reflectivity higher than or equal to 40% and lower than or equal to 100%, preferably higher than or equal to 70% and lower than or equal to 100%, and a resistivity of $1\times10^{-2}$ Ω·cm or lower. In addition, the semi-transmissive and semi-reflective electrode has a visible light reflectivity higher than or equal to 20% and lower than or equal to 80%, preferably higher than or equal to 40% and lower than or equal to 70%, and a resistivity of $1\times10^{-2}$ Ω·cm or lower.

Light emitted from the light-emitting layer included in the EL layer is reflected and resonated by the reflective electrode and the transflective electrode.

In the light-emitting device, by changing the thickness of the transparent conductive film, the composite material, the carrier-transport material, or the like, the optical path length between the reflective electrode and the semi-transmissive and semi-reflective electrode can be changed. Thus, light with a wavelength that is resonated between the reflective electrode and the transflective electrode can be intensified while light with a wavelength that is not resonated therebetween can be attenuated.

Note that light that is reflected back by the reflective electrode (first reflected light) considerably interferes with light that directly enters the transflective electrode from the light-emitting layer (first incident light). For this reason, the optical path length between the reflective electrode and the light-emitting layer is preferably adjusted to $(2n-1)\lambda/4$ (n is a natural number of 1 or more and k is a wavelength of light to be amplified). By adjusting the optical path length, the phases of the first reflected light and the first incident light can be aligned with each other and the light emitted from the light-emitting layer can be further amplified.

Note that in the above structure, the EL layer may include a plurality of light-emitting layers or may include a single light-emitting layer. The tandem light-emitting device described above may be combined with a plurality of EL layers; for example, a light-emitting device may have a structure in which a plurality of EL layers are provided, a charge-generation layer is provided between the EL layers, and each EL layer includes a plurality of light-emitting layers or a single light-emitting layer.

With the microcavity structure, emission intensity with a specific wavelength in the front direction can be increased, whereby power consumption can be reduced. Note that in the case of a light-emitting apparatus that displays images with subpixels of four colors, red, yellow, green, and blue, the light-emitting apparatus can have favorable characteristics because the luminance can be increased owing to yellow light emission and each subpixel can employ a microcavity structure suitable for wavelengths of the corresponding color.

The light-emitting apparatus in this embodiment is fabricated using the light-emitting device described in any one of Embodiments 2 to 6 and thus can have favorable characteristics. Specifically, since the light-emitting device described in any one of Embodiments 2 to 6 has high emission efficiency, the light-emitting apparatus can achieve low power consumption.

Figure 9A:
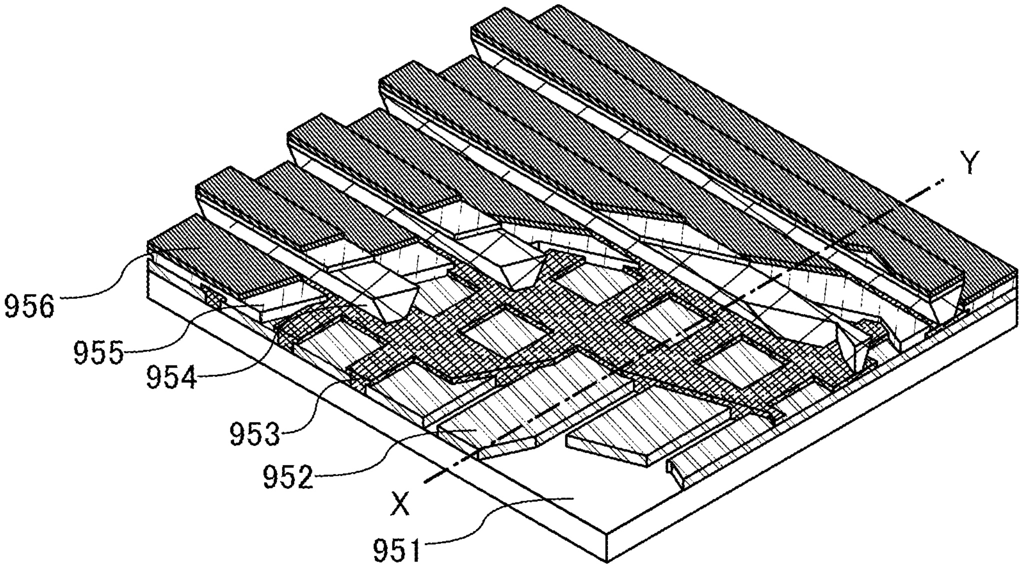
FIGS. 9A and 9B illustrate a passive matrix light-emitting apparatus of an embodiment.
Figure 9B:
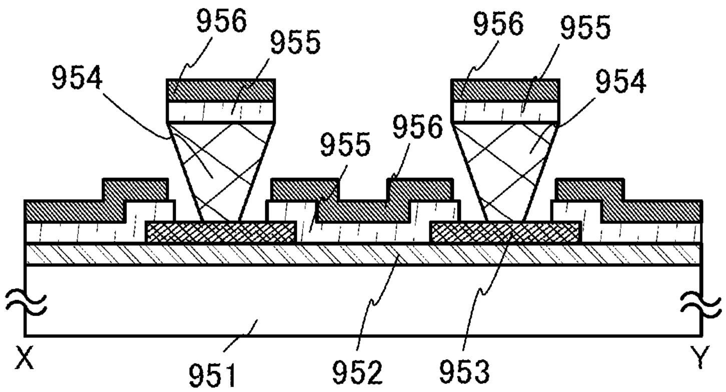

An active matrix light-emitting apparatus is described above, whereas a passive matrix light-emitting apparatus is described below. FIGS. 9A and 9B illustrate a passive matrix light-emitting apparatus manufactured using the present invention. Note that FIG. 9A is a perspective view of the light-emitting apparatus, and FIG. 9B is a cross-sectional view taken along the line X-Y in FIG. 9A. In FIGS. 9A and 9B, over a substrate 951, an EL layer 955 is provided between an electrode 952 and an electrode 956. An end portion of the electrode 952 is covered with an insulating layer 953. A partition layer 954 is provided over the insulating layer 953. The sidewalls of the partition layer 954 are aslope such that the distance between both sidewalls is gradually narrowed toward the surface of the substrate. In other words, a cross section taken along the direction of the short side of the partition layer 954 is trapezoidal, and the lower side (a side of the trapezoid which is parallel to the surface of the insulating layer 953 and is in contact with the insulating layer 953) is shorter than the upper side (a side of the trapezoid which is parallel to the surface of the insulating layer 953 and is not in contact with the insulating layer 953). The partition layer 954 thus provided can prevent defects in the light-emitting device due to static electricity or others. The passive-matrix light-emitting apparatus also includes the light-emitting device described in any one of Embodiments 2 to 6; thus, the light-emitting apparatus can have high reliability or low power consumption.

Since many minute light-emitting devices arranged in a matrix in the light-emitting apparatus described above can each be controlled, the light-emitting apparatus can be suitably used as a display device for displaying images.

This embodiment can be freely combined with any of the other embodiments.

Embodiment 10

Figure 10A:
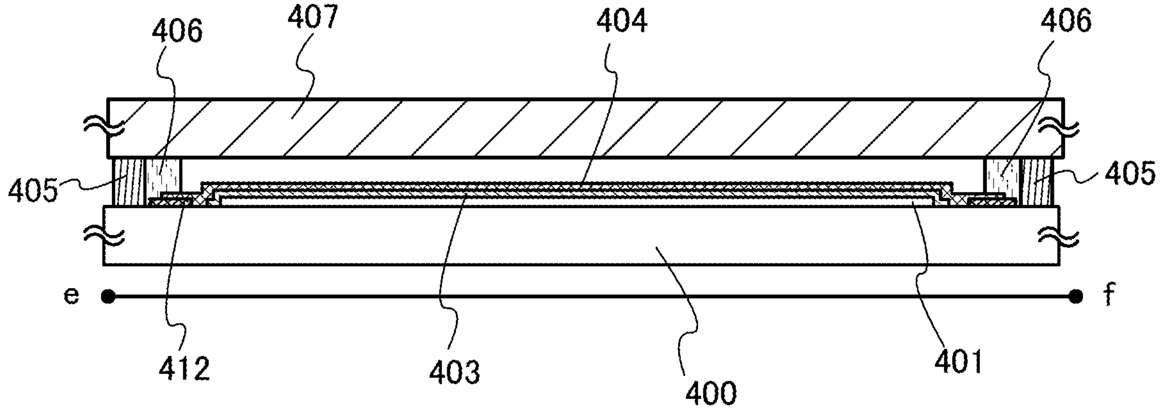
FIGS. 10A and 10B illustrate a lighting apparatus of an embodiment.
Figure 10B:
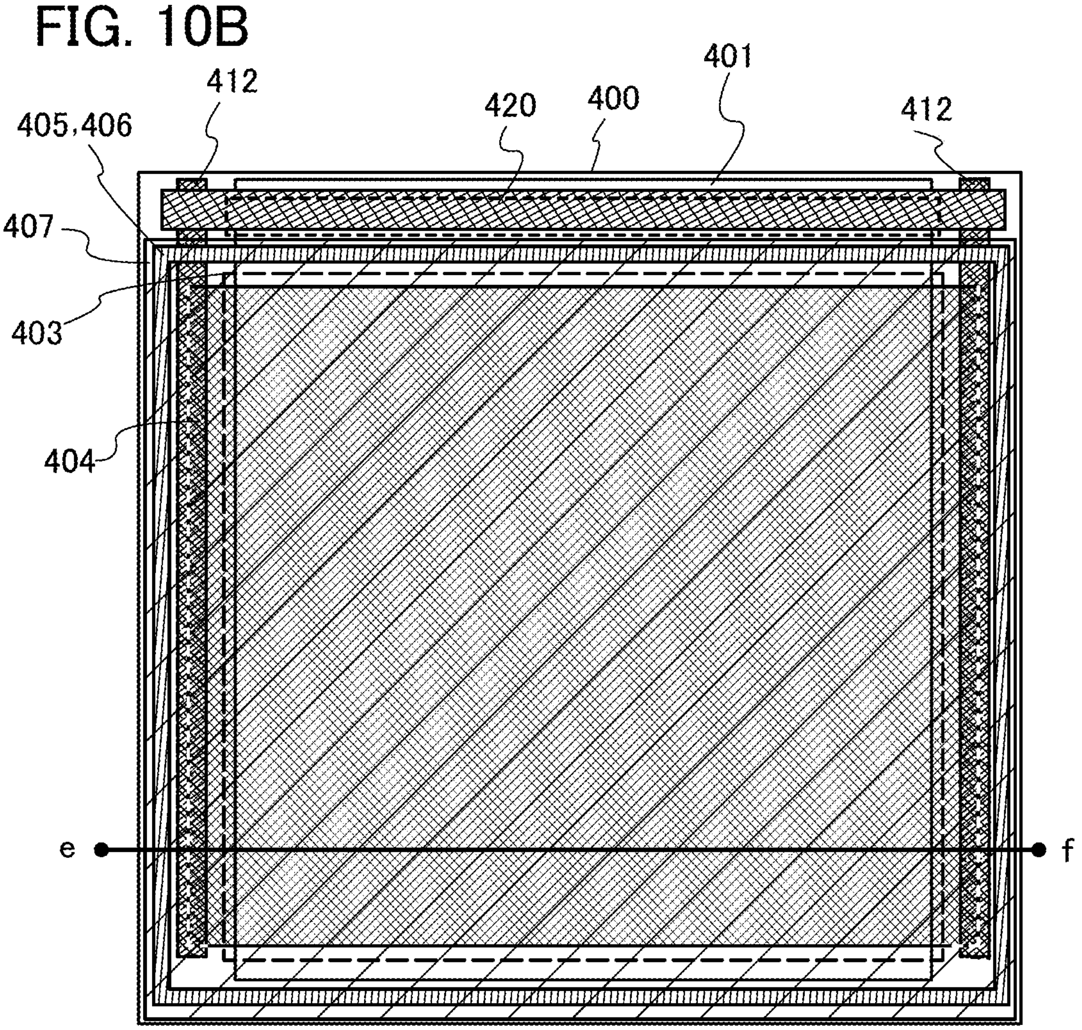

In this embodiment, an example in which the light-emitting device described in any one of Embodiments 2 to 6 is used for a lighting device will be described with reference to FIGS. 10A and 10B. FIG. 10B is a top view of the lighting device, and FIG. 10A is a cross-sectional view taken along the line e-f in FIG. 10B.

In the lighting device in this embodiment, a first electrode 401 is formed over a substrate 400 that is a support and has a light-transmitting property. The first electrode 401 corresponds to the electrode 551X in any one of Embodiments 2 to 6. When light is extracted from the first electrode 401 side, the first electrode 401 is formed using a material having a light-transmitting property.

A pad 412 for applying voltage to a second electrode 404 is provided over the substrate 400.

An EL layer 403 is formed over the first electrode 401. The EL layer 403 corresponds to the structure in which the layer 104X, the unit 103X, and the layer 105X are combined, the structure in which the layer 104X, the unit 103X, the intermediate layer 106X, the unit 103X2, and the layer 105X are combined, or the like in any one of Embodiments 2 to 6. Refer to the corresponding description for these structures.

The second electrode 404 is formed to cover the EL layer 403. The second electrode 404 corresponds to the electrode 552X in any one of Embodiments 2 to 6. The second electrode 404 is formed using a material having high reflectance when light is extracted from the first electrode 401 side. The second electrode 404 is connected to the pad 412 so that voltage is supplied to the second electrode 404.

As described above, the lighting device described in this embodiment includes a light-emitting device including the first electrode 401, the EL layer 403, and the second electrode 404. Since the light-emitting device has high emission efficiency, the lighting device in this embodiment can have low power consumption.

The substrate 400 provided with the light-emitting device having the above structure is fixed to a sealing substrate 407 with sealing materials 405 and 406 and sealing is performed, whereby the lighting device is completed. It is possible to use only either the sealing material 405 or the sealing material 406. The inner sealing material 406 (not illustrated in FIG. 10B) can be mixed with a desiccant that enables moisture to be adsorbed, which results in improved reliability.

When parts of the pad 412 and the first electrode 401 are extended to the outside of the sealing materials 405 and 406, the extended parts can serve as external input terminals. An IC chip 420 mounted with a converter or the like may be provided over the external input terminals.

The lighting device described in this embodiment includes the light-emitting device described in any one of Embodiments 2 to 6 as an EL element, and thus can be a lighting device with low power consumption.

Embodiment 11

In this embodiment, examples of electronic devices each including the light-emitting device described in any one of Embodiments 2 to 6 will be described. The light-emitting device described in any one of Embodiments 2 to 6 has high emission efficiency and low power consumption. As a result, the electronic devices described in this embodiment can each include a light-emitting portion having low power consumption.

Examples of the electronic device including the above light-emitting device include television devices (also referred to as TV or television receivers), monitors for computers and the like, digital cameras, digital video cameras, digital photo frames, cellular phones (also referred to as mobile phones or mobile phone devices), portable game machines, portable information terminals, audio playback devices, and large game machines such as pachinko machines. Specific examples of these electronic devices are shown below.

Figure 11A:
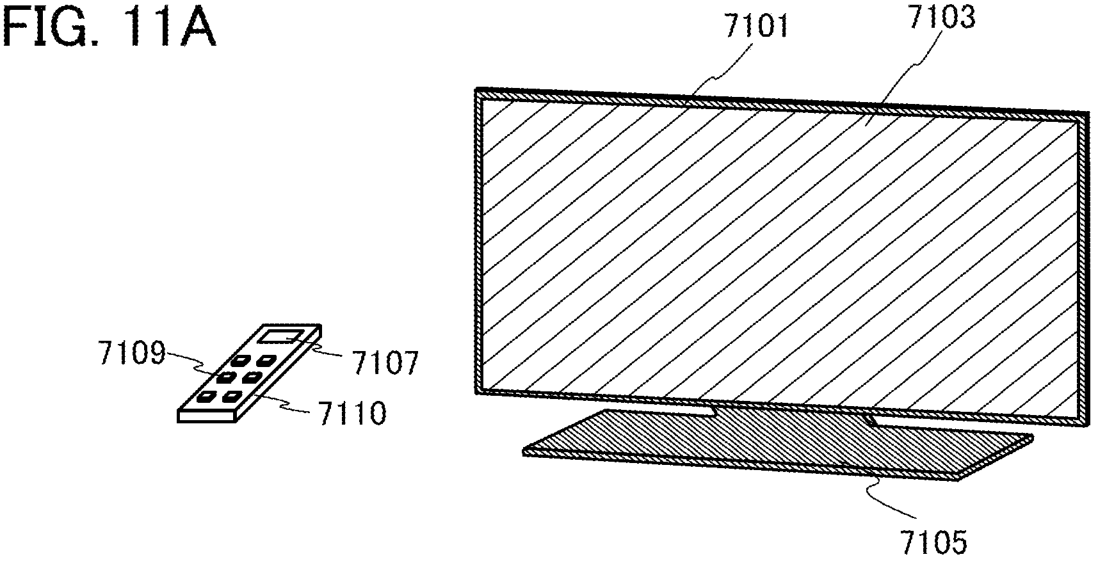
FIGS. 11A to 11D illustrate electronic devices of an embodiment.

FIG. 11A shows an example of a television device. In the television device, a display portion 7103 is incorporated in a housing 7101. Here, the housing 7101 is supported by a stand 7105. Images can be displayed on the display portion 7103, and in the display portion 7103, the light-emitting devices described in any one of Embodiments 2 to 6 are arranged in a matrix.

The television device can be operated with an operation switch of the housing 7101 or a separate remote controller 7110. With operation keys 7109 of the remote controller 7110, channels or volume can be controlled and images displayed on the display portion 7103 can be controlled. Furthermore, the remote controller 7110 may be provided with a display portion 7107 and data output from the remote controller 7110 may be displayed on the display portion 7107.

Note that the television device is provided with a receiver, a modem, or the like. With use of the receiver, a general television broadcast can be received. Moreover, when the television device is connected to a communication network with or without wires via the modem, one-way (from a sender to a receiver) or two-way (between a sender and a receiver or between receivers) data communication can be performed.

Figure 11B:
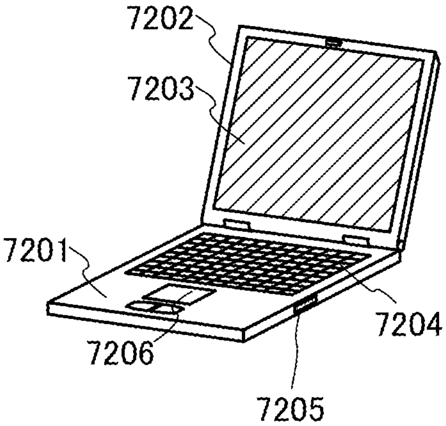
Figure 11C:
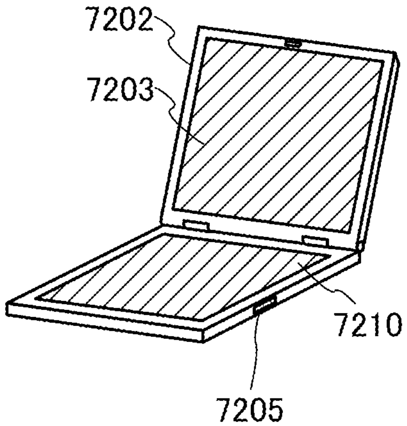

FIG. 11B illustrates a computer, which includes a main body 7201, a housing 7202, a display portion 7203, a keyboard 7204, an external connection port 7205, a pointing device 7206, and the like. Note that this computer is fabricated using the light-emitting devices described in any one of Embodiments 2 to 6 and arranged in a matrix in the display portion 7203. The computer illustrated in FIG. 11B may have a structure illustrated in FIG. 11C. A computer illustrated in FIG. 11C is provided with a second display portion 7210 instead of the keyboard 7204 and the pointing device 7206. The second display portion 7210 is a touch panel, and input operation can be performed by touching display for input on the second display portion 7210 with a finger or a dedicated pen. The second display portion 7210 can also display images other than the display for input. The display portion 7203 may also be a touch panel. Connecting the two screens with a hinge can prevent troubles; for example, the screens can be prevented from being cracked or broken while the computer is being stored or carried.

Figure 11D:
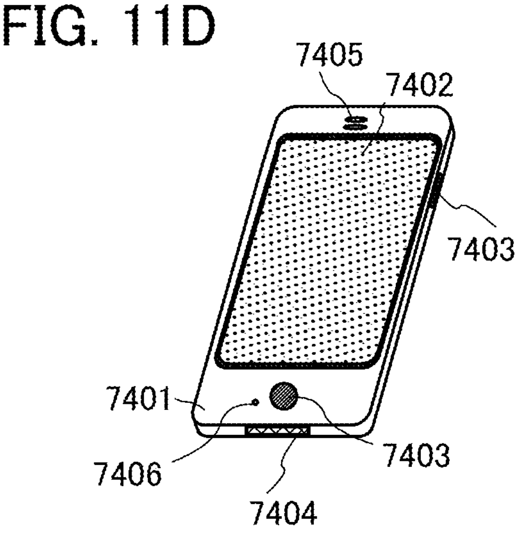

FIG. 11D shows an example of a portable terminal. The portable terminal is provided with a display portion 7402 incorporated in a housing 7401, operation buttons 7403, an external connection port 7404, a speaker 7405, a microphone 7406, and the like. Note that the portable terminal has the display portion 7402 including the light-emitting devices described in any one of Embodiments 2 to 6 and arranged in a matrix.

When the display portion 7402 of the portable terminal illustrated in FIG. 11D is touched with a finger or the like, data can be input into the portable terminal. In this case, operations such as making a call and creating an e-mail can be performed by touching the display portion 7402 with a finger or the like.

The display portion 7402 has mainly three screen modes. The first mode is a display mode mainly for displaying images. The second mode is an input mode mainly for inputting data such as text. The third mode is a display-and-input mode in which the two modes, the display mode and the input mode, are combined.

For example, in the case of making a call or creating an e-mail, a text input mode mainly for inputting text is selected for the display portion 7402 so that text displayed on the screen can be input. In this case, it is preferable to display a keyboard or number buttons on almost the entire screen of the display portion 7402.

When a sensing device including a sensor such as a gyroscope sensor or an acceleration sensor for detecting inclination is provided inside the portable terminal, display on the screen of the display portion 7402 can be automatically changed in direction by determining the orientation of the portable terminal (whether the portable terminal is placed horizontally or vertically).

The screen modes are switched by touching the display portion 7402 or operating the operation buttons 7403 of the housing 7401. Alternatively, the screen modes can be switched depending on the kind of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed for a certain period while a signal sensed by an optical sensor in the display portion 7402 is sensed, the screen mode may be controlled so as to be switched from the input mode to the display mode.

The display portion 7402 may also function as an image sensor. For example, an image of a palm print, a fingerprint, or the like is taken when the display portion 7402 is touched with the palm or the finger, whereby personal authentication can be performed. Furthermore, by providing a backlight or a sensing light source which emits near-infrared light in the display portion, an image of a finger vein, a palm vein, or the like can be captured.

Figure 12A:
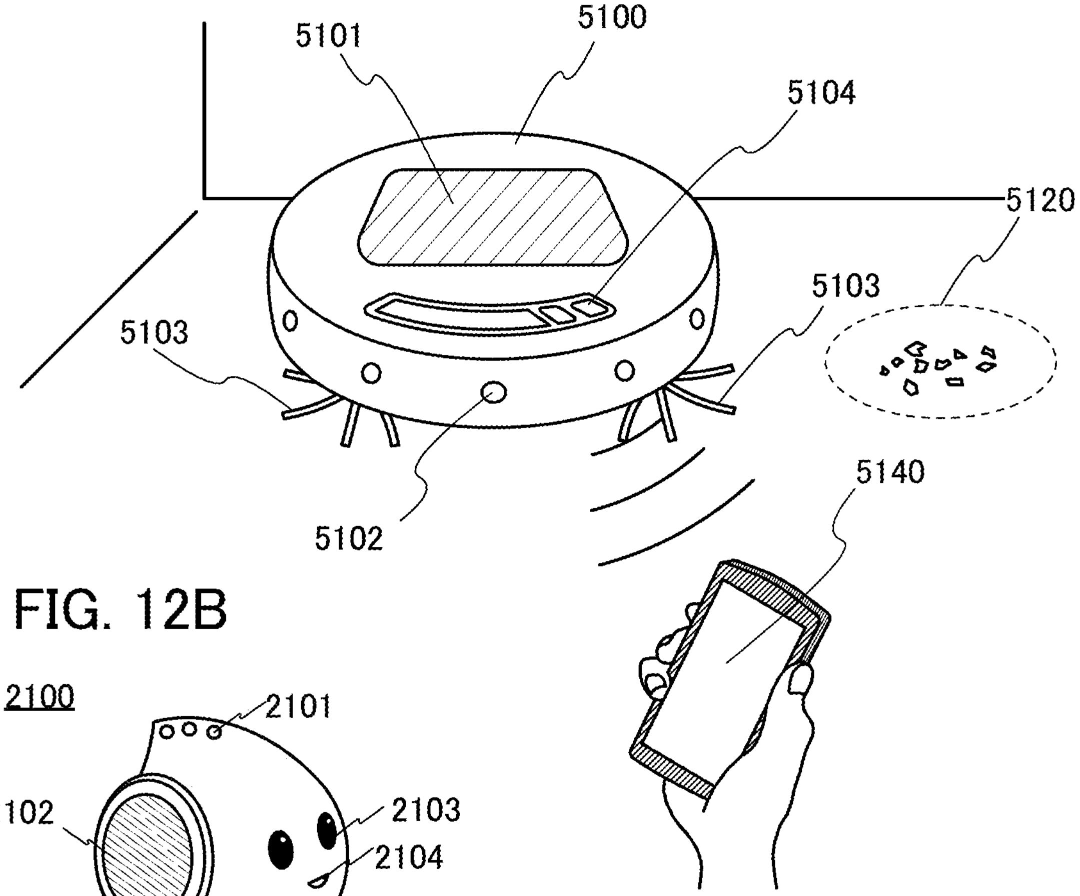
FIGS. 12A to 12C illustrate electronic devices of an embodiment.

FIG. 12A is a schematic view showing an example of a cleaning robot.

A cleaning robot 5100 includes a display 5101 on its top surface, a plurality of cameras 5102 on its side surface, a brush 5103, and operation buttons 5104. Although not illustrated, the bottom surface of the cleaning robot 5100 is provided with a tire, an inlet, and the like. Furthermore, the cleaning robot 5100 includes various sensors such as an infrared sensor, an ultrasonic sensor, an acceleration sensor, a piezoelectric sensor, an optical sensor, and a gyroscope sensor. The cleaning robot 5100 has a wireless communication means.

The cleaning robot 5100 is self-propelled, detects dust 5120, and vacuums the dust through the inlet provided on the bottom surface.

The cleaning robot 5100 can determine whether there is an obstacle such as a wall, furniture, or a step by analyzing images taken by the cameras 5102. When the cleaning robot 5100 detects an object that is likely to be caught in the brush 5103 (e.g., a wire) by image analysis, the rotation of the brush 5103 can be stopped.

The display 5101 can display the remaining capacity of a battery, the amount of collected dust, or the like. The display 5101 may display a path on which the cleaning robot 5100 has run. The display 5101 may be a touch panel, and the operation buttons 5104 may be provided on the display 5101.

The cleaning robot 5100 can communicate with a portable electronic device 5140 such as a smartphone. Images taken by the cameras 5102 can be displayed on the portable electronic device 5140. Accordingly, an owner of the cleaning robot 5100 can monitor his/her room even when the owner is not at home. The owner can also check the display on the display 5101 by the portable electronic device 5140 such as a smartphone.

The light-emitting apparatus of one embodiment of the present invention can be used for the display 5101.

Figure 12B:
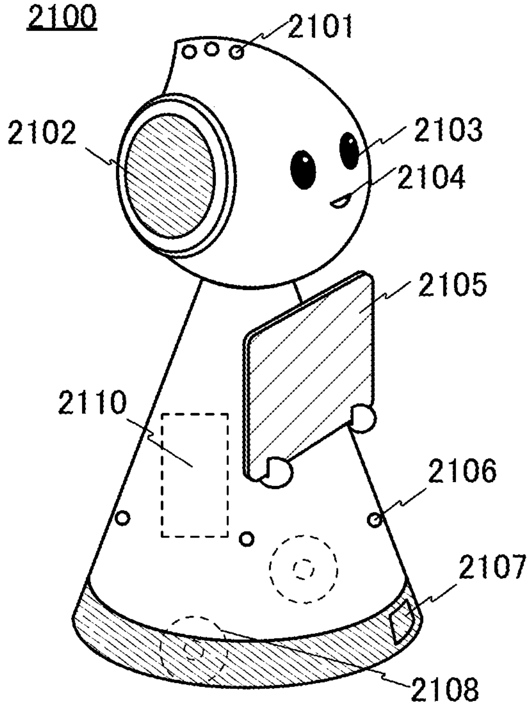

A robot 2100 illustrated in FIG. 12B includes an arithmetic device 2110, a microphone 2102, an upper camera 2103, a speaker 2104, a display 2105, a lower camera 2106, an obstacle sensor 2107, and a moving mechanism 2108.

The microphone 2102 has a function of detecting a speaking voice of a user, an environmental sound, and the like. The speaker 2104 has a function of outputting sound. The robot 2100 can communicate with a user using the microphone 2102 and the speaker 2104.

The display 2105 has a function of displaying various kinds of information. The robot 2100 can display information desired by a user on the display 2105. The display 2105 may be provided with a touch panel. Moreover, the display 2105 may be a detachable information terminal, in which case charging and data communication can be performed when the display 2105 is set at the home position of the robot 2100.

The upper camera 2103 and the lower camera 2106 each have a function of taking an image of the surroundings of the robot 2100. The obstacle sensor 2107 can detect an obstacle in the direction where the robot 2100 advances with the moving mechanism 2108. The robot 2100 can move safely by recognizing the surroundings with the upper camera 2103, the lower camera 2106, and the obstacle sensor 2107. The light-emitting apparatus of one embodiment of the present invention can be used for the display 2105.

Figure 12C:
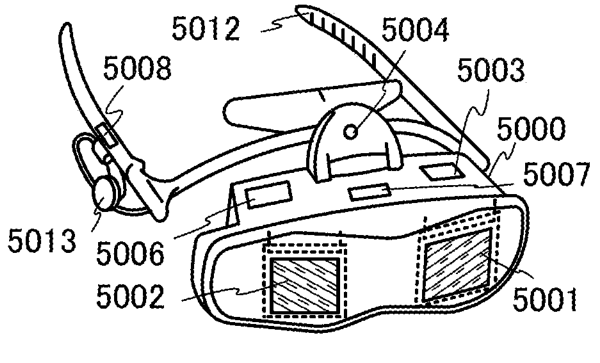

FIG. 12C shows an example of a goggle-type display. The goggle-type display includes, for example, a housing 5000, a display portion 5001, a speaker 5003, an LED lamp 5004, operation keys (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, a display portion 5002, a support 5012, and an earphone 5013.

The light-emitting apparatus of one embodiment of the present invention can be used for the display portion 5001 and the display portion 5002.

Figure 13:
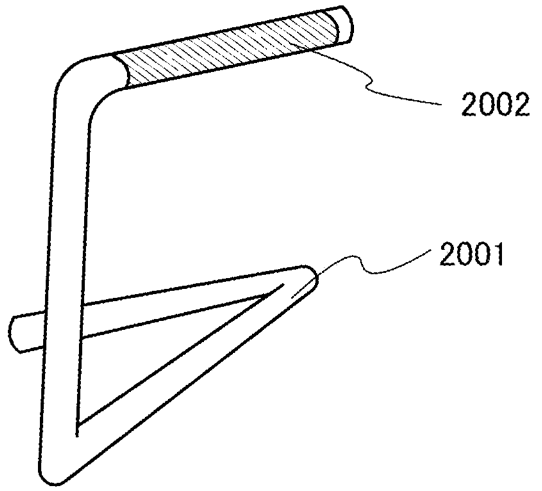
FIG. 13 illustrates a lighting device of an embodiment.

FIG. 13 shows an example in which the light-emitting device described in any one of Embodiments 2 to 6 is used for a table lamp which is a lighting device. The table lamp illustrated in FIG. 13 includes a housing 2001 and a light source 2002, and the lighting device described in Embodiment 10 may be used for the light source 2002.

Figure 14:
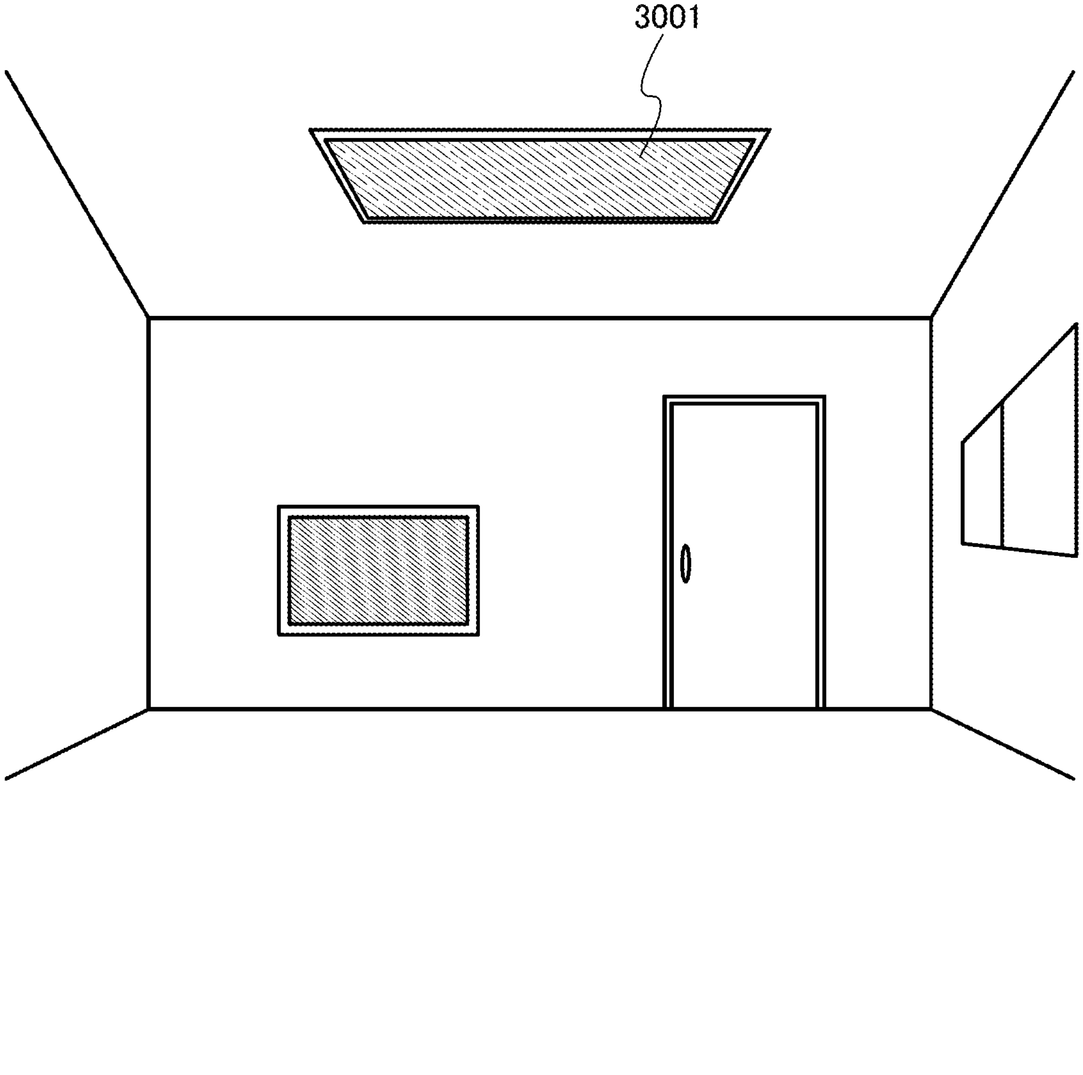
FIG. 14 illustrates a lighting device of an embodiment.

FIG. 14 shows an example in which the light-emitting device described in any one of Embodiments 2 to 6 is used for an indoor lighting device 3001. Since the light-emitting device described in any one of Embodiments 2 to 6 has high emission efficiency, the lighting device can have low power consumption. Furthermore, since the light-emitting device described in any one of Embodiments 2 to 6 can have a large area, the light-emitting device can be used for a large-area lighting device. Furthermore, since the light-emitting device described in any one of Embodiments 2 to 6 is thin, the light-emitting device can be used for a thin lighting device.

Figure 15:
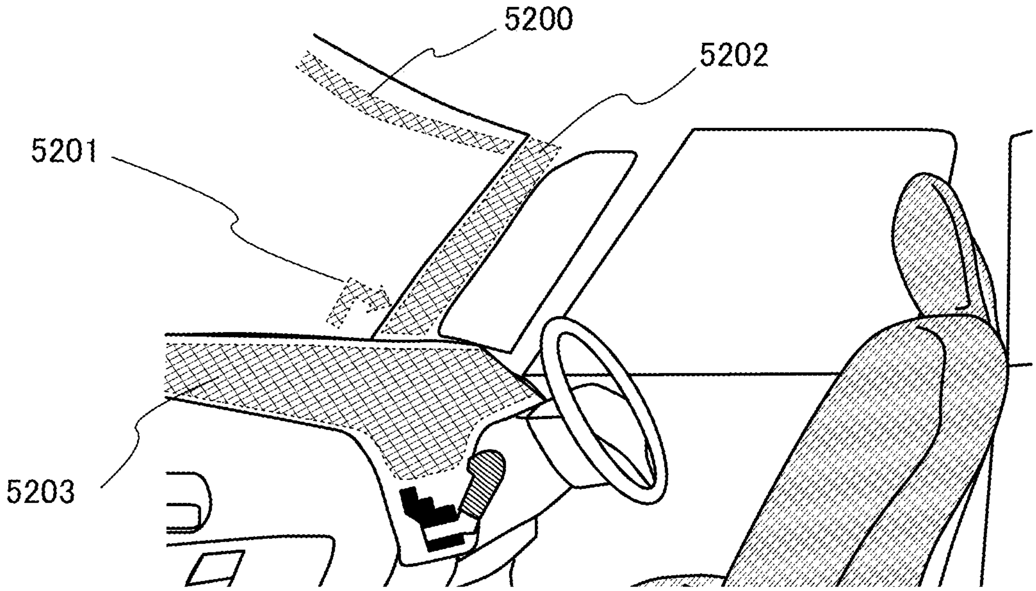
FIG. 15 illustrates an in-vehicle display device and a lighting device of an embodiment.

The light-emitting device described in any one of Embodiments 2 to 6 can also be used for an automobile windshield or an automobile dashboard. FIG. 15 illustrates one mode in which the light-emitting device described in any one of Embodiments 2 to 6 is used for an automobile windshield or an automobile dashboard. Display regions 5200 to 5203 each include the light-emitting device described in any one of Embodiments 2 to 6.

The display regions 5200 and 5201 are display devices which are provided in the automobile windshield and in which the light-emitting device described in any one of Embodiments 2 to 6 is incorporated. When the light-emitting device described in any one of Embodiments 2 to 6 is fabricated using a first electrode and a second electrode each of which has a light-transmitting property, what is called a see-through display device, through which the opposite side can be seen, can be provided. Such see-through display devices can be provided even in the automobile windshield without hindering the view. In the case where a driving transistor or the like is provided, a transistor having a light-transmitting property, such as an organic transistor including an organic semiconductor material or a transistor including an oxide semiconductor, is preferably used.

A display device incorporating the light-emitting device described in any one of Embodiments 2 to 6 is provided in the display region 5202 in a pillar portion. The display region 5202 can compensate for the view hindered by the pillar by displaying an image taken by an imaging unit provided in the car body. Similarly, the display region 5203 provided in the dashboard portion can compensate for the view hindered by the car body by displaying an image taken by an imaging unit provided on the outside of the automobile; thus, blind areas can be eliminated to enhance the safety. Images that compensate for the areas which a driver cannot see enable the driver to ensure safety easily and comfortably.

The display region 5203 can provide a variety of kinds of information by displaying navigation data, speed, a tachometer, a mileage, a fuel level, a gearshift state, air-condition setting, and the like. The content or layout of the display can be changed freely by a user as appropriate. Note that such information can also be displayed on the display regions 5200 to 5202. The display regions 5200 to 5203 can also be used as lighting devices.

Figure 16A:
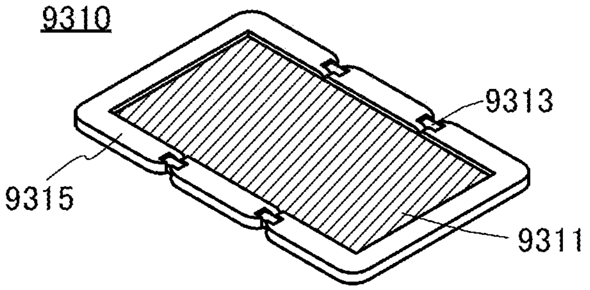
FIGS. 16A to 16C illustrate electronic devices of an embodiment.
Figure 16B:
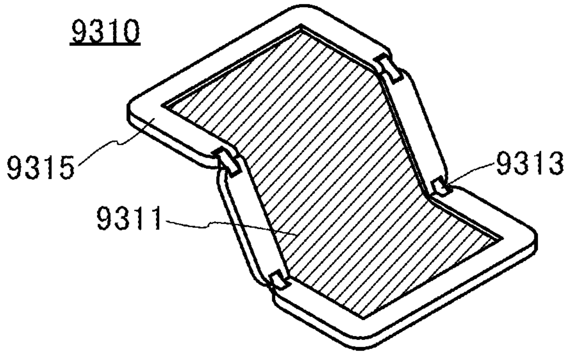
Figure 16C:
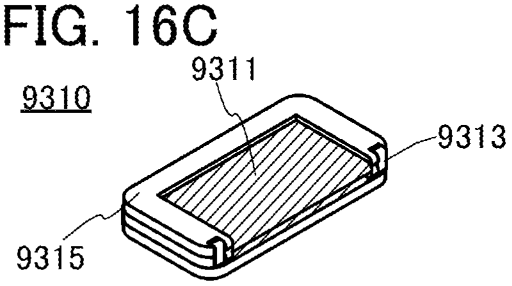

FIGS. 16A to 16C illustrate a foldable portable information terminal 9310. FIG. 16A illustrates the portable information terminal 9310 that is opened. FIG. 16B illustrates the portable information terminal 9310 that is being opened or being folded. FIG. 16C illustrates the portable information terminal 9310 that is folded. The portable information terminal 9310 is highly portable when folded. The portable information terminal 9310 is highly browsable when opened because of a seamless large display region.

A display panel 9311 is supported by three housings 9315 joined together by hinges 9313. Note that the display panel 9311 may be a touch panel (an input/output device) including a touch sensor (an input device). By folding the display panel 9311 at the hinges 9313 between two housings 9315, the portable information terminal 9310 can be reversibly changed in shape from the opened state to the folded state. The light-emitting apparatus of one embodiment of the present invention can be used for the display panel 9311.

Note that the structure described in this embodiment can be combined with any of the structures described in Embodiments 2 to 6 as appropriate.

As described above, the application range of the light-emitting apparatus including the light-emitting device described in any one of Embodiments 2 to 6 is wide, and thus the light-emitting apparatus can be applied to electronic devices in a variety of fields. By using the light-emitting device described in any one of Embodiments 2 to 6, an electronic device with low power consumption can be obtained.

Note that this embodiment can be combined with any of the other embodiments in this specification as appropriate.

Example 1

In this example, physical properties of the organic compound of one embodiment of the present invention and methods for synthesizing the organic compound will be described with reference to FIG. 17 to FIG. 22.

Figure 17:
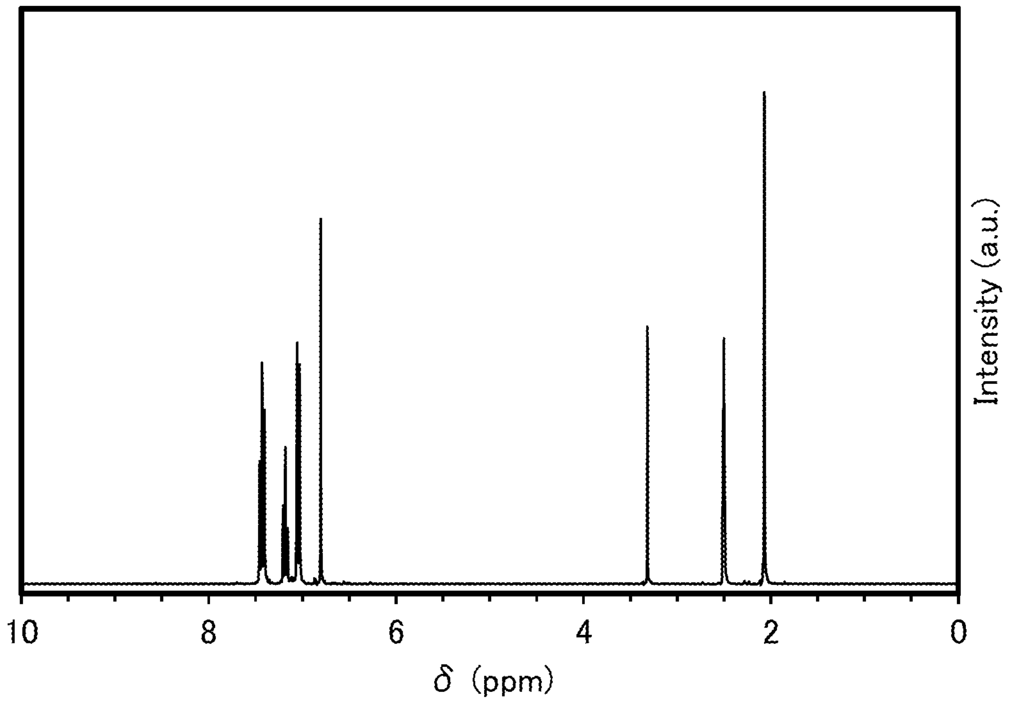
FIG. 17 shows a proton NMR spectrum of an organic compound of Example.

FIG. 17 shows $^1$H-NMR spectrum measurement results of 4-bromo-2,6-diphenoxytoluene.

Figure 18:
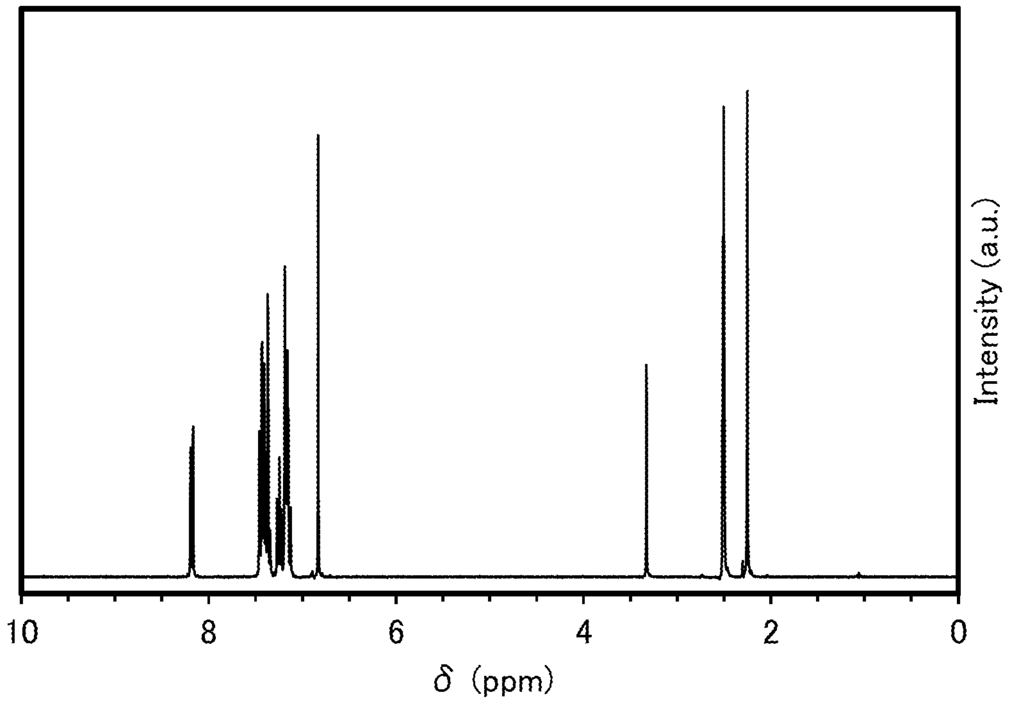
FIG. 18 shows a proton NMR spectrum of an organic compound of Example.

FIG. 18 shows $^1$H-NMR spectrum measurement results of 9-(4-methyl-3,5-diphenoxyphenyl)-9H-carbazole.

Figure 19:
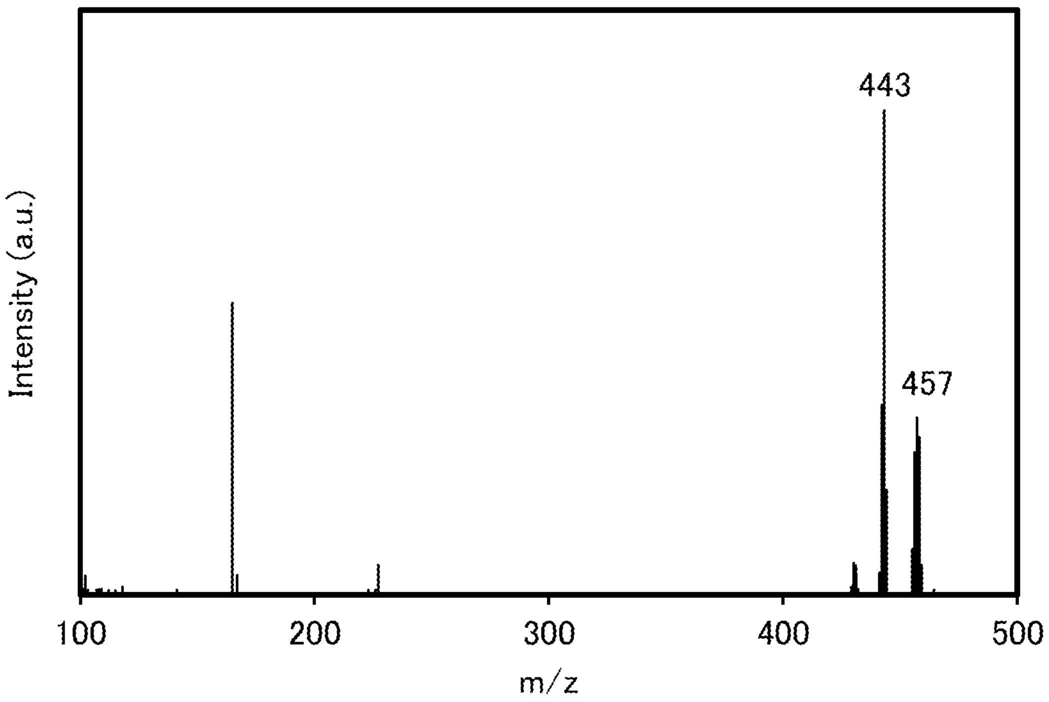
FIG. 19 shows a mass spectrum of an organic compound of Example.

FIG. 19 shows a mass spectrum of Me-Oipp, which was obtained with a liquid chromatography-tandem mass spectrometer.

Figure 20:
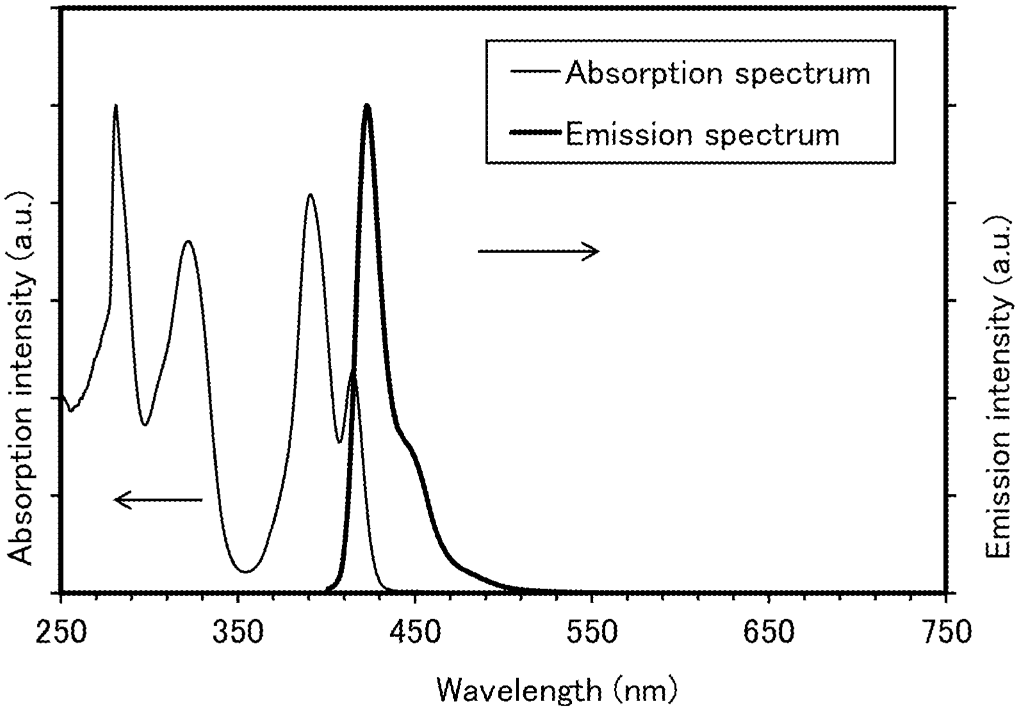
FIG. 20 shows an absorption spectrum and an emission spectrum of an organic compound of Example.

FIG. 20 shows measurement results of an absorption spectrum and an emission spectrum of a toluene solution containing Me-Oipp.

Figure 21:
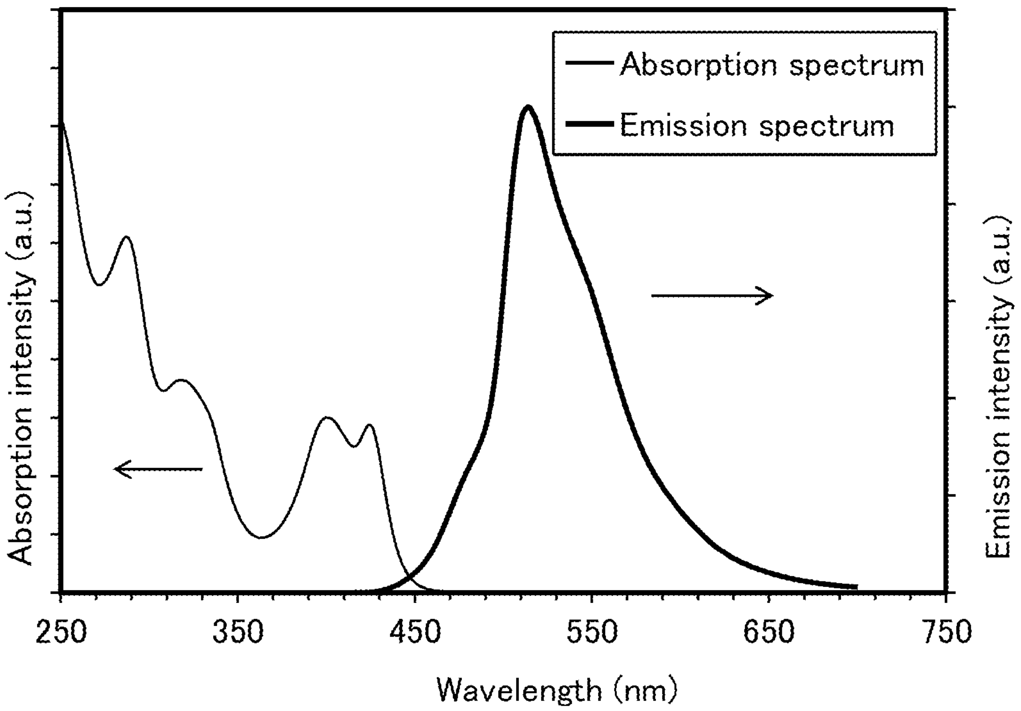
FIG. 21 shows an absorption spectrum and an emission spectrum of an organic compound of Example.

FIG. 21 shows measurement results of an absorption spectrum and an emission spectrum of a solid thin film containing Me-Oipp.

Figure 22:
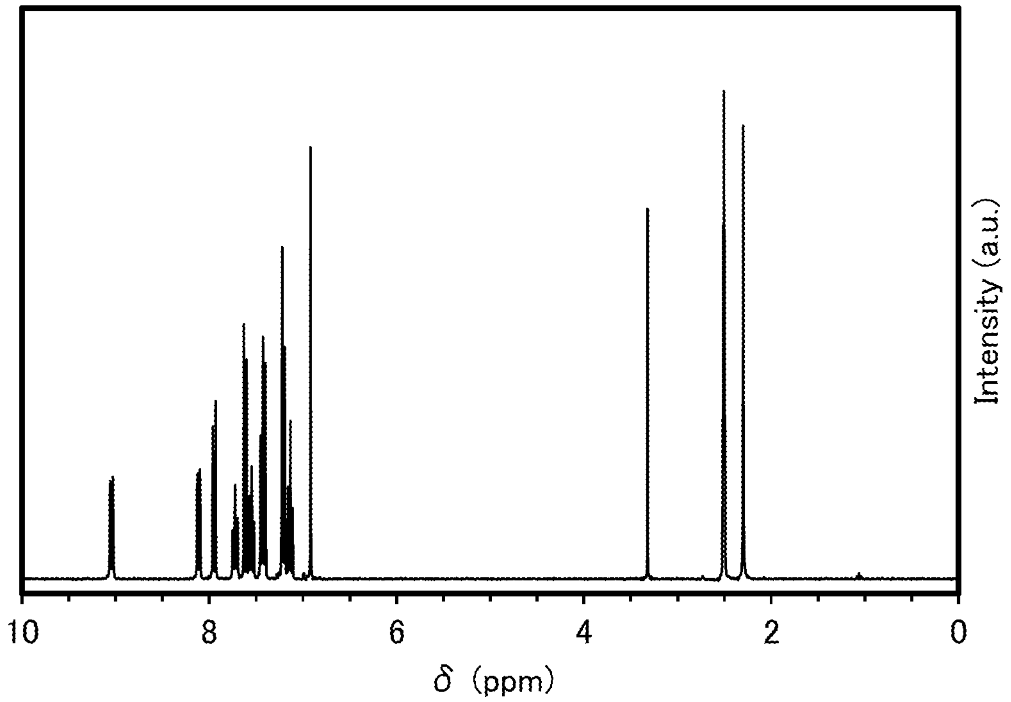
FIG. 22 shows a proton NMR spectrum of an organic compound of Example.

FIG. 22 shows $^1$H-NMR spectrum measurement results of 7-(4-methyl-3,5-diphenoxyphenyl)-7H-dibenzo[c,g]carbazole.

Figure 23:
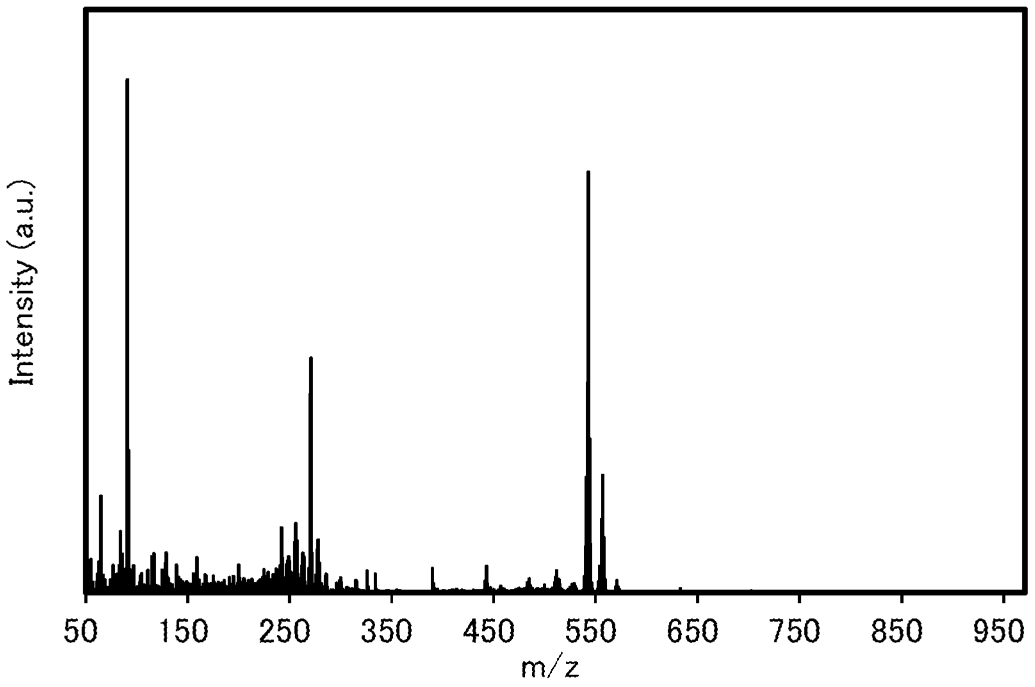
FIG. 23 shows a mass spectrum of an organic compound of Example.

FIG. 23 shows a mass spectrum of Me-Oipp-02, which was obtained with an electron ionization-mass spectrometer (ITQ1100 produced by Thermo Fisher Scientific K.K.).

Figure 24:
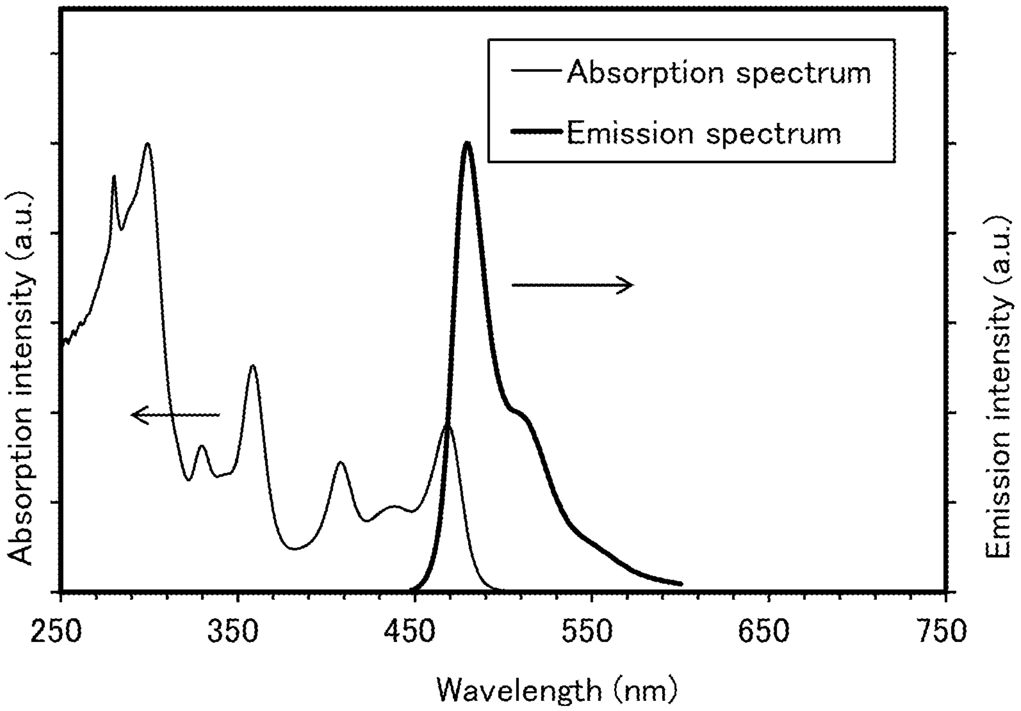
FIG. 24 shows an absorption spectrum and an emission spectrum of an organic compound of Example.

FIG. 24 shows measurement results of an absorption spectrum and an emission spectrum of a toluene solution containing Me-Oipp-02.

Synthesis Example 1

Synthesis example 1 will show a synthesis example of 9-methyl-8,10-dioxa-17d-aza-3b,14b-diboraindeno[1',2',3',4':5,4,3]phenanthro[2,1,10,9-fghi]pentacene (abbreviation: Me-Oipp) represented by Structural Formula (181) in Embodiment 1.

[Chemical Formula 47]

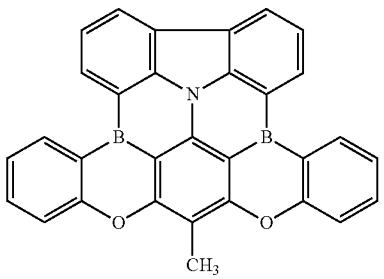

Me-Oipp

Synthesis Method

A synthesis method described in this synthesis example includes first to third steps.

[First Step]

In the first step, 4-bromo-2,6-diphenoxytoluene was synthesized. A synthesis scheme (la) of the first step is shown below.

[Chemical Formula 48]

(1a)

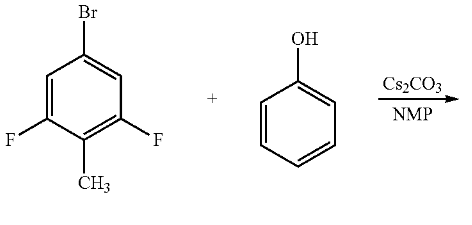

-continued

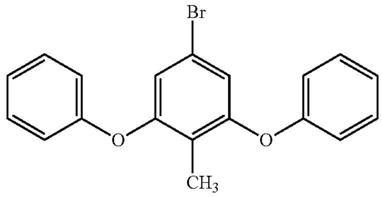

Into a 1000 mL three-neck flask were put 20 g (97 mmol) of 4-bromo-2,6-difluorotoluene, 27 g (0.29 mol) of phenol, 94 g (0.29 mol) of cesium carbonate ($Cs_2CO_3$), and 480 mL of N-methyl-2-pyrrolidone (abbreviation: NMP). The mixture was degassed by being stirred while the pressure in the flask was reduced.

This mixture was reacted at 120° C. for 16 hours while being stirred under a nitrogen stream, and then reacted at 150° C. for 8 hours.

After a predetermined time elapsed, water was added to this mixture, the mixture was separated into an aqueous layer and an organic layer with use of a separating funnel. Toluene was added to the aqueous layer to extract a target substance remaining in the aqueous layer, and the extracted solution was added to the organic layer. Water was added to this organic layer to wash the organic layer. The organic layer was separated and then magnesium sulfate was added thereto, so that moisture remaining in the organic layer is removed. The organic layer was gravity filtered, and the filtrate was concentrated to give an oily substance. With silica gel column chromatography using hexane for a mobile phase, a target substance was separated from the oily substance. The mobile phase was distilled off to give 30 g of a white solid (yield: 87%).

FIG. 17 shows the measurement results with nuclear magnetic resonance spectroscopy ($^1$H-NMR). Analysis results are shown below.

$^1$H-NMR (DMSO-$d_6$, 300 MHz): δ=2.07 (s, 3H), 6.80 (s, 2H), 7.04 (d, J1=7.5 Hz, 4H), 7.18 (t, J1=7.2 Hz, 2H), 7.43 (t, J1=7.2 Hz, 4H).

[Second Step]

In the second step, 9-(4-methyl-3,5-diphenoxyphenyl)-9H-carbazole was synthesized. A synthesis scheme (1b) is shown below.

[Chemical Formula 49]

(1b)

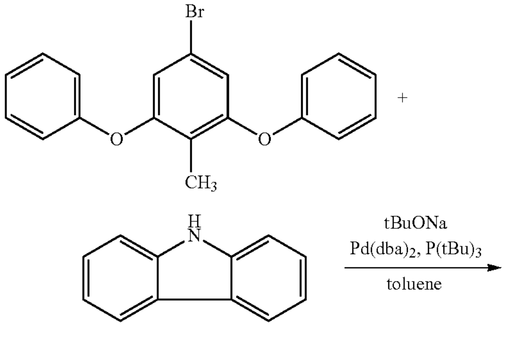

-continued

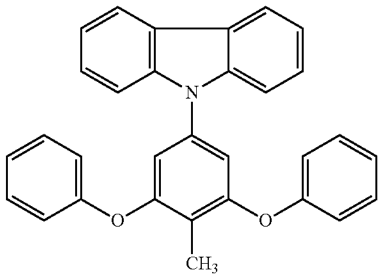

Into a 500 mL three-neck flask were put 15 g (43 mmol) of 1-bromo-4-methyl-3,5-diphenoxybenzene, 8.6 g (52 mmol) of calbazole, 12 g (0.13 mol) of sodium tert-butoxide (abbreviation: tBuONa), 215 mL of toluene, and 0.4 mL of a 10% hexane solution of tri(tert-butyl)phosphine (abbreviation: $P(tBu)_3$). The mixture was degassed by being stirred while the pressure in the flask was reduced.

After addition of 0.25 g (0.43 mmol) of bis(dibenzylideneacetone)palladium(0) (abbreviation: $Pd(dba)_2$), this mixture was reacted at 120° C. for 36 hours while being stirred under a nitrogen stream.

After a predetermined time elapsed, toluene was added to this mixture, and the mixture was suction-filtered through a filter aid where Florisil, Celite, and alumina were stacked. The filtrate was condensed to give a solid. With silica gel column chromatography using a mixed solvent (the ratio of toluene to hexane is 1:4) for a mobile phase, a target substance was separated from the solid. Then, the mobile phase was distilled off to give a solid. Through addition of ethanol and irradiation with an ultrasonic wave to/on the solid, 17 g of a white solid was obtained (yield: 89%).

FIG. 18 shows the measurement results with nuclear magnetic resonance spectroscopy ($^1$H-NMR). Analysis results are shown below.

$^1$H-NMR (DMSO-$d_6$, 300 MHz): δ=2.25 (s, 3H), 6.83 (s, 2H), 7.12-7.19 (m, 6H), 7.25 (ddd, J1=9.9 Hz, J2=86.0 Hz, J3=2.1 Hz, 2H), 7.34-7.47 (m, 8H), 8.18 (d, J1=7.5 Hz, 2H).

[Third Step]

In the third step, a target substance, Me-Oipp, was synthesized. A synthesis scheme (1c) is shown below.

[Chemical Formula 50]

(1c)

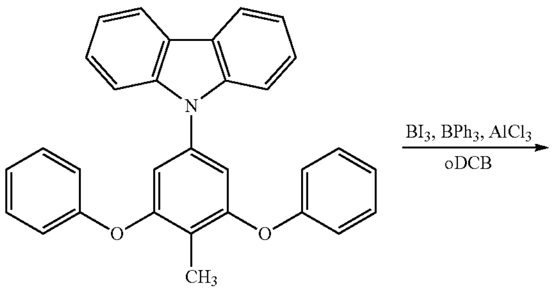

-continued

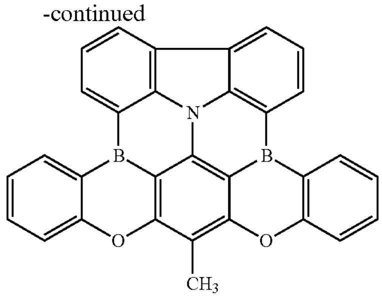

Into a 300 mL three-neck flask were put 1.9 g (4.4 mmol) of 9-(4-methyl-3,5-diphenoxyphenyl)-9H-carbazole, and 2.0 g (8.3 mmol) of triphenylborane (abbreviation: $BPh_3$). The inside of the flask was replaced with nitrogen.

After addition of 45 mL of o-dichlorobenzene (abbreviation: oDCB) and 4.1 g (11 mmol) of boron triiodide ($BI_3$), this mixture was reacted at 180° C. for 3 hours while being stirred.

After a predetermined time elapsed, 2.5 g (6.5 mmol) of boron triiodide and 0.78 g (5.9 mmol) of aluminum chloride ($AlCl_3$) were added to this mixture, and the mixture was reacted at 180° C. for 7 hours while being stirred.

After a predetermined time elapsed, this mixture was cooled to 0° C., subjected to addition of approximately 20 mL of a phosphate buffer solution, and stirred. After that, the mixture was filtered to give a solid. The solid was subjected to addition of toluene and suction filtration through a filter aid where Florisil, Celite, and alumina were stacked. The filtrate was condensed to give a solid. From this solid and a solution containing toluene, 0.99 g of a yellow solid (yield: 50%) was obtained by performing a recrystallization method twice. By a train sublimation method, 0.97 g of the yellow solid was sublimated and purified to give 0.70 g of a target substance in a yellow solid state (collection rate: 73%). Note that in the sublimation purification, the solid was heated at 305° C. under a pressure of 3.8 Pa with a flow rate of an argon gas at 15 mL/min.

Mass Spectrum

FIG. 19 shows a mass spectrum measured with liquid chromatography mass spectrometry (abbreviation LC/MS analysis).

For the liquid chromatography (abbreviation: LC) separation, Ultimate 3000 produced by Thermo Fisher Scientific K.K. was used. A column and a solvent were set as appropriate. The column temperature was set to 40° C., and a predetermined solution sending condition was set. 5.0 μL of a sample in which Me-Oipp was dissolved in an organic solvent was introduced into the system.

For the mass analysis (abbreviation: MS analysis), Q Exactive produced by Thermo Fisher Scientific K.K. was used. By a parallel reaction monitoring (PRM) method, MS/MS measurement of m/z=457.14 corresponding to the exact mass of Me-Oipp was performed. For setting of the PRM, the mass range of a target ion was set to m/z=457.14±2.0 (isolation window=4) and detection was performed in a positive mode. The measurement was performed with energy (normalized collision energy: NCE) for accelerating a target ion in a collision cell set to 60.

Products ions of Me-Oipp were mainly detected at m/z of around 443 (see FIG. 19). The results in FIG. 19 show characteristics derived from Me-Oipp and therefore can be regarded as important data for identifying Me-Oipp contained in a mixture.

It can be presumed that the product ions detected at m/z of around 443 are cations in a state where a methyl group is eliminated, which suggests that Me-Oipp contains a methyl group.

Physical Properties

Physical properties of the toluene solution containing Me-Oipp and the solid thin film containing Me-Oipp were measured.

The absorption spectrum of the toluene solution was measured at room temperature with an UV-Visible/NIR spectrophotometer (V-770DS, produced by JASCO Corporation) in a state where the toluene solution was put in a quartz cell. The absorption spectrum shown in FIG. 20 is a result obtained by subtraction of an absorption spectrum of only toluene in a quartz cell from the measured absorption spectrum of the toluene solution in the quartz cell.

The absorption spectrum of the solid thin film was measured with a spectrophotometer (U-4100 Spectrophotometer, produced by Hitachi High-Technologies Corporation).

The emission spectrum was measured with a fluorescence spectrophotometer (FP-8600, produced by JASCO Corporation). The quantum yield was measured using an absolute PL quantum yield measurement system (Quantaurus-QY, produced by Hamamatsu Photonics K.K.).

[Toluene Solution Containing Me-Oipp]

FIG. 20 shows measurement results of an ultraviolet-visible absorption spectrum and an emission spectrum of the toluene solution containing Me-Oipp. The horizontal axis represents wavelength, and the vertical axis represents absorption intensity or emission intensity.

The absorption spectrum of the toluene solution containing Me-Oipp exhibited peaks at 322 nm, 391 nm, and 408 nm (see FIG. 20).

The toluene solution containing Me-Oipp emitted blue light. Its emission spectrum exhibited a maximum peak at 423 nm and a shoulder peak at 448 nm, and the full width at half maximum was 18 nm (see FIG. 20). Note that light with a wavelength of 391 nm was used as excitation light. The quantum yield of the toluene solution containing Me-Oipp was 70%. The results indicate that Me-Oipp is an organic compound with high emission efficiency, whose emission spectrum shows a narrow full width at half maximum and a short peak wavelength. The emission color is bluish purple and the color purity is high.

[Solid Thin Film Containing Me-Oipp]

FIG. 21 shows measurement results of an ultraviolet-visible absorption spectrum and an emission spectrum of the solid thin film containing Me-Oipp. Note that the sample in a solid thin film state containing Me-Oipp was formed over a quartz substrate by a vacuum evaporation method.

The absorption spectrum of the solid thin film containing Me-Oipp exhibited peaks at 229 nm, 287 nm, 317 nm, 401 nm, and 424 nm.

The emission spectrum of the solid thin film containing Me-Oipp exhibited a shoulder peak at 479 nm and a maximum peak at 514 nm. Note that light with a wavelength of 400 nm was used as excitation light.

From the results, Me-Oipp was found to be useful for a host of a light-emitting substance and a substance emitting fluorescence in a visible region.

Synthesis Example 2

Synthesis example 2 will show a synthesis example of 11-methyl-10,12-dioxa-16e-aza-5b,16b-diborabenzo[6',7']

indeno[1',2',3',4':5,4,3]benzo[6,7]phenanthro[2,1,10,9-fghi]pentacene (abbreviation Me-Oipp-02) represented by Structural Formula (179) in Embodiment 1.

[Chemical Formula 51]

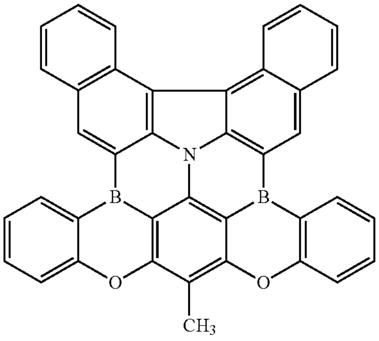

Me-Oipp-02

Synthesis Method

A synthesis method described in this synthesis example includes first and second steps.

[First Step]

In the first step, 7-(4-methyl-3,5-diphenoxyphenyl)-7H-dibenzo[c,g]carbazole was synthesized. A synthesis scheme (2b) of the first step is shown below.

[Chemical Formula 52]

(2b)

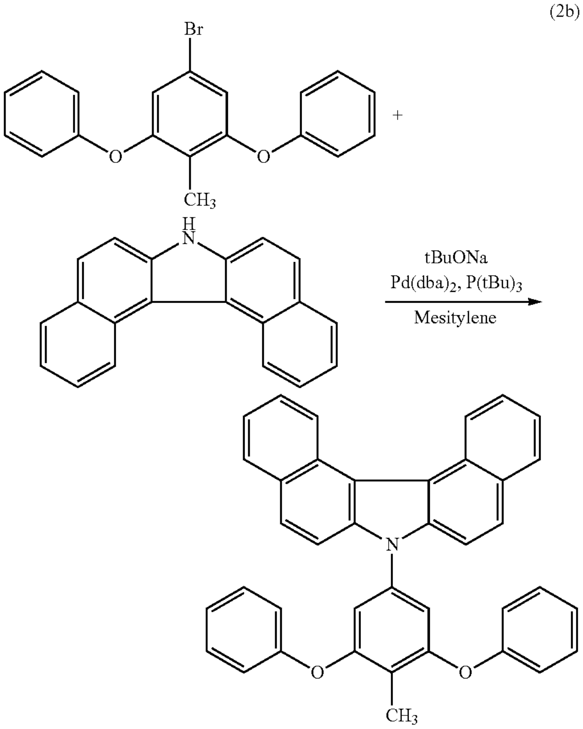

Into a 200 mL three-neck flask were put 7.8 g (22 mmol) of 4-bromo-2,6-diphenoxytoluene, 5.9 g (22 mmol) of 7H-dibenzo[c,g]carbazole, 4.2 g (44 mmol) of sodium tert-butoxide, 110 mL of mesitylene, and 0.8 mL of a 10% hexane solution of tri(tert-butyl)phosphine. The mixture was degassed by being stirred while the pressure in the flask was reduced.

After addition of 0.38 g (0.66 mmol) of bis(dibenzylideneacetone)palladium(0) to this mixture, the mixture was reacted at 120° C. for 36 hours while being stirred under a nitrogen stream.

After a predetermined time elapsed, this mixture was subjected to addition of toluene and suction filtration through a filter aid where Florisil, Celite, and alumina were stacked. The filtrate was condensed to give a solid. With silica gel column chromatography using a mixed solvent (the ratio of toluene to hexane is 1:3) for a mobile phase, a target substance was separated from the solid. Then, the mobile phase was distilled off to give a solid. From the obtained solid and a solution containing toluene and ethanol, 8.8 g of a white solid (yield: 73%) was obtained by performing a recrystallization method twice.

FIG. 22 shows the measurement results with nuclear magnetic resonance spectroscopy ($^1$H-NMR). Analysis results are shown below.

$^1$H-NMR (DMSO-$d_6$, 300 MHz): δ=2.30 (s, 3H), 6.92 (s, 2H), 7.11-7.23 (m, 6H), 7.39-7.46 (m, 4H), 7.52-7.57 (m, 2H), 7.62 (d, J1=8.7 Hz, 2H), 7.70-7.75 (m, 2H), 7.95 (d, J1=9.3 Hz, 2H), 8.11 (dd, J1=8.1 Hz, J2=1.2 Hz, 2H), 9.04 (d, J1=8.4 Hz, 2H).

[Second Step]

In the second step, a target substance, Me-Oipp-02, was synthesized. A synthesis scheme (2c) is shown below.

[Chemical Formula 53]

(2c)

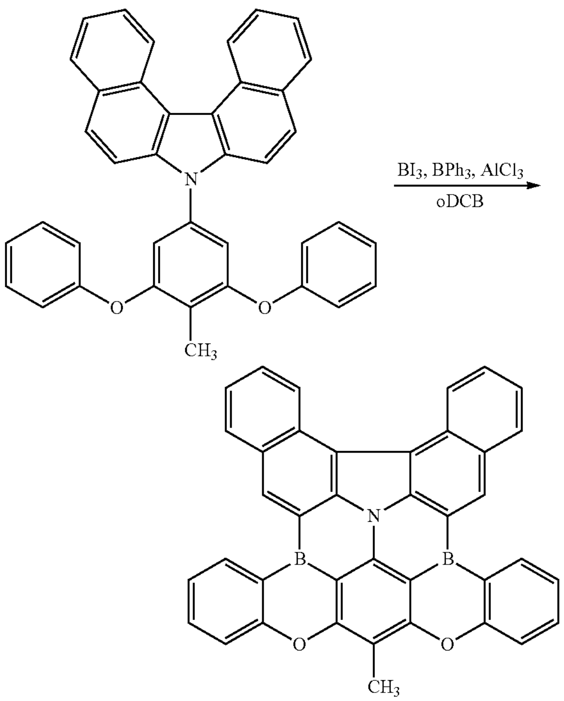

Into a 300 mL three-neck flask were put 2.9 g (5.4 mmol) of 7-(4-methyl-3,5-diphenoxyphenyl)-7H-dibenzo[c,g]carbazole and 2.5 g (10 mmol) of triphenylborane. The inside of the flask was replaced with nitrogen.

To this mixture, 55 mL of o-dichlorobenzene and 0.86 g (6.5 mmol) of boron triiodide were added, and the mixture was reacted at 180° C. for 15 hours while being stirred.

After a predetermined time elapsed, this mixture was cooled to 0° C., subjected to addition of a phosphate buffer solution, and stirred all night. After that, the mixture was filtered to give a solid. Through addition of ethanol and irradiation with an ultrasonic wave, the solid was collected. With silica gel column chromatography using toluene for a mobile phase, a target substance was separated from the solid. The mobile phase was distilled off to give a solid. Toluene was added, and the solid was heated while being stirred. After that, the mixture was filtered, so that 0.61 g of an orange solid (yield: 20%) was obtained. By a train sublimation method, 0.22 g of the solid was sublimated and purified to give 0.16 g of an orange solid (collection rate: 73%). Note that in the sublimation purification, the solid was heated at 350° C. under a pressure of $2.5\times10^{-2}$ Pa with a flow rate of an argon gas at 0 mL/min.

Mass Spectrum

FIG. 23 shows a mass spectrum measured with electron ionization-mass spectrometry (abbreviation: EI-MS analysis).

A sample was ionized with electrons accelerated at 70 eV. In FIG. 23, the horizontal axis represents m/z (mass-to-charge ratio) and the vertical axis represents the intensity (arbitrary unit). According to the spectrum shown in FIG. 23, the peak at m/z of 557 is derived from molecular ions. From the results, it was found that Me-Oipp-02, the organic compound of one embodiment of the present invention, was obtained in this synthesis example.

Physical Properties

Physical properties of the toluene solution containing Me-Oipp-02 and the solid thin film containing Me-Oipp-02 were measured.

The absorption spectrum was measured at room temperature with an UV-Visible/NIR spectrophotometer (V-770DS, produced by JASCO Corporation) in a state where the toluene solution was put in a quartz cell. The absorption spectrum shown in FIG. 24 is a result obtained by subtraction of an absorption spectrum of only toluene in a quartz cell from the measured absorption spectrum of the toluene solution in the quartz cell.

The emission spectrum was measured with a fluorescence spectrophotometer (FP-8600, produced by JASCO Corporation). The quantum yield was measured using an absolute PL quantum yield measurement system (Quantaurus-QY, produced by Hamamatsu Photonics K.K.).

[Toluene Solution Containing Me-Oipp-02]

FIG. 24 shows measurement results of an ultraviolet-visible absorption spectrum and an emission spectrum of the toluene solution containing Me-Oipp-02. The horizontal axis represents wavelength, and the vertical axis represents absorption intensity or emission intensity.

The absorption spectrum of the toluene solution containing Me-Oipp-02 exhibited peaks at 299 nm, 330 nm, 358 nm, 408 nm, 438 nm, and 468 nm (see FIG. 24).

The toluene solution containing Me-Oipp-02 emitted blue light. Its emission spectrum exhibited a maximum peak at 480 nm and a shoulder peak at 513 nm, and the full width at half maximum was 26 nm (see FIG. 24). Note that light with a wavelength of 438 nm was used as excitation light. The quantum yield of the toluene solution containing Me-Oipp-02 was 64%. The results indicate that Me-Oipp-02 is an organic compound with high emission efficiency, whose emission spectrum shows a narrow full width at half maximum and a short peak wavelength. The emission color is blue and the color purity is high.

From the results, Me-Oipp-02 was found to be useful for a host of a light-emitting substance and a substance emitting fluorescence in a visible region.

Example 2

In this example, a light-emitting device 1 of one embodiment of the present invention will be described with reference to FIG. 25, FIG. 26, FIG. 27, FIG. 28, FIG. 29, FIG. 30, and FIG. 31.

Figure 25:
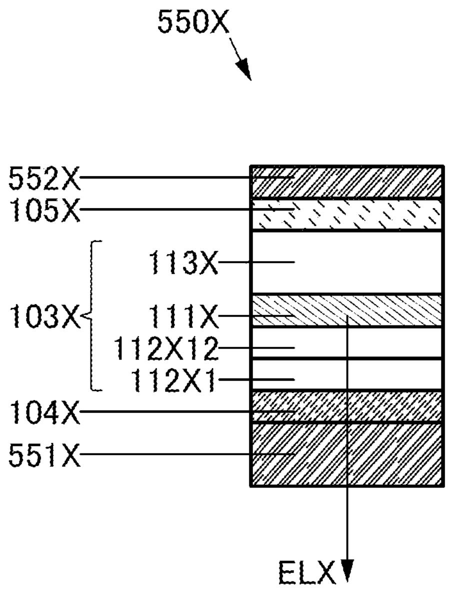
FIG. 25 illustrates a structure of a light-emitting device of Example.

FIG. 25 illustrates a structure of the light-emitting device 550X.

Figure 26:
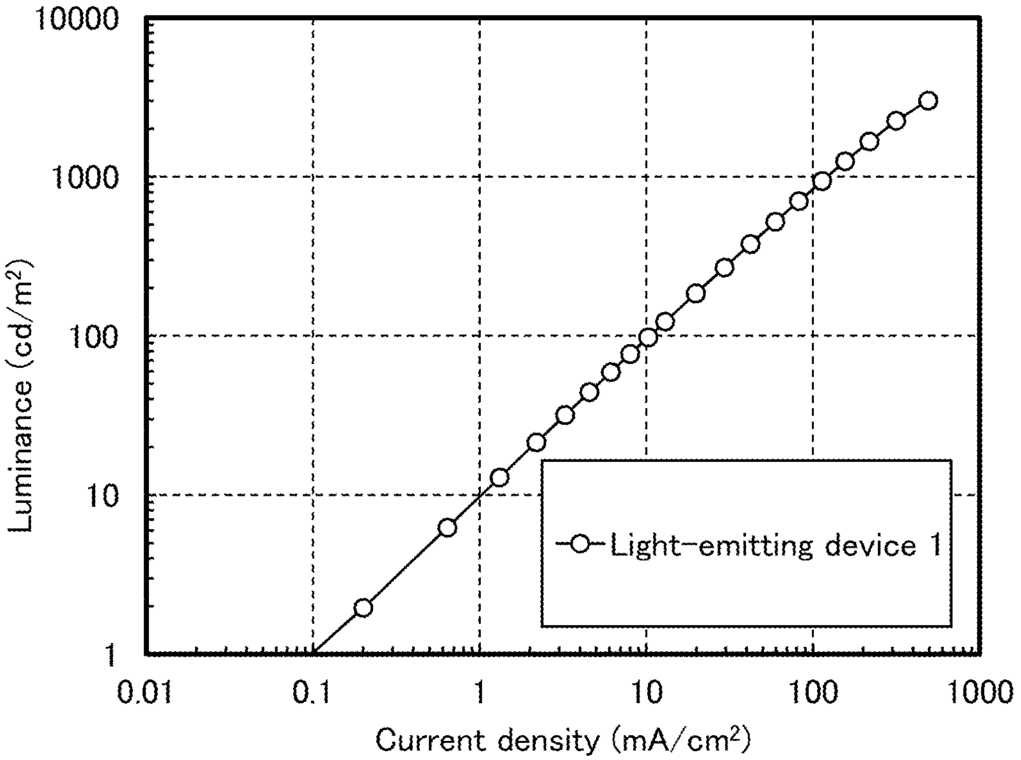
FIG. 26 is a graph showing current density-luminance characteristics of a light-emitting device of Example.

FIG. 26 shows current density-luminance characteristics of the light-emitting device 1.

Figure 27:
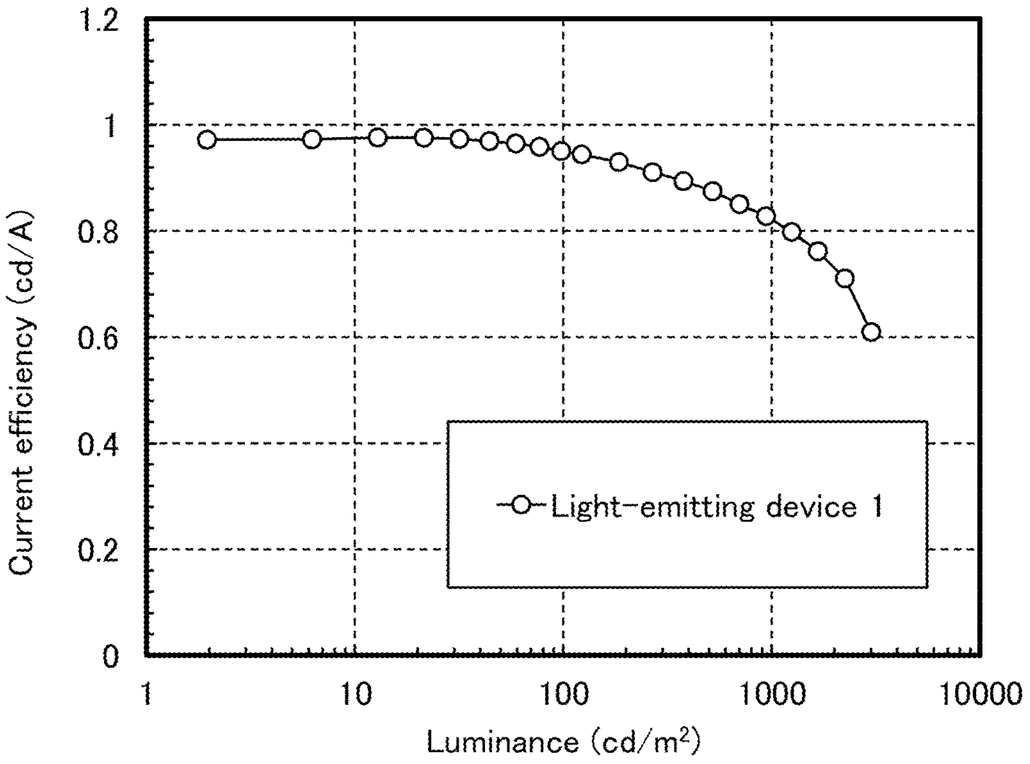
FIG. 27 is a graph showing luminance-current efficiency characteristics of the light-emitting device of Example.

FIG. 27 shows luminance-current efficiency characteristics of the light-emitting device 1.

Figure 28:
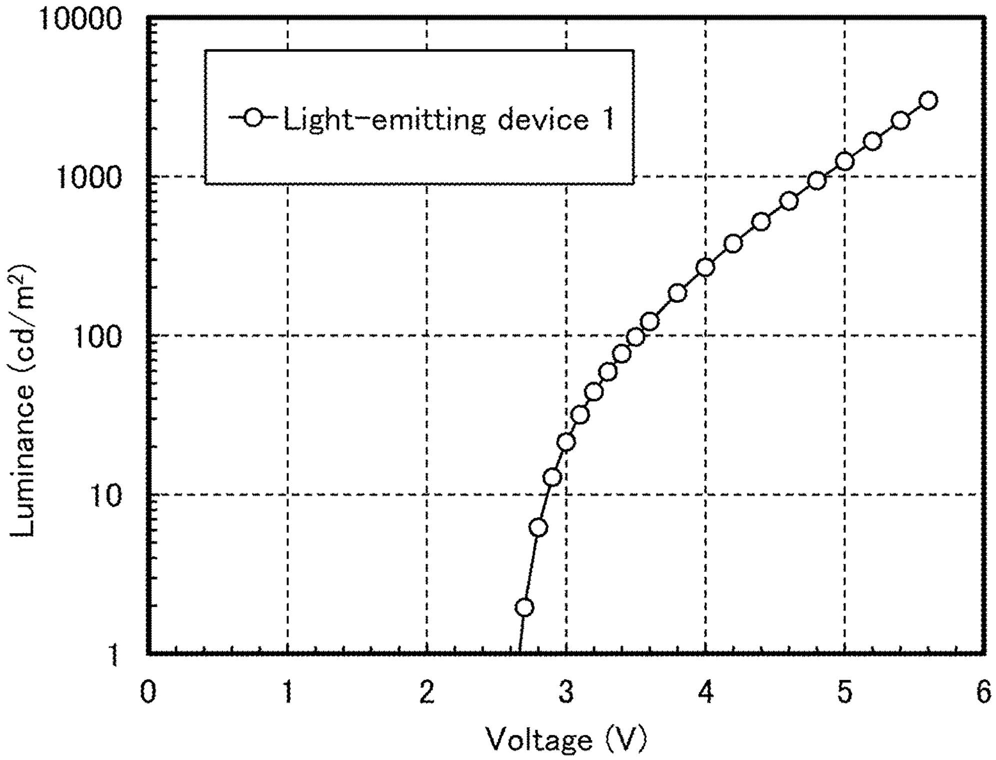
FIG. 28 is a graph showing voltage-luminance characteristics of the light-emitting device of Example.

FIG. 28 shows voltage-luminance characteristics of the light-emitting device 1.

Figure 29:
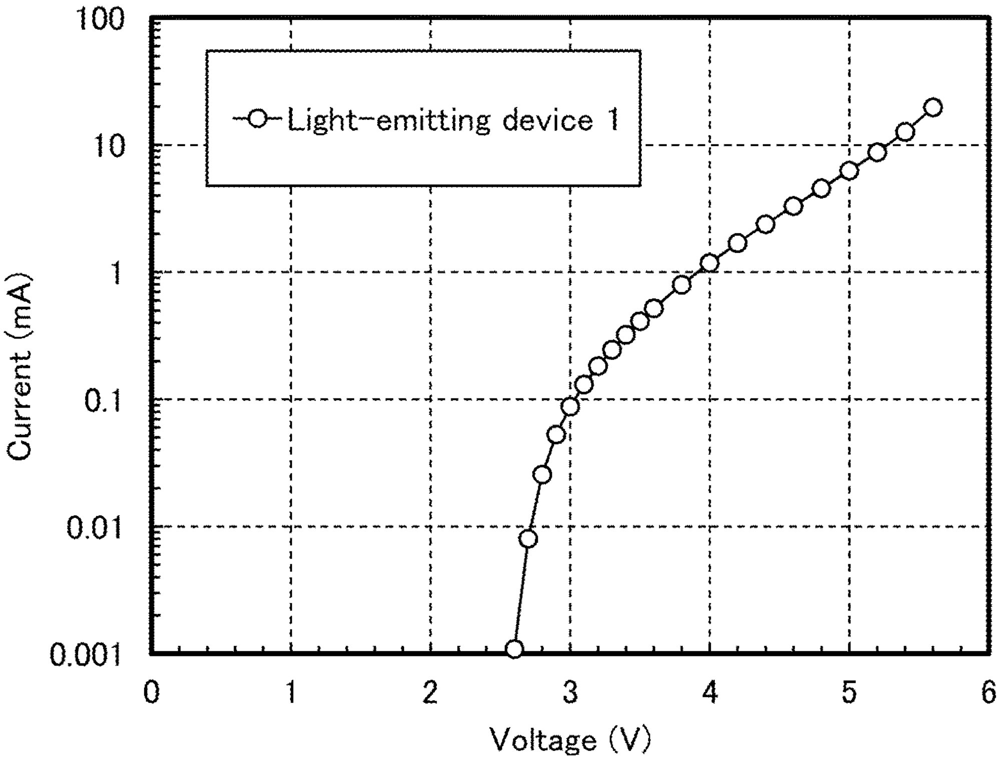
FIG. 29 is a graph showing voltage-current characteristics of the light-emitting device of Example.

FIG. 29 shows voltage-current characteristics of the light-emitting device 1.

Figure 30:
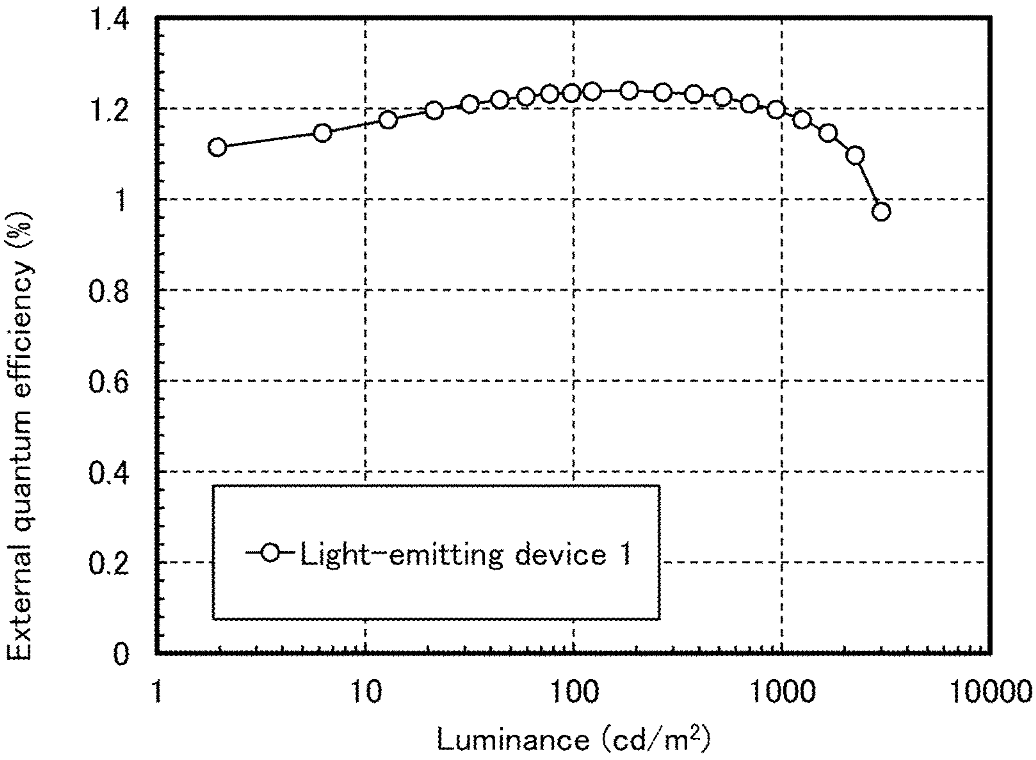
FIG. 30 is a graph showing luminance-external quantum efficiency characteristics of the light-emitting device of Example.

FIG. 30 shows luminance-external quantum efficiency characteristics of the light-emitting device 1. Note that the external quantum efficiency was calculated from luminance assuming that the light distribution characteristics of the light-emitting device were Lambertian type.

Figure 31:
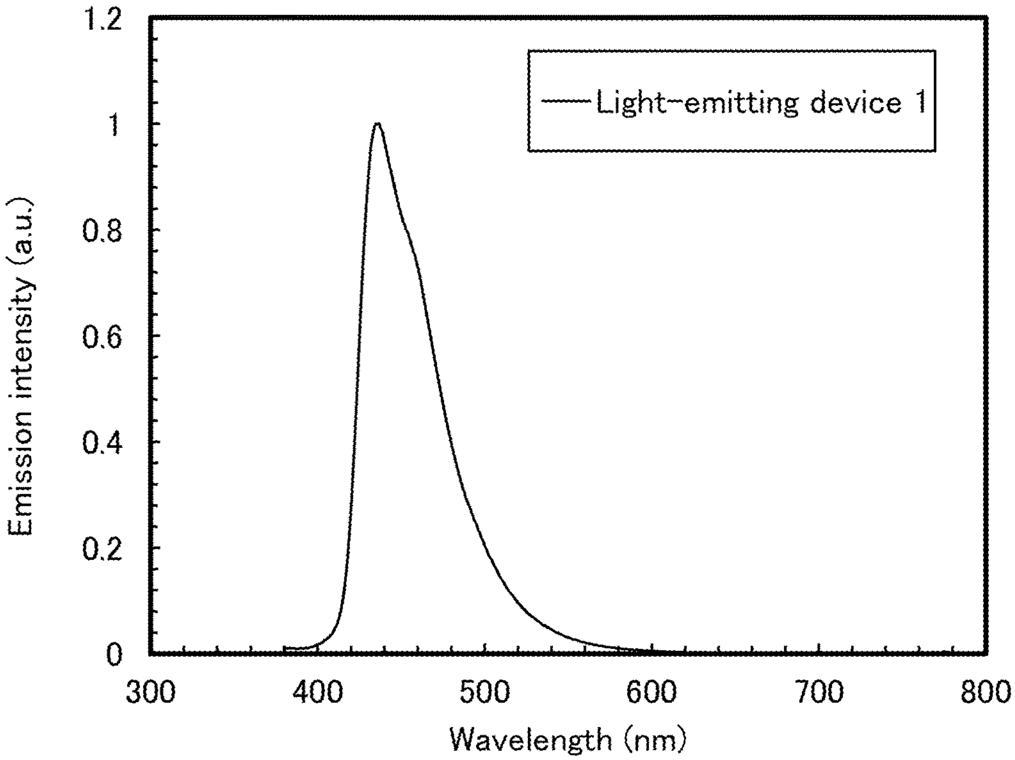
FIG. 31 is a graph showing an emission spectrum of the light-emitting device of Example.

FIG. 31 shows an emission spectrum of the light-emitting device 1 emitting light at a luminance of 1000 cd/$m^2$.

Light-Emitting Device 1

The fabricated light-emitting device 1, which is described in this example, has a structure similar to that of the light-emitting device 550X (see FIG. 25).

The light-emitting device 550X includes the electrode 551X, the electrode 552X, and the unit 103X. The unit 103X is sandwiched between electrodes 551X and 552X and contains an organic compound of one embodiment of the present invention.

Structure of Light-Emitting Device 1

Table 1 shows the structure of the light-emitting device 1. Structural formulae of materials used in the light-emitting device described in this example are shown below. Note that in the tables in this example, subscript and superscript characters are written in ordinary size for convenience. For example, a subscript character in an abbreviation or a superscript character in a unit are written in ordinary size in the tables. The corresponding description in the specification gives an accurate reading of such notations in the tables.

TABLE 1

| Component | Reference numeral | Material | Composition ratio | Thickness/ nm |
|---|---|---|---|---|
| Electrode | 552X | Al | | 150 |
| Layer | 105X | LiF | | 1 |
| Layer | 113X | mPPhen2P | | 25 |
| Layer | 111X | Me-35DCzPPy:Me-Oipp | 1:0.015 | 25 |
| Layer | 112X12 | PCzN2 | | 10 |
| Layer | 112X1 | BBABnf | | 20 |

TABLE 1-continued

| Component | Reference numeral | Material | Composition ratio | Thick-ness/ nm |
|---|---|---|---|---|
| Layer | 104X | BBABnf:OCHD-003 | 1:0.1 | 10 |
| Electrode | 55X | ITSO | | 70 |

[Chemical Formula 54]

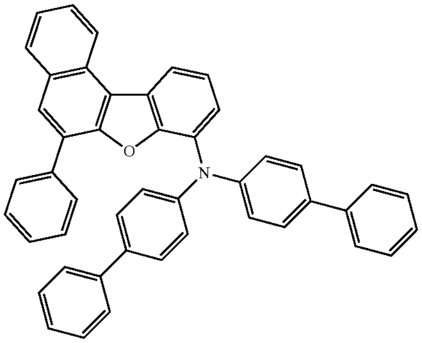

BBABnf

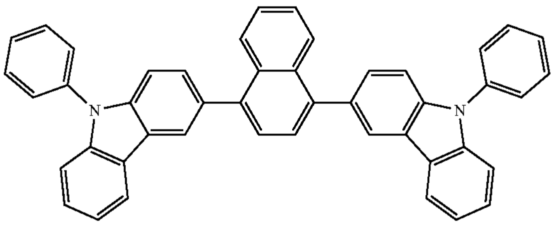

PCzN2

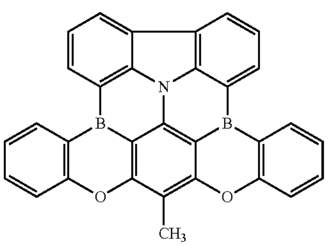

Me-Oipp

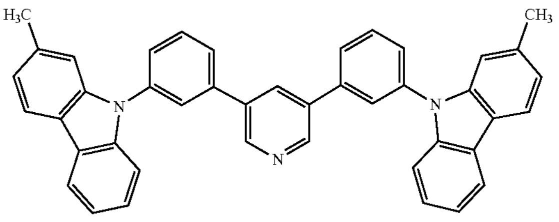

Me-35DCzPPy

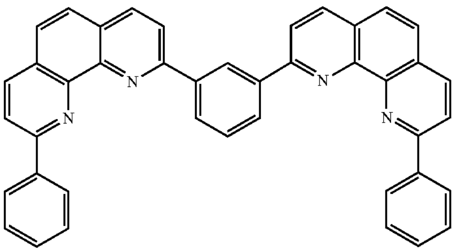

mPPhen2P

Fabrication Method of Light-Emitting Device 1

The light-emitting device 1 described in this example was fabricated using a method including the following steps.

[First Step]

In a first step, the electrode 551X was formed. Specifically, the electrode 551X was formed by a sputtering method using indium oxide-tin oxide containing silicon or silicon oxide (abbreviation: ITSO) as a target. The electrode 551X contains ITSO and has a thickness of 70 nm and an area of 4 $mm^2$ (2 mm×2 mm).

Next, a workpiece where the electrode 551X was formed was washed with water, and baked at 200° C. for 1 hour. Then, the workpiece was transferred into a vacuum evaporation apparatus where the pressure was reduced to approximately $10^{-4}$ Pa, and vacuum-baked at 170° C. for 30 minutes in a heating chamber of the vacuum evaporation apparatus. Then, cooling down for approximately 30 minutes was performed.

[Second Step]

In a second step, the layer 104X was formed over the electrode 551X. Specifically, materials of the layer 104X were co-deposited by a resistance-heating method. The layer 104X contains N,N-bis(4-biphenyl)-6-phenylbenzo[b]naphtho[1,2-d]furan-8-amine (abbreviation: BBABnf) and an electron acceptor material (abbreviation: OCHD-003) at BBABnf: OCHD-003=1:0.1 in a weight ratio and has a thickness of 10 nm.

[Third Step]

In a third step, a layer 112X1 was formed over the layer 104X. Specifically, a material of the layer 112X1 was deposited by a resistance-heating method. The layer 112X1 contains BBABnf and has a thickness of 20 nm.

[Fourth Step]

In a fourth step, a layer 112X12 was formed over the layer 112X1. Specifically, a material of the layer 112X12 was deposited by a resistance-heating method. The layer 112X12 contains 3,3'-(naphthalene-1,4-diyl)bis(9-phenyl-9H-carbazole) (abbreviation: PCzN2) and has a thickness of 10 nm.

[Fifth Step]

In a fifth step, the layer 111X was formed over the layer 112X12. Specifically, materials of the layer 111X were co-deposited by a resistance-heating method. The layer 111X contains 3,5-bis[3-(2-methyl-9H-carbazol-9-yl)phenyl]pyridine (abbreviation: Me-35DCzPPy) and 9-methyl-8,10-dioxa-17d-aza-3b,14b-diboraindeno[1',2',3',4':5,4,3]phenanthro[2,1,10,9-fghi]pentacene (abbreviation: Me-Oipp) at Me-35DCzPPy: Me-Oipp=1:0.015 in a weight ratio and has a thickness of 25 nm.

[Sixth Step]

In a sixth step, the layer 113X was formed over the layer 111X. Specifically, a material of the layer 113X was deposited by a resistance-heating method. The layer 113X contains 2,2'-(1,3-phenylene)bis(9-phenyl-1,10-phenanthroline) (abbreviation: mPPhen2P) and has a thickness of 25 nm.

[Seventh Step]

In a seventh step, the layer 105X was formed over the layer 113X. Specifically, a material of the layer 105X was deposited by a resistance-heating method. The layer 105X contains lithium fluoride (abbreviation: LiF) and has a thickness of 1 nm.

[Eighth Step]

In an eighth step, the electrode 552X was formed over the layer 105X. Specifically, a material of the electrode 552X was deposited by a resistance-heating method. The electrode 552X contains aluminum (abbreviation: Al) and has a thickness of 150 nm.

Operation Characteristics of Light-Emitting Device 1

When supplied with electric power, the light-emitting device 1 emitted light EL1 (see FIG. 25). Operation characteristics of the light-emitting device 1 were measured at room temperature (see FIG. 26 to FIG. 31). Note that luminance, CIE chromaticity, and emission spectra were measured with a spectroradiometer (SR-UL1R produced by TOPCON TECHNOHOUSE CORPORATION).

Table 2 shows main initial characteristics of the fabricated light-emitting device emitting light at a luminance of approximately 1000 cd/m$^2$.

TABLE 2

| | Voltage (V) | Cuurent (mA) | Current density (mA/cm2) | Chromaticity x | Chromaticity y | Current efficiency (cd/A) | External quantum efficiency (%) |
|---|---|---|---|---|---|---|---|
| Light-emitting device 1 | 4.8 | 4.54 | 113.5 | 0.15 | 0.07 | 0.8 | 1.2 |

The light-emitting device 1 was found to exhibit favorable characteristics. For example, the light-emitting device 1 emitted light exhibiting an extremely deep blue color, and its chromaticity y was 0.07. The emission spectrum exhibited a peak at a wavelength that was short as 435 nm. Further, the full width at half maximum of the emission spectrum was narrow as 50 nm, and the light emission exhibited a high color purity. The light emission, in spite of deep blue light, enables brightness to have a luminance of approximately 1000 cd/m$^2$ at a low voltage less than or equal to 5 V.

Example 3

In this example, physical properties of organic compounds of one embodiment of the present invention and methods for synthesizing the organic compounds will be described with reference to FIG. 32, FIG. 33, FIG. 34, FIG. 35, FIG. 36, FIG. 37, and FIG. 38.

Figure 32:
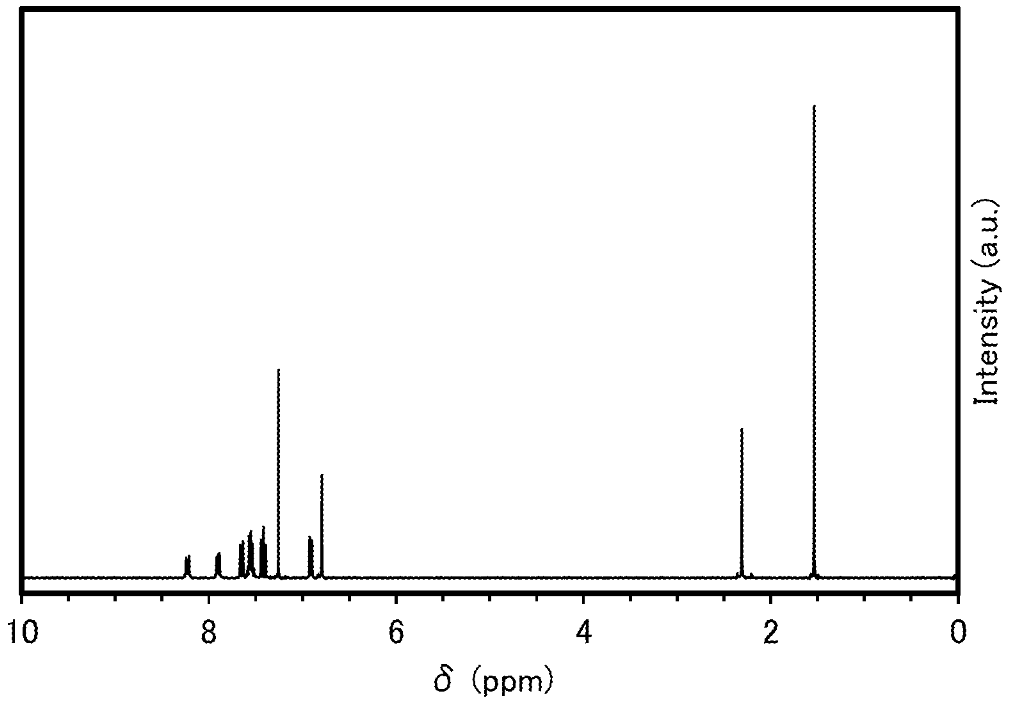
FIG. 32 shows a proton NMR spectrum of an organic compound of Example.

FIG. 32 shows $^1$H-NMR spectrum measurement results of 4-bromo-2,6-bis(1-naphthoxy)toluene.

Figure 33:
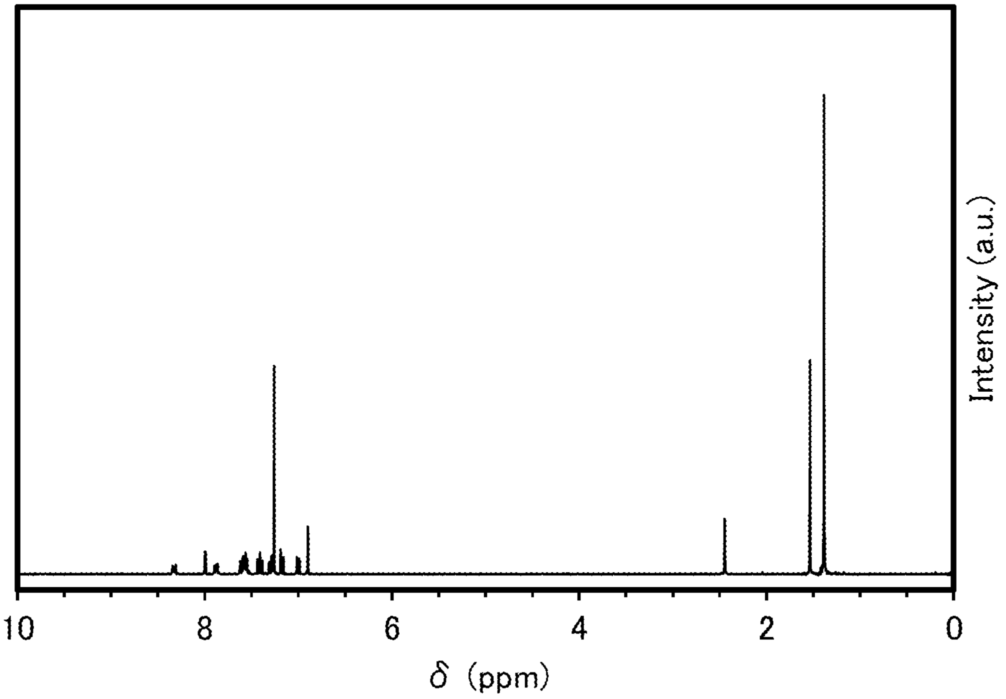
FIG. 33 shows a proton NMR spectrum of an organic compound of Example.

FIG. 33 shows $^1$H-NMR spectrum measurement results of 3,6-di-tert-butyl-9-[4-methyl-3,5-bis(1-naphthoxy)phenyl]-9H-carbazole.

Figure 34:
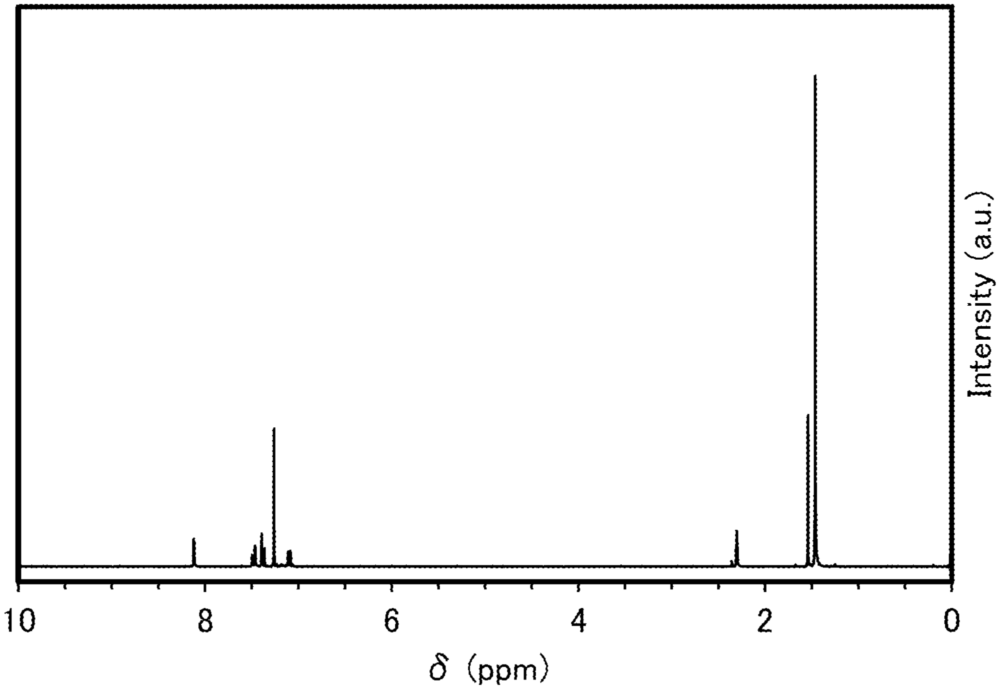
FIG. 34 shows a proton NMR spectrum of an organic compound of Example.

FIG. 34 shows $^1$H-NMR spectrum measurement results of 3,6-di-tert-butyl-9-(3,5-difluoro-4-methylphenyl)-9H-carbazole.

Figure 35:
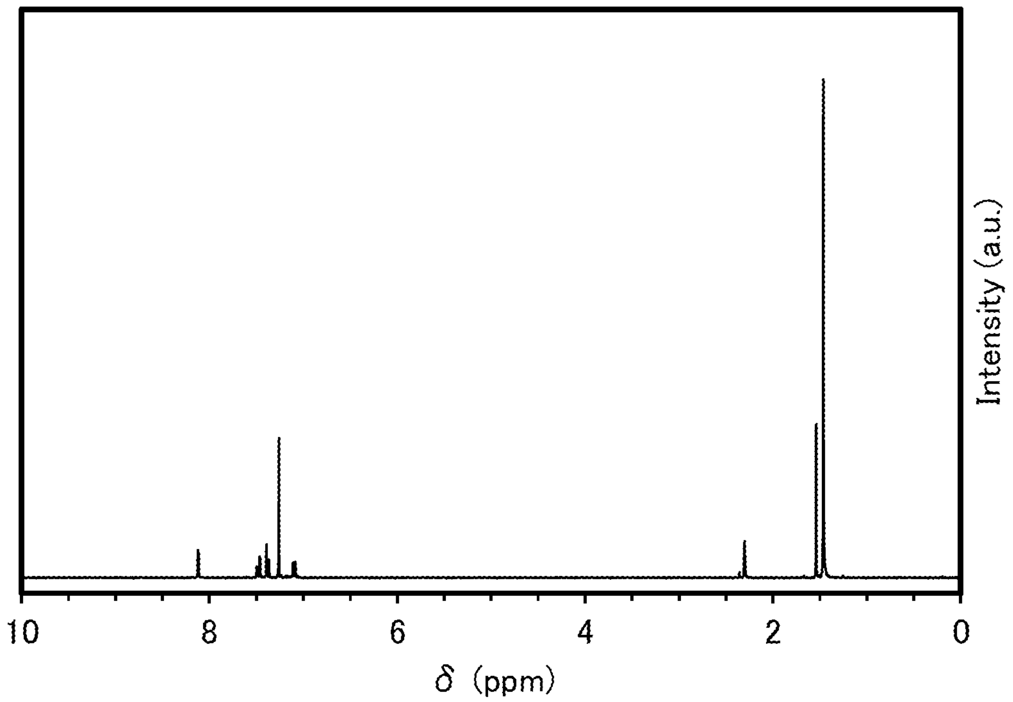
FIG. 35 shows a proton NMR spectrum of an organic compound of Example.

FIG. 35 shows $^1$H-NMR spectrum measurement results of 3,6-di-tert-butyl-9-[3,5-bis(bromophenoxy)-4-methylphenyl]-9H-carbazole.

Figure 36:
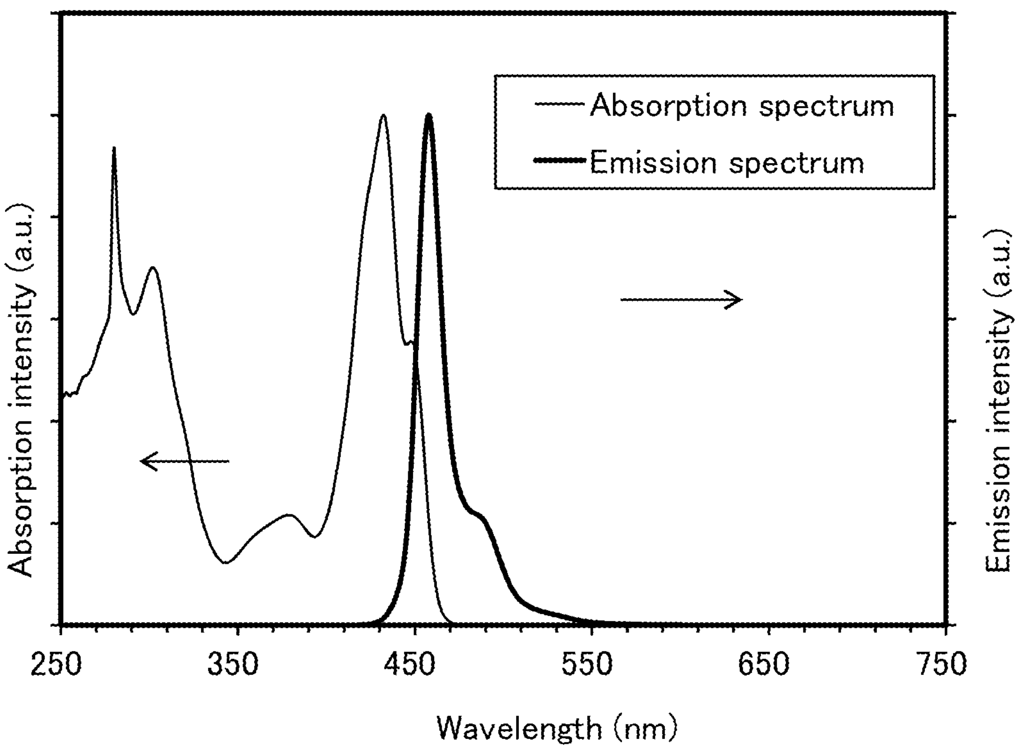
FIG. 36 shows an absorption spectrum and an emission spectrum of an organic compound of Example.

FIG. 36 shows measurement results of an absorption spectrum and an emission spectrum of a toluene solution containing mmtBuDPhA2Me-Oipp.

Figure 37:
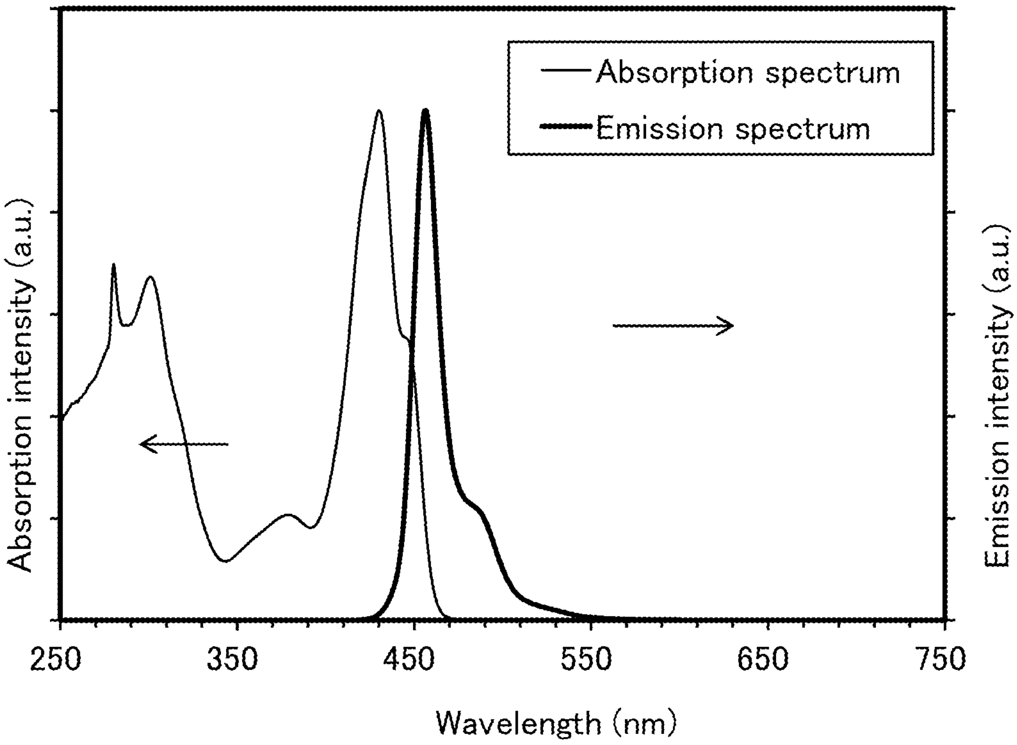
FIG. 37 shows an absorption spectrum and an emission spectrum of an organic compound of Example.

FIG. 37 shows measurement results of an absorption spectrum and an emission spectrum of a toluene solution containing mmtBuDPhA2Me-Oipp-02.

Figure 38:
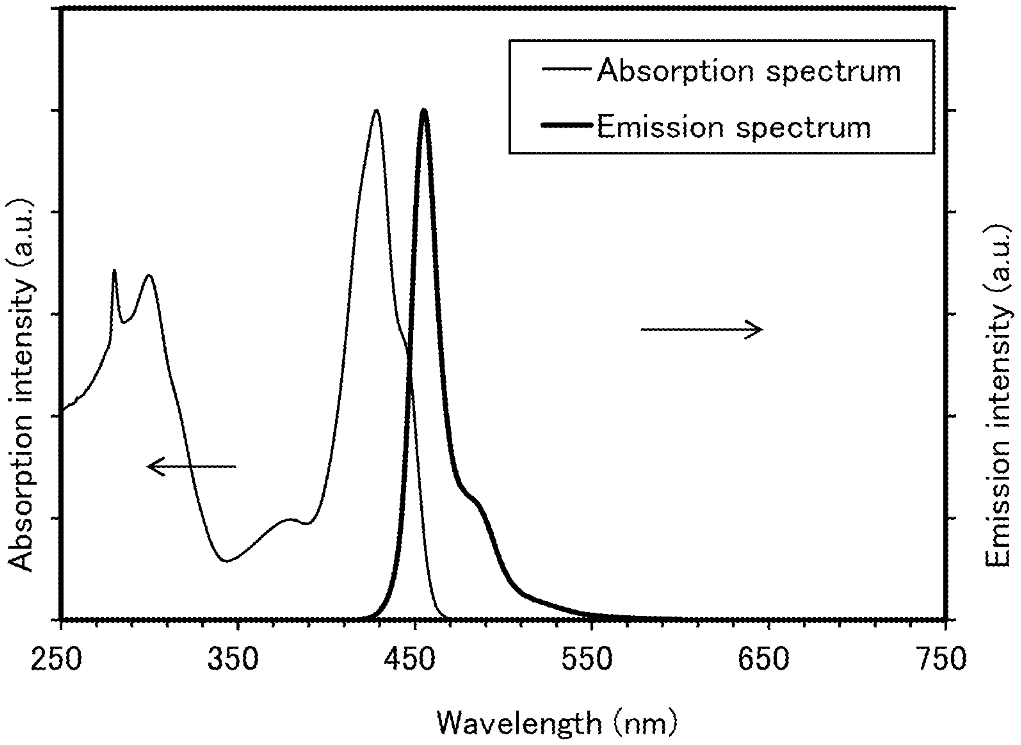
FIG. 38 shows an absorption spectrum and an emission spectrum of an organic compound of Example.

FIG. 38 shows measurement results of an absorption spectrum and an emission spectrum of a toluene solution containing mmtBuDPhA2Me-Oipp-03.

Synthesis Example 3

Synthesis example 3 will show a synthesis example of 11-methyl-10,12-dioxa-21d-aza-3b,18b-diboraindeno[1',2',3',4' 5,4,3]phenanthro[2,1,10,9-fghi]dibenzo[a,n]pentacene (abbreviation: Me-Oipp-03).

[Chemical Formula 55]

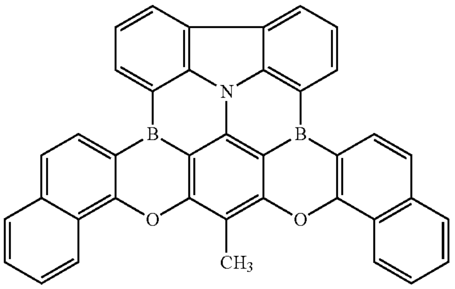

Me-Oipp-03

Synthesis Method

A synthesis method described in this synthesis example includes first to third steps.

[First Step]

In the first step, 4-bromo-2,6-bis(1-naphthoxy)toluene was synthesized. A synthesis scheme (3a) of the first step is shown below.

[Chemical Formula 56]

(3a)

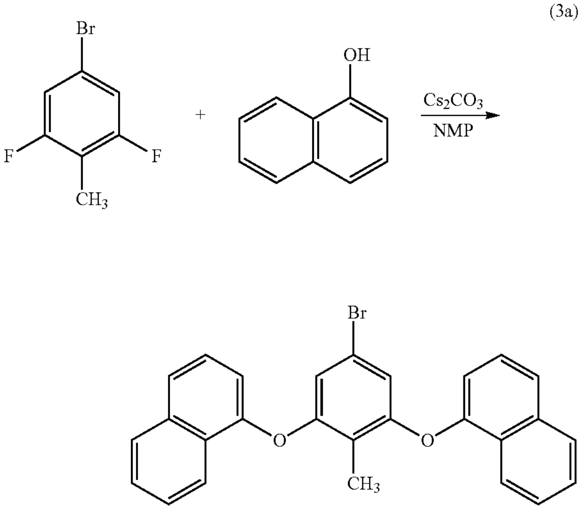

Into a 200 mL three-neck flask were put 5.0 g (24 mmol) of 4-bromo-2,6-difluorotoluene, 10.0 g (72 mmol) of 1-naphthol, 26.0 g (72 mmol) of cesium carbonate ($Cs_2CO_3$), and 120 mL of N-methyl-2-pyrrolidone (abbreviation: NMP).

This mixture was stirred under a nitrogen stream and reacted at 150° C. for 21 hours.

After a predetermined time elapsed, water was added to this mixture, so that the mixture was separated into an aqueous layer and an organic layer with use of a separating funnel. Toluene was added to the aqueous layer to extract a target substance remaining in the aqueous layer, and the extracted solution was added to the organic layer. Water was added to this organic layer to wash the organic layer with use of the separating funnel, so that the organic layer was further separated into an aqueous layer and an organic layer. Next, saturated saline was added to the organic layer to wash the organic layer with use of the separating funnel, so that the organic layer was further separated into an aqueous layer and an organic layer. Then, magnesium sulfate was added to the organic layer to adsorb moisture remaining in the organic layer. The organic layer was gravity filtered, and the filtrate was concentrated to give an oily substance. With silica gel column chromatography using a mixed solvent (the ratio of toluene to hexane is 9:1) for a mobile phase, a target substance was separated from the oily substance. The mobile phase was distilled off to give 5.5 g of a white solid (yield: 50%).

FIG. 32 shows the measurement results with nuclear magnetic resonance spectroscopy ($^1$H-NMR). Analysis results are shown below.

$^1$H-NMR ($CDCl_3$, 300 MHz): δ=2.31 (s, 3H), 6.79 (s, 2H), 7.62 (dd, J1=7.8 Hz, J2=1.2 Hz, 2H), 7.42 (t, J1=7.5 Hz, 2H), 7.52-7.59 (m, 4H), 7.65 (d, J1=8.4 Hz, 2H), 7.87-7.92 (m, 2H), 8.20-8.24 (m, 2H).

[Second Step]

In the second step, 3,6-di-tert-butyl-9-[4-methyl-3,5-bis(1-naphthoxy)phenyl]-9H-carbazole was synthesized. A synthesis scheme (3b) is shown below.

[Chemical Formula 57]

(3b)

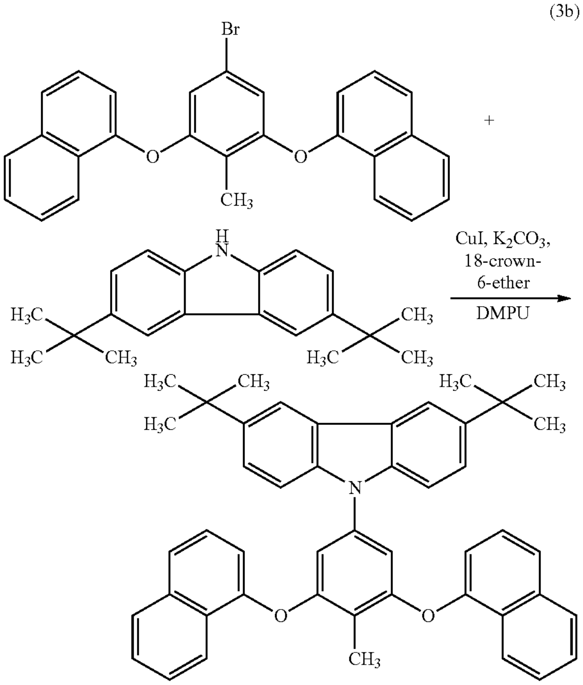

Into a 200 mL three-neck flask were put 5.5 g (12 mmol) of 4-bromo-2,6-bis(1-naphthoxy)toluene, 3.7 g (13 mmol) of 3,6-di-tert-butylcarbazole, 3.3 g (24 mmol) of potassium carbonate ($K_2CO_3$), and 95 mg (0.36 mmol) of 18-crown-6-ether. The mixture was stirred.

To the mixture, 5 mL of 1,3-dimethyl-3,4,5,6-tetrahydro-2(1H)pyrimidinone (abbreviation: DMPU) was added, and the mixture was stirred.

Then, the mixture was subjected to addition of 0.23 g (1.2 mmol) of copper(I) iodide (CuI), and reacted at 180° C. for 7 hours while being stirred under a nitrogen atmosphere.

After a predetermined time elapsed, this mixture was subjected to addition of toluene and suction filtration through a filter aid where Florisil, Celite, and alumina were stacked. The filtrate was condensed to give an oily substance. With silica gel column chromatography using a mixed solvent (the ratio of toluene to hexane is 1:5) for a mobile phase, a target substance was separated from the oily substance. From a solid given by distilling the mobile phase and the solution containing ethyl acetate and ethanol, 6.5 g of a white solid (yield: 83%) was obtained by performing a recrystallization method.

FIG. 33 shows the measurement results with nuclear magnetic resonance spectroscopy ($^1$H-NMR). Analysis results are shown below.

$^1$H-NMR ($CDCl_3$, 300 MHz): δ=1.39 (s, 18H), 2.45 (s, 3H), 6.90 (s, 2H), 7.00 (dd, J1=7.8 Hz, J2=1.2 Hz, 2H), 7.17 (d, J1=8.4 Hz, 2H), 7.30 (dd, J1=8.7 Hz, J2=1.8 Hz, 2H), 7.41 (t, J1=7.8 Hz, 2H), 7.52-7.62 (m, 6H), 7.85-7.89 (m, 2H), 7.99 (d, J1=1.8 Hz, 2H), 8.30-8.34 (m, 2H).

[Third Step]

In the third step, 11-methyl-10,12-dioxa-21d-aza-3b,18b-diboraindeno[1',2',3',4':5,4,3]phenanthro[2,1,10,9-fghi]dibenzo[a,n]pentacene (abbreviation: Me-Oipp-03) was synthesized. A synthesis scheme (3c) is shown below.

[Chemical Formula 58]

(3c)

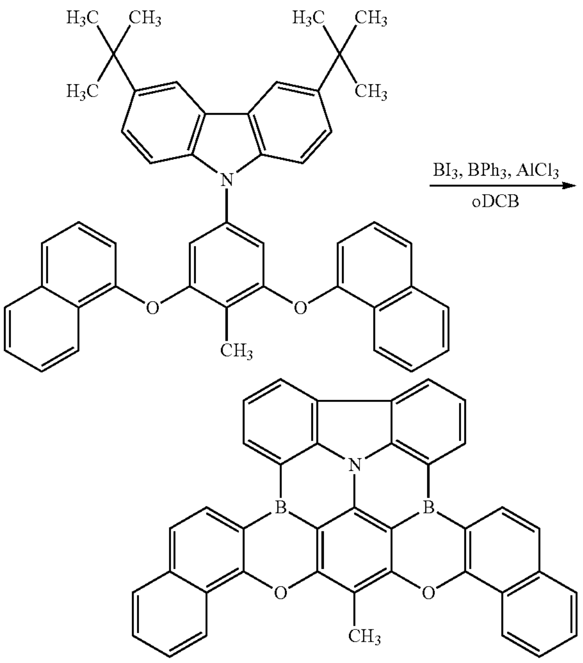

Into a 300 mL three-neck flask were put 2.9 g (4.5 mmol) of 3,6-di-tert-butyl-9-[4-methyl-3,5-bis(1-naphthoxy)phenyl]-9H-carbazole and 2.1 g (8.5 mmol) of triphenylborane. The inside of the flask was replaced with nitrogen.

After addition with 45 mL of o-dichlorobenzene (abbreviation: oDCB) and 1.5 g (3.8 mmol) of boron triiodide ($BI_3$), this mixture was reacted at 180° C. for 7 hours while being stirred.

After a predetermined time elapsed, 1.5 g (3.8 mmol) of boron triiodide, 0.72 g (5.4 mmol) of aluminum chloride ($AlCl_3$) was added, and the mixture was reacted at 180° C. for 5.5 hours while being stirred.

After a predetermined time elapsed, this mixture was cooled to 0° C., subjected to addition of a phosphate buffer solution, and stirred. After that, the mixture was filtered to give a solid. With silica gel column chromatography using toluene for a mobile phase, another solid was obtained from the above solid. The obtained solid was further purified to give 0.17 g of a pale yellow solid.

With use of a matrix-assisted laser desorption/ionization time-of-flight mass spectrometer (MALDI-TOFMS), the obtained pale yellow solid was analyzed.

The measurement was performed with MALDI-TOFMS (JMS-S3000 produced by JEOL Ltd.) in a spiral POS mode at 65% of laser intensity, 70 nesc of delay time, 70% of detector, 0.5 nesc of sampling interval, and 250 Hz of laser frequency.

A peak at m/z of 557 was detected. From this result, it was confirmed that Me-Oipp-03 was obtained in this synthesis example.

Note that in the third step of this synthesis example, 3,6-di-tert-butyl-9-[4-methyl-3,5-bis(1-naphthoxy)phenyl]-9H-carbazole may be used instead of 9-[4-methyl-3,5-bis(1-naphthoxy)phenyl]-9H-carbazole.

Physical Properties

Physical properties of the toluene solution containing Me-Oipp-03 were measured.

[Toluene Solution Containing Me-Oipp-03]

The toluene solution containing Me-Oipp-03 emitted blue light, and its emission spectrum exhibited a peak at 437 nm. The full width at half maximum of the emission spectrum was 21 nm. Me-Oipp-03 was found to be applicable to a host of a light-emitting substance and a substance emitting fluorescence in a visible region.

Synthesis Example 4

Synthesis example 4 will show a synthesis example of N,N,N',N'-tetrakis(3,5-di-tert-butylphenyl)-2,16-di-tert-butyl-9-methyl-8,10-dioxa-17d-aza-3b,14b-diboraindeno[1',2',3',4':5,4,3]phenanthro[2,1,10,9-fghi]pentacene-6,12-diamine (abbreviation: mmtBuDPhA2Me-Oipp) represented by Structural Formula (171) in Embodiment 1.

[Chemical Formula 59]

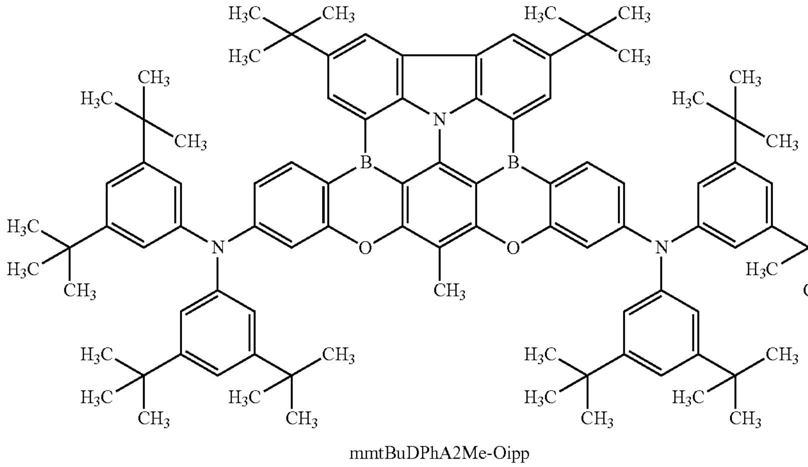

mmtBuDPhA2Me-Oipp

Synthesis Method

A synthesis method described in this synthesis example includes first to third steps.

[First Step]

In the first step, 3,6-di-tert-butyl-9-(3,5-difluoro-4-methylphenyl)-9H-carbazole was synthesized, and 3,6-di-tert-butyl-9-[3,5-bis(bromophenoxy)-4-methylphenyl]-9H-carbazole was synthesized. A synthesis scheme (4a-1) and a synthesis scheme (4a-2) of the first step are shown below.

[Chemical Formula 60]

(4a-1)

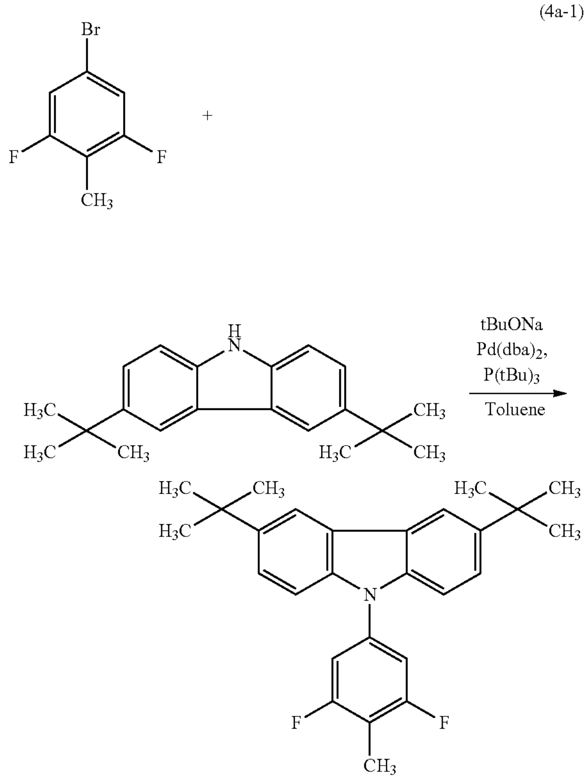

(4a-2)

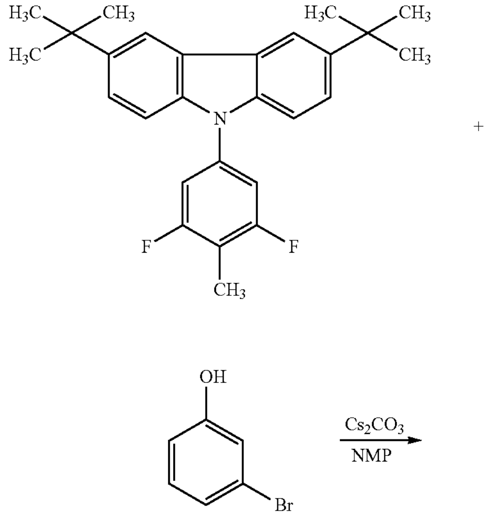

-continued

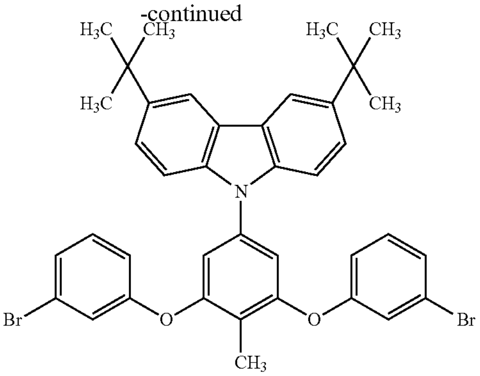

Into a 200 mL three-neck flask were put 5.0 g (24 mmol) of 4-bromo-2,6-difluorotoluene, 8.1 g (29 mmol) of 3,5-di-tert-butyl-9H-carbazole, 7.0 g (72 mmol) of sodium tert-butoxide, 110 mL of toluene, and 0.4 mL of a 10% hexane solution of tri(tert-butyl)phosphine (abbreviation: $P(tBu)_3$). The mixture was degassed by being stirred while the pressure in the flask was reduced.

After addition of 0.14 g (0.24 mmol) of bis(dibenzylideneacetone)palladium(0), the mixture was reacted at 120° C. for 23 hours by being stirred under a nitrogen stream.

After a predetermined time elapsed, this mixture was subjected to addition of toluene and suction filtration through a filter aid where Florisil, Celite, and alumina were stacked. The filtrate was condensed to give an oily substance. With silica gel column chromatography using a mixed solvent (the ratio of toluene to hexane is 1:5) for a mobile phase, a target substance was separated from the oily substance. The mobile phase was distilled off to give 9.7 g of a pale yellow solid (yield: 99%).

FIG. 34 shows the measurement results with nuclear magnetic resonance spectroscopy ($^1$H-NMR). Analysis results are shown below.

$^1$H-NMR ($CDCl_3$, 300 MHz): δ=1.46 (s, 18H), 2.30 (t, J1=1.5 Hz, 3H), 7.10 (d, J1=7.8 Hz, 2H), 7.38 (d, J1=8.4 Hz, 2H), 7.48 (dd, J1=9.0 Hz, J1=1.8 Hz, 2H), 8.12 (d, J1=1.8 Hz, 2H).

Into a 200 mL three-neck flask were put 9.7 g (24 mmol) of 3,6-di-tert-butyl-9-(3,5-difluoro-4-methylphenyl)-9H-carbazole, 12 g (72 mmol) of 3-bromophenol, 23.0 g (72 mmol) of cesium carbonate, and 110 mL of N-methyl-2-pyrrolidone. The mixture was degassed by being stirred while the pressure in the flask was reduced.

This mixture was reacted at 150° C. for 62 hours while being stirred under a nitrogen stream.

After a predetermined time elapsed, water was added to this mixture, and the precipitated solid was collected. With silica gel column chromatography using a mixed solvent (the ratio of toluene to hexane is 1:20) for a mobile phase, a target substance was separated from the solid. The mobile phase was distilled off to give a solid. Through addition of hexane and irradiation with an ultrasonic wave to/on the solid, 9.9 g of a white solid was obtained (yield: 58%).

FIG. 35 shows the measurement results with nuclear magnetic resonance spectroscopy ($^1$H-NMR). Analysis results are shown below.

$^1$H-NMR (DMSO-$d_6$, 300 MHz): δ=1.37 (s, 18H), 2.18 (s, 3H), 6.99 (s, 2H), 7.15 (dt, J1=7.2 Hz, J2=2.1 Hz, 2H), 7.29-7.45 (m, 10H), 7.23 (d, J1=1.8 Hz, 2H).

[Second Step]

In the second step, 1,3-bis[4-bis(3,5-di-tert-butylphenyl) aminophenoxy]-5-(3,6-di-tert-butyl-9H-carbazole-9-yl)-2-methyl-benzene was synthesized. A synthesis scheme (4b) is shown below.

[Chemical Formula 61]

(4b)

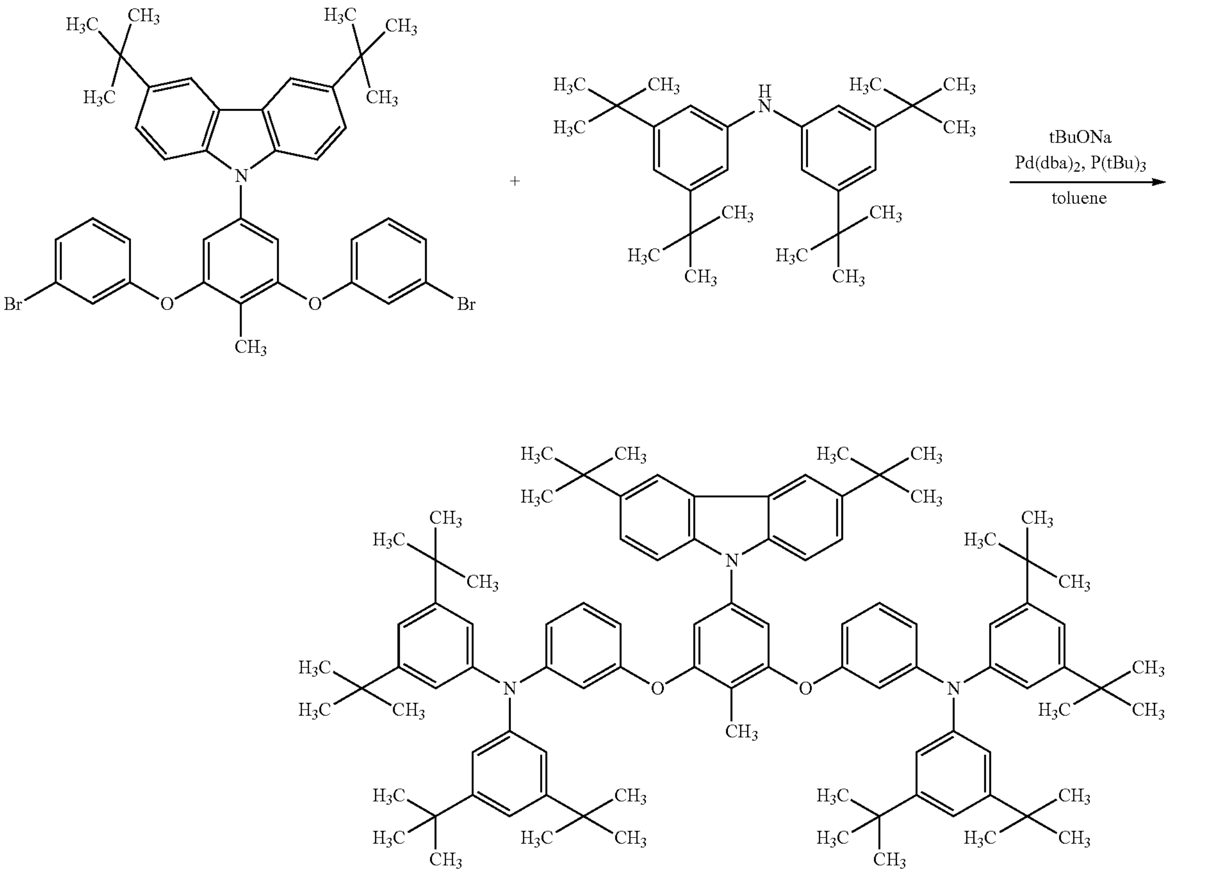

Into a 200 mL three-neck flask were put 2.7 g (3.7 mmol) of 3,6-di-tert-butyl-9-[3,5-bis(bromophenoxy)-4-methylphenyl]-9H-carbazole, 3.7 g (9.4 mmol) of bis(3,5-di-tert-butylphenyl)amine, 2.2 g (22 mmol) of sodium tert-butoxide, 20 mL of toluene, and 0.2 mL of a 10% hexane solution of tri(tert-butyl)phosphine. The mixture was degassed by being stirred while the pressure in the flask was reduced.

After addition of 43 mg (75 μmol) of bis(dibenzylideneacetone)palladium(0), the mixture was reacted at 120° C. for 6 hours by being stirred under a nitrogen stream.

After a predetermined time elapsed, this mixture was subjected to addition of toluene and suction filtration through a filter aid where Florisil, Celite, and alumina were stacked. The filtrate was condensed to give a solid. With silica gel column chromatography using a mixed solvent (the ratio of toluene to hexane is 1:4) for a mobile phase, a target substance was separated from the solid. Then, the mobile phase was distilled off to give a solid. Through addition of ethanol and irradiation with an ultrasonic wave to/on the solid, 5.2 g of a white solid was obtained.

The obtained white solid was analyzed with MALDI-TOFMS (JMS-S3000 produced by JEOL Ltd.). The measurement was performed in a spiral POS mode at 65% of laser intensity, 70 nesc of delay time, 70% of detector, 0.5 nesc of sampling interval, and 250 Hz of laser frequency.

A peak at m/z of 1336 was detected. From this result, it was confirmed that 1,3-bis[4-bis(3,5-di-tert-butylphenyl) aminophenoxy]-5-(3,6-di-tert-butyl-9H-carbazole-9-yl)-2-methyl-benzene was obtained in this synthesis example.

[Third Step]

In the third step, N,N,N',N'-tetrakis(3,5-di-tert-butylphenyl)-2,16-di-tert-butyl-9-methyl-8,10-dioxa-17d-aza-3b, 14b-diboraindeno[1',2',3',4':5,4,3]phenanthro[2,1,10,9-fghi] pentacene-6,12-diamine (abbreviation: mmtBuDPhA2Me-Oipp) was synthesized. A synthesis scheme (4c) is shown below.

[Chemical Formula 62]

(4c)

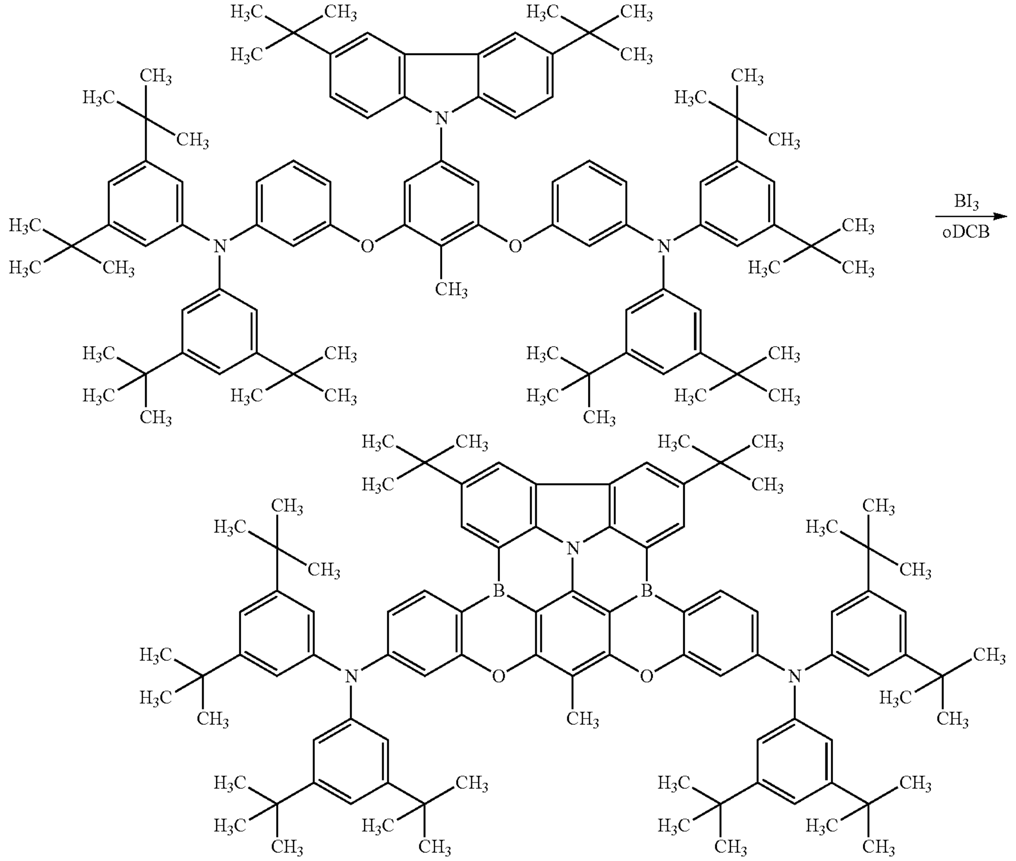

Into a 100 mL three-neck flask was put 1.5 g (1.1 mmol) of 1,3-bis[4-bis(3,5-di-tert-butylphenyl)aminophenoxy]-5-(3,6-di-tert-butyl-9H-carbazole-9-yl)-2-methyl-benzene. The inside of the flask was replaced with nitrogen.

After addition of 15 mL of o-dichlorobenzene and 1.1 g (2.8 mmol) of boron triiodide, the mixture was reacted at 130° C. for 6 hours while being stirred under a nitrogen stream.

After a predetermined time elapsed, a phosphate buffer solution was added, and the mixture was stirred. Then, the mixture was separated into an aqueous layer and an organic layer with use of a separating funnel. Toluene was added to the aqueous layer to extract a target substance remaining in the aqueous layer, and the extracted solution was added to the organic layer. Water was added to this organic layer to wash the organic layer with use of the separating funnel, so that the organic layer was further separated into an aqueous layer and an organic layer. Next, a saturated aqueous solution of sodium hydrogen carbonate was added to the organic layer to wash the organic layer with use of the separating funnel, so that the organic layer was further separated into an aqueous layer and an organic layer. Then, magnesium sulfate was added to the organic layer to adsorb moisture remaining in the organic layer. The organic layer was gravity filtered, and the filtrate was concentrated to give a solid. With silica gel column chromatography using a mixed solvent (the ratio of toluene to hexane is 1:9) for a mobile phase, a mixture containing a target substance was separated from the solid.

With high performance liquid column chromatography using chloroform for a mobile phase, the target substance, mmtBuDPhA2Me-Oipp, was separated from the mixture.

The separated target substance was analyzed with MALDI-TOFMS (JMS-S3000 produced by JEOL Ltd.). The measurement was performed in a spiral POS mode at 65% of laser intensity, 70 nesc of delay time, 70% of detector, 0.5 nesc of sampling interval, and 250 Hz of laser frequency.

A peak at m/z of 1352 was detected. From this result, it was confirmed that mmtBuDPhA2Me-Oipp was obtained in this synthesis example.

Physical Properties

Physical properties of the toluene solution containing mmtBuDPhA2Me-Oipp were measured.

The absorption spectrum of the toluene solution was measured at room temperature with an UV-Visible/NIR spectrophotometer (V-770DS, produced by JASCO Corporation) in a state where the toluene solution was put in a quartz cell. The absorption spectrum shown in FIG. 36 is a result obtained by subtraction of an absorption spectrum of only toluene in a quartz cell from the measured absorption spectrum of the toluene solution in the quartz cell.

The emission spectrum was measured with a fluorescence spectrophotometer (FP-8600, produced by JASCO Corporation). The quantum yield was measured using an absolute PL quantum yield measurement system (Quantaurus-QY, produced by Hamamatsu Photonics K.K.).

[Toluene Solution Containing mmtBuDPhA2Me-Oipp]

FIG. 36 shows measurement results of an ultraviolet-visible absorption spectrum and an emission spectrum of the toluene solution containing mmtBuDPhA2Me-Oipp. The horizontal axis represents wavelength, and the vertical axis represents absorption intensity or emission intensity.

The absorption spectrum of the toluene solution containing mmtBuDPhA2Me-Oipp exhibited peaks at 448 nm, 432 nm, 379 nm, and 302 nm (see FIG. 36).

Synthesis Example 5

Synthesis example 5 will show a synthesis example of N,N,N',N'-tetrakis(3,5-di-tert-butylphenyl)-2-tert-butyl-9-methyl-8,10-dioxa-17d-aza-3b,14b-diboraindeno[1',2',3',4':5,4,3]phenanthro[2,1,10,9-fghi]pentacene-6,12-diamine (abbreviation: mmtBuDPhA2Me-Oipp-02) represented by Structural Formula (187) in Embodiment 1.

[Chemical Formula 63]

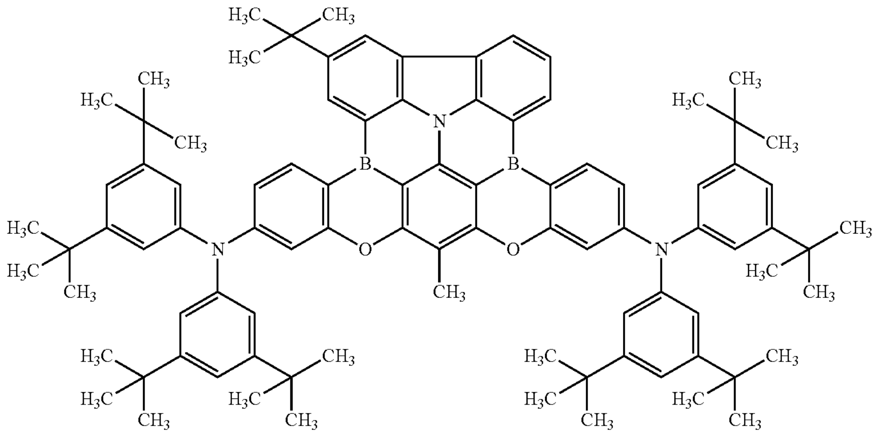

mmtBuDPhA2Me-Oipp-02

The toluene solution containing mmtBuDPhA2Me-Oipp emitted blue light. Its emission spectrum exhibited a maximum peak at 458 nm and a shoulder peak at 487 nm, and the full width at half maximum was 17 nm (see FIG. 36). Note that light with a wavelength of 410 nm was used as excitation light. The quantum yield of the toluene solution containing mmtBuDPhA2Me-Oipp was 79%. The results indicate that mmtBuDPhA2Me-Oipp is an organic compound with high emission efficiency, whose emission spectrum shows a narrow full width at half maximum, and is suitable for a light-emitting material. The emission spectrum peak observed at 458 nm is just apart only by 10 nm from the absorption spectrum peak observed at 448 nm, which indicates an extremely small Stokes shift. Thus, with use of mmtBuDPhA2Me-Oipp of one embodiment of the present invention for a light-emitting material (guest material), the loss of excitation energy due to vibration relaxation can be reduced. Furthermore, it is possible to emit light whose energy is close to the excitation energy received from a host material. Furthermore, it is not necessary to use a host material whose S1 level is unnecessarily high, and a light-emitting device with high reliability can be expected. It was found that mmtBuDPhA2Me-Oipp emits blue light and is applicable to a host of a light-emitting substance and a substance emitting fluorescence in a visible region. It was further found that mmtBuDPhA2Me-Oipp has a high color purity and is suitable particularly for a light-emitting material of displays.

Synthesis Method

In a synthesis method described in this synthesis example, a mixture was synthesized using the same method as in synthesizing mmtBuDPhA2Me-Oipp described in (Synthesis example 4), and a target substance was separated from the mixture with high performance liquid column chromatography.

In this synthesis example, 1,3-bis[4-bis(3,5-di-tert-butylphenyl)aminophenoxy]-5-(3-tert-butyl-9H-carbazole-9-yl)-2-methyl-benzene may be used instead of 1,3-bis[4-bis(3,5-di-tert-butylphenyl)aminophenoxy]-5-(3,6-di-tert-butyl-9H-carbazole-9-yl)-2-methyl-benzene.

With high performance liquid column chromatography using chloroform for a mobile phase, the target substance, mmtBuDPhA2Me-Oipp-02, was separated from the mixture.

The separated target substance was analyzed with ALDI-TOFMS (JMS-S3000 produced by JEOL Ltd.). The measurement was performed in a spiral POS mode at 65% of laser intensity, 70 nesc of delay time, 70% of detector, 0.5 nesc of sampling interval, and 250 Hz of laser frequency.

A peak at m/z of 1296 was detected. From this result, it was confirmed that mmtBuDPhA2Me-Oipp-02 was obtained in this synthesis example.

Physical Properties

Physical properties of the toluene solution containing mmtBuDPhA2Me-Oipp-02 were measured.

The absorption spectrum of the toluene solution was measured at room temperature with an UV-Visible/NIR spectrophotometer (V-770DS, produced by JASCO Corporation) in a state where the toluene solution was put in a quartz cell. The absorption spectrum shown in FIG. 37 is a result obtained by subtraction of an absorption spectrum of only toluene in a quartz cell from the measured absorption spectrum of the toluene solution in the quartz cell.

The emission spectrum was measured with a fluorescence spectrophotometer (FP-8600, produced by JASCO Corporation). The quantum yield was measured using an absolute PL quantum yield measurement system (Quantaurus-QY, produced by Hamamatsu Photonics K.K.).

[Toluene Solution Containing mmtBuDPhA2Me-Oipp-02]

FIG. 37 shows measurement results of an ultraviolet-visible absorption spectrum and an emission spectrum of the toluene solution containing mmtBuDPhA2Me-Oipp-02. The horizontal axis represents wavelength, and the vertical axis represents absorption intensity or emission intensity.

The absorption spectrum of the toluene solution containing mmtBuDPhA2Me-Oipp-02 exhibited peaks at 447 nm, 430 nm, 380 nm, and 301 nm (see FIG. 37).

The toluene solution containing mmtBuDPhA2Me-Oipp-02 emitted blue light. Its emission spectrum exhibited a maximum peak at 456 nm and a shoulder peak at 485 nm (see FIG. 37), and the full width at half maximum was 18 nm. Note that light with a wavelength of 410 nm was used as excitation light. The quantum yield of the toluene solution containing mmtBuDPhA2Me-Oipp-02 was 78%. The results indicate that mmtBuDPhA2Me-Oipp-02 is an organic compound with high emission efficiency, whose emission spectrum shows an extremely narrow full width at half maximum, and is suitable for a light-emitting material. The emission spectrum peak observed at 456 nm is just apart only by 9 nm from the absorption spectrum peak observed at 447 nm, which indicates an extremely small Stokes shift. Thus, with use of mmtBuDPhA2Me-Oipp-02 of one embodiment of the present invention for a light-emitting material (guest material), the loss of excitation energy due to vibration relaxation can be reduced. Furthermore, it is possible to emit light whose energy is close to the excitation energy received from a host material. Furthermore, it is not necessary to use a host material whose S1 level is unnecessarily high, and a light-emitting device with high reliability can be expected. It was found that mmtBuDPhA2Me-Oipp-02 emits blue light and is applicable to a host of a light-emitting substance and a substance emitting fluorescence in a visible region. It was further found that mmtBuDPhA2Me-Oipp-02 has a high color purity and is suitable particularly for a light-emitting material of displays.

Synthesis Example 6

Synthesis example 6 will show a synthesis example of N,N,N',N'-tetrakis(3,5-di-tert-butylphenyl)-9-methyl-8,10-dioxa-17d-aza-3b,14b-diboraindeno[1',2',3',4':5,4,3]phenanthro[2,1,10,9-fghi]pentacene-6,12-diamine (abbreviation: mmtBuDPhA2Me-Oipp-03) represented by Structural Formula (188) in Embodiment 1.

[Chemical Formula 64]

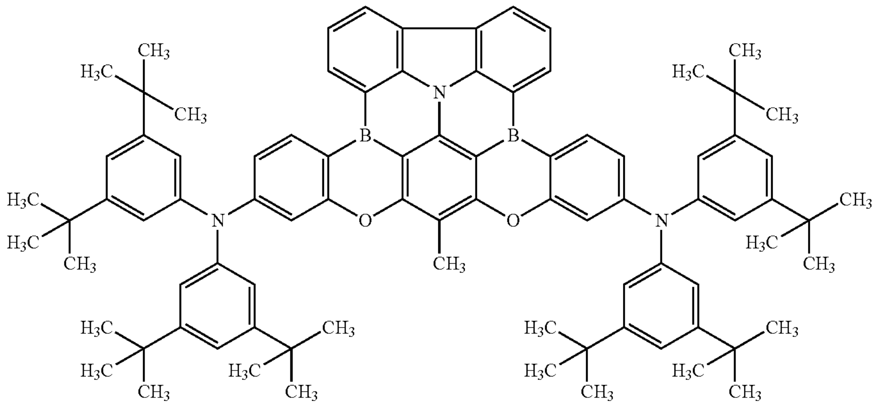

mmtBuDPhA2Me-Oipp-03

Synthesis Method

In a synthesis method described in this synthesis example, a mixture was synthesized using the same method as in synthesizing mmtBuDPhA2Me-Oipp described in (Synthesis example 4), and a target substance was separated from the mixture with high performance liquid column chromatography.

In this synthesis example, 1,3-bis[4-bis(3,5-di-tert-butylphenyl)aminophenoxy]-5-(9H-carbazole-9-yl)-2-methyl-benzene may be used instead of 1,3-bis[4-bis(3,5-di-tert-butylphenyl)aminophenoxy]-5-(3,6-di-tert-butyl-9H-carbazole-9-yl)-2-methyl-benzene.

With high performance liquid column chromatography using chloroform for a mobile phase, the target substance, mmtBuDPhA2Me-Oipp-03, was separated from the mixture.

The separated target substance was analyzed with MALDI-TOFMS (JMS-S3000 produced by JEOL Ltd.). The measurement was performed in a spiral POS mode at 65% of laser intensity, 70 nesc of delay time, 70% of detector, 0.5 nesc of sampling interval, and 250 Hz of laser frequency.

A peak at m/z of 1240 was detected. From this result, it was confirmed that mmtBuDPhA2Me-Oipp-03 was obtained in this synthesis example.

Physical Properties

Physical properties of the toluene solution containing mmtBuDPhA2Me-Oipp-03 were measured.

The absorption spectrum of the toluene solution was measured at room temperature with an UV-Visible/NIR spectrophotometer (V-770DS, produced by JASCO Corporation) in a state where the toluene solution was put in a quartz cell. The absorption spectrum shown in FIG. 38 is a result obtained by subtraction of an absorption spectrum of only toluene in a quartz cell from the measured absorption spectrum of the toluene solution in the quartz cell.

The emission spectrum was measured with a fluorescence spectrophotometer (FP-8600, produced by JASCO Corporation). The quantum yield was measured using an absolute PL quantum yield measurement system (Quantaurus-QY, produced by Hamamatsu Photonics K.K.).

[Toluene Solution Containing mmtBuDPhA2Me-Oipp-03]

FIG. 38 shows measurement results of an ultraviolet-visible absorption spectrum and an emission spectrum of the toluene solution containing mmtBuDPhA2Me-Oipp-03. The horizontal axis represents wavelength, and the vertical axis represents absorption intensity or emission intensity.

The absorption spectrum of the toluene solution containing mmtBuDPhA2Me-Oipp-03 exhibited peaks at 443 nm, 428 nm, 379 nm, and 300 nm (see FIG. 38).

The toluene solution containing mmtBuDPhA2Me-Oipp-03 emitted blue light. Its emission spectrum exhibited a maximum peak at 455 nm and a shoulder peak at 486 nm (see FIG. 38), and the full width at half maximum was 18 nm. Note that light with a wavelength of 410 nm was used as excitation light. The quantum yield of the toluene solution containing mmtBuDPhA2Me-Oipp-03 was 77%. The results indicate that mmtBuDPhA2Me-Oipp-03 is an organic compound with high emission efficiency, whose emission spectrum shows an extremely narrow full width at half maximum, and is suitable for a light-emitting material. The emission spectrum peak observed at 455 nm is just apart only by 12 nm from the absorption spectrum peak observed at 443 nm, which indicates an extremely small Stokes shift. Thus, with use of mmtBuDPhA2Me-Oipp-03 of one embodiment of the present invention for a light-emitting material (guest material), the loss of excitation energy due to vibration relaxation can be reduced. Furthermore, it is possible to emit light whose energy is close to the excitation energy received from a host material. Furthermore, it is not necessary to use a host material whose S1 level is unnecessarily high, and a light-emitting device with high reliability can be expected. It was found that mmtBuDPhA2Me-Oipp-03 emits blue light and is applicable to a host of a light-emitting substance and a substance emitting fluorescence in a visible region. It was further found that mmtBuDPhA2Me-Oipp-03 has a high color purity and is suitable particularly for a light-emitting material of displays.

This application is based on Japanese Patent Application Serial No. 2022-126899 filed with Japan Patent Office on Aug. 9, 2022, the entire contents of which are hereby incorporated by reference.

What is claimed is:

1. An organic compound represented by General Formula (G0), (G0)

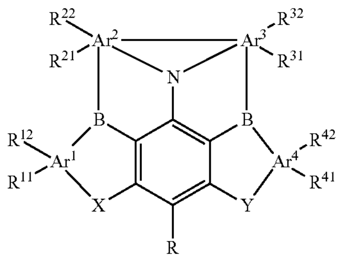

wherein in General Formula (G0):

X and Y each independently represent an oxygen atom or a sulfur atom;

$Ar^1$ to $Ar^4$ each independently represent an aromatic ring or a nitrogen-containing heteroaromatic ring;

the aromatic ring contains 6 to 10 carbon atoms;

the nitrogen-containing heteroaromatic ring is composed only of one or more six-membered rings and contains 4 to 9 carbon atoms;

R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine, or substituted or unsubstituted heteroarylamine having 3 to 18 carbon atoms; and at least one of R, $R^{11}$, $R^{12}$, $R^{21}$, $R^{22}$, $R^{31}$, $R^{32}$, $R^{41}$, and $R^{42}$ represents substituted diarylamine comprising a plurality of branched alkyl groups.

2. A light-emitting device comprising:

a first electrode;

a second electrode; and a unit, wherein the unit is between the first electrode and the second electrode, and wherein the unit comprises the organic compound according to claim 1.

3. A display device comprising:

the light-emitting device according to claim 2; and at least one of a transistor and a substrate.

4. An electronic device comprising:

the display device according to claim 3; and at least one of a sensor, an operation button, a speaker, and a microphone.

5. A light-emitting apparatus comprising:

the light-emitting device according to claim 2; and at least one of a transistor and a substrate.

6. A lighting device comprising:

the light-emitting apparatus according to claim 5; and a housing.

7. An organic compound represented by General Formula (G1), (G1)

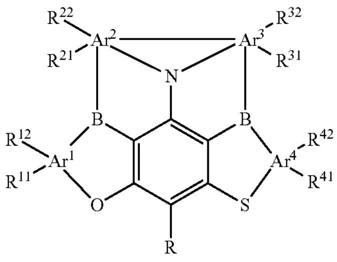

wherein in General Formula (G1):

$Ar^1$ to $Ar^4$ each independently represent an aromatic ring or a nitrogen-containing heteroaromatic ring;

the aromatic ring contains 6 to 10 carbon atoms;

the nitrogen-containing heteroaromatic ring is composed only of one or more six-membered rings and contains 4 to 9 carbon atoms;

R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine, or substituted or unsubstituted heteroarylamine having 3 to 18 carbon atoms; and at least one of R, $R^{11}$, $R^{12}$, $R^{21}$, $R^{22}$, $R^{31}$, $R^{32}$, $R^{41}$, and $R^{42}$ represents substituted diarylamine comprising a plurality of branched alkyl groups.

8. A light-emitting device comprising:

a first electrode;

a second electrode; and a unit, wherein the unit is between the first electrode and the second electrode, and wherein the unit comprises the organic compound according to claim 1.

9. A display device comprising:

the light-emitting device according to claim 8; and at least one of a transistor and a substrate.

10. An electronic device comprising:

the display device according to claim 9; and at least one of a sensor, an operation button, a speaker, and a microphone.

11. A light-emitting apparatus comprising:

the light-emitting device according to claim 8; and at least one of a transistor and a substrate.

12. A lighting device comprising:

the light-emitting apparatus according to claim 11; and a housing.

13. An organic compound represented by General Formula (G2), (G2)

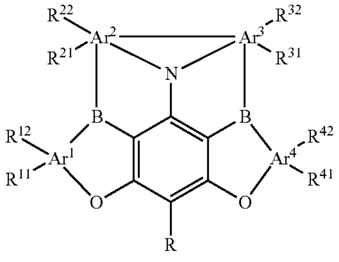

wherein in General Formula (G2):

$Ar^1$ to $Ar^4$ each independently represent an aromatic ring or a nitrogen-containing heteroaromatic ring;

the aromatic ring contains 6 to 10 carbon atoms;

the nitrogen-containing heteroaromatic ring is composed only of one or more six-membered rings and contains 4 to 9 carbon atoms;

R, $R^{11}$, $R^{12}$, $R^{21}$, $R^{22}$, $R^{31}$, $R^{32}$, $R^{41}$, and $R^{42}$ each independently represent hydrogen, a straight-chain alkyl group having 1 to 6 carbon atoms, a branched alkyl group having 3 to 7 carbon atoms, a substituted or unsubstituted aryl group having 6 to 13 carbon atoms, substituted or unsubstituted diarylamine, or substituted or unsubstituted heteroarylamine having 3 to 18 carbon atoms; and at least one of R, $R^{11}$, $R^{12}$, $R^{21}$, $R^{22}$, $R^{31}$, $R^{32}$, $R^{41}$, and $R^{42}$ represents substituted diarylamine comprising a plurality of branched alkyl groups.

14. A light-emitting device comprising:

a first electrode;

a second electrode; and a unit, wherein the unit is between the first electrode and the second electrode, and wherein the unit comprises the organic compound according to claim 1.

15. A display device comprising:

the light-emitting device according to claim 14; and at least one of a transistor and a substrate.

16. An electronic device comprising:

the display device according to claim 15; and at least one of a sensor, an operation button, a speaker, and a microphone.

17. A light-emitting apparatus comprising:

the light-emitting device according to claim 14; and at least one of a transistor and a substrate.

18. A lighting device comprising:

the light-emitting apparatus according to claim 17; and a housing.

* * * * *